US012575132B2

(12) United States Patent
Kusunoki et al.

(10) Patent No.:  US 12,575,132 B2
(45) Date of Patent:       Mar. 10, 2026

(54) SEMICONDUCTOR DEVICE

(71) Applicant: Semiconductor Energy Laboratory Co., Ltd., Atsugi (JP)

(72) Inventors: Koji Kusunoki, Isehara (JP); Susumu Kawashima, Atsugi (JP); Hideaki Shishido, Atsugi (JP); Tomoaki Atsumi, Hadano (JP); Motoharu Saito, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 238 days.

(21) Appl. No.: 18/129,122

(22) Filed: Mar. 31, 2023

(65) Prior Publication Data

US 2023/0335605 A1     Oct. 19, 2023

(30) Foreign Application Priority Data

Apr. 15, 2022   (JP) ................................. 2022-067469
Apr. 29, 2022   (JP) ................................. 2022-075586
May 27, 2022   (JP) ................................. 2022-086755

(51) Int. Cl.
H10D 30/67        (2025.01)
H10D 84/83        (2025.01)

(52) U.S. Cl.
CPC ..... H10D 30/6729 (2025.01); H10D 30/6755 (2025.01); H10D 84/83 (2025.01); *H10D 30/6757* (2025.01)

(58) Field of Classification Search
CPC ........... H10D 30/6729; H10D 30/6755; H10D 30/6757; H10D 84/83; H10D 30/6728;

H10D 84/00; H10D 84/01; H10D 84/0112; H10D 86/60; H10D 30/6739; H10D 86/441; H03K 19/09441
USPC ......................................................... 257/288
See application file for complete search history.

(56) References Cited

U.S. PATENT DOCUMENTS

| | | |
|---|---|---|
| 6,813,332 B2 | 11/2004 | Nagao et al. |
| 7,202,863 B2 | 4/2007 | Kimura et al. |
| 7,205,610 B2 | 4/2007 | Koyama |
| 7,978,274 B2 | 7/2011 | Umezaki et al. |
| 8,772,771 B2 | 7/2014 | Tanaka |
| 9,059,029 B2 | 6/2015 | Arai |
| 9,450,581 B2 | 9/2016 | Tamura |
| 9,496,408 B2 | 11/2016 | Yamazaki et al. |
| 9,698,170 B2 | 7/2017 | Umezaki |
| 9,741,865 B2 | 8/2017 | Yamazaki et al. |
| 9,762,239 B2 | 9/2017 | Tamura |
| 9,786,688 B2 | 10/2017 | Umezaki |

(Continued)

*Primary Examiner* — Monica D Harrison

(74) *Attorney, Agent, or Firm* — Eric J. Robinson; Robinson Intellectual Property Law Office, P.C.

(57)              ABSTRACT

A novel semiconductor device is provided. The semiconductor device is a single-polarity semiconductor device including a vertical-channel transistor. In the vertical-channel transistor, the higher parasitic capacitance value of the gate-source parasitic capacitance and the gate-drain parasitic capacitance is used as a bootstrap capacitor, which decreases the occupied area of the semiconductor device. The use of an oxide semiconductor for a semiconductor layer of the vertical-channel transistor increases the breakdown voltage between the source and the drain, which can shorten the channel length. In addition, stable operation can be performed even in a high-temperature environment.

12 Claims, 52 Drawing Sheets

(56)     References Cited

U.S. PATENT DOCUMENTS

| | | | |
|---|---|---|---|
| 9,831,309 | B2 | 11/2017 | Miyairi |
| 9,859,439 | B2 | 1/2018 | Miyairi |
| 9,887,010 | B2 | 2/2018 | Asami |
| 9,899,536 | B2 | 2/2018 | Yamazaki et al. |
| 9,905,700 | B2 | 2/2018 | Asami |
| 10,071,904 | B2 | 9/2018 | Umezaki |
| 10,205,452 | B2 | 2/2019 | Tamura |
| 10,297,331 | B2 | 5/2019 | Miyake |
| 10,600,469 | B2 | 3/2020 | Kimura. et al. |
| 11,335,812 | B2 | 5/2022 | Yamazaki et al. |
| 2020/0395486 | A1* | 12/2020 | Yamazaki ......... H01L 21/76801 |
| 2025/0234591 | A1 | 7/2025 | Jintyou et al. |

* cited by examiner

C1 > C2

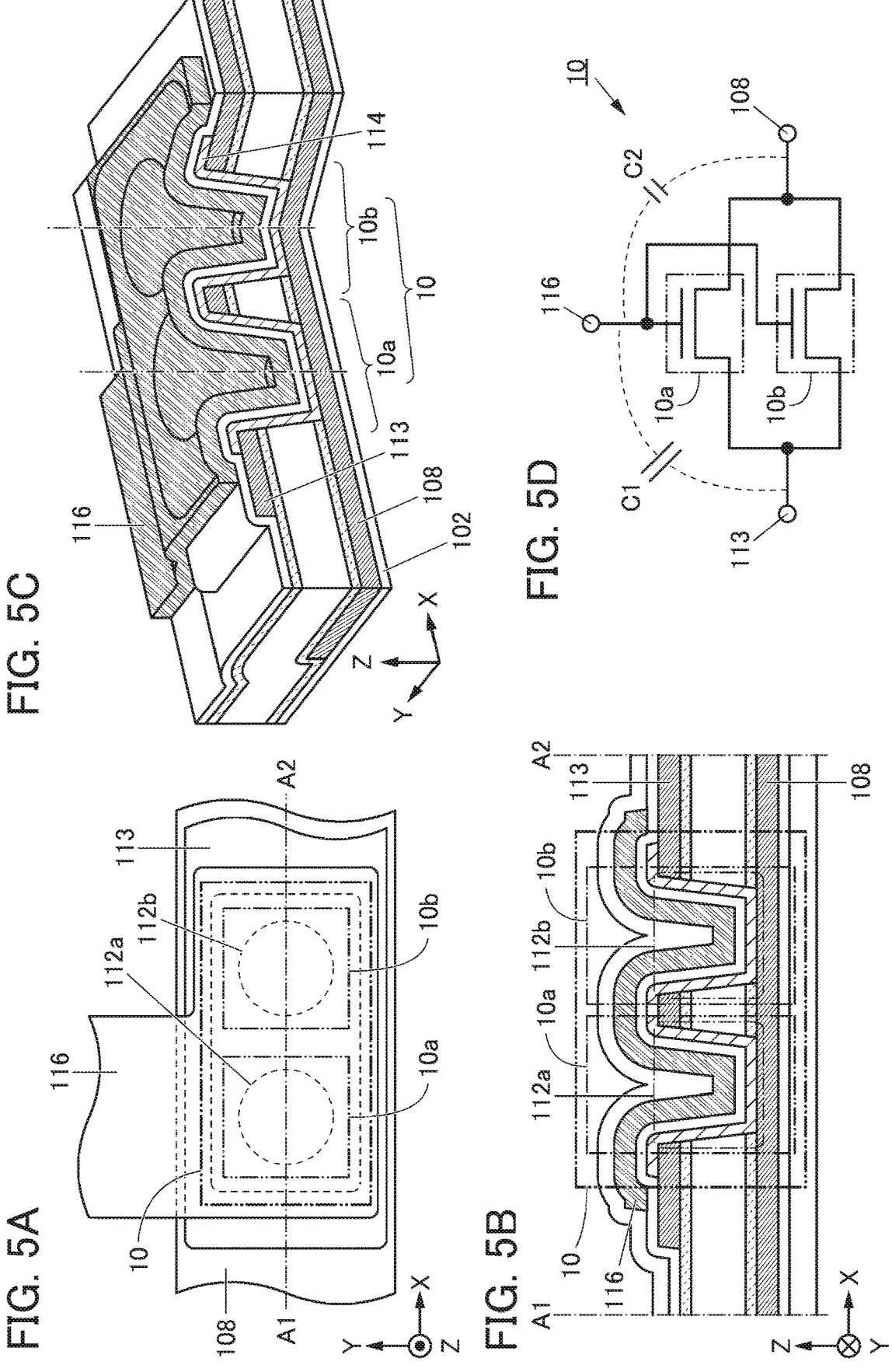

IN1 — OUT

IN2 —

| IN1 | IN2 | OUT |
|-----|-----|-----|
| H | H | L |
| H | L | H |
| L | H | H |
| L | L | H |

<T1>

<T2>

<T2a>

<T5>

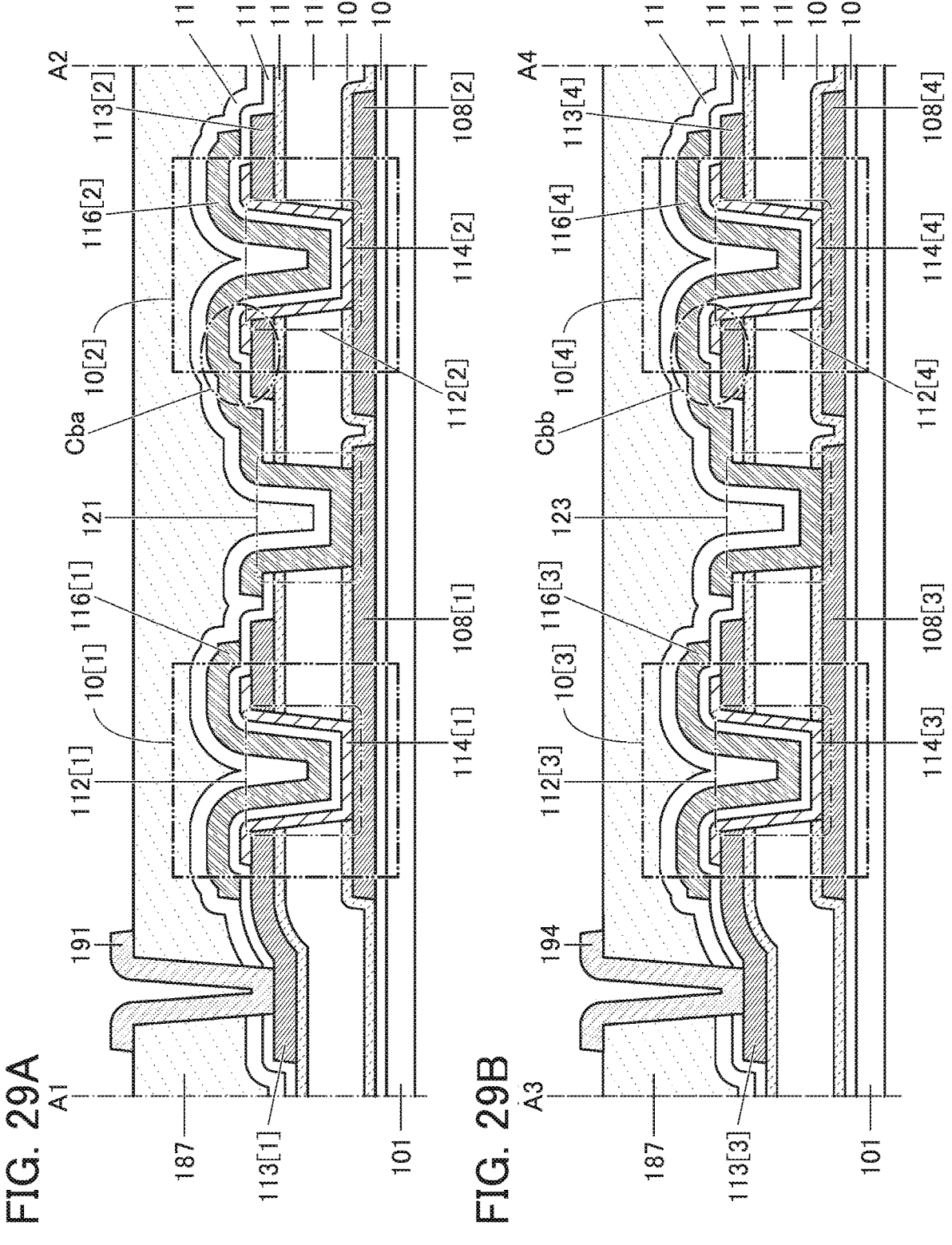

FIG. 34A
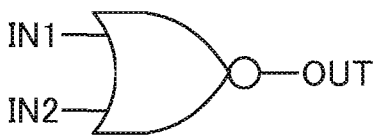
FIG. 34B
| IN1 | IN2 | OUT |
|-----|-----|-----|
| H | H | L |
| H | L | L |
| L | H | L |
| L | L | H |
FIG. 34C
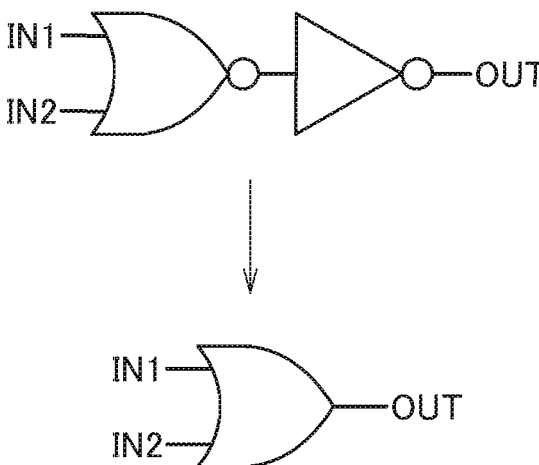

<T1>

<T2>

<T2a>

<T3>

FIG. 44A          FIG. 44B          FIG. 44C
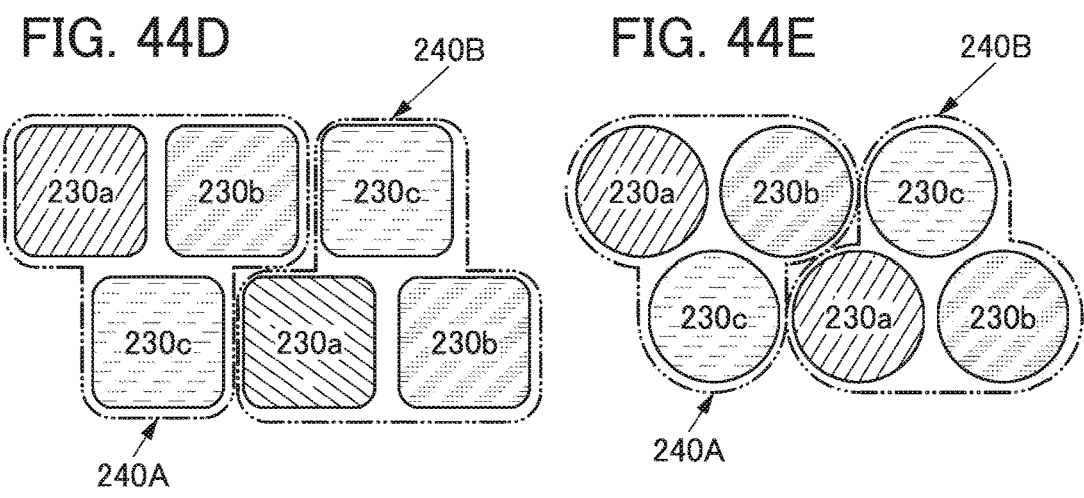
FIG. 44D          FIG. 44E
FIG. 44G
FIG. 44F
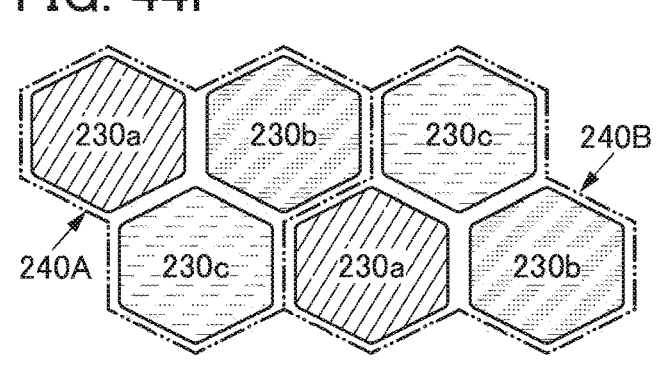
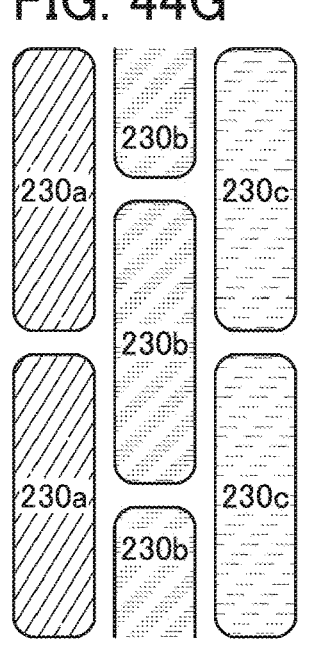

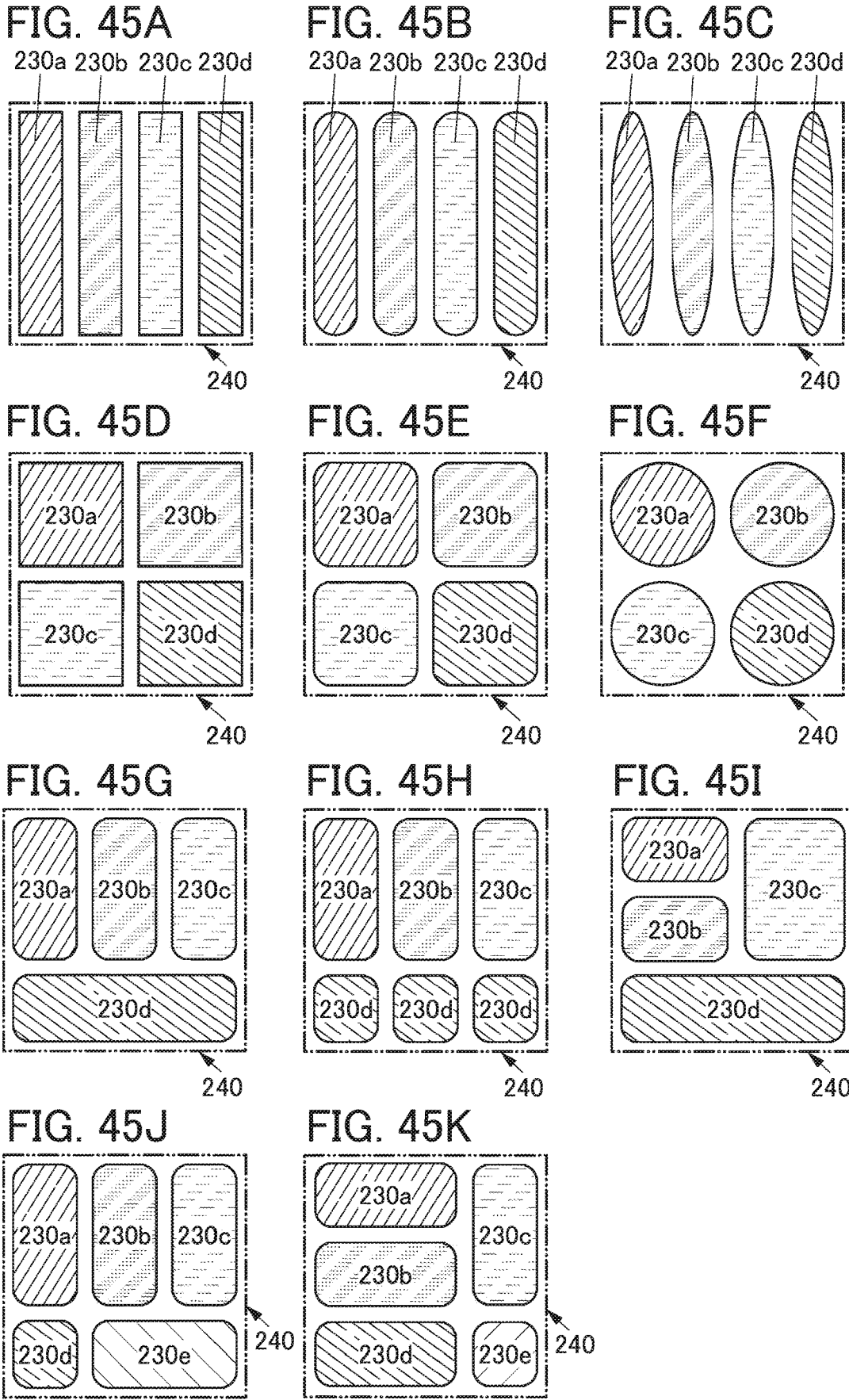

FIG. 49A
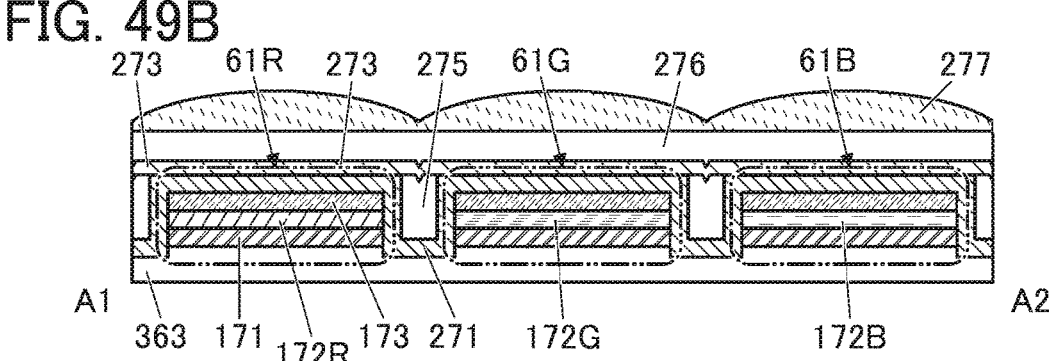
FIG. 49B
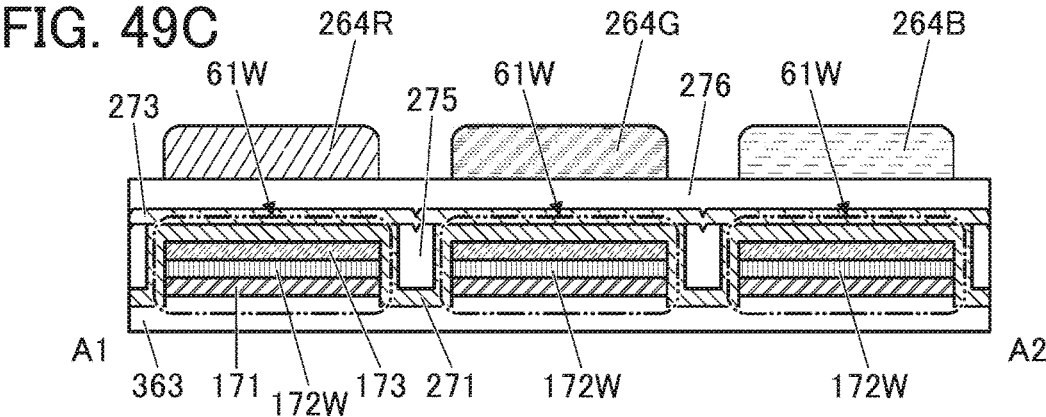
FIG. 49C
FIG. 49D

SEMICONDUCTOR DEVICE

BACKGROUND OF THE INVENTION

1. Field of the Invention

One embodiment of the invention disclosed in this specification and the like relates to an object, a method, or a manufacturing method. One embodiment of the invention disclosed in this specification and the like also relates to a process, a machine, manufacture, or a composition of matter. Specifically, one embodiment of the present invention relates to a semiconductor device and a method of manufacturing the semiconductor device.

One embodiment of the present invention is not limited to the above technical field. Examples of the technical field of one embodiment of the invention disclosed in this specification and the like include a semiconductor device, a display device, a light-emitting apparatus, a power storage device, a memory device, an electronic device, a lighting device, an input device (e.g., a touch sensor), an input/output device (e.g., a touch panel), a method of driving any of them, and a method of manufacturing any of them.

In this specification and the like, a semiconductor device means a device that utilizes semiconductor characteristics, and refers to a circuit including a semiconductor element (e.g., a transistor, a diode, or a photodiode), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. In some cases, a memory device, a display device, a light-emitting apparatus, a lighting device, an electronic device, and the like themselves are semiconductor devices and also include a semiconductor device.

2. Description of the Related Art

In recent years, demand for an integrated circuit in which transistors and the like are integrated with high density has risen with reductions in the size and weight of an electronic device. As a means of integrating transistors with high density, miniaturization of a transistor and a reduction in occupied area have been underway.

As a semiconductor material that can be used in a transistor, an oxide semiconductor using a metal oxide has been attracting attention. For example, Patent Document 1 discloses a semiconductor device achieving high field-effect mobility (in some cases, simply referred to as mobility or μFE) with a structure where a plurality of oxide semiconductor layers are stacked, and among them, the oxide semiconductor layer serving as a channel contains indium and gallium and has an indium content higher than a gallium content.

REFERENCE

Patent Document

[Patent Document 1] Japanese Published Patent Application No. 2014-007399

SUMMARY OF THE INVENTION

An object of one embodiment of the present invention is to provide a semiconductor device that occupies a small area. Another object is to provide a semiconductor device with low power consumption. Another object is to provide a highly reliable semiconductor device. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a semiconductor device in which one of a source and a drain of a first transistor is electrically connected to a first terminal, a gate of the first transistor is electrically connected to a second terminal, the other of the source and the drain of the first transistor is electrically connected to a gate of a second transistor, one of a source and a drain of the second transistor is electrically connected to a third terminal, the other of the source and the drain of the second transistor is electrically connected to a fourth terminal and one of a source and a drain of a third transistor, a gate of the third transistor is electrically connected to a fifth terminal, and the other of the source and the drain of the third transistor is electrically connected to a sixth terminal. The second transistor includes a first conductive layer over a first layer, a first insulating layer over the first conductive layer, a second conductive layer over the first insulating layer, and an opening in the first insulating layer and the second conductive layer. The opening overlaps with the first conductive layer. The second transistor includes a semiconductor layer including a region in contact with the first conductive layer, a region in contact with the first insulating layer, and a region in contact with the second conductive layer in the opening. The second transistor includes a second insulating layer that covers the semiconductor layer. The second transistor includes, over the second insulating layer, a third conductive layer including a region overlapping with the semiconductor layer. The first conductive layer is electrically connected to the third terminal, the second conductive layer is electrically connected to the fourth terminal, and the third conductive layer is electrically connected to the other of the source and the drain of the first transistor.

In (1), for example, a first input signal is supplied to the fifth terminal, an inverted signal of the first input signal is supplied to the first terminal, an output signal is supplied to the fourth terminal, a first signal is supplied to the second terminal and the third terminal, and a second signal is supplied to the sixth terminal. The potential of the second signal is lower than that of the first signal.

(2) Another embodiment of the present invention is a semiconductor device in which one of a source and a drain of a first transistor is electrically connected to a first terminal and one of a source and a drain of a third transistor, the other of the source and the drain of the first transistor is electrically connected to a second terminal and one of a source and a drain of a second transistor, the other of the source and the drain of the third transistor is electrically connected to one of a source and a drain of a fourth transistor and a gate of the first transistor, the other of the source and the drain of the second transistor is electrically connected to a third terminal and the other of the source and the drain of the fourth transistor, and a gate of the second transistor is electrically connected to a fourth terminal and a gate of the fourth transistor. The first transistor includes a first conductive layer over a first layer, a first insulating layer over the first conductive layer, a second conductive layer over the first insulating layer, and an opening in the first insulating layer and the second conductive layer. The opening overlaps with the first conductive layer. The first transistor includes a semiconductor layer including a region in contact with the first conductive layer, a region in contact with the first insulating layer, and a region in contact with the second conductive layer in the opening. The first transistor includes a second insulating layer that covers the semiconductor layer. The first transistor includes, over the second insulating layer, a third conductive layer including a region overlapping with the semiconductor layer. The first conductive layer is electrically connected to the first terminal, the second conductive layer is electrically connected to the second terminal, and the third conductive layer is electrically connected to the other of the source and the drain of the third transistor.

In (2), for example, a first signal is supplied to the first terminal, a second signal is supplied to the third terminal, an input signal is supplied to the fourth terminal, and an output signal is supplied to the second terminal. The potential of the second signal is lower than that of the first signal.

(3) Another embodiment of the present invention is a semiconductor device in which one of a source and a drain of a first transistor is electrically connected to a first terminal, a gate of the first transistor is electrically connected to a second terminal, the other of the source and the drain of the first transistor is electrically connected to a gate of a second transistor, one of a source and a drain of the second transistor is electrically connected to a third terminal, the other of the source and the drain of the second transistor is electrically connected to a fourth terminal and one of a source and a drain of a third transistor, a gate of the third transistor is electrically connected to a fifth terminal, the other of the source and the drain of the third transistor is electrically connected to one of a source and a drain of a fourth transistor, a gate of the fourth transistor is electrically connected to a sixth terminal, the other of the source and the drain of the fourth transistor is electrically connected to a seventh terminal, one of a source and a drain of a fifth transistor is electrically connected to an eighth terminal, a gate of the fifth transistor is electrically connected to a ninth terminal, the other of the source and the drain of the fifth transistor is electrically connected to a gate of the sixth transistor, one of a source and a drain of the sixth transistor is electrically connected to a tenth terminal, and the other of the source and the drain of the sixth transistor is electrically connected to the fourth terminal and the one of the source and the drain of the third transistor. The second transistor includes a first conductive layer over a first layer, a first insulating layer over the first conductive layer, a second conductive layer over the first insulating layer, and a first opening in the first insulating layer and the second conductive layer. The opening overlaps with the first conductive layer. The second transistor includes a first semiconductor layer including a region in contact with the first conductive layer, a region in contact with the first insulating layer, and a region in contact with the second conductive layer in the first opening. The first semiconductor layer is covered with a second insulating layer. The second transistor includes, over the second insulating layer, a third conductive layer including a region overlapping with the first semiconductor layer. The first conductive layer is electrically connected to the third terminal, the second conductive layer is electrically connected to the fourth terminal, and the third conductive layer is electrically connected to the other of the source and the drain of the first transistor. The sixth transistor includes a fourth conductive layer over a first layer, a first insulating layer over the fourth conductive layer, a fifth conductive layer over the first insulating layer, and a second opening in the first insulating layer and the fifth conductive layer. The second opening overlaps with the fourth conductive layer. The sixth transistor includes a second semiconductor layer including a region in contact with the fourth conductive layer, a region in contact with the first insulating layer, and a region in contact with the fifth conductive layer in the second opening. The second semiconductor layer is covered with the second insulating layer. The sixth transistor includes, over the second insulating layer, a sixth conductive layer including a region overlapping with the second semiconductor layer. The fourth conductive layer is electrically connected to the tenth terminal, the fifth conductive layer is electrically connected to the fourth terminal, and the sixth conductive layer is electrically connected to the other of the source and the drain of the fifth transistor.

In (3), for example, a first signal is supplied to the second terminal, the third terminal, the ninth terminal, and the tenth terminal, a second signal is supplied to the seventh terminal, a first input signal is supplied to the fifth terminal, an inverted signal of the first input signal is supplied to the first terminal, a second input signal is supplied to the sixth terminal, an inverted signal of the second input signal is supplied to the eighth terminal, and an output signal is supplied to the fourth terminal. The potential of the second signal is lower than that of the first signal.

(4) Another embodiment of the present invention is a semiconductor device in which a gate and one of a source and a drain of a first transistor is electrically connected to a first terminal, the other of the source and the drain of the first transistor is electrically connected to a gate of a second transistor, one of a source and a drain of the second transistor is electrically connected to a second terminal, the other of the source and the drain of the second transistor is electrically connected to a third terminal and one of a source and a drain of a third transistor, a gate of the third transistor is electrically connected to a fourth terminal, and the other of the source and the drain of the third transistor is electrically connected to one of a source and a drain of a fourth transistor, a gate of the fourth transistor is electrically connected to a fifth terminal, and the other of the source and the drain of the fourth transistor is electrically connected to a sixth terminal. The second transistor includes a first conductive layer over a first layer, a first insulating layer over the first conductive layer, a second conductive layer over the first insulating layer, and an opening in the first insulating layer and the second conductive layer. The opening overlaps with the first conductive layer. The second transistor includes a semiconductor layer including a region in contact with the first conductive layer, a region in contact with the first insulating layer, and a region in contact with the second conductive layer in the opening. The semiconductor layer is covered with a second insulating layer. The second transistor includes, over the second insulating layer, a third conductive layer including a region overlapping with the semiconductor layer. The first conductive layer is electrically connected to the second terminal, the second conductive layer is electrically connected to the third terminal, and the third conductive layer is electrically connected to the other of the source and the drain of the first transistor.

In (4), for example, a first signal is supplied to the first terminal and the second terminal, a second signal is supplied to the sixth terminal, a first input signal is supplied to the fourth terminal, a second input signal is supplied to the fifth terminal, and an output signal is supplied to the third terminal. The potential of the second signal is lower than that of the first signal.

(5) Another embodiment of the present invention is a semiconductor device in which one of a source and a drain of a first transistor is electrically connected to a first terminal, a gate of the first transistor is electrically connected to a second terminal, the other of the source and the drain of the first transistor is electrically connected to a gate of a second transistor, a drain of the second transistor is electrically connected to a third terminal, a source of the second transistor is electrically connected to a drain of a fourth transistor, one of a source and a drain of a third transistor is electrically connected to a fourth terminal, a gate of the third transistor is electrically connected to a fifth terminal, the other of the source and the drain of the third transistor is electrically connected to a gate of the fourth transistor, a source of the fourth transistor is electrically connected to a drain of a fifth transistor, a drain of a sixth transistor, and a sixth terminal, a gate of the fifth transistor is electrically connected to a seventh terminal, a source of the fifth transistor is electrically connected to an eighth terminal, a gate of the sixth transistor is electrically connected to a ninth terminal, and a source of the sixth transistor is electrically connected to a tenth terminal. The second transistor includes a first conductive layer over a first layer, a first insulating layer over the first conductive layer, a second conductive layer over the first insulating layer, and a first opening in the first insulating layer and the second conductive layer. The first opening overlaps with the first conductive layer. The second transistor includes a first semiconductor layer including a region in contact with the first conductive layer, a region in contact with the first insulating layer, and a region in contact with the second conductive layer in the first opening. The first semiconductor layer is covered with a second insulating layer. The second transistor includes, over the second insulating layer, a third conductive layer including a region overlapping with the first semiconductor layer. The first conductive layer is electrically connected to the third terminal, the second conductive layer is electrically connected to a drain of the fourth transistor, and the third conductive layer is electrically connected to the other of the source and the drain of the first transistor. The fourth transistor includes a fourth conductive layer over a first layer, a first insulating layer over the fourth conductive layer, a fifth conductive layer over the first insulating layer, and a second opening in the first insulating layer and the fifth conductive layer. The second opening overlaps with the fourth conductive layer. The fourth transistor includes a second semiconductor layer including a region in contact with the fourth conductive layer, a region in contact with the first insulating layer, and a region in contact with the fifth conductive layer in the second opening. The second semiconductor layer is covered with the second insulating layer. The fourth transistor includes, over the second insulating layer, a sixth conductive layer including a region overlapping with the second semiconductor layer. The fifth conductive layer is electrically connected to the drain of the fifth transistor, and the sixth conductive layer is electrically connected to the other of the source and the drain of the third transistor.

In (5), for example, a first signal is supplied to the second terminal, the third terminal, and the fifth terminal, a second signal is supplied to the first terminal, the fourth terminal, the eighth terminal, and the tenth terminal, a first input signal is supplied to the seventh terminal, an inverted signal of the first input signal is supplied to the first terminal, a second input signal is supplied to the ninth terminal, an inverted signal of the second input signal is supplied to the fourth terminal, and an output signal is supplied to the sixth terminal. The potential of the second signal is lower than that of the first signal.

(6) Another embodiment of the present invention is a semiconductor device in which a gate and one of a source and a drain of a first transistor is electrically connected to a first terminal, the other of the source and the drain of the first transistor is electrically connected to a gate of a second transistor, a drain of the second transistor is electrically connected to a second terminal, a source of the second transistor is electrically connected to a drain of a third transistor, a drain of a fourth transistor, and a third terminal, a gate of the third transistor is electrically connected to a fourth terminal, a source of the third transistor is electrically connected to a fifth terminal, a gate of the fourth transistor is electrically connected to a sixth terminal, and a source of the fourth transistor is electrically connected to a seventh terminal. The second transistor includes a first conductive layer over a first layer, a first insulating layer over the first conductive layer, a second conductive layer over the first insulating layer, and an opening in the first insulating layer and the second conductive layer. The opening overlaps with the first conductive layer. The second transistor includes a semiconductor layer including a region in contact with the first conductive layer, a region in contact with the first insulating layer, and a region in contact with the second conductive layer in the opening. The semiconductor layer is covered with a second insulating layer. The second transistor includes, over the second insulating layer, a third conductive layer including a region overlapping with the semiconductor layer. The first conductive layer is electrically connected to the second terminal, the second conductive layer is electrically connected to the third terminal, and the third conductive layer is electrically connected to the other of the source and the drain of the first transistor.

In (6), for example, a first signal is supplied to the first terminal and the second terminal, a second signal is supplied to the fifth terminal and the seventh terminal, a first input signal is supplied to the fourth terminal, a second input signal is supplied to the sixth terminal, and an output signal is supplied to the third terminal. The potential of the second signal is lower than that of the first signal.

The semiconductor layer in any of (1), (2), (4), and (6) preferably includes an oxide semiconductor. Each of the first semiconductor layer and the second semiconductor layer in any of (3) and (5) preferably includes an oxide semiconductor. The oxide semiconductor preferably includes at least one of indium and zinc. The first insulating layer preferably includes an insulating layer including silicon and oxygen between two insulating layers each including silicon and nitrogen. An insulating substrate or an insulating layer may be used as the first layer.

One embodiment of the present invention can provide a semiconductor device that occupies a small area. A semiconductor device with low power consumption can be provided. A semiconductor device with high reliability can be provided. A novel semiconductor device can be provided.

Note that the descriptions of these effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

FIG. 5A is a plan view of a transistor. FIG. 5B is a cross-sectional view of the transistor. FIG. 5C is a perspective view of the transistor. FIG. 5D is an equivalent circuit diagram of the transistor.

FIGS. 29A and 29B are cross-sectional views of a semiconductor device.

FIGS. 34A and 34C each illustrate a circuit symbol of a NOR circuit. FIG. 34B is a graph showing combinations of input signals and an output signal.

FIGS. 44A to 44G illustrate examples of a pixel.

FIGS. 45A to 45K illustrate examples of a pixel.

FIGS. 49A to 49D each illustrate a structure example of a light-emitting device.

DETAILED DESCRIPTION OF THE INVENTION

Figures 1A, 1B, 1C, 1D:
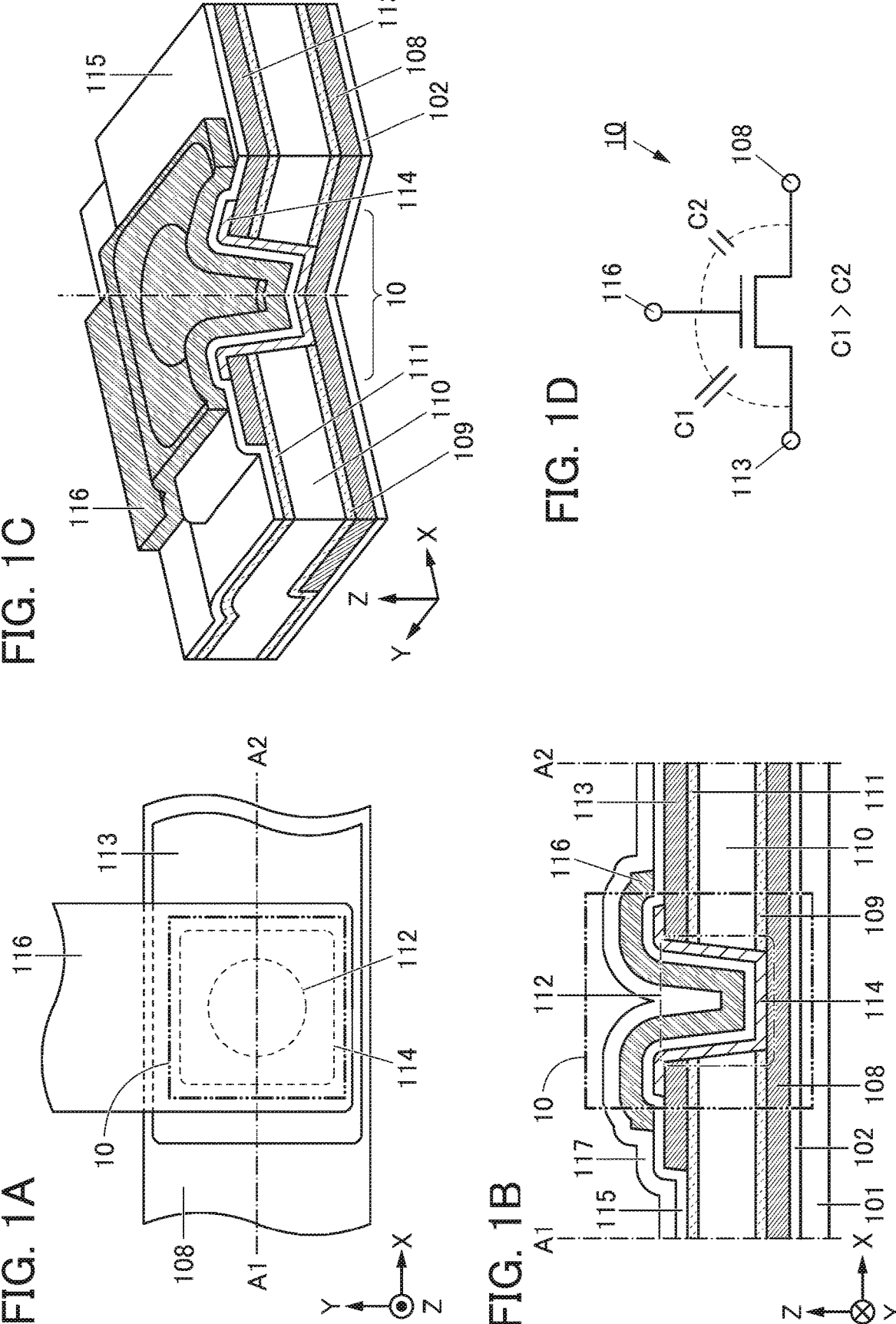
FIG. 1A is a plan view of a transistor.
FIG. 1B is a cross-sectional view of the transistor.
FIG. 1C is a perspective view of the transistor.
FIG. 1D is an equivalent circuit diagram of the transistor.

Embodiments will be described in detail with reference to the drawings. Note that the present invention is not limited to the following description, and it will be readily appreciated by those skilled in the art that modes and details can be modified in various ways without departing from the spirit and scope of the present invention. Thus, the present invention should not be construed as being limited to the description in the following embodiments. Note that in the structures of the present invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching, which is not illustrated in some cases for easy understanding of the present invention.

In this specification and the like, in the case where an etching step (a removal step) is performed after a resist mask is formed in a photolithography method, the resist mask is removed after the etching step, unless otherwise specified.

Especially in a plan view (also referred to as a "top view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A different ordinal number from an ordinal number used to denote a component in this specification and the like might be used to denote the component in a claim. Moreover, a term with an ordinal number in this specification and the like might not be provided with any ordinal number in a claim and the like.

In addition, in this specification and the like, the term such as an "electrode", a "wiring", or a "terminal" does not limit a function of the component. For example, an "electrode" is used as part of a "wiring" in some cases, and vice versa. Furthermore, the term "electrode" or "wiring" can also mean a combination of a plurality of "electrodes" and "wirings" provided in an integrated manner. As another example, a "terminal" is used as part of a "wiring" or an "electrode" in some cases, and vice versa. Furthermore, the term "terminal" includes the case where a plurality of "electrodes", "wirings", "terminals", and the like are formed in an integrated manner. Therefore, for example, an "electrode" can be part of a "wiring" or a "terminal", and a "terminal" can be part of a "wiring" or an "electrode". Moreover, the terms "electrode", "wiring", and "terminal" can be replaced with the term "region" in some cases.

In this specification and the like, supply of a signal refers to supply of a predetermined potential to a wiring or the like. The term "signal" can be replaced with the term "potential" in some cases. The term "potential" can be replaced with the term "signal" in some cases. The "signal" may be a fluctuating potential or a fixed potential. For example, the "signal" may be a power supply potential.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a "capacitor element" can be, for example, a circuit element having an electrostatic capacitance greater than 0 F, a region of a wiring having an electrostatic capacitance greater than 0 F, parasitic capacitance, or gate capacitance of a transistor. The terms "capacitor element", "parasitic capacitance", or "gate capacitance" can be sometimes replaced with the term "capacitor"; conversely, the term "capacitor" can be sometimes replaced with the terms "capacitor element", "parasitic capacitance", or "gate capacitance". In addition, the "capacitor" (including a capacitor with three or more terminals) includes an insulator and a pair of conductors between which an insulator is interposed. The term "a pair of conductors" of a capacitor can be replaced with the terms "a pair of electrodes", "a pair of conductive regions" "a pair of regions", or "a pair of terminals". The term "one of a pair of terminals" is referred to as "one terminal" or a "first terminal" in some cases. The term "the other of the pair of terminals" is referred to as "the other terminal" or a "second terminal" in some cases. Note that the electrostatic capacitance can be higher than or equal to 0.05 fF and lower than or equal to 10 pF, for example. For example, the electrostatic capacitance may be higher than or equal to 1 pF and lower than or equal to 10 µF.

Functions of a "source" and a "drain" of a transistor are sometimes switched when a transistor of opposite polarity is used or when the direction of current flow is changed in circuit operation, for example. Therefore, the terms "source" and "drain" can be used interchangeably in this specification and the like.

In this specification and the like, a "gate" refers to part or the whole of a gate electrode and a gate wiring. A gate wiring refers to a wiring for electrically connecting at least one gate electrode of a transistor to another electrode or another wiring.

In this specification and the like, a "source" refers to part or the whole of a source region, a source electrode, and a source wiring. A source region refers to a region in a semiconductor layer, where the resistivity is lower than or equal to a given value. A source electrode refers to a conductive layer including a part connected to a source region. A source wiring refers to a wiring for electrically connecting at least one source electrode of a transistor to another electrode or another wiring.

In this specification and the like, a "drain" refers to part or the whole of a drain region, a drain electrode, and a drain wiring. A drain region refers to a region in a semiconductor layer, where the resistivity is lower than or equal to a given value. A drain electrode refers to a conductive layer including a part connected to a drain region. A drain wiring refers to a wiring for electrically connecting at least one drain electrode of a transistor to another electrode or another wiring.

Unless otherwise specified, a transistor described in this specification and the like is an enhancement-mode (a normally-off mode) field-effect transistor. In the case where a transistor in this specification and the like is an n-channel transistor and unless otherwise specified, and the threshold voltage (also referred to as "$V_{th}$") of the transistors is higher than 0 V. In the case where the transistor in this specification and the like is a p-channel transistor and unless otherwise specified, the threshold voltage (also referred to as "$V_{th}$") of the transistor is lower than or equal to 0 V. Unless otherwise specified, a plurality of transistors having the same conductivity type have the same $V_{th}$.

Unless otherwise specified, off-state current in this specification and the like refers to a current flowing between a source and a drain of a transistor (also referred to as a drain current or $I_d$) when the transistor is in an off state (also referred to as a "non-conduction state" or a "cutoff" state). Unless otherwise specified, the off state of an n-channel transistor means that a potential difference (hereinafter also referred to as $V_g$) between its gate and source when the potential of the source is regarded as a reference potential is lower than the threshold voltage $V_{th}$, and the off state of a p-channel transistor means that the voltage $V_g$ between its gate and source is higher than the threshold voltage $V_{th}$. For example, the off-state current of an n-channel transistor sometimes refers to drain current that flows when $V_g$ is lower than the threshold voltage $V_{th}$.

In this specification and the like, the term "leakage current" sometimes expresses the same meaning as "off-state current". In this specification and the like, the off-state current sometimes refers to current that flows between a source and a drain of a transistor in the off state, for example.

Unless otherwise specified, an on-state current in this specification and the like refers to an $I_d$ of a transistor in an on state (also referred to as a conduction state). Unless otherwise specified, an on state of an n-channel transistor refers to a state where $V_g$ is higher than or equal to the threshold voltage, and an on state of a p-channel transistor refers to a state where $V_g$ is lower than or equal to the threshold voltage. For example, an on-state current of an n-channel transistor sometimes refers to a drain current that flows when $V_g$ is higher than or equal to $V_{th}$.

In this specification and the like, a high power supply potential VDD (hereinafter also simply referred to as VDD or a potential H) is a power supply potential higher than a low power supply potential VSS. The low power supply potential VSS (hereinafter also simply referred to as VSS or a potential L) is a power supply potential lower than the high power supply potential VDD. In addition, a ground potential GND (also simply referred to as "GND") can be used as VDD or VSS. For example, VSS is a potential lower than GND when VDD is GND, and VDD is a potential higher than GND when VSS is GND. Note that in this specification and the like, VSS is the reference potential unless otherwise specified.

A "voltage" usually refers to a potential difference between a given potential and a reference potential (e.g., a ground potential or a source potential). A "potential" is relative, and a potential supplied to a wiring or the like changes depending on the reference potential in some cases. Therefore, the terms "voltage" and "potential" can be replaced with each other in some cases.

In this specification and the like, terms for describing arrangement, such as "over", "above", "under", and "below", are sometimes used for convenience to describe the positional relation between components with reference to drawings. The positional relation between components is changed as appropriate in accordance with the direction from which each component is described. Thus, the positional relation is not limited to that described with a term used in this specification and the like and can be explained with another term as appropriate depending on the situation. For example, the expression "an insulator over (on) a top surface of a conductor" can be replaced with the expression "an insulator on a bottom surface of a conductor" when the direction of a diagram showing these components is rotated by 180°.

Note that the term "over" or "below" does not necessarily mean that a component is placed "directly over" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

The term "overlap", for example, in this specification and the like does not limit a state such as the stacking order of components. For example, the expression "electrode B overlapping with insulating layer A" does not necessarily mean the state where the electrode B is formed over the insulating layer A, and includes the case where the electrode B is formed under the insulating layer A and the case where the electrode B is formed on the right (or left) side of the insulating layer A.

The terms "adjacent" and "close" in this specification and the like do not necessarily mean that a component is directly in contact with another component. For example, the expression "electrode B adjacent to insulating layer A" does not necessarily mean that the electrode B is formed in direct contact with the insulating layer A and can mean the case where another component is provided between the insulating layer A and the electrode B.

In this specification and the like, the "parallel" indicates that the angle formed between two straight lines is greater than or equal to −10° and less than or equal to 10°. Thus, the case where the angle is greater than or equal to −5° and less than or equal to 5° is also included. The terms "approximately parallel" and "substantially parallel" indicate that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. The terms "approximately perpendicular" and "substantially perpendicular" indicate that the angle formed between two straight lines is greater than or equal to 60° and less than or equal to 120°.

In this specification and the like, the terms "identical", "the same", "equal", "uniform", and the like (including synonyms thereof) used in describing calculation values and actual measurement values allow for a margin of error of ±20% unless otherwise specified.

In this specification and the like, an end portion of an object having a tapered shape indicates that the end portion of the object has a cross-sectional shape in which the angle between a side surface (a surface) of the object and a surface on which the object is formed (a bottom surface) is greater than 0° and less than 90° in a region of the end portion, and the thickness continuously increases from the end portion. A taper angle refers to an angle between a bottom surface (a surface on which an object is formed) and a side surface (a surface) at an end portion of the object.

In the drawings for this specification and the like, arrows indicating an X direction, a Y direction, and a Z direction are illustrated in some cases. In this specification and the like, the "X direction" is a direction along the X axis, and unless otherwise specified, the forward direction and the reverse direction are not distinguished in some cases. The same applies to the "Y direction" and the "Z direction". The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

In this specification and the like, when a plurality of components denoted by the same reference numerals need to be distinguished from each other, identification signs such as "A", "b", "_1", "[n]", and "[m,n]" are sometimes added to the reference numerals. For example, an EL layer 172R, an EL layer 172G, an EL layer 172B, and an EL layer 172W which are separated from an EL layer 172 are shown in some cases.

Embodiment 1

A transistor 10 of one embodiment of the present invention will be described. FIG. 1A is a plan view of the transistor 10. FIG. 1B is a cross-sectional view taken along the dashed-dotted line A1-A2 in FIG. 1A. FIG. 1C is a perspective view of the transistor 10. FIG. 1D is an equivalent circuit diagram of the transistor 10. For easy understanding of the structure of the transistor 10, some components of the transistor 10 are not illustrated in FIGS. 1A and 1C. For example, an insulating layer 117 illustrated in FIG. 1B is not illustrated in FIGS. 1A and 1C.

Figure 2A:
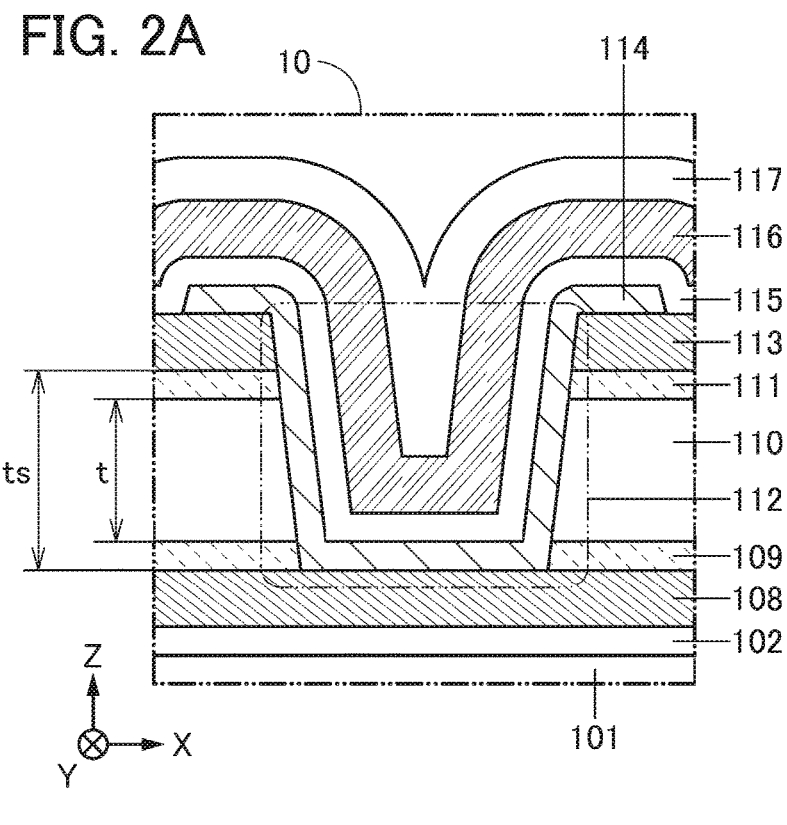
FIGS. 2A and 2B are cross-sectional views of a transistor.
Figure 2C:
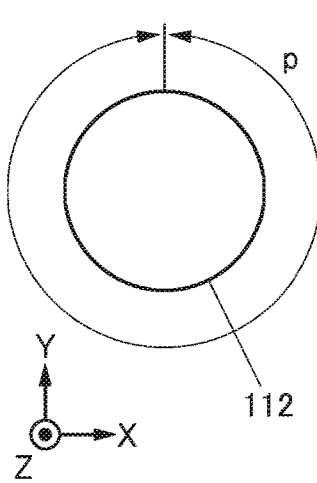
FIGS. 2C to 2F are each a plan view of an opening.
Figure 2D:
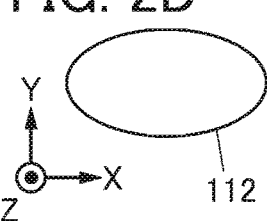
Figure 2B:
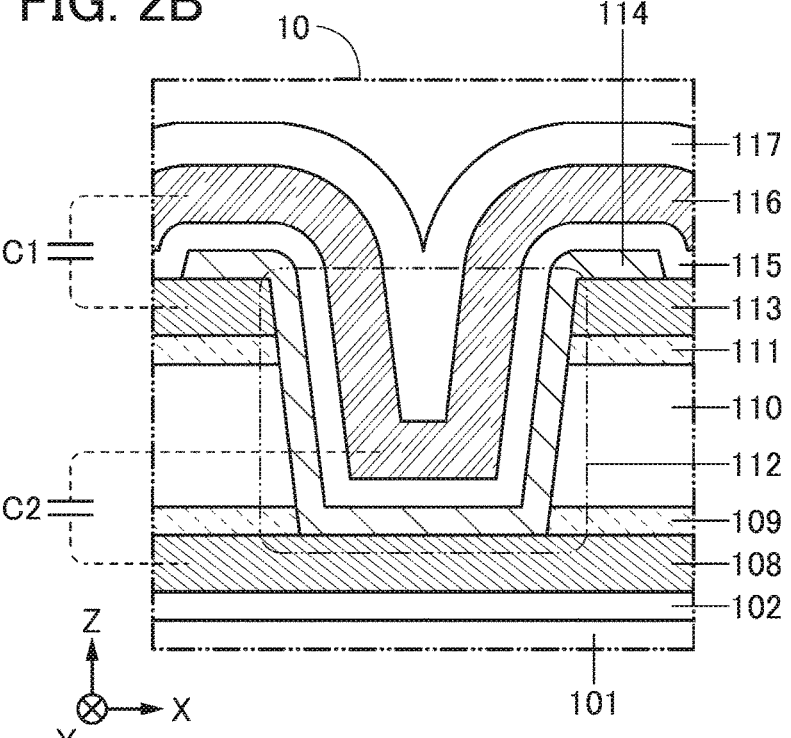

FIGS. 2A and 2B are enlarged views of the transistor 10 illustrated in FIG. 1B. FIG. 2C illustrates an opening 112 seen from the Z direction.

The transistor 10 includes an insulating layer 102 over a substrate 101 and a conductive layer 108 over the insulating layer 102. The transistor 10 further includes an insulating layer 109 over the conductive layer 108, an insulating layer 110 over the insulating layer 109, an insulating layer 111 over the insulating layer 110, and a conductive layer 113 over the insulating layer 111.

The opening 112 is formed in a region of the conductive layer 113, the insulating layer 111, the insulating layer 110, and the insulating layer 109 and the region overlaps with a part of the conductive layer 108 (see FIG. 1B and FIG. 2A). The opening 112 includes a semiconductor layer 114. The semiconductor layer 114 has a region overlapping with a bottom portion of the opening 112 and a region overlapping with a side surface of the opening 112. The semiconductor layer 114 has a region in contact with a side surface of the insulating layer 111, a region in contact with a side surface of the insulating layer 110, and a region in contact with a side surface of the insulating layer 109. A part of the semiconductor layer 114 is electrically connected to the conductive layer 113, another part of the semiconductor layer 114 is electrically connected to the conductive layer 108.

The transistor 10 includes an insulating layer 115 over the insulating layer 111, the conductive layer 113, and the semiconductor layer 114; a conductive layer 116 over the insulating layer 115; and an insulating layer 117 over the insulating layer 115 and the conductive layer 116. The insulating layer 115 has a region overlapping with the side surface of the opening 112 with the semiconductor layer 114 interposed therebetween. The conductive layer 116 is provided to cover the semiconductor layer 114. That is, the conductive layer 116 has a region extending beyond an end portion of the semiconductor layer 114. The conductive layer 116 has a region overlapping with the side surface of the opening 112 with the insulating layer 115 and the semiconductor layer 114 interposed between the conductive layer 116 and the side surface of the opening 112.

The conductive layer 108 serves as one of a source electrode and a drain electrode of the transistor 10. The conductive layer 113 serves as the other of the source electrode and the drain electrode of the transistor 10. For example, in the case where the conductive layer 108 serves as the drain electrode of the transistor 10, the conductive layer 113 serves as the source electrode of the transistor 10.

The semiconductor layer 114 serves as a semiconductor layer of the transistor where a channel is formed; the insulating layer 115 serves as a gate insulating layer; and the conductive layer 116 serves as a gate electrode. Thus, the transistor 10 is provided in a region including the opening 112.

In the transistor 10, the source electrode and the drain electrode are placed in the Z direction. Thus, the source and the drain of the transistor 10 are provided at different levels. In other words, the source and the drain of the transistor 10 are placed in different positions in the Z direction. Such a transistor is also referred to as a "vertical-channel transistor", a "vertical transistor", or a "vertical field effect transistor (VFET)". In the vertical-channel transistor, the Z direction (vertical direction) is included in the direction in which $I_d$ flows. For example, in the transistor 10 which is a vertical-channel transistor, the angle between the direction in which $I_d$ flows and a top surface of the conductive layer 108 on which the semiconductor layer 114 is formed is larger than or equal to 5° and smaller than or equal to 110°, larger than or equal to 10° and smaller than or equal to 90°, larger than or equal to 30° and smaller than or equal to 90°, or larger than or equal to 60° and smaller than or equal to 90°.

Since the source electrode and the drain electrode of the vertical-channel transistor are provided in the Z direction, the area occupied by the transistor can be reduced. With the use of the vertical-channel transistor for a semiconductor device, the area occupied by the semiconductor device can be significantly reduced.

Here, materials that can be used for the transistor 10 or the semiconductor device of one embodiment of the present invention are described.

[Substrate]

There is no particular limitation on the material used for the substrate 101. The material is determined according to the purpose in consideration of whether it has a light-transmitting property, heat resistance high enough to withstand heat treatment, or the like. For example, a glass substrate of barium borosilicate glass and aluminoborosilicate glass, or the like, a ceramic substrate, a quartz substrate, or a sapphire substrate can be used. Alternatively, a semiconductor substrate, a flexible substrate, an attachment film, a base film, or the like may be used.

Examples of the semiconductor substrate include a semiconductor substrate containing a material such as silicon or germanium and a compound semiconductor substrate containing a material such as silicon carbide, silicon germanium, gallium arsenide, indium phosphide, zinc oxide, or gallium oxide. The semiconductor substrate may be a single crystal semiconductor or a polycrystalline semiconductor.

As a substrate in the case where the transistor 10 or the like of one embodiment of the present invention is used for a display device, a large-sized glass substrate of the 6th generation (1500 mm×1850 mm), the 7th generation (1870 mm×2200 mm), the 8th generation (2200 mm×2400 mm), the 9th generation (2400 mm×2800 mm), or the 10th generation (2950 mm×3400 mm), for example, can be used. Thus, a large-sized display device can be fabricated. When the substrate is made larger, more display devices can be produced from one substrate, which leads to a reduction in production cost.

For the material of the flexible substrate, the attachment film, the base film, or the like, polyester such as polyethylene terephthalate (PET) or polyethylene naphthalate (PEN), polyacrylonitrile, an acrylic resin, polyimide, polymethyl methacrylate, polycarbonate (PC), polyethersulfone (PES), polyamide (e.g., nylon or aramid), polysiloxane, a cycloolefin resin, polystyrene, polyamide-imide, polyurethane, polyvinyl chloride, polyvinylidene chloride, polypropylene, polytetrafluoroethylene (PTFE), an ABS resin, or cellulose nanofiber can be used, for example.

With the use of any of the materials described above for the substrate, a lightweight semiconductor device including the transistor 10 can be provided. Furthermore, with the use of any of the materials described above for the substrate, a shock-resistant semiconductor device can be provided. Furthermore, with the use of any of the materials described above for the substrate, a semiconductor device that is less likely to be broken can be provided.

The flexible substrate used as the substrate preferably has a lower coefficient of linear expansion because deformation due to an environment is suppressed. For the flexible substrate used as the substrate, for example, a material whose coefficient of linear expansion is lower than or equal to $1\times10^{-3}$/K, lower than or equal to $5\times10^{-5}$/K, or lower than or equal to $1\times10^{-5}$/K is used. In particular, aramid is suitable for the flexible substrate because of its low coefficient of linear expansion.

[Conductive Layer]

As conductive materials used for the gate electrode, the source electrode, and the drain electrode of the transistor 10 and the conductive layers of wirings, electrode, or the like included in the semiconductor device, a metal element selected from aluminum (Al), chromium (Cr), copper (Cu), silver (Ag), gold (Au), platinum (Pt), tantalum (Ta), nickel (Ni), titanium (Ti), molybdenum (Mo), tungsten (W), hafnium (Hf), vanadium (V), niobium (Nb), manganese (Mn), magnesium (Mg), zirconium (Zr), beryllium (Be), and the like, an alloy containing any of the above metal elements as a component, an alloy containing a combination of the above metal elements, or the like can be used. Furthermore, a semiconductor typified by polycrystalline silicon containing an impurity element such as phosphorus, or silicide such as nickel silicide may be used. The method of forming the conductive material is not particularly limited; various methods such as an evaporation method, an atomic layer deposition (ALD) method, a chemical vapor deposition (CVD) method, a sputtering method, and a spin coating method can be used.

A Cu—X alloy (X is Mn, Ni, Cr, Fe, Co, Mo, Ta, or Ti) may be used for the conductive material. The layer formed with a Cu—X alloy enables fabrication costs to be inhibited because processing can be performed by a wet etching process. Alternatively, an aluminum alloy containing one or more of the elements selected from titanium, tantalum, tungsten, molybdenum, chromium, neodymium, and scandium may be used for the conductive material.

As the conductive material that can be used for the conductive layer, a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. Furthermore, a conductive material containing nitrogen, such as titanium nitride, tantalum nitride, or tungsten nitride, can be used. The conductive layer can have a stacked-layer structure with an appropriate combination of a conductive material containing oxygen, a conductive material containing nitrogen, and a material containing the above-described metal element.

For example, the conductive layer can have a single-layer structure of an aluminum film including silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, or a three-layer structure of a titanium layer, an aluminum layer stacked over the titanium layer, and a titanium layer further stacked thereover.

Furthermore, a plurality of conductive layers formed with the above conductive materials may be stacked and used. For example, the conductive layer can have a stacked-layer structure combining a material containing the above metal element and a conductive material containing oxygen. The conductive layer can also have a stacked-layer structure combining a material containing the above metal element and a conductive material containing nitrogen. The conductive layer can also have a stacked-layer structure combining a material containing the above metal element, a conductive material containing oxygen, and a conductive material containing nitrogen.

For example, the conductive layer can have a three-layer structure in which a conductive layer containing copper is stacked over a conductive layer containing oxygen and at least one of indium and zinc, and a conductive layer containing oxygen and at least one of indium and zinc further stacked thereover. In this case, the side surface of the conductive layer containing copper is preferably covered with the conductive layer containing oxygen and at least one of indium and zinc. In addition, for example, a plurality of conductive layers containing oxygen and at least one of indium and zinc may be stacked and used.

[Insulating Layers]

As each insulating layer, a single layer or a stacked layer of an insulating material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like is used. Furthermore, a material in which more than one of the materials selected from an oxide material, a nitride material, an oxynitride material, and a nitride oxide material are mixed may be used.

There is no particular limitation on the formation method of the insulating material, and a variety of formation methods such as an evaporation method, an ALD method, a CVD method, a sputtering method, and a spin coating method can be employed.

Note that in this specification and the like, a nitride oxide refers to a material in which the nitrogen content is higher than the oxygen content. Furthermore, an oxynitride refers to a material in which the oxygen content is higher than the nitrogen content. Note that the content of each element can be measured by RBS (Rutherford Backscattering Spectrometry), for example.

For example, it is preferable that the insulating layer 102 and the insulating layer 117 be formed using an insulating material through which impurities do not easily pass. For example, a single layer or a stacked layer of an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. As examples of an insulating material that does not allow impurities to permeate easily, aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride can be given.

When an insulating material through which impurities do not easily pass is used for the insulating layer 102, impurity diffusion from the substrate 101 side can be inhibited, and the reliability of the transistor 10 can be improved. That is, the reliability of a semiconductor device including the transistor 10 can be improved. When the insulating material through which impurities do not easily pass is used for the insulating layer 117, impurity diffusion from above the insulating layer 117 can be inhibited, and the reliability of the transistor 10 can be improved. That is, the reliability of a semiconductor device including the transistor 10 can be improved.

As the insulating layer, an insulating layer that can serve as a planarization layer may be used. Examples of materials for the insulating layer that can serve as a planarization layer include an acrylic resin, polyimide resin, an epoxy resin, polyamide, polyimide amide, a siloxane resin, a benzocyclobutene resin, a phenol resin, and precursors thereof. Other than the above-described organic materials, it is also possible to use a low-dielectric constant material (a low-k material), a siloxane-based resin, PSG (phosphosilicate glass), BPSG (borophosphosilicate glass), or the like. Note that a plurality of insulating layers formed of these materials may be stacked.

Note that the siloxane resin corresponds to a resin including a Si—O—Si bond formed using a siloxane-based material as a starting material. The siloxane-based resin may include an organic group (e.g., an alkyl group or an aryl group) or a fluoro group as a substituent. The organic group may include a fluoro group.

A surface of the insulating layer or the like may be subjected to chemical mechanical polishing (CMP) treatment. By performing the CMP treatment, unevenness of the surface of the insulating layer or the like can be reduced, so that the coverage with an insulating layer and a conductive layer to be formed later can be increased.

[Semiconductor Layer]

For the semiconductor layer 114, a single crystal semiconductor, a polycrystalline semiconductor, a microcrystalline semiconductor, an amorphous semiconductor, or the like can be used alone or in combination. As a semiconductor material, silicon and germanium can be used, for example. Alternatively, a compound semiconductor such as silicon germanium, silicon carbide, gallium arsenide, or a nitride semiconductor can be used. As the compound semiconductor, an organic substance having semiconductor characteristics or a metal oxide having semiconductor characteristics (also referred to as an oxide semiconductor) can be used. Note that these semiconductor materials may contain an impurity as a dopant.

An oxide semiconductor has a band gap of 2 eV or more; therefore, a transistor including an oxide semiconductor, which is one kind of metal oxide, in a semiconductor layer where a channel is formed (also referred to as an "OS transistor") has an extremely low off-state current. Thus, the power consumption of a semiconductor device including an OS transistor can be reduced. In addition, the OS transistor operates stably even in a high-temperature environment and has small fluctuation in characteristics. For example, the off-state current hardly increases even in a high-temperature environment. Specifically, the off-state current hardly increases even at an environment temperature higher than or equal to room temperature and lower than or equal to 200° C. In addition, the on-state current of the OS transistor is less likely to decrease even in a high-temperature environment. Therefore, a semiconductor device including the OS memory achieves stable operation and high reliability even in a high-temperature environment.

In this embodiment and the like, an OS transistor is used as the transistor 10. Since an OS transistor has a high breakdown voltage between the source and the drain, the channel length can be shortened. Thus, the on-state current can be increased. An OS transistor is suitably used as a vertical-channel transistor.

Examples of the metal oxide that can be used for the semiconductor layer of the OS transistor include indium oxide, gallium oxide, and zinc oxide. The metal oxide preferably contains at least indium (In) or zinc (Zn). The metal oxide preferably contains two or three kinds selected from indium, the element M, and zinc. The element M is a metal element or metalloid element having a high bonding energy with oxygen. For example, the bonding energy of the metal element or metalloid element with oxygen is higher than that of indium.

Specific examples of the element M include aluminum, gallium, tin, yttrium, titanium, vanadium, chromium, manganese, iron, cobalt, nickel, zirconium, molybdenum, hafnium, tantalum, tungsten, lanthanum, cerium, neodymium, magnesium, calcium, strontium, barium, boron, silicon, germanium, and antimony. The element M included in the metal oxide is preferably one or more of the above elements, further preferably one or more selected from aluminum, gallium, tin, and yttrium, and still further preferably gallium. Note that in this specification and the like, a metal element and a metalloid element are collectively referred to as a "metal element" in some cases, and a "metal element" described in this specification and the like includes a metalloid element in some cases.

For example, indium zinc oxide (In—Zn oxide), indium tin oxide (In—Sn oxide), indium titanium oxide (In—Ti oxide), indium gallium oxide (In—Ga oxide), indium gallium aluminum oxide (In—Ga—Al oxide), indium gallium tin oxide (In—Ga—Sn oxide), gallium zinc oxide (also referred to as Ga—Zn oxide or GZO), aluminum zinc oxide (also referred to as Al—Zn oxide or AZO), indium aluminum zinc oxide (also referred to as In—Al—Zn oxide or IAZO), indium tin zinc oxide (In—Sn—Zn oxide), indium titanium zinc oxide (In—Ti—Zn oxide), indium gallium zinc oxide (also referred to as In—Ga—Zn oxide or IGZO), indium gallium tin zinc oxide (also referred to as In—Ga—Sn—Zn oxide or IGZTO), or indium gallium aluminum zinc oxide (also referred to as In—Ga—Al—Zn oxide, IGAZO, or IAGZO) can be used. Alternatively, indium tin oxide containing silicon, gallium tin oxide (Ga—Sn oxide), aluminum tin oxide (Al—Sn oxide), or the like can be used.

By increasing the proportion of indium atoms in the sum of atoms of all metal elements included in the metal oxide, the field-effect mobility of the transistor can be increased.

Instead of indium or in addition to indium, the metal oxide may contain one or more kinds of metal elements whose period number in the periodic table is large. As an overlap of orbitals of metal elements becomes larger, the carrier conduction in the metal oxide is likely to be large. Thus, when a metal element with a large period number is included in the metal oxide, the field-effect mobility of the transistor can be increased in some cases. As examples of the metal element with a large period number, metal elements belonging to Period 5 or 6 in the periodic table are given. Specific examples of the metal element include yttrium, zirconium, silver, cadmium, tin, antimony, barium, lead, bismuth, lanthanum, cerium, praseodymium, neodymium, promethium, samarium, and europium. Note that lanthanum, cerium, praseodymium, neodymium, promethium, samarium, and europium are called light rare-earth elements.

The metal oxide may contain one or more kinds of non-metal elements. The metal oxide containing a non-metal element can increase the field-effect mobility of a transistor in some cases. Examples of the non-metal element include carbon, nitrogen, phosphorus, sulfur, selenium, fluorine, chlorine, bromine, and hydrogen.

By increasing the proportion of zinc atoms in the sum of atoms included in the main constituent elements included in the metal oxide, the metal oxide has high crystallinity, so that diffusion of impurities in the metal oxide can be inhibited. Consequently, changes in the electrical characteristics of the transistor can be reduced to improve the reliability of the transistor.

By increasing the proportion of the element M atoms in the sum of atoms included in the main constituent elements included in the metal oxide, oxygen vacancies can be prevented from being formed in the metal oxide. Accordingly, generation of carriers due to oxygen vacancies is inhibited, which makes the off-state current of the transistor small. Furthermore, changes in the electrical characteristics of the transistor can be reduced to improve the reliability of the transistor.

The composition of the metal oxide used for the semiconductor layer changes electrical characteristics and the reliability of the transistor. Therefore, by changing the composition of the metal oxide depending on electrical characteristics and reliability required for the transistor, a semiconductor device having both excellent electrical characteristics and high reliability can be achieved.

In the case where In—Zn oxide is used for the semiconductor layer of the OS transistor, a metal oxide in which the proportion of indium atoms is higher than or equal to that of zinc atoms is preferably used. For example, it is possible to use a metal oxide in which the atomic ratio of metal elements is In:Zn=1:1, In:Zn=2:1, In:Zn=3:1, In:Zn=4:1, In:Zn=5:1, In:Zn=7:1, or In:Zn=10:1, or in the neighborhood thereof. In the case where an In—Sn oxide is used for the semiconductor layer of the OS transistor, a metal oxide in which the proportion of indium atoms is higher than or equal to that of tin atoms is preferably used. For example, a metal oxide in which the atomic ratio of metal elements is In:Sn=1:1, In:Sn=2:1, In:Sn=3:1, In:Sn=4:1, In:Sn=5:1, In:Sn=7:1, or In:Sn=10:1, or the vicinity thereof can be used.

In the case where an In—Sn—Zn oxide is used for the semiconductor layer of the OS transistor, a metal oxide in which the proportion of indium atoms is higher than that of tin atoms can be used. It is preferable to use a metal oxide in which the proportion of zinc atoms is higher than that of tin atoms. For example, a metal oxide in which the atomic ratio of metal elements is any of the following can be used: In:Sn:Zn=2:1:3, In:Sn:Zn=3:1:2, In:Sn:Zn=4:2:3, In:Sn:Zn=4:2:4.1, In:Sn:Zn=5:1:3, In:Sn:Zn=5:1:6, In:Sn:Zn=5:1:7, In:Sn:Zn=5:1:8, In:Sn:Zn=6:1:6, In:Sn:Zn=10:1:3, In:Sn:Zn=10:1:6, In:Sn:Zn=10:1:7, In:Sn:Zn=10:1:8, In:Sn:Zn=5:2:5, In:Sn:Zn=10:1:10, In:Sn:Zn=20:1:10, In:Sn:Zn=40:1:10, or the vicinity thereof.

In the case where an In—Al—Zn oxide is used for the semiconductor layer of the OS transistor, a metal oxide in which the proportion of indium atoms is higher than that of aluminum atoms can be used. It is preferable to use a metal oxide in which the proportion of zinc atoms is higher than that of aluminum atoms. For example, a metal oxide in which the atomic ratio of metal elements is any of the following can be used: In:Al:Zn=2:1:3, In:Al:Zn=3:1:2, In:Al:Zn=4:2:3, In:Al:Zn=4:2:4.1, In:Al:Zn=5:1:3, In:Al:Zn=5:1:6, In:Al:Zn=5:1:7, In:Al:Zn=5:1:8, In:Al:Zn=6:1:6, In:Al:Zn=10:1:3, In:Al:Zn=10:1:6, In:Al:Zn=10:1:7, In:Al:Zn=10:1:8, In:Al:Zn=5:2:5, In:Al:Zn=10:1:10, In:Al:Zn=20:1:10, In:Al:Zn=40:1:10, or the vicinity thereof.

In the case where an In—Ga—Zn oxide is used for the semiconductor layer of the OS transistor, a metal oxide in which the proportion of indium atoms is higher than that of gallium atoms can be used. It is preferable to use a metal oxide in which the proportion of zinc atoms is higher than that of gallium atoms. For example, a metal oxide in which the atomic ratio of metal elements is any of the following can be used: In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=5:1:6, In:Ga:Zn=5:1:7, In:Ga:Zn=5:1:8, In:Ga:Zn=6:1:6, In:Ga:Zn=10:1:3, In:Ga:Zn=10:1:6, In:Ga:Zn=10:1:7, In:Ga:Zn=10:1:8, In:Ga:Zn=5:2:5, In:Ga:Zn=10:1:10, In:Ga:Zn=20:1:10, In:Ga:Zn=40:1:10, or the vicinity thereof.

In the case where an In-M-Zn oxide is used for the semiconductor layer of the OS transistor, a metal oxide in which the proportion of indium atoms is higher than that of the element M atoms can be used. It is preferable to use a metal oxide in which the proportion of zinc atoms is higher than that of the element M atoms. For example, a metal oxide in which the atomic ratio of metal elements is any of the following can be used: In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, In:M:Zn=10:1:3, In:M:Zn=10:1:6, In:M:Zn=10:1:7, In:M:Zn=10:1:8, In:M:Zn=5:2:5, In:M:Zn=10:1:10, In:M:Zn=20:1:10, In:M:Zn=40:1:10, or the vicinity thereof.

In the case where a plurality of metal elements are contained as the element M, the atomic ratio of the sum of the metal elements can be the atomic ratio of the element M. In an In—Ga—Al—Zn oxide where gallium and aluminum are contained as the element M, for example, the atomic ratio of the sum of gallium and aluminum can be the atomic ratio of the element M. The atomic ratio of indium to the element M and zinc is preferably within the ranges given above.

It is preferable to use a metal oxide in which the proportion of indium atoms in the sum of atoms included in the main constituent elements included in the metal oxide is higher than or equal to 30 atomic % and lower than or equal to 100 atomic %, preferably higher than or equal to 30 atomic % and lower than or equal to 95 atomic %, further preferably higher than or equal to 35 atomic % and lower than or equal to 95 atomic %, further preferably higher than or equal to 35 atomic % and lower than or equal to 90 atomic %, further preferably higher than or equal to 40 atomic % and lower than or equal to 90 atomic %, further preferably higher than or equal to 45 atomic % and lower than or equal to 90 atomic %, further preferably higher than or equal to 50 atomic % and lower than or equal to 80 atomic %, further preferably higher than or equal to 60 atomic % and lower than or equal to 80 atomic %, further preferably higher than or equal to 70 atomic % and lower than or equal to 80 atomic %. For example, when an In-M-Zn oxide is used for the semiconductor layer, the atomic ratio of indium to the element M and zinc is preferably within the ranges given above.

As described above, by increasing the proportion of indium atoms in the sum of atoms included in the main constituent elements included in the metal oxide, the field-effect mobility of the transistor can be increased. With the use of such a transistor, a circuit capable of high-speed operation can be fabricated. Furthermore, the area occupied by a circuit can be reduced. In a large-sized or high-resolution display apparatus in which the number of wirings is increased, for example, the use of the transistor can reduce signal delay in wirings and can reduce display unevenness in a large-sized or high-resolution display apparatus. In addition, since the area occupied by a circuit can be reduced, the bezel of the display apparatus can be narrowed.

As an analysis method of the composition of a metal oxide, for example, energy dispersive X-ray spectroscopy (EDX), X-ray photoelectron spectroscopy (XPS), inductively coupled plasma-mass spectrometry (ICP-MS), inductively coupled plasma-atomic emission spectroscopy (ICP-AES), or the like can be used. Alternatively, any of these methods may be combined with each other for the analysis. Note that as for an element whose content is low, the actual content may be different from the content obtained by analysis because of the influence of the analysis accuracy. In the case where the content of the element M is low, for example, the content of the element M obtained by analysis may be lower than the actual content.

For the formation of a metal oxide, a sputtering method or an atomic layer deposition method can be suitably used.

Note that in the case where the metal oxide is formed by a sputtering method, the atomic ratio in a target may be different from the atomic ratio in the metal oxide. Especially for zinc, the atomic ratio of zinc in the metal oxide is lower than that in the target in some cases. Specifically, the atomic ratio of zinc in the metal oxide may be approximately higher than or equal to 40% and lower than or equal to 90% of the atomic ratio of zinc in the target.

Here, the reliability of a transistor is described. Here, one of indexes for evaluating the reliability of a transistor is a gate bias-temperature stress (GBT) test in which an electric field applied to a gate is retained. A GBT test includes a positive bias-temperature stress (PBTS) test in which a positive potential (positive bias) with respect to a source potential and a drain potential is supplied to a gate and retained at a high temperature and a negative bias-temperature stress (NBTS) test in which a negative potential (negative bias) is supplied to a gate and retained at a high temperature. The PBTS test and the NBTS test conducted in a state where irradiation with light is performed are respectively referred to as a positive bias temperature illumination stress (PBTIS) test and a negative bias temperature illumination stress (NBTIS) test.

In an n-channel transistor, a positive potential is supplied to a gate when the transistor becomes an on state; thus, the amount of change in the threshold voltage in a PBTS test is one of important indexes to be focused on as a reliability indicator of the transistor.

With the use of a metal oxide that does not contain gallium or has a low gallium content in the semiconductor layer, the transistor can be highly reliable against positive bias application. In other words, the amount of change in the threshold voltage of the transistor in the PBTS test can be small. Meanwhile, with the use of a metal oxide that contains gallium, the gallium content is preferably lower than the indium content so that the transistor can be highly reliable.

One of the factors changing the threshold voltage in the PBTS test is a defect state at the interface between a gate insulating layer and a semiconductor layer or in the vicinity of the interface. As the density of defect states increases, degradation in the PBTS test becomes significant. Generation of a defect state can be inhibited by a reduction in the gallium content in a region of the semiconductor layer, which is in contact with the gate insulating layer.

The following can be given as the reason why the amount of change in the threshold voltage in the PBTS test can be reduced when a metal oxide that does not contain gallium or has a low gallium content is used for the semiconductor layer. Gallium contained in the metal oxide more easily attracts oxygen than another metal element (e.g., indium or zinc). Therefore, when, at the interface between the metal oxide containing a large amount of gallium and the gate insulating layer, gallium is bonded to excess oxygen in the gate insulating layer, trap sites of carriers (here, electrons) are likely to be generated easily. This might cause the change in the threshold voltage when a positive potential is supplied to a gate and carriers are trapped at the interface between the semiconductor layer and the gate insulating layer.

Specifically, in the case where an In—Ga—Zn oxide is used for the semiconductor layer, a metal oxide in which the atomic ratio of indium is higher than that of gallium can be used for the semiconductor layer. It is further preferable to use a metal oxide in which the atomic ratio of zinc is higher than that of gallium. In other words, a metal oxide with metal elements in an atomic ratio satisfying both relationships In >Ga and Zn>Ga is preferably used for the semiconductor layer.

For example, a metal oxide with metal elements in any of the following atomic ratios can be used for the semiconductor layer of the OS transistor: In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=5:1:6, In:Ga:Zn=5:1:7, In:Ga:Zn=5:1:8, In:Ga:Zn=6:1:6, In:Ga:Zn=10:1:3, In:Ga:Zn=10:1:6, In:Ga:Zn=10:1:7, In:Ga:Zn=10:1:8, In:Ga:Zn=5:2:5, In:Ga:Zn=10:1:10, In:Ga:Zn=20:1:10, In:Ga:Zn=40:1:10, and the vicinity thereof.

In the case where a metal oxide is used for the semiconductor layer of the OS transistor, the atomic ratio of gallium to the metal elements contained in the metal oxide is higher than 0 atomic % and lower than or equal to 50 atomic %, preferably higher than or equal to 0.1 atomic % and lower than or equal to 40 atomic %, further preferably higher than or equal to 0.1 atomic % and lower than or equal to 35 atomic %, further preferably higher than or equal to 0.1 atomic % and lower than or equal to 30 atomic %, further preferably higher than or equal to 0.1 atomic % and lower than or equal to 25 atomic %, further preferably higher than or equal to 0.1 atomic % and lower than or equal to 20 atomic %, further preferably higher than or equal to 0.1 atomic % and lower than or equal to 15 atomic %, further preferably higher than or equal to 0.1 atomic % and lower than or equal to 10 atomic %. The reduction in the gallium content in the semiconductor layer enables the transistor to be highly resistant to the PBTS test. Note that oxygen vacancies (VO) are less likely to be generated in the metal oxide when the metal oxide contains gallium.

A metal oxide that does not contain gallium may be used for the semiconductor layer of the OS transistor. For example, an In—Zn oxide can be used for the semiconductor layer. In this case, when the atomic ratio of indium to the metal elements contained in the metal oxide is increased, the field-effect mobility of the transistor can be increased. By contrast, when the atomic ratio of zinc to the metal elements contained in the metal oxide is increased, the metal oxide has high crystallinity; thus, a change in the electrical characteristics of the transistor can be suppressed and the reliability can be increased. A metal oxide that contains neither gallium nor zinc, such as indium oxide, can be used for the semiconductor layer. The use of a metal oxide not containing gallium can make a change in the threshold voltage particularly in the PBTS test extremely small.

For example, an oxide containing indium and zinc can be used for the semiconductor layer. At that time, for example, a metal oxide with metal elements in an atomic ratio of In:Zn=2:3, In:Zn=4:1, or the vicinity thereof can be used.

Although the case of using gallium is described as an example, the same applies in the case where the element M is used instead of gallium. A metal oxide that has an atomic ratio of indium higher than that of the element M is preferably used for the semiconductor layer. Furthermore, a metal oxide that has an atomic ratio of zinc higher than that of the element M is preferably used.

With the use of a metal oxide with a low content of the element M for the semiconductor layer, the transistor can be highly reliable against positive bias application. With the use of the transistor as a transistor that is required to have high reliability against positive bias application, a highly reliable semiconductor device can be provided.

Next, the reliability of a transistor against light is described.

Light incidence on a transistor may change its electrical characteristics. In particular, a transistor provided in a region on which light can be incident preferably exhibits a small variation in electrical characteristics under light irradiation and has high reliability against light. The reliability against light can be evaluated by the amount of change in threshold voltage in a NBTIS test, for example.

The high content of the element M in a metal oxide used for the semiconductor layer enables the transistor to be highly reliable against light. In other words, the amount of change in the threshold voltage of the transistor in the NBTIS test can be small. Specifically, in a metal oxide in which the atomic ratio of the element M is higher than or equal to that of indium, the band gap is increased and accordingly the amount of change in the threshold voltage of the transistor in the NBTIS test can be reduced. The band gap of the metal oxide in the semiconductor layer is preferably greater than or equal to 2.0 eV, further preferably greater than or equal to 2.5 eV, further preferably greater than or equal to 3.0 eV, further preferably greater than or equal to 3.2 eV, further preferably greater than or equal to 3.3 eV, further preferably greater than or equal to 3.4 eV, further preferably greater than or equal to 3.5 eV.

For example, a metal oxide with metal elements in an atomic ratio of In:M:Zn=1:1:1, In:M:Zn=1:1:1.2, In:M:Zn=1:3:2, In:M:Zn=1:3:3, or In:M:Zn=1:3:4, or the vicinity thereof can be used for the semiconductor layer.

For the semiconductor layer, in particular, it is preferable to use a metal oxide in which the atomic ratio of the element M to that of the metal elements contained in the metal oxide is higher than or equal to 20 atomic % and lower than or equal to 70 atomic %, preferably higher than or equal to 30 atomic % and lower than or equal to 70 atomic %, further preferably higher than or equal to 30 atomic % and lower than or equal to 60 atomic %, further preferably higher than or equal to 40 atomic % and lower than or equal to 60 atomic %, further preferably higher than or equal to 50 atomic % and lower than or equal to 60 atomic %.

In the case where an In—Ga—Zn oxide is used for the semiconductor layer, a metal oxide in which the atomic ratio of indium is higher than or equal to that of gallium is preferably used. For example, a metal oxide with metal elements in any of the following atomic ratios can be used: In:Ga:Zn=1:1:1, In:Ga:Zn=1:1:2, In:Ga:Zn=1:3:2, In:Ga:Zn=1:3:3, In:Ga:Zn=1:3:4, and the vicinity thereof.

For the semiconductor layer, in particular, it is preferable to use a metal oxide in which the atomic ratio of gallium to that of the metal elements contained in the metal oxide is higher than or equal to 20 atomic % and lower than or equal to 60 atomic %, preferably higher than or equal to 20 atomic % and lower than or equal to 50 atomic %, further preferably higher than or equal to 30 atomic % and lower than or equal to 50 atomic %, still further preferably higher than or equal to 40 atomic % and lower than or equal to 60 atomic %, still more further preferably higher than or equal to 50 atomic % and lower than or equal to 60 atomic %.

With the use of a metal oxide with a high content of the element M for the semiconductor layer, the transistor can be highly reliable against light. With the use of the transistor as a transistor that is required to have high reliability against light, a highly reliable semiconductor device can be provided.

The semiconductor layer may have a stacked structure of two or more metal oxide layers. The two or more metal oxide layers included in the semiconductor layer may have the same compositions or substantially the same compositions. With the stacked-layer structure of metal oxide layers having the same compositions, the manufacturing cost can be reduced because the metal oxide layers can be formed with the same sputtering target.

The two or more metal oxide layers in the semiconductor layer may have different compositions. For example, a stacked structure of a first metal oxide layer having In:M:Zn=1:3:4 [atomic ratio] or a composition in the vicinity thereof and a second metal oxide layer having In:M:Zn=1:1:1 [atomic ratio] or a composition in the vicinity thereof and being formed over the first metal oxide layer can be favorably employed. In particular, gallium or aluminum is preferably used as the element M. A stacked structure of one selected from indium oxide, indium gallium oxide, and IGZO, and one selected from IAZO, IAGZO, and ITZO (registered trademark) may be employed, for example.

A metal oxide having crystallinity is preferably used for the semiconductor layer. For example, a metal oxide layer having a c-axis aligned crystal (CAAC) structure, a nanocrystal (nc) structure, a polycrystalline structure, a microcrystalline structure, or the like can be used. By using a metal oxide having crystallinity for the semiconductor layer, the density of defect states in the semiconductor layer can be reduced, which enables the display apparatus to have high reliability.

As the metal oxide layer used for the semiconductor layer has higher crystallinity, the density of defect states in the semiconductor layer can be lower. By contrast, the use of a metal oxide layer with low crystallinity enables a transistor to flow a high current.

In the case where a metal oxide layer is formed by a sputtering method, the crystallinity of the metal oxide layer can be increased as the substrate temperature (the stage temperature) in formation is higher. The crystallinity of the metal oxide layer can be increased as the proportion of a flow rate of an oxygen gas to the whole formation gas (also referred to as oxygen flow rate ratio) used in formation is higher.

The semiconductor layer of the OS transistor may have a stacked structure of two or more metal oxide layers having different crystallinity. For example, when the stacked structure includes a first metal oxide layer and a second metal oxide layer provided over the first metal oxide layer, the second metal oxide layer can have a region having higher crystallinity than the first metal oxide layer; alternatively, the second metal oxide layer can have a region having lower crystallinity than the first metal oxide layer. The two or more metal oxide layers included in the semiconductor layer may have the same compositions or substantially the same compositions. With the stacked-layer structure of metal oxide layers having the same compositions, the manufacturing cost can be reduced because the metal oxide layers can be formed with the same sputtering target. For example, the stacked structure of two or more metal oxide layers having different crystallinity can be formed with the same sputtering target and different oxygen flow rate ratios.

The channel length L of the transistor 10 described in this embodiment is determined by the thickness of an insulating layer provided between the conductive layer 113 and the conductive layer 108. Thus, a transistor with a short channel length L can be formed with high accuracy. Furthermore, variations in characteristics among the transistors 10 are also reduced. Accordingly, the operation of a semiconductor device including the transistor 10 can be stabilized and the reliability thereof can be improved. When the variations in characteristics is reduced, the circuit design flexibility of the semiconductor device is increased and the operation voltage can be reduced. As a result, power consumption of the semiconductor device can be reduced.

In the case where an oxide semiconductor is used for the semiconductor layer 114, a material containing hydrogen is preferably used for the insulating layer 109 and the insulating layer 111. When an insulating layer containing hydrogen is in contact with the oxide semiconductor, the number of oxygen vacancies in a region of the oxide semiconductor with which the insulating layer is in contact is increased, increasing the carrier concentration. Accordingly, the region can serve as a source region or a drain region. For the insulating layer containing hydrogen, a material containing silicon, nitrogen, and hydrogen may be used, for example. Specifically, a silicon nitride containing hydrogen or a silicon nitride oxide containing hydrogen may be used.

In the case where an oxide semiconductor is used for the semiconductor layer 114, a conductive material that increases the number of oxygen vacancies in the oxide semiconductor is preferably used for the conductive layer 108 in contact with the semiconductor layer 114 and the conductive layer 113 in contact with the semiconductor layer 114. For example, a conductive material containing nitrogen may be used. For example, a conductive material containing nitrogen and titanium or tantalum may be used. Another conductive material may be provided so as to overlap with the conductive material containing nitrogen. For the conductive layer 108 and the conductive layer 113, a conductive material containing oxygen, such as indium tin oxide (also referred to as In—Sn oxide or ITO), indium tin oxide containing silicon (also referred to as In—Si—Sn oxide or ITSO), indium zinc oxide (In—Zn oxide), or indium zinc oxide containing tungsten (In—W—Zn oxide), may be used.

In contrast, for the insulating layer 110, a material which contains oxygen and in which the amount of hydrogen is reduced is preferably used. For example, a material containing silicon and oxygen may be used. Specifically, silicon oxide, silicon oxynitride, or the like may be used. Since hydrogen is an impurity element in the oxide semiconductor, when the semiconductor layer 114 formed with an oxide semiconductor and the insulating layer 110 which contains oxygen and in which the amount of hydrogen is reduced are in contact with each other, the carrier concentration in a region of the semiconductor layer 114 in contact with the insulating layer 110 is reduced. The number of oxygen vacancies in the region is reduced; thus, the transistor 10 has stable characteristics and improved reliability.

When an oxide semiconductor is used for the semiconductor layer 114, the insulating layer 110 preferably contains excess oxygen. In this specification and the like, excess oxygen refers to oxygen that is released by heating. In the case where a material containing excess oxygen is used for the insulating layer 110, a material through which oxygen is less likely to pass is preferably used for the insulating layer 109 and the insulating layer 111. Examples of the material through which oxygen is less likely to pass include a nitride of silicon and an oxide containing aluminum and/or hafnium. With the use of the material through which oxygen is less likely to pass for the insulating layer 109 and the insulating layer 111, excess oxygen contained in the insulating layer 110 is less likely to be released to a lower layer or an upper layer. Thus, sufficient oxygen can be supplied to the oxide semiconductor. For example, an insulating layer containing silicon and oxygen (the insulating layer 110) is preferably provided between two insulating layers containing silicon and nitrogen (the insulating layer 109 and the insulating layer 111).

In the case where an oxide semiconductor is used for the semiconductor layer 114 and a material containing hydrogen is used for the insulating layer 109 and the insulating layer 111, a region of the semiconductor layer 114 in contact with the conductive layer 113 and a region of the semiconductor layer 114 in contact with the insulating layer 111 serve as one of a source (a source region) and a drain (a drain region). A region of the semiconductor layer 114 in contact with the conductive layer 108 and a region of the semiconductor layer 114 in contact with the insulating layer 109 serve as the other of the source (the source region) and the drain (the drain region). Thus, a thickness t of the insulating layer 110 determines the channel length L of the transistor 10 (see FIG. 2A).

A material that contains no hydrogen or an extremely small amount of hydrogen may be used for the insulating layer 109 and the insulating layer 111. For example, silicon nitride that contains an extremely small amount of hydrogen or silicon nitride oxide that contains an extremely small amount of hydrogen may be used. In that case, the carrier concentrations of the region of the semiconductor layer 114 in contact with the insulating layer 109 and the region of the semiconductor layer 114 in contact with the insulating layer 111 do not become high. Thus, the region of the semiconductor layer 114 in contact with the conductive layer 113 serves as one of a source (a source region) and a drain (a drain region). The region of the semiconductor layer 114 in contact with the conductive layer 108 serves as the other of the source (the source region) and the drain (the drain region). In that case, a thickness is obtained by combining the thicknesses of the insulating layer 109, the insulating layer 110, and the insulating layer 111 corresponds to the channel length L of the transistor 10 (see FIG. 2A).

Although an example in which three insulating layers (the insulating layer 109, the insulating layer 110, and the insulating layer 111) are provided between the conductive layer 108 and the conductive layer 113 is shown in this embodiment, the number of insulating layers between the conductive layer 108 and the conductive layer 113 is not limited to three. The number of insulating layers between the conductive layer 108 and the conductive layer 113 may be one, two, four, or more.

Since the semiconductor layer 114 is provided in the opening 112, a length p of the circumference of the opening 112 corresponds to the channel width W of the transistor (see FIG. 2C). The length p of the circumference may be obtained in a position corresponding to the half (t/2) of the thickness t of the insulating layer 110 or the half (ts/2) of the thickness ts, for example. Note that the length of the circumference of the opening 112 in an arbitrary position may be regarded as the channel width W as necessary. For example, the length p of the circumference of the lowest portion or the uppermost portion of the opening 112 may be regarded as the channel width W.

Figure 2E:
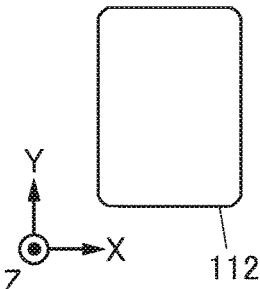
Figure 2F:
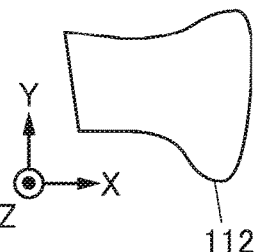

Although the outline (the planar shape) of the opening 112 seen from the Z direction is circular in FIG. 2C, the outline is not limited to this. For example, the outline of the opening 112 seen from the Z direction may be elliptical (see FIG. 2D) or rectangular (see FIG. 2E). Note that the outline in FIG. 2E is a rectangle having rounded corner portions. For example, the outline of the opening 112 seen from the Z direction may have a shape including a straight portion and/or a curved portion (see FIG. 2F).

In the transistor 10 of one embodiment of the present invention, the capacitance values of parasitic capacitance generated between the gate and the source and that generated between the gate and the drain are different from each other. Specifically, the capacitance value of a capacitance (a capacitor C1) generated between the conductive layer 113 and the conductive layer 116 is higher than the capacitance value of a capacitance (a capacitor C2) generated between the conductive layer 108 and the conductive layer 116 (see FIG. 1D and FIG. 2B).

Figure 3A:
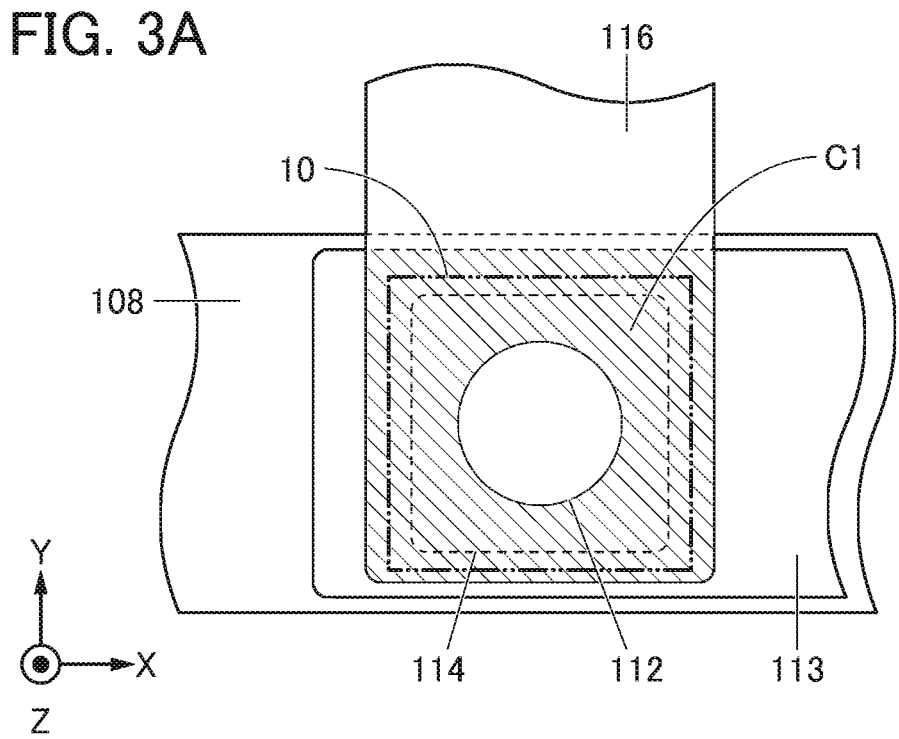
FIGS. 3A and 3B are each a plan view of a transistor.
Figure 3B:
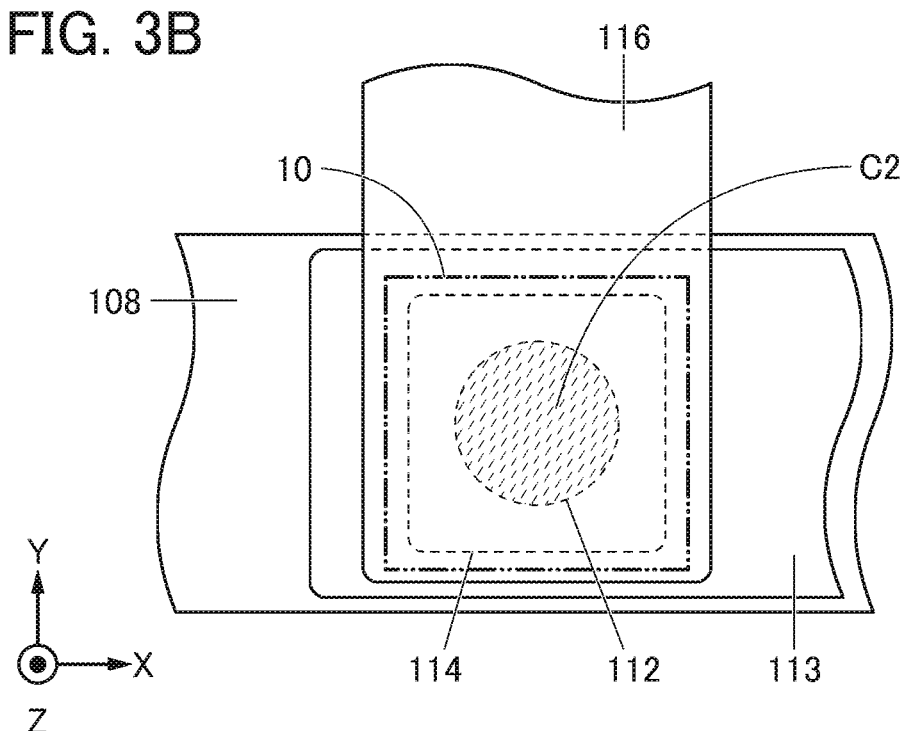

FIGS. 3A and 3B are plan views similar to FIG. 1A. When the transistor 10 of one embodiment of the present invention is seen from the Z direction, the conductive layer 116 overlaps with the conductive layer 113 in the periphery of the opening 112 to surround the opening 112, and overlaps with the conductive layer 113 in the bottom portion of the opening 112.

In FIG. 3A, a region serving as the capacitor C1 is hatched when seen from the Z direction. A region where the conductive layer 113 and the conductive layer 116 overlap with each other with the semiconductor layer 114 and the insulating layer 115 interposed therebetween serves as the capacitor C1 (see FIG. 2B and FIG. 3A). Note that the insulating layer 115 is omitted in FIG. 3A.

In FIG. 3B, a region serving as the capacitor C2 is hatched when seen from the Z direction. In the bottom portion of the opening 112, a region where the conductive layer 108 and the conductive layer 116 overlap with each other with the semiconductor layer 114 and the insulating layer 115 interposed therebetween serves as the capacitor C2 (see FIG. 2B and FIG. 3B). Note that the insulating layer 115 is omitted in FIG. 3B.

According to FIGS. 3A and 3B, the region serving as the capacitor C1 has a larger area than the region serving as the capacitor C2. When the area of the region serving as the capacitor C1 is larger than the area of the region serving as the capacitor C2, the capacitance value of the capacitor C1 is higher than that of the capacitor C2.

When the area where the conductive layer 108 and the conductive layer 116 overlap with each other is changed in order to change the capacitance value of the capacitor C2, the shape of the opening 112 is changed, that is, the length p of the circumference of the opening 112 is changed. Since the change in the length p of the circumference directly influences the electrical characteristics of the transistor 10, the capacitance value of the capacitor C2 is difficult to control.

In contrast, an overlapped area between the conductive layer 116 and the conductive layer 113 is easy to control and less likely to influence the electrical characteristics of the transistor 10. For example, by increasing the overlapped area between the conductive layer 116 and the conductive layer 113, the capacitance value of the capacitor C1 can be increased.

Figure 4A:
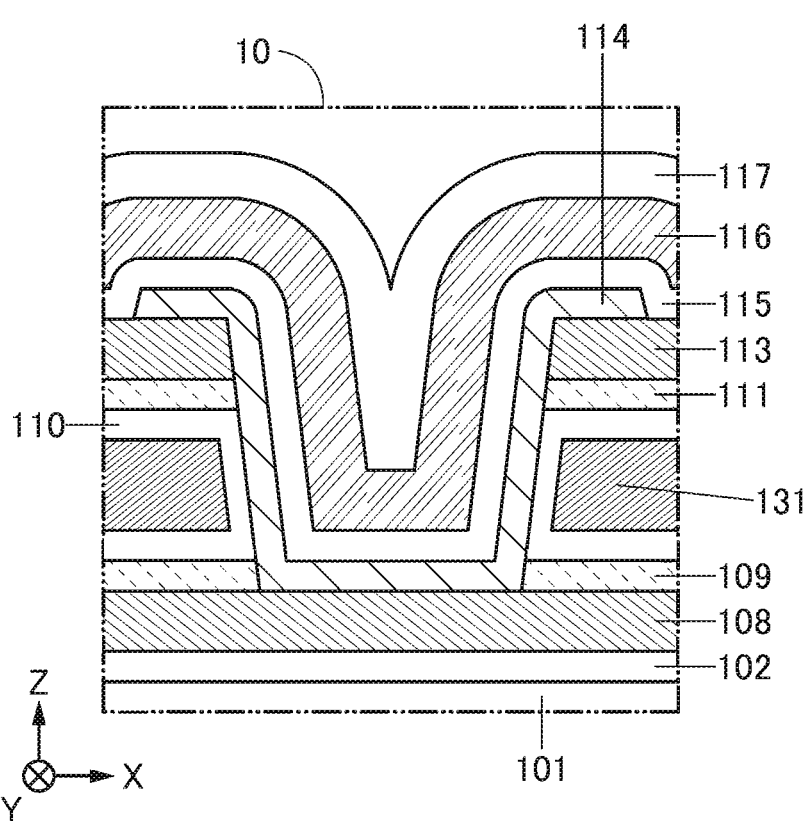
FIG. 4A is a cross-sectional view of a transistor.
Figure 4B:
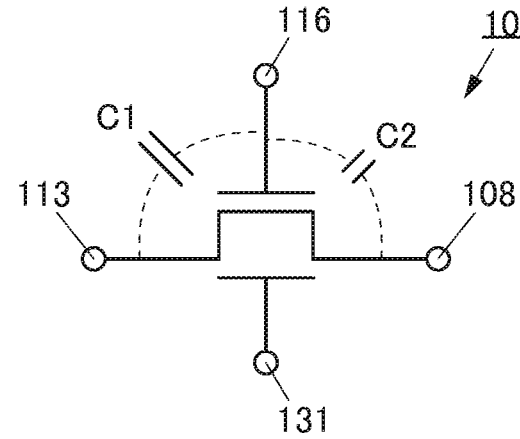
FIG. 4B is an equivalent circuit diagram of the transistor.

As illustrated in the cross-sectional view of FIG. 4A, a conductive layer 131 which is close to the semiconductor layer 114 may be provided in the insulating layer 110. The conductive layer 131 is provided not to be in contact with the semiconductor layer 114. The conductive layer 131 is preferably provided to surround the semiconductor layer 114. The conductive layer 131 can serve as a backgate electrode of the transistor when provided close to, but without being in contact with, the semiconductor layer 114. Thus, the transistor 10 illustrated in FIG. 4A serves as a transistor having a backgate (a backgate electrode). Note that FIG. 4B is an equivalent circuit diagram of the transistor 10 illustrated in FIG. 4A.

Here, a backgate electrode is described. In general, a backgate electrode is formed using a conductive layer and positioned such that a channel formation region of a semiconductor layer is sandwiched between a gate electrode and the backgate electrode. Thus, the backgate electrode can function in a manner similar to that of the gate electrode. The potential of the backgate electrode may be the same as that of the gate electrode or may be a GND potential or a predetermined potential. The on-state current of the transistor can be increased by electrically connecting the gate electrode and the backgate electrode. When the potential of the backgate electrode is not the same as the potential of the gate electrode and is changed independently of the potential of the gate electrode, the threshold voltage of the transistor can be changed.

When the plurality of transistors 10 are connected in parallel, an apparent channel width W of the transistor 10 can be increased. A large channel width W of the transistor 10 leads to a smaller resistance value between the source and the drain in an on state and thus $I_d$ in the on state can be increased.

FIG. 5A is a plan view of the transistor 10 including a transistor 10a and a transistor 10b. FIG. 5B is a cross-sectional view taken along the dashed-dotted line A1-A2 in FIG. 5A. FIG. 5C is a perspective view of the transistor 10 including the transistor 10a and the transistor 10b. FIG. 5D is an equivalent circuit diagram of the transistor 10 including the transistor 10a and the transistor 10b. For easy understanding of the structure of the transistor 10, some components of the transistor 10 are not illustrated in FIGS. 5A and 5C.

Each of the transistor 10a and the transistor 10b has a structure similar to that of the transistor 10 described with reference to FIGS. 1A to 1D and FIGS. 2A to 2F. The transistor 10a is provided in a region including an opening 112a, and the transistor 10b is provided in a region including an opening 112b. The openings 112a and 112b can be formed in a manner similar to that of the opening 112.

A part of the conductive layer 108 serves as one of a source electrode and a drain electrode of the transistor 10a and another part of the conductive layer 108 serves as one of a source electrode and a drain electrode of the transistor 10b. A part of the conductive layer 113 serves as the other of the source electrode and the drain electrode of the transistor 10a and another part of the conductive layer 113 serves as the other of the source electrode and the drain electrode of the transistor 10b. A part of the conductive layer 116 serves as a gate electrode of the transistor 10a, and another part of the conductive layer 116 serves as a gate electrode of the transistor 10b.

In the equivalent circuit diagram of FIG. 5D, one of a source and a source of the transistor 10a and one of a source and a source of the transistor 10b are electrically connected to each other, and the other of the source and the drain of the transistor 10a and the other of the source and the drain of the transistor 10b are electrically connected to each other. A gate of the transistor 10a and a gate of the transistor 10b are electrically connected to each other. Thus, on-states and the off states of the transistors 10a and 10b are switched at the same time and the transistors 10a and 10b serve as one transistor 10.

<Logic Circuit>

The transistor 10 can be used as a variety of circuits. A configuration example of a logic circuit including the transistor 10 is described.

<Inverter Circuit>

A configuration example of a semiconductor device 100A serving as an inverter circuit (also referred to as a "NOT circuit") is described as the configuration example of the logic circuit including the transistor 10. The semiconductor device 100A is a semiconductor device of one embodiment of the present invention.

Figure 6:
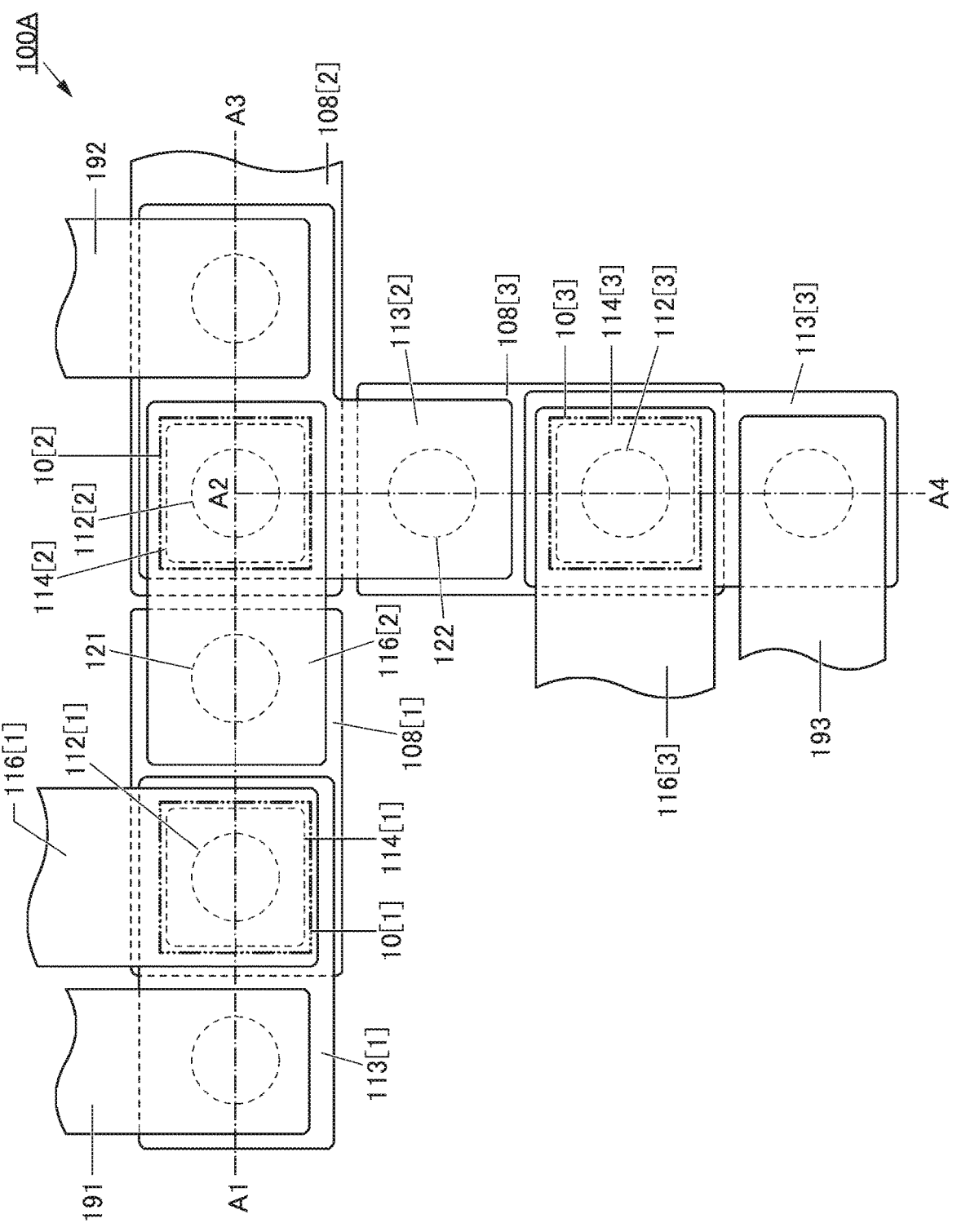
FIG. 6 is a plan view of a semiconductor device.
Figures 7A, 7B:
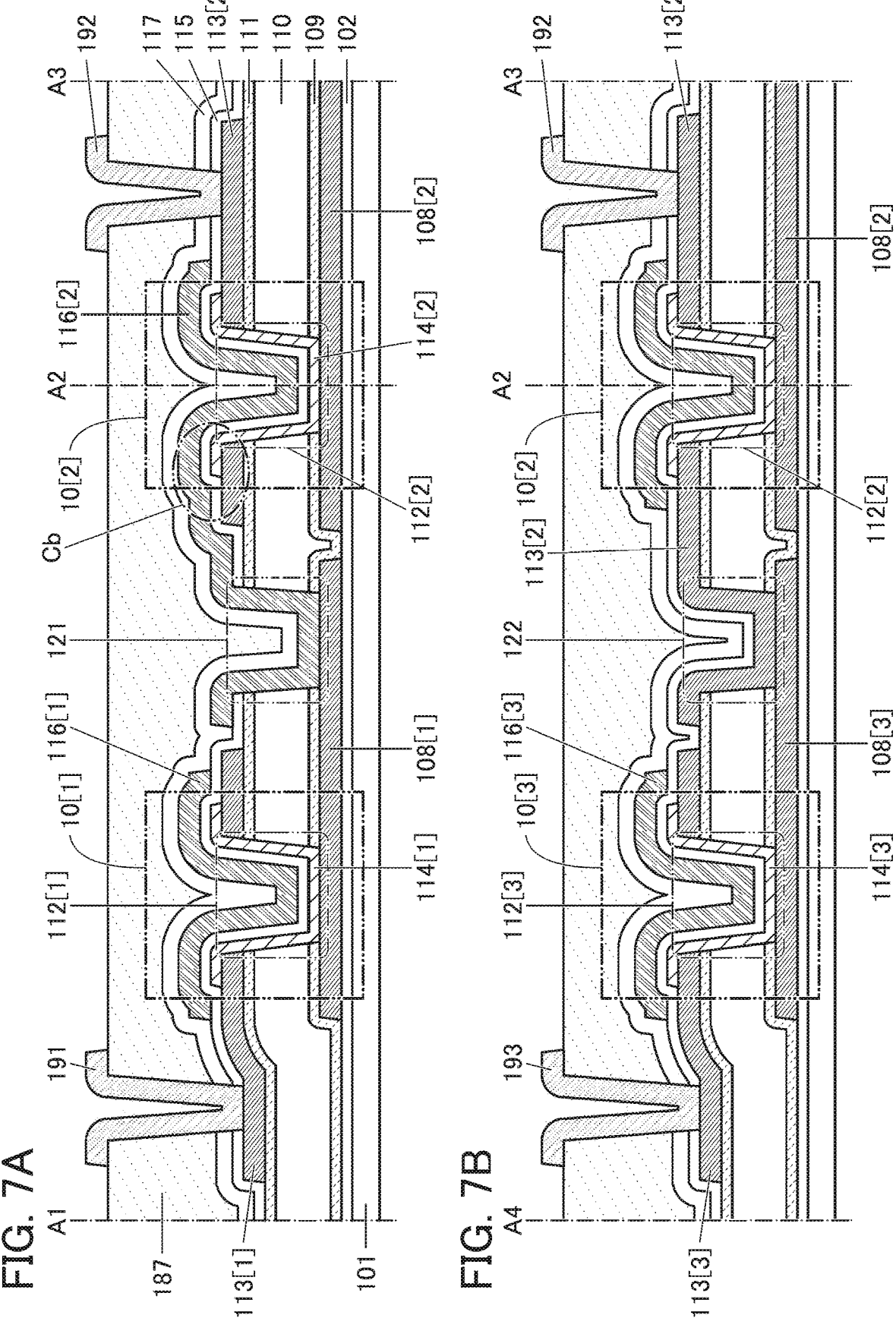
FIGS. 7A and 7B are cross-sectional views of a semiconductor device.
Figure 8A:
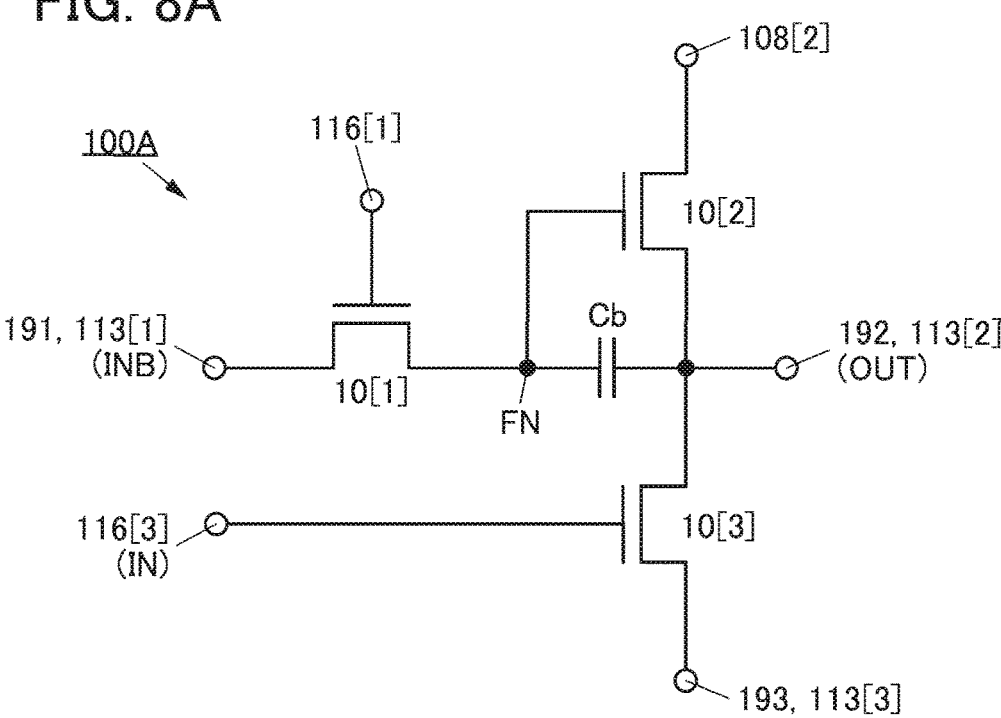
FIGS. 8A and 8B are each a circuit diagram of a semiconductor device.
Figure 8B:
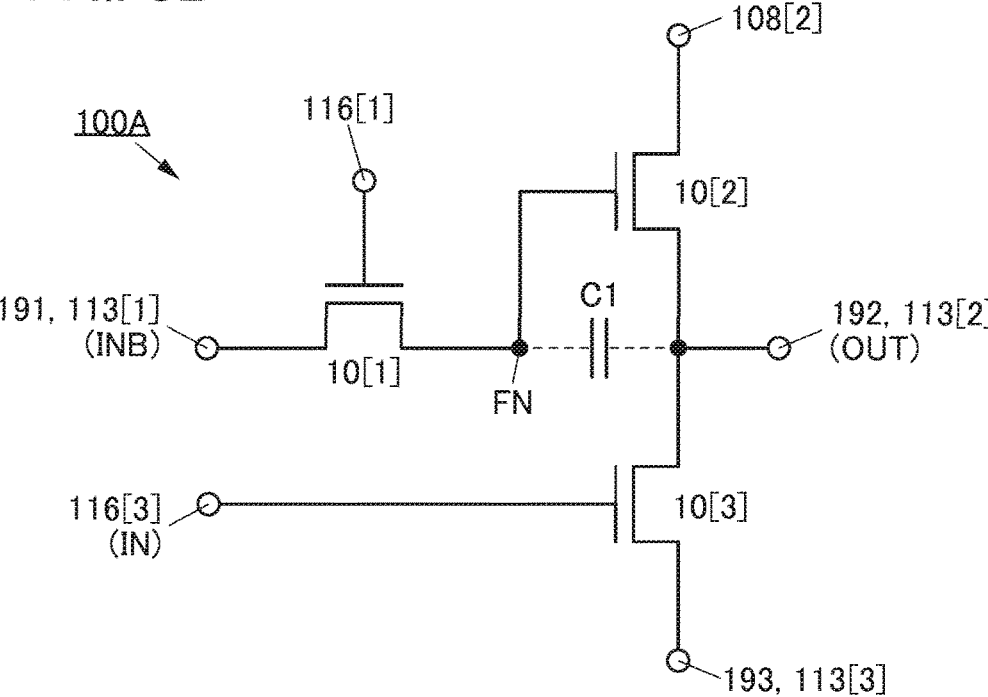
Figure 8C:
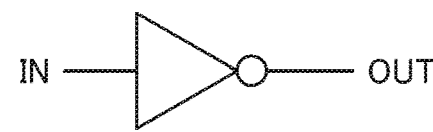
FIG. 8C illustrates a circuit symbol of an inverter circuit.

FIG. 6 is a plan view of the semiconductor device 100A. FIG. 7A is a cross-sectional view taken along the dashed-dotted line A1-A2-A3 in FIG. 6. FIG. 7B is a cross-sectional view taken along the dashed-dotted line A4-A2-A3 in FIG. 6. FIGS. 8A and 8B are equivalent circuit diagrams of the semiconductor device 100A. FIG. 8C shows a circuit symbol of an inverter circuit.

First, the circuit configuration of the semiconductor device 100A is described with reference to the equivalent circuit diagram of FIG. 8A.

The semiconductor device 100A includes a transistor 10[1], a transistor 10[2], a transistor 10[3], and a capacitor Cb. The semiconductor device 100A further includes two input terminals (a terminal INB and a terminal IN) and one output terminal (a terminal OUT) (see FIG. 8A). A potential H or a potential L is input to the terminal IN, and an inverted signal of the terminal IN is input to the terminal INB.

In this specification and the like, a signal supplied to the terminal IN or the terminal INB is also referred to as an "input signal". A potential of the terminal IN or the terminal INB is also referred to as an "input potential". A signal supplied to the terminal OUT is also referred to as an "output signal". A potential of the terminal OUT is also referred to as an "output potential".

As illustrated in the equivalent circuit of FIG. 8A, one of a source and a drain of the transistor 10[1] is electrically connected to the terminal INB. A gate of the transistor 10[1] is electrically connected to a conductive layer 116[1]. The other of the source and the drain of the transistor 10[1] is electrically connected to one terminal of the capacitor Cb and a gate of the transistor 10[2]. A region where the other of the source and the drain of the transistor 10[1], the one terminal of the capacitor Cb, and the gate of the transistor 10[2] are electrically connected to one another functions as a node FN.

One of a source and a drain of the transistor 10[2] is electrically connected to a conductive layer 108[2]. The other of the source and the drain of the transistor 10[2] is electrically connected to the other terminal of the capacitor Cb, the terminal OUT, and one of a source and a drain of the transistor 10[3]. The other of the source and the drain of the transistor 10[3] is electrically connected to a conductive layer 193. A gate of the transistor 10[3] is electrically connected to a conductive layer 116[3].

In the semiconductor device 100A, an inverted signal of a signal input to the terminal IN is output from the terminal OUT. The terminal INB is not illustrated in FIG. 8C.

The semiconductor device 100A is a single-polarity inverter circuit formed with only n-channel transistors. Since p-channel transistors are not used for the semiconductor device 100A, the manufacturing cost can be reduced. Furthermore, since steps of forming the p-channel transistors are unnecessary, the manufacturing period is shortened and the manufacturing yield is improved. Note that p-channel transistors may be used for the semiconductor device 100A as needed.

Next, an example of a stacked-layer structure of the semiconductor device 100A is described. The semiconductor device 100A includes a conductive layer 108[1], a conductive layer 108[2], and a conductive layer 108[3] over the insulating layer 102 (see FIGS. 7A and 7B). The conductive layer 108[1], the conductive layer 108[2], and the conductive layer 108[3] can be formed in a manner similar to that of the above-described conductive layer 108. A conductive layer 113[1], a conductive layer 113[2], and a conductive layer 113[3] are provided over the insulating layer 111. The conductive layer 113[1], the conductive layer 113[2], and the conductive layer 113[3] can be formed in a manner similar to that of the above-described conductive layer 113.

The semiconductor device 100A includes an opening 112[1] in a region overlapping with the conductive layer 108[1], an opening 112[2] in a region overlapping with the conductive layer 108[2], and an opening 112[3] in a region overlapping with the conductive layer 108[3]. The opening 112[1], the opening 112[2], and the opening 112[3] can be formed in a manner similar to that of the above-described opening 112.

The semiconductor device 100A includes a semiconductor layer 114[1] and a conductive layer 116[1]. The semiconductor layer 114[1] is provided over the conductive layer 113[1] and the conductive layer 108[1] and has a region overlapping with the opening 112[1]. The conductive layer 116[1] is provided over the insulating layer 115 and has a region overlapping with the semiconductor layer 114[1]. The semiconductor device 100A includes a semiconductor layer 114[2] and a conductive layer 116[2]. The semiconductor layer 114[2] is provided over the conductive layer 113[2] and the conductive layer 108[2] and has a region overlapping with the opening 112[2]. The conductive layer 116[2] is provided over the insulating layer 115 and has a region overlapping with the semiconductor layer 114[2]. The semiconductor device 100A includes a semiconductor layer 114[3] and a conductive layer 116[3]. The semiconductor layer 114[3] is provided over the conductive layer 113[3] and the conductive layer 108[3] and has a region overlapping with the opening 112[3]. The conductive layer 116[3] is provided over the insulating layer 115 and has a region overlapping with the semiconductor layer 114[3].

The semiconductor layer 114[1], the semiconductor layer 114[2], and the semiconductor layer 114[3] can be formed in a manner similar to that of the above-described semiconductor layer 114. The conductive layer 116[1], the conductive layer 116[2], and the conductive layer 116[3] can be formed at the same time as the above-described conductive layer 116.

The transistor 10[1] includes the conductive layer 108[1], the semiconductor layer 114[1], the conductive layer 113[1], and the conductive layer 116[1]. The transistor 10[2] includes the conductive layer 108[2], the semiconductor layer 114[2], the conductive layer 113[2], and the conductive layer 116[2]. The transistor 10[3] includes the conductive layer 108[3], the semiconductor layer 114[3], the conductive layer 113[3], and the conductive layer 116[3]. The transistor 10[1], the transistor 10[2], and the transistor 10[3] can have a structure similar to that of the above-described transistor 10. The transistor 10[1], the transistor 10[2], and the transistor 10[3] may each have a backgate.

In a region overlapping with the conductive layer 108[1] of the semiconductor device 100A, an opening 121 is provided in the insulating layer 115, the insulating layer 111, the insulating layer 110, and the insulating layer 109. In the opening 121, the conductive layer 116[2] is electrically connected to the conductive layer 108[1].

The electrical connection between the conductive layer 116[2] and the conductive layer 108[1] enables the capacitor C1 of the transistor 10[2] to be used as the capacitor Cb. With the use of the capacitor C1 of the transistor 10[2] as the capacitor Cb, another capacitor Cb does not need to be additionally provided, reducing the occupied area of the semiconductor device (see FIG. 7A and FIG. 8B). For this reason, it is preferable that the conductive layer 116[2] and the conductive layer 108[1] be electrically connected to each other.

In a region overlapping with the conductive layer 108[3] of the semiconductor device 100A, an opening 122 is provided in the insulating layer 115, the insulating layer 111, the insulating layer 110, and the insulating layer 109. In the opening 122, the conductive layer 113[2] is electrically connected to the conductive layer 108[3].

The semiconductor device 100A includes an insulating layer 187 over the insulating layer 117. The insulating layer 187 preferably serves as a planarization layer for reducing difference in level generated by a transistor, a capacitor, a wiring, and the like below the insulating layer 187. An organic insulating film is suitably used as the planarization layer. The insulating layer 187 may be formed with an inorganic material or an organic material and then subjected to planarization treatment such as CMP treatment.

The semiconductor device 100A includes a conductive layer 191, a conductive layer 192, and the conductive layer 193 over the insulating layer 187. The conductive layers 191, 192, and 193 can be formed with the same material by the same method as those of other conductive layers.

In the semiconductor device 100A, an opening is formed in the insulating layer 187, the insulating layer 117, and the insulating layer 115 in each of a region overlapping with the conductive layer 113[1], a region overlapping with the conductive layer 113[2], and a region overlapping with the conductive layer 113[3].

The conductive layer 191 is electrically connected to the conductive layer 113[1] in an opening overlapping with the conductive layer 113[1]. The conductive layer 192 is electrically connected to the conductive layer 113[2] in the opening overlapping with the conductive layer 113[2]. The conductive layer 193 is electrically connected to the conductive layer 113[3] in the opening overlapping with the conductive layer 113[3].

In the semiconductor device 100A, the conductive layer 191 serves as the terminal INB, the conductive layer 192 serves as the terminal OUT, and the conductive layer 116[3] serves as the terminal IN.

In order that the capacitor C1 of the transistor 10[2] is used as the capacitor Cb in the semiconductor device 100A illustrated in the circuit diagrams of FIGS. 8A and 8B, it is important to use the transistor (vertical-channel transistor) of one embodiment of the present invention as the transistor 10[2]. Transistors other than the transistor of one embodiment of the present invention may be used as transistors other than the transistor 10[2]. However, a large number of the transistors of one embodiment of the present invention are preferably used for the semiconductor device 100A in order to achieve a semiconductor device with a small occupied area. Therefore, all the transistors included in semiconductor device 100A are preferably the transistors of one embodiment of the present invention.

Figure 9:
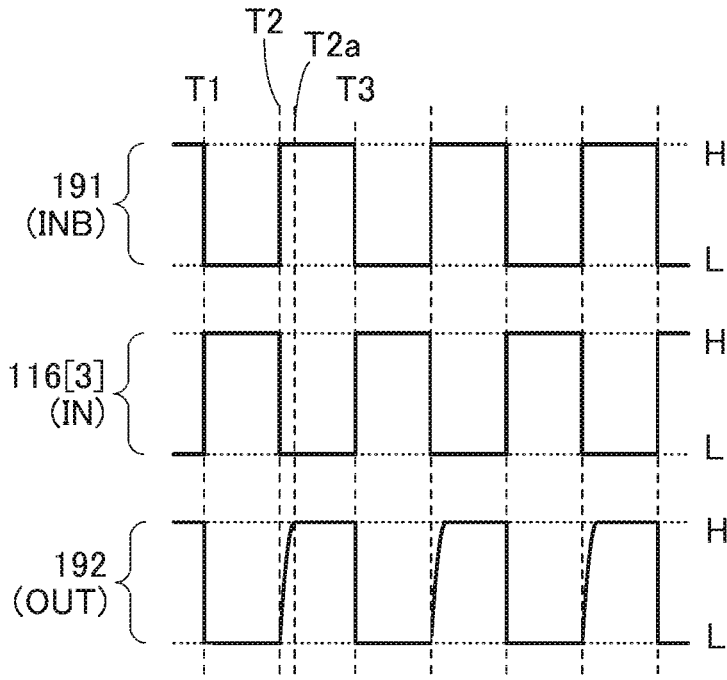
FIG. 9 is a timing chart for explaining operation examples of a semiconductor device.
Figure 10A:
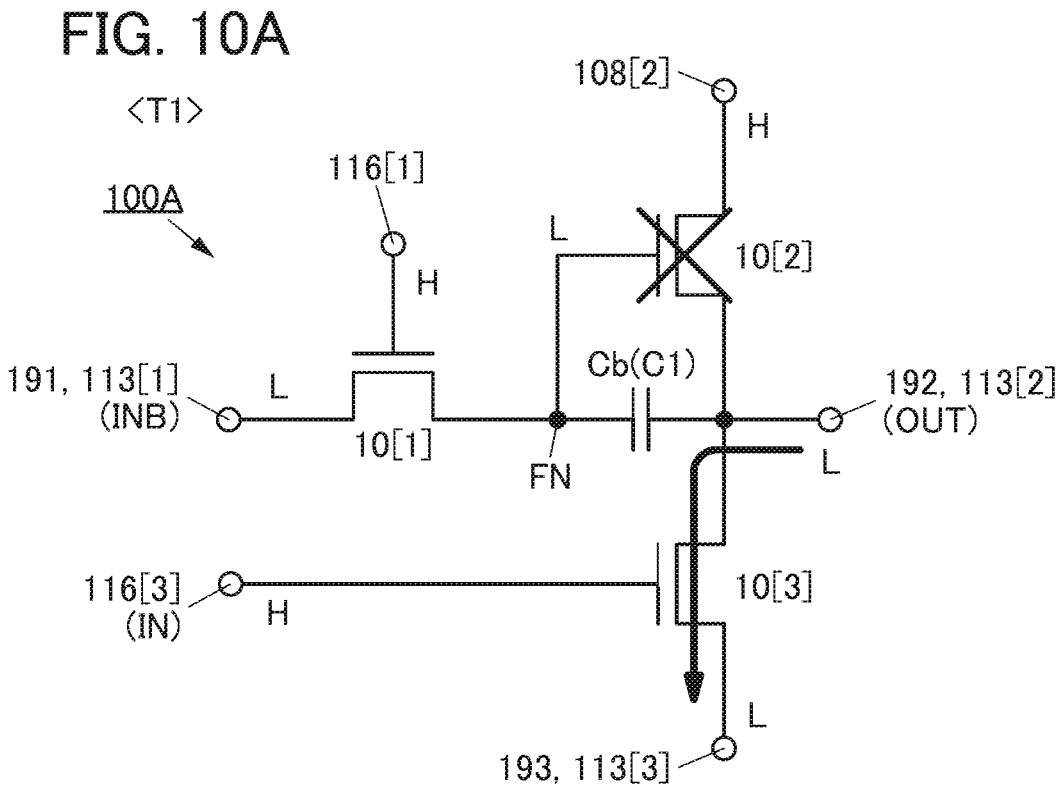
FIGS. 10A and 10B are circuit diagrams for explaining operation examples of a semiconductor device.
Figure 10B:
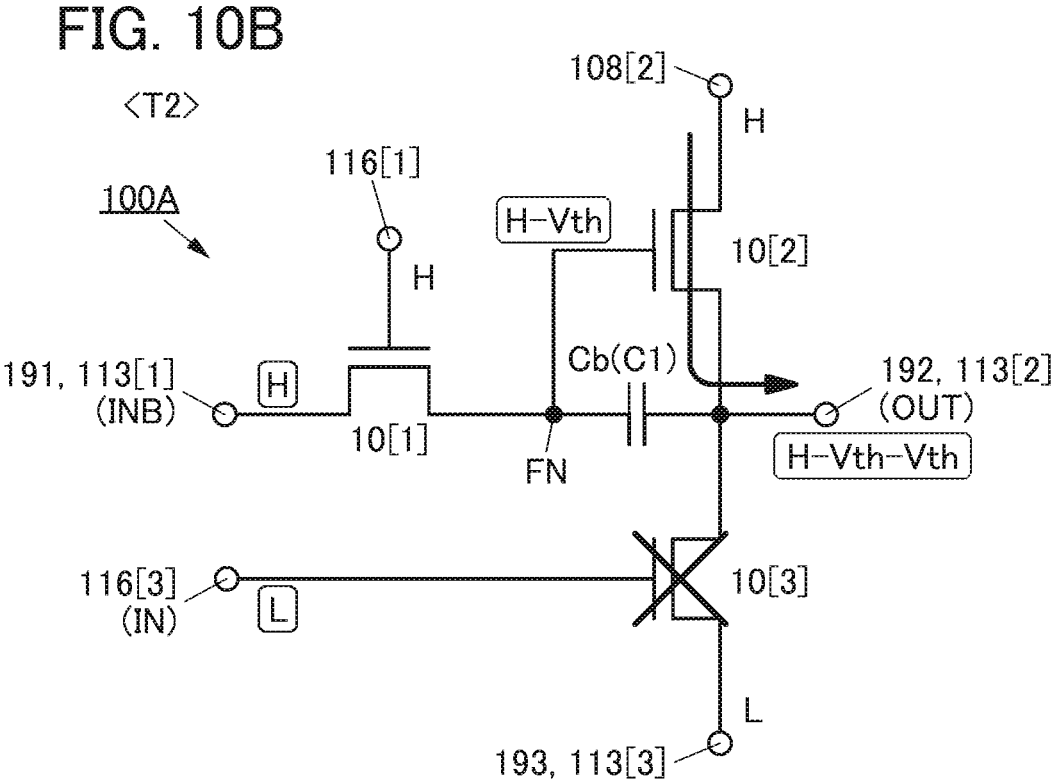
Figure 11A:
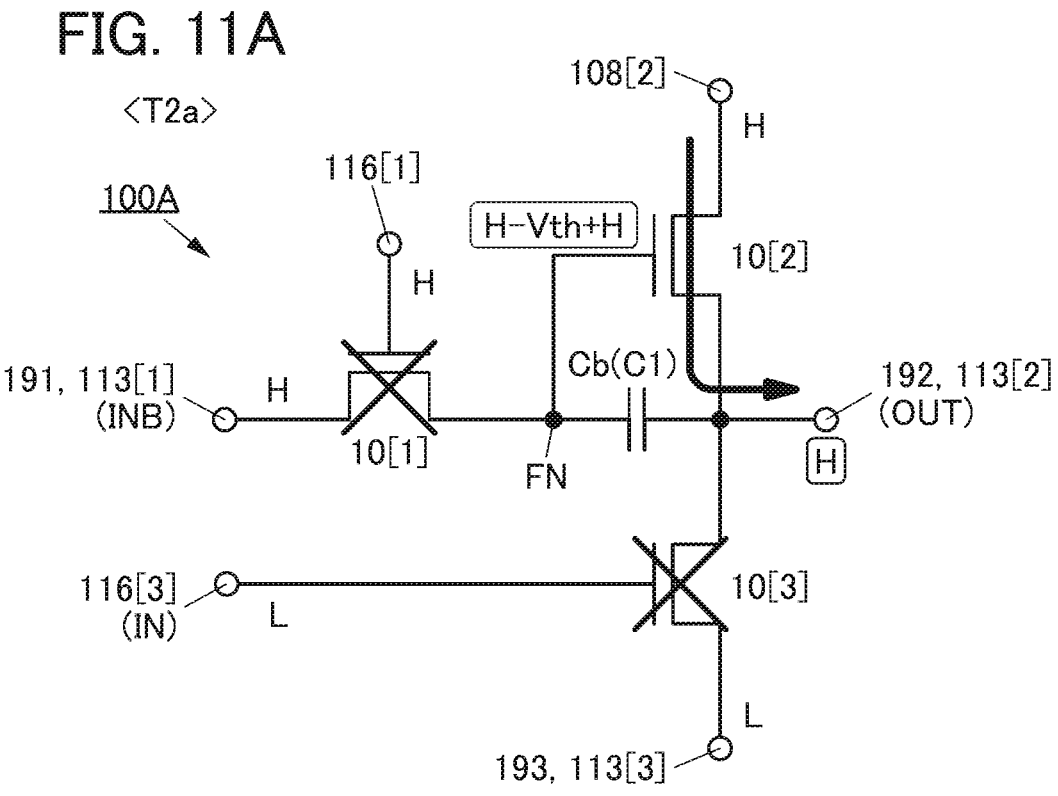
FIGS. 11A and 11B are circuit diagrams for explaining operation examples of a semiconductor device.
Figure 11B:
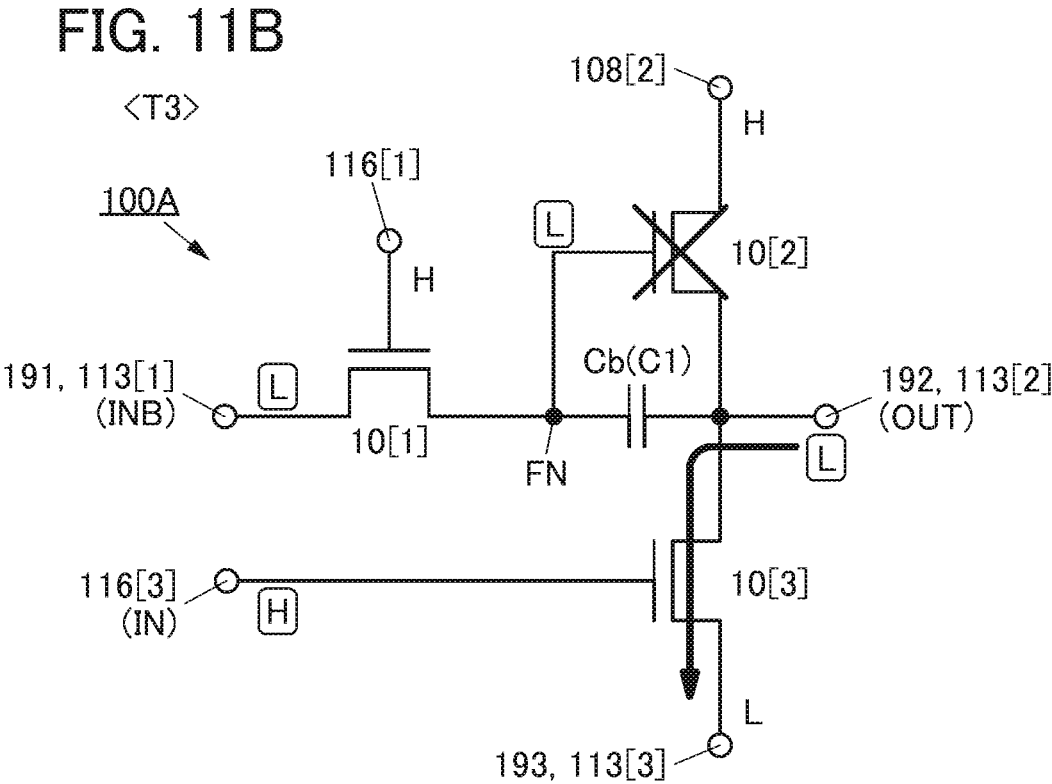

Next, an operation example of the semiconductor device 100A is described. FIG. 9 is a timing chart showing an operation example of the semiconductor device 100A. FIGS. 10A and 10B and FIGS. 11A and 11B are circuit diagrams illustrating operation examples of the semiconductor device 100A.

In the drawings and the like, for easy understanding of the potential of a wiring or an electrode, "H" representing an H potential or "L" representing an L potential is sometimes written near the wiring or the electrode. In addition, enclosed "H" or "L" is sometimes written near a wiring or an electrode whose potential is changed. Moreover, a symbol "x" is sometimes written on a transistor in an off state. Furthermore, arrows indicating current flow are shown in some cases.

A potential H (VDD) is supplied to the conductive layer 116[1] and the conductive layer 108[2], and a potential L (VSS) is supplied to the conductive layer 193 (the conductive layer 113[3]). In the initial state (a state immediately before Time T1), the potential H is supplied to the terminal INB (the conductive layer 191 and the conductive layer 113[1]) and the potential L is supplied to the terminal IN (the conductive layer 116[3]). Thus, the terminal OUT (the conductive layer 192 and the conductive layer 113[2]) has the potential H.

In Time T1 (see FIG. 9 and FIG. 10A), the potential L is supplied to the terminal INB and the potential H is supplied to the terminal IN. When the potential L is supplied to the terminal INB, the potential of the node FN becomes the potential L, so that the transistor 10[2] is turned off. When the potential H is supplied to the terminal IN, the transistor 10[3] is turned on and the potential of the terminal OUT becomes the potential L.

In Time T2 (see FIG. 9 and FIG. 10B), the potential H is supplied to the terminal INB and the potential L is supplied to the terminal IN, so that the transistor 10[3] is turned off. The potential of the node FN changes from the potential H to a potential lower by the $V_{th}$ of the transistor 10[1] (the potential $H-V_{th}$). Here, the value of the potential $H-V_{th}$ is greater than or equal to $V_{th}$. As a result, the transistor 10[2] is turned on and the potential of the terminal OUT is increased. In Time T2, since the potential of the node FN (the gate potential of the transistor 10[2]) is the potential $H-V_{th}$, the potential of the terminal OUT becomes the potential $H-V_{th}-V_{th}$.

The terminal OUT and the node FN are connected (capacitively coupled) through the capacitor Cb. Accordingly, in accordance with the increase in the potential of the terminal OUT, the potential of the node FN also increases. When the potential of the node FN increases, the transistor 10[1] is turned off and the node FN is brought into a floating state. The capacitor Cb serves as a bootstrap capacitor. By the capacitive coupling between the terminal OUT and the node FN through the capacitor Cb, the potential of the node FN increases to the potential $H-V_{th}$+the potential H (2×the potential $H-V_{th}$) (Time T2a, see FIG. 9, FIG. 11A). Since this potential is higher than the potential $H+V_{th}$, the potential of the terminal OUT can be the potential H.

In Time T3 (see FIG. 9 and FIG. 11B), when the potential L is supplied to the terminal INB and the potential H is supplied to the terminal IN, the transistor 10[2] is turned off, the transistor 10[3] is turned on, and the potential L is supplied to the terminal OUT.

As described above, the semiconductor device 100A of one embodiment of the present invention is configured to output an inverted signal of a signal input to the terminal IN to the terminal OUT. The semiconductor device 100A of one embodiment of the present invention can surely set the potential of the terminal OUT to the potential H by including the capacitor Cb serving as a bootstrap capacitor. Thus, the semiconductor device 100A of one embodiment of the present invention is configured to increase the amplitude of an input signal attenuated by transmission loss or the like and output the amplified signal.

With the use of the transistors 10 for the semiconductor device 100A, the occupied area of the semiconductor device 100A can be reduced. The use of the transistor 10 as the transistor included in the semiconductor device 100A enables the capacitor C1 to be used as the capacitor Cb. The capacitor Cb does not need to be additionally provided, further reducing the occupied area of the semiconductor device 100A.

The semiconductor device 100A of one embodiment of the present invention includes the terminal IN and the terminal INB as input terminals. One of the transistor 10[2] and the transistor 10[3] is turned off when an inverted signal of the terminal IN is input to the terminal INB. Thus, a current flowing between the conductive layer 108[2] and the conductive layer 193 (also referred to as a "shoot-through current") can be significantly reduced. As a result, the power consumption of the semiconductor device 100A can be reduced.

Figure 12A:
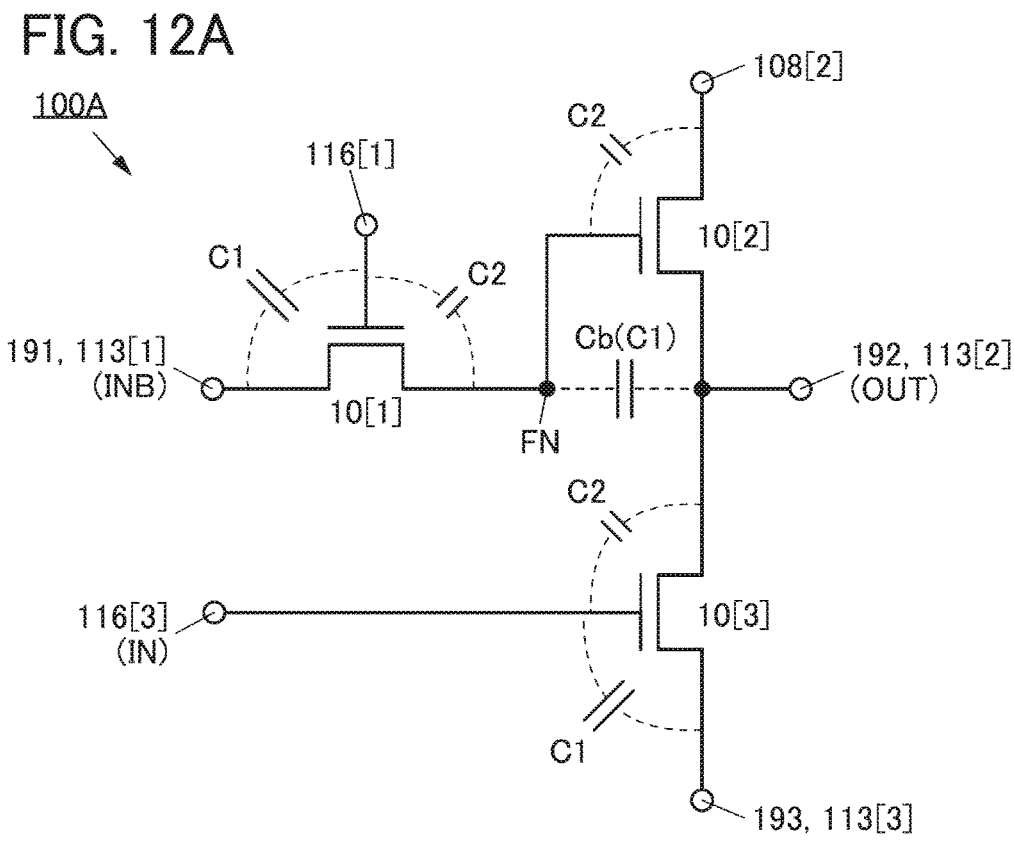
FIGS. 12A and 12B are each a circuit diagram of a semiconductor device.

In order to surely operate the semiconductor device 100A, the capacitance value of parasitic capacitance generated between the node FN and the conductive layer 116[1] is preferably lower than the capacitance value of the capacitor Cb. Thus, in the transistor 10[1], it is preferable that the capacitor C1 be provided between the terminal INB and the conductive layer 116[1] and the capacitor C2 be provided between the node FN and the conductive layer 116[1] (see FIG. 12A). Accordingly, the conductive layer 116[2] is preferably electrically connected to the conductive layer 108[1]. The conductive layer 113[1] is preferably electrically connected to the conductive layer 191.

In the transistor 10[3], the capacitor C1 and the capacitor C2 may be interchanged with each other. Note that in the transistor 10[3], the conductive layer 193 side serves as the source and the terminal OUT side serves as the drain. It is preferable that the capacitor C1 be provided on the source side and the capacitor C2 be provided on the drain side in order that the on state and the off state of the transistor 10[3] are kept more surely. The conductive layer 116[2] is preferably electrically connected to the conductive layer 108[3]. The conductive layer 113[3] is preferably electrically connected to the conductive layer 193.

Figure 12B:
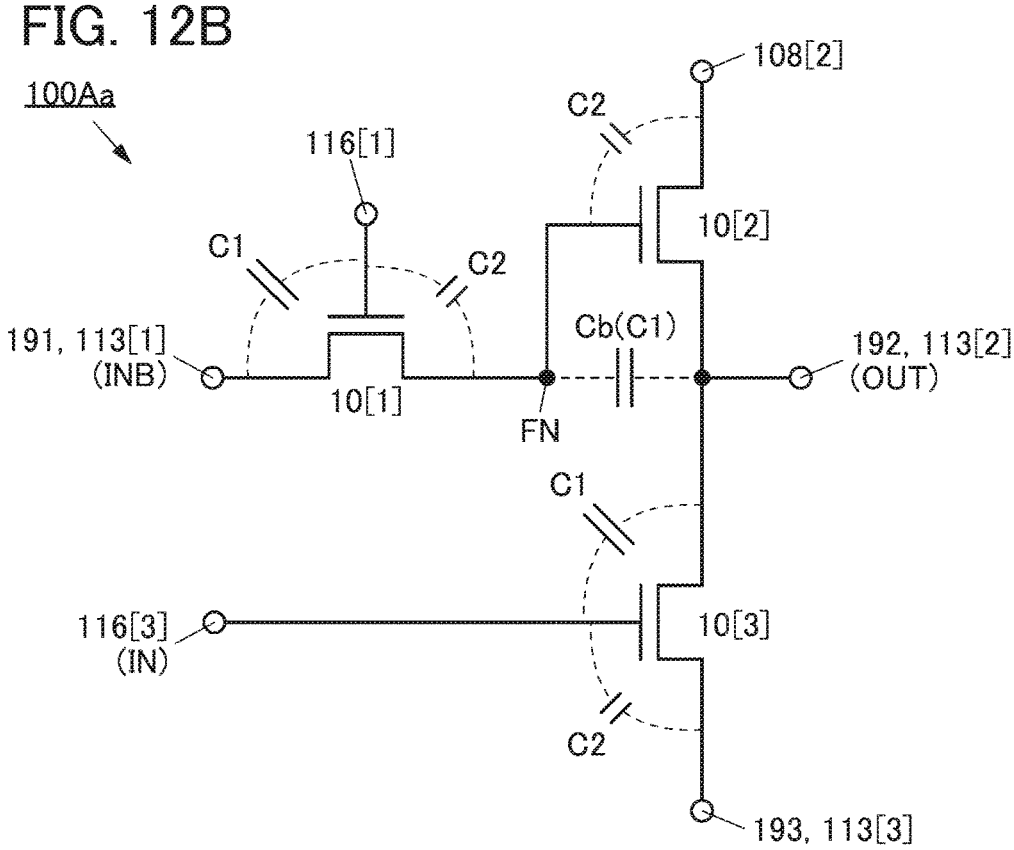

FIG. 12B is an equivalent circuit diagram of a semiconductor device 100Aa, which is a modification example of the semiconductor device 100A. The semiconductor device 100Aa is configured to generate the capacitor C1 on the terminal OUT side and the capacitor C2 on the conductive layer 193 side in the transistor 10[3].

Figure 13:
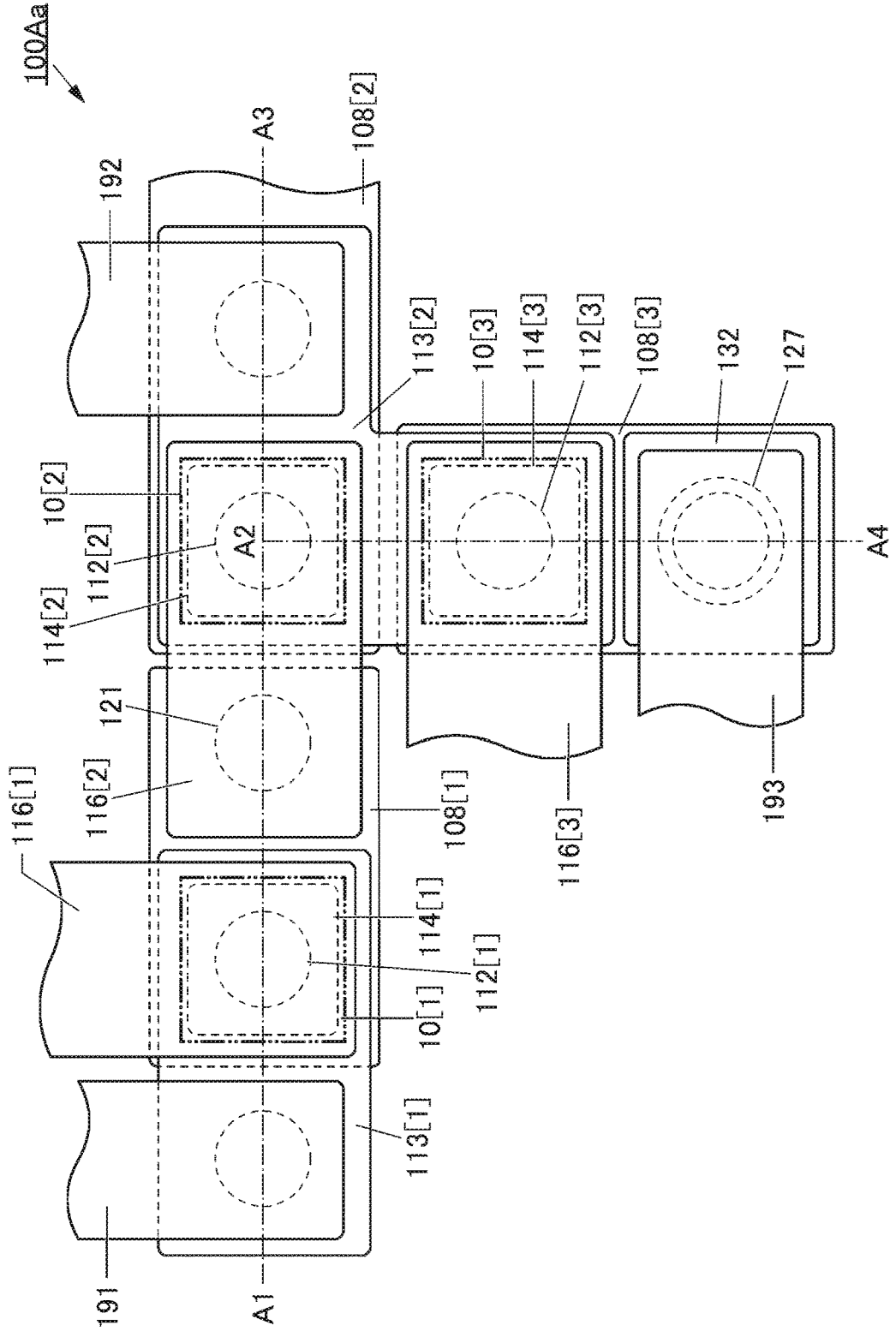
FIG. 13 is a plan view of a semiconductor device.
Figures 14A, 14B:
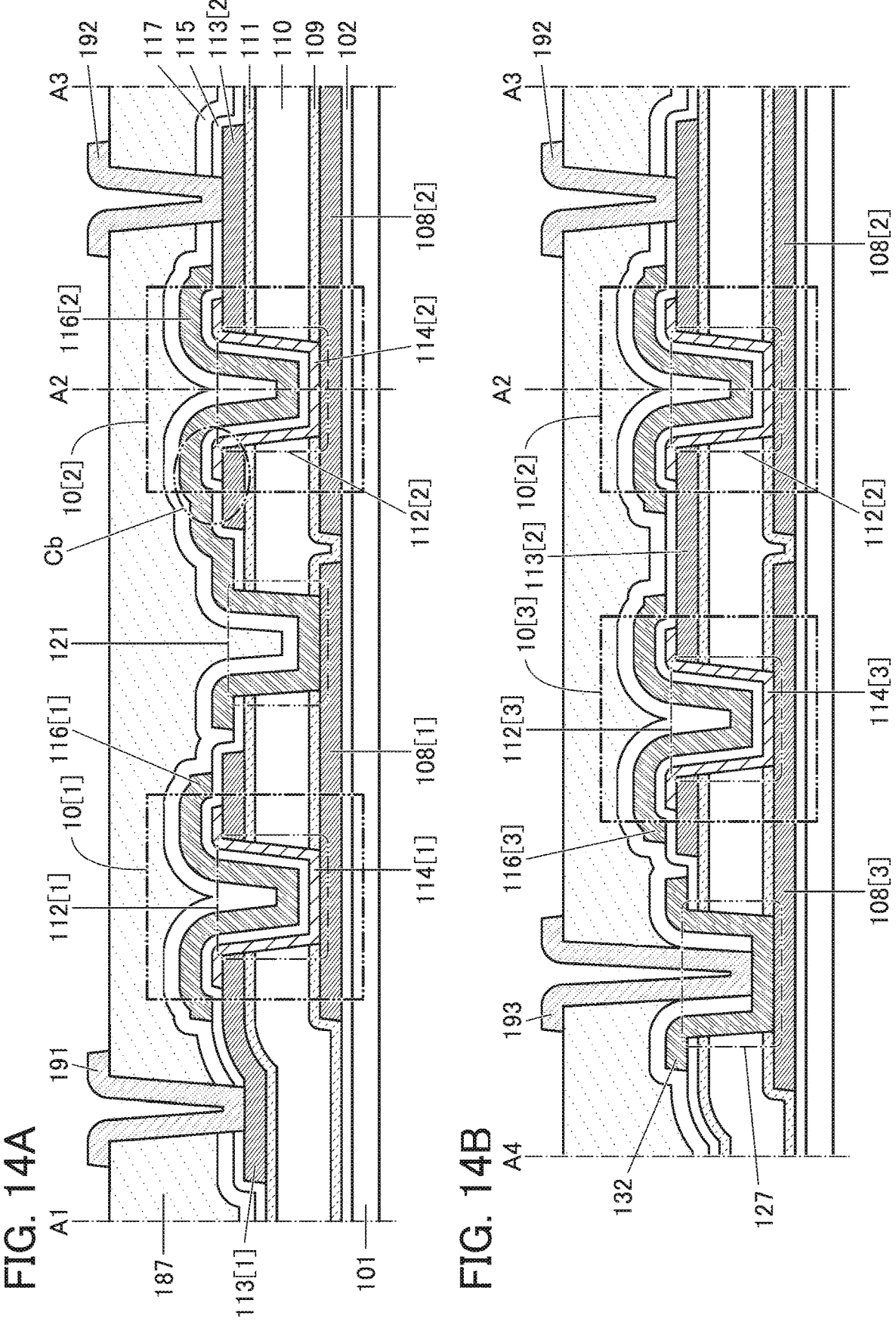
FIGS. 14A and 14B are cross-sectional views of a semiconductor device.

FIG. 13 is a plan view of the semiconductor device 100Aa. FIG. 14A is a cross-sectional view taken along the dashed-dotted line A1-A2-A3 in FIG. 13. FIG. 14B is a cross-sectional view taken along the dashed-dotted line A4-A2-A3 in FIG. 13.

The semiconductor device 100Aa has a region where the conductive layer 113[2] overlaps with the conductive layer 108[3], and the transistor 10[3] is formed in the region. In the semiconductor device 100A, the opening 122 is provided in a region where the conductive layer 113[2] overlaps with the conductive layer 108[3] so that the conductive layer 113[2] and the conductive layer 108[3] are electrically connected to each other; in contrast, in the semiconductor device 100Aa, formation of the opening 122 is unnecessary because electrical connection between the conductive layer 113[2] and the conductive layer 108[3] is not needed. Thus, the area occupied by the semiconductor device 100Aa can be smaller than that occupied by the semiconductor device 100A.

In the semiconductor device 100Aa, in the region overlapping with the conductive layer 108[3], an opening 127 is formed in the insulating layer 115, the insulating layer 111, the insulating layer 110, and the insulating layer 109. The opening 127 can be formed in the same step as the opening 121. A conductive layer 132 covering the opening 127 is provided over the insulating layer 115. The conductive layer 132 can be formed with the same material and in the same step as the conductive layer 116. The conductive layer 132 is electrically connected to the conductive layer 108[3] in a bottom portion of the opening 127. In the semiconductor device 100Aa, the conductive layer 193 is electrically connected to the conductive layer 132 in an opening overlapping with the conductive layer 132.

Note that the technical idea shown using the semiconductor device 100Aa can also be applied to a semiconductor device 100B, a semiconductor device 100C, and the like described later.

Figure 15:
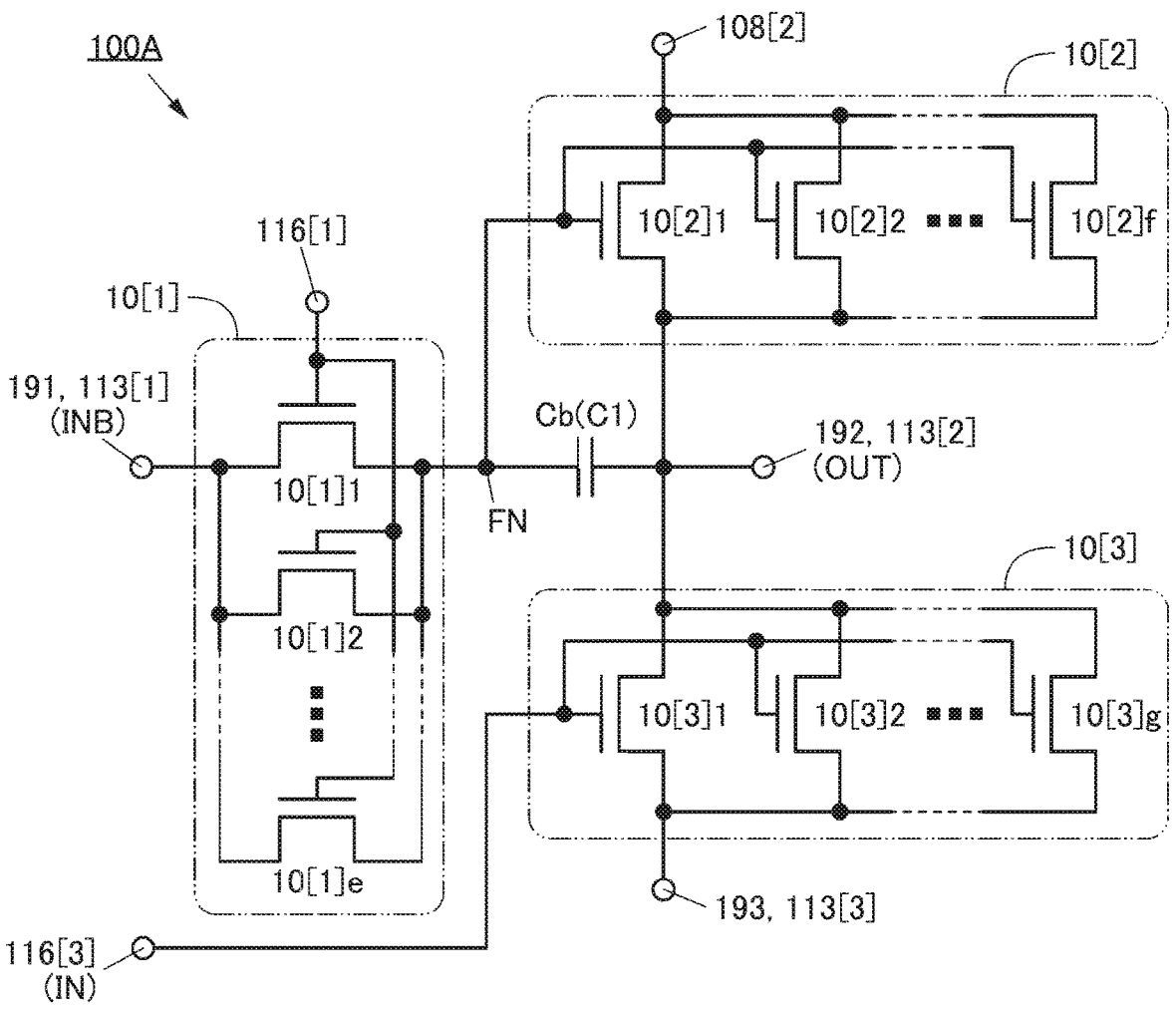
FIG. 15 is a circuit diagram of a semiconductor device.

Each of the transistor 10[1], the transistor 10[2], and the transistor 10[3] may be formed with a plurality of transistors arranged in parallel. FIG. 15 illustrates an example of a circuit configuration of the semiconductor device 100A.

FIG. 15 illustrates an example where the transistor 10[1] is formed with e transistors 10 (a transistor 10[1]1 and transistors 10[1]2 to 10[1]e) connected in parallel (e is an integer greater than or equal to 2). FIG. 15 illustrates an example where the transistor 10[2] is formed with f transistors 10 (a transistor 10[2]1 and transistors 10[2]2 to 10[2]f) connected in parallel (f is an integer greater than or equal to 2). FIG. 15 illustrates an example where the transistor 10[3] is formed with g transistors 10 (a transistor 10[3]1 and transistors 10[3]2 to 10[3]g) connected in parallel (g is an integer greater than or equal to 2). Note that e, f and g may be the same number or different numbers. Alternatively, two of e, f, and g may be the same number.

An increase in the number of transistors arranged in parallel included in the transistor 10[1] can increase the operation speed of the semiconductor device 100A. This can shorten (the) time from input of a signal (a potential) to the terminal IN to output of a signal corresponding to the input signal from the terminal OUT (that is, delay time).

The semiconductor device 100A of one embodiment of the present invention has high input impedance and low output impedance. An increase in the number of transistors arranged in parallel included in the transistor 10[2] can decrease the output impedance at the time when the potential H is output from the terminal OUT of the semiconductor device 100A. An increase in the number of transistors arranged in parallel included in the transistor 10[3] can decrease the output impedance at the time when the potential L is output from the terminal OUT of the semiconductor device 100A.

Figure 16A:
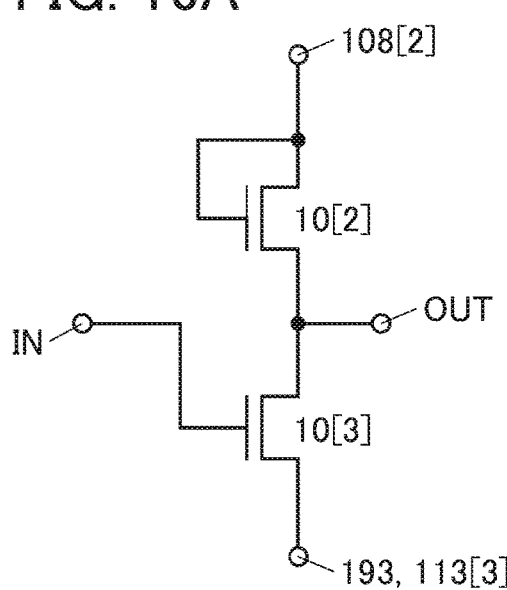
FIGS. 16A to 16C are each a circuit diagram of a semiconductor device.
Figure 16B:
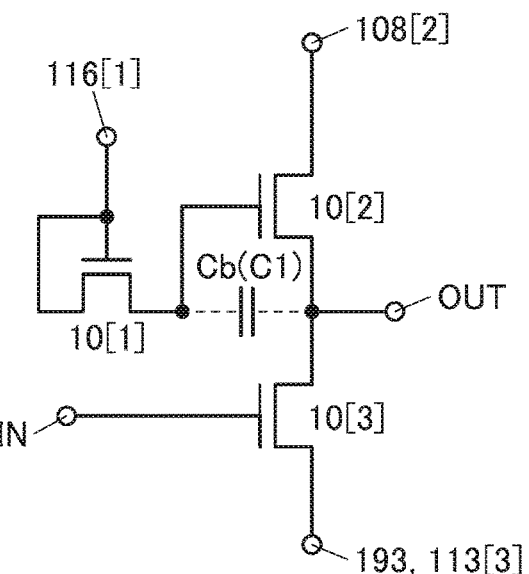
Figure 16C:
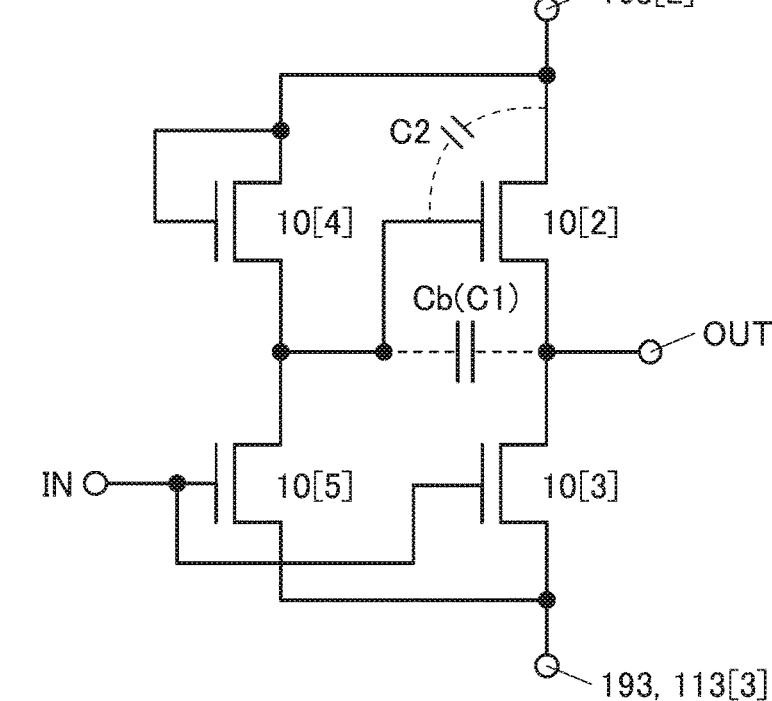

The transistor 10 of one embodiment of the present invention may be used in the inverter circuits illustrated in FIGS. 16A to 16C. Each of the inverter circuits in FIGS. 16A to 16C includes one input terminal (the terminal IN) and one output terminal (the terminal OUT).

The inverter circuit in FIG. 16A has a configuration similar to the connection configuration between the transistor 10[2] and the transistor 10[3] in the semiconductor device 100A. In the inverter circuit in FIG. 16A, a gate and one of a source and a drain of the transistor 10[2] are electrically connected to the conductive layer 108[2], and the other of the source and the drain is electrically connected to the terminal OUT and the one of the source and the drain of the transistor 10[3]. The other of the source and the drain of the transistor 10[3] is electrically connected to the conductive layer 193, and the gate of the transistor 10[3] is electrically connected to the terminal IN.

In the inverter circuit in FIG. 16A, in the case where the potential L is supplied to the terminal IN, the potential supplied to the terminal OUT becomes a potential lower than the potential H by $V_{th}$ of the transistor 10[2]. In the case where the potential H is supplied to the terminal IN, a shoot-through current is likely to be generated between the conductive layer 108[2] and the conductive layer 193. However, in the inverter circuit in FIG. 16A, the number of transistors included in the inverter circuit can be decreased. With the use of the vertical-channel transistor of one embodiment of the present invention as the transistor included in the inverter circuit in FIG. 16A, the occupied area of the inverter circuit can be reduced.

In the semiconductor device 100A, as long as the decrease in the output potential is acceptable, the capacitor C2 of the transistor 10[2] may be provided on the source side of the transistor 10[2] (on the terminal OUT side) and the capacitor C1 may be provided on the drain side of the transistor 10[2]. In that case, the conductive layer 108[2] is electrically connected to the conductive layer 192 (the terminal OUT) and the potential H (VDD) is supplied to the conductive layer 113[2]. Note that the technical idea can be applied to not only the semiconductor device 100A but also the semiconductor device 100Aa and the semiconductor devices 100B and 100C to be described later, for example.

The inverter circuit in FIG. 16B has a configuration in which one of the source and the drain of the transistor 10[1] included in the semiconductor device 100A in FIG. 8A is electrically connected to the gate of the transistor 10[1], and the terminal INB is not provided. Specifically, the conductive layer 191 (or the conductive layer 113[1]) is electrically connected to the conductive layer 116[1].

In the inverter circuit in FIG. 16B, in the case where the potential H is supplied to the terminal IN, a shoot-through current is likely to be generated between the conductive layer 108[2] and the conductive layer 193. However, in the case where the potential L is supplied to the terminal IN, the potential H can be surely output from the terminal OUT due to the presence of the bootstrap capacitor (the capacitor Cb). Furthermore, since the number of input terminals is smaller than that in the semiconductor device 100A in FIG. 8A, the occupied area of the inverter circuit can be further reduced.

The inverter circuit in FIG. 16C has a configuration where the transistor 10[1] is removed from the semiconductor device 100A in FIG. 16B and the inverter circuit in FIG. 16A is added. In the inverter circuit in FIG. 16C, one of the source and the drain of the transistor 10[2] is electrically connected to the conductive layer 108[2], one of a source and a drain of a transistor 10[4], and a gate of the transistor 10[4]. The gate of the transistor 10[2] is electrically connected to the one terminal of the capacitor Cb, the other of the source and the drain of the transistor 10[4], and one of a source and a drain of a transistor 10[5]. The other of the source and the drain of the transistor 10[5] is electrically connected to the other of the source and the drain of the transistor 10[3] and the conductive layer 193. The gate of the transistor 10[3] and a gate of the transistor 10[5] are electrically connected to the terminal IN.

The vertical-channel transistor of one embodiment of the present invention is preferably used as the transistor included in the inverter circuit in FIG. 16C. The vertical-channel transistor of one embodiment of the present invention is preferably used as at least the transistor 10[2] of the inverter circuit in FIG. 16C. Specifically, the transistor of one embodiment of the present invention is placed such that the capacitor C2 is provided between the one of the source and the drain of the transistor 10[2] and the gate thereof and the capacitor C1 is provided between the other of the source and the drain of the transistor 10[2] and the gate thereof.

By providing the capacitor C1 having a higher capacitance value than the capacitor C2 between the other of the source and the drain of the transistor 10[2] and the gate thereof, the capacitor C1 can be used as the capacitor Cb. Thus, the capacitor Cb does not need to be provided additionally, reducing the occupied area of the inverter circuit.

In the inverter circuit in FIG. 16C, in the case where the potential H is supplied to the terminal IN, a shoot-through current is likely to be generated between the conductive layer 108[2] and the conductive layer 193. However, in the case where the potential L is supplied to the terminal IN, the potential H can be surely output from the terminal OUT due to the presence of the bootstrap capacitor (the capacitor Cb).

<NAND Circuit>

A configuration example of the semiconductor device 100B serving as an NAND circuit is described as the configuration example of the logic circuit including the transistor 10. The semiconductor device 100B is a semiconductor device of one embodiment of the present invention.

Figure 17:
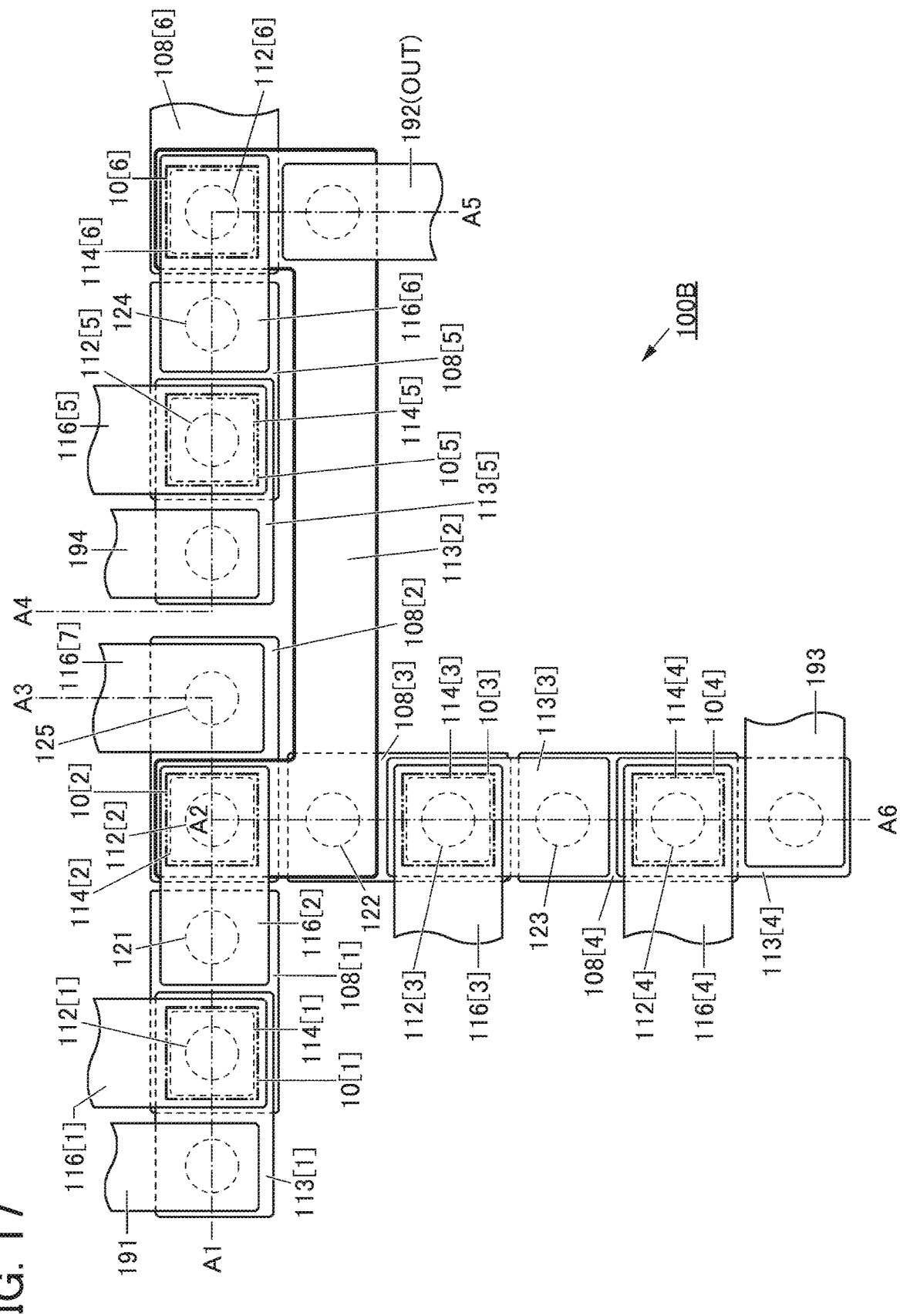
FIG. 17 is a plan view of a semiconductor device.
Figures 18A, 18B:
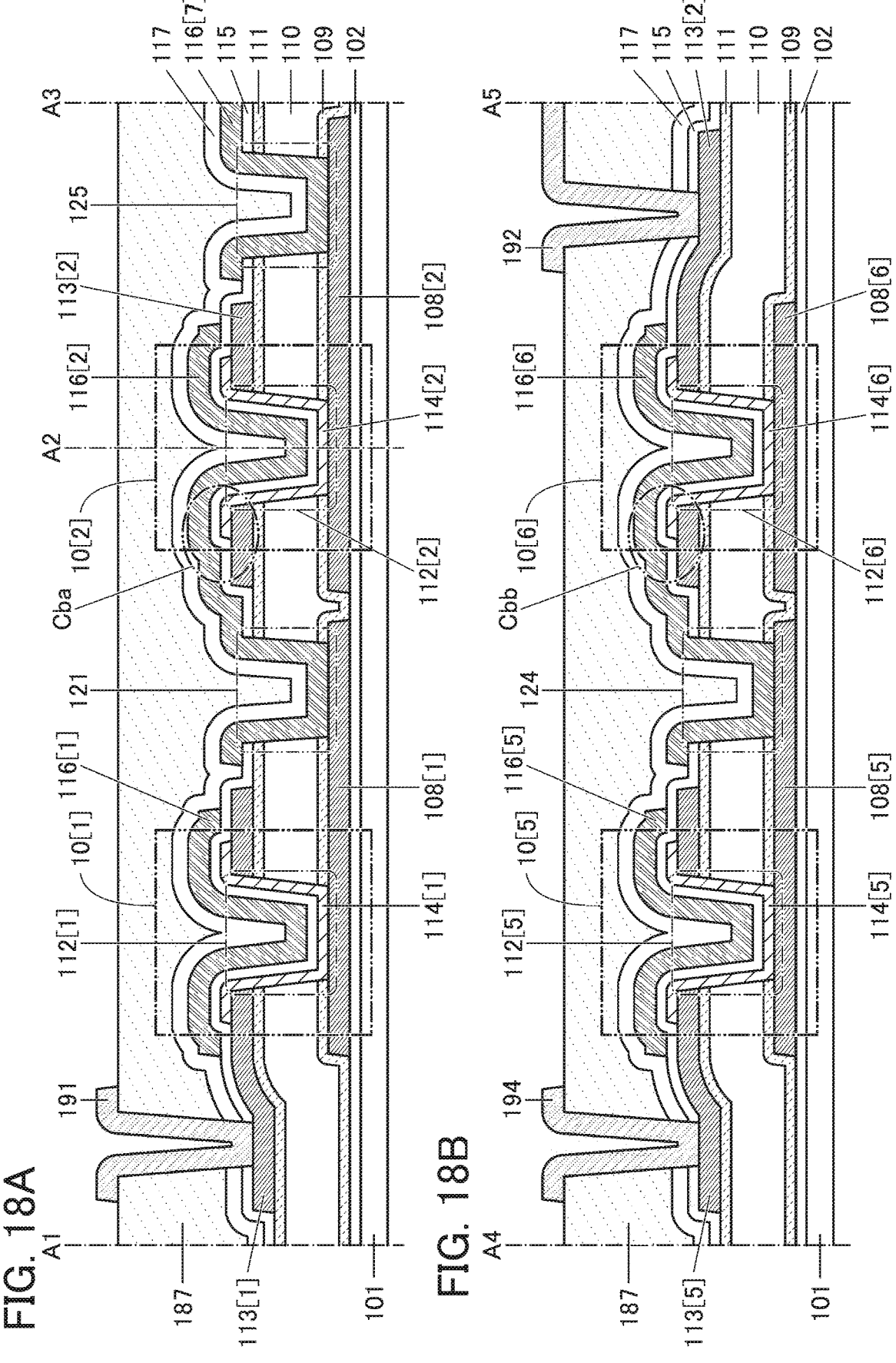
FIGS. 18A and 18B are cross-sectional views of a semiconductor device.
Figure 19:
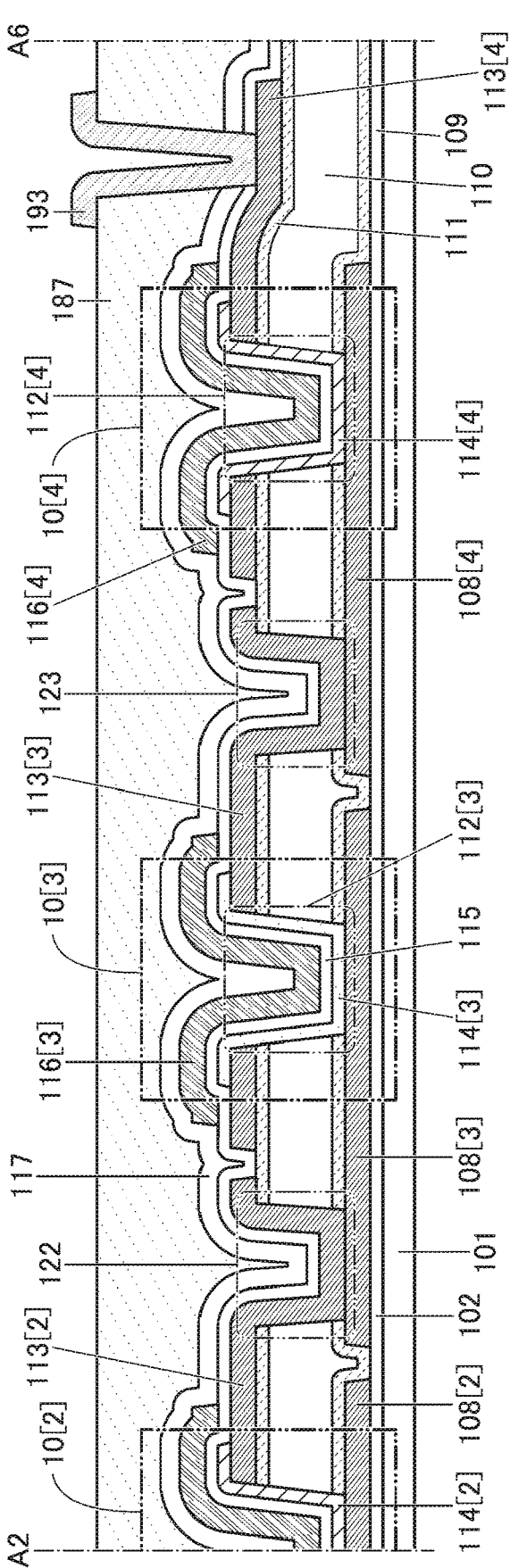
FIG. 19 is a cross-sectional view of a semiconductor device.
Figure 21A:
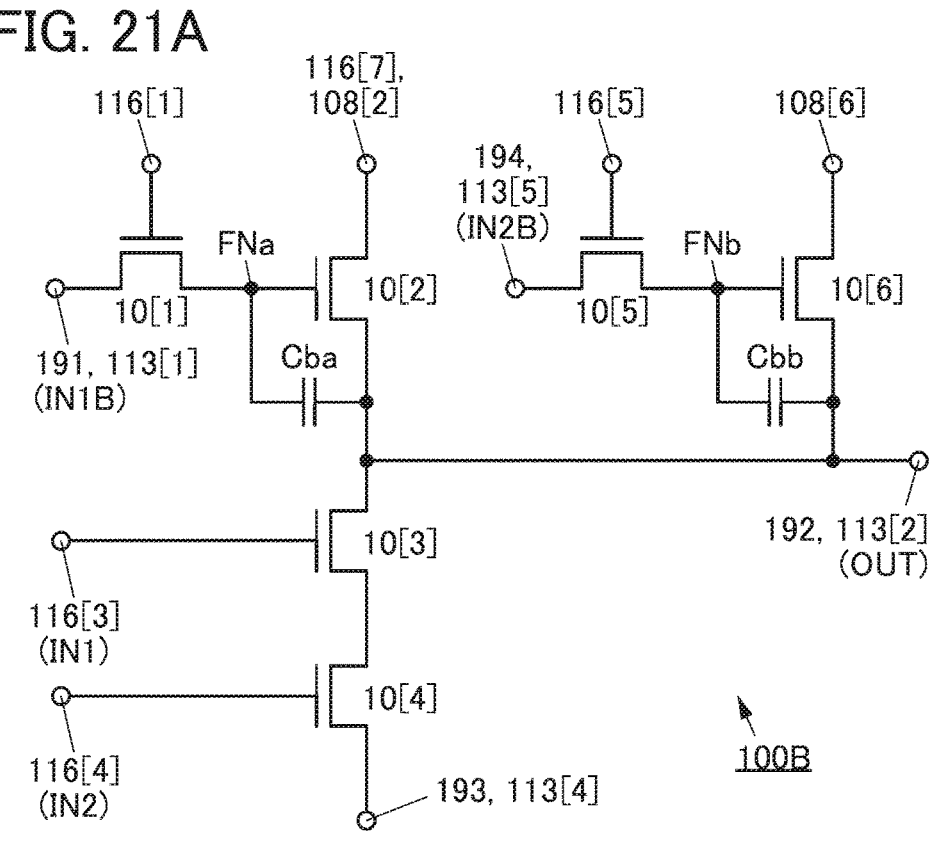
FIGS. 21A and 21B are each a circuit diagram of a semiconductor device.
Figure 21B:
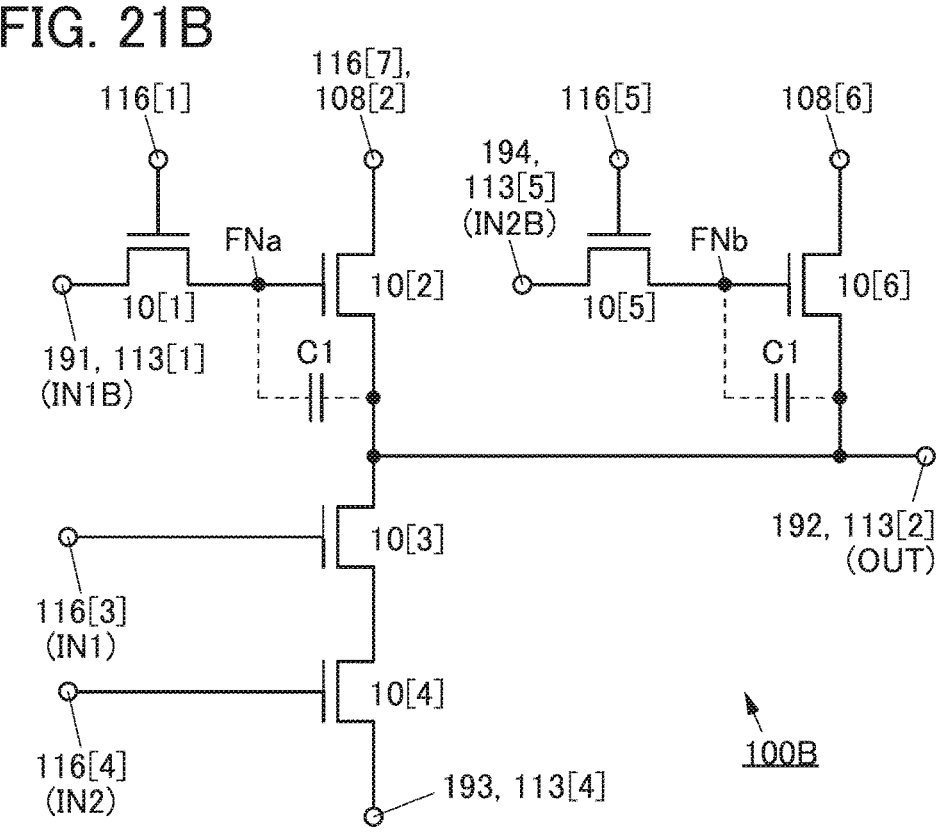
Figures 22A, 22B, 22C:
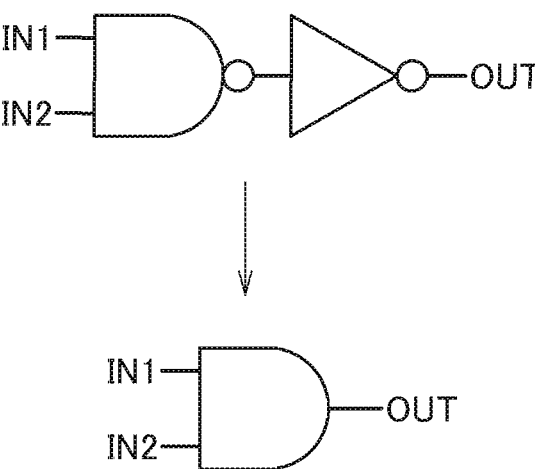
FIGS. 22A and 22C each illustrate a circuit symbol of a NAND circuit.
FIG. 22B is a graph showing combinations of input signals and an output signal.

FIG. 17 is a plan view of the semiconductor device 100B. FIG. 18A is a cross-sectional view taken along the dashed-dotted line A1-A2-A3 in FIG. 17. FIG. 18B is a cross-sectional view taken along the dashed-dotted line A4-A5 in FIG. 17. FIG. 19 is a cross-sectional view taken along the dashed-dotted line A2-A6 in FIG. 17. FIGS. 21A and 21B are equivalent circuit diagrams of the semiconductor device 100B. FIG. 22A shows a circuit symbol of a NAND circuit. FIG. 22B is a graph showing combinations of signals input to a terminal IN1 and a terminal IN2 and a signal output to the terminal OUT. FIG. 22C shows circuit symbols of a NAND circuit, a NOT circuit, and an AND circuit.

First, the circuit configuration of the semiconductor device 100B is described with reference to the equivalent circuit diagram of FIG. 21A.

The semiconductor device 100B includes the transistor 10[1], the transistor 10[2], the transistor 10[3], the transistor 10[4], the transistor 10[5], a transistor 10[6], a capacitor Cba, and a capacitor Cbb. The semiconductor device 100B includes four input terminals (the terminal IN1, a terminal IN1B, the terminal IN2, and a terminal IN2B) and one output terminal (the terminal OUT) (see FIG. 21A). The potential H or the potential L is input to the terminal IN1, and an inverted signal of the terminal IN1 is input to the terminal IN1B. The potential H or the potential L is input to the terminal IN2, and an inverted signal of the terminal IN2 is input to the terminal IN2B.

In this specification and the like, like the signal supplied to the terminal IN or the terminal INB, a signal supplied to the terminal IN1, the terminal IN1B, the terminal IN2, or the terminal IN2B is referred to as an "input signal".

The one of the source and the drain of the transistor 10[1] is electrically connected to the terminal IN1B. The gate of the transistor 10[1] is electrically connected to the conductive layer 116[1]. The other of the source and the drain of the transistor 10[1] is electrically connected to one terminal of the capacitor Cba and the gate of the transistor 10[2]. A region where the other of the source and the drain of the transistor 10[1], the one terminal of the capacitor Cba, and the gate of the transistor 10[2] are electrically connected to one another functions as a node FNa.

The one of the source and the drain of the transistor 10[2] is electrically connected to the conductive layer 108[2]. The other of the source and the drain of the transistor 10[2] is electrically connected to the other terminal of the capacitor Cba, the terminal OUT, and the one of the source and the drain of the transistor 10[3]. The other of the source and the drain of the transistor 10[3] is electrically connected to the one of the source and the drain of the transistor 10[4]. The other of the source and the drain of the transistor 10[4] is electrically connected to the conductive layer 193. The gate of the transistor 10[3] is electrically connected to the terminal IN1, and the gate of the transistor 10[4] is electrically connected to the terminal IN2.

The one of the source and the drain of the transistor 10[5] is electrically connected to the terminal IN2B. The gate of the transistor 10[5] is electrically connected to a conductive layer 116[5]. The other of the source and the drain of the transistor 10[5] is electrically connected to one terminal of the capacitor Cbb and a gate of the transistor 10[6]. A region where the other of the source and the drain of the transistor 10[5], the one terminal of the capacitor Cbb, and the gate of the transistor 10[6] are electrically connected to one another functions as a node FNb.

One of a source and a drain of the transistor 10[6] is electrically connected to a conductive layer 108[6]. The other of the source and the drain of the transistor 10[6] is electrically connected to the other terminal of the capacitor Cbb, the terminal OUT, and the one of the source and the drain of the transistor 10[3].

In the semiconductor device 100B, a signal output to the terminal OUT is determined by a combination of signals input to the terminal IN1 and the terminal IN2. Thus, in FIGS. 22A and 22C showing the circuit symbols of the semiconductor device 100B, the terminal IN1B and the terminal IN2B are not illustrated.

As shown in FIG. 22B, in the semiconductor device 100B, when the potential H is input to the terminal IN1 and the terminal IN2, the potential L is output to the terminal OUT. When the potential L is input to one or both of the terminal IN1 and the terminal IN2, the potential H is output to the terminal OUT.

The terminal IN of the semiconductor device 100A which is a NOT circuit is connected to the terminal OUT of the semiconductor device 100B which is a NAND circuit, so that an AND circuit is formed (see FIG. 22C).

As illustrated in FIG. 21A, the semiconductor device 100B is a single-polarity NAND circuit formed with only n-channel transistors. Since p-channel transistors are not used for the semiconductor device 100B, the manufacturing cost can be reduced. Furthermore, since steps of forming the p-channel transistors are unnecessary, the manufacturing period is shortened and the manufacturing yield is improved. Note that p-channel transistors may be used for the semiconductor device 100B as needed.

Next, examples of a planar structure and a stacked-layer structure of the semiconductor device 100B are described with reference to FIG. 17 to FIG. 19.

The semiconductor device 100B includes, over the insulating layer 102, the conductive layer 108[1], the conductive layer 108[2], the conductive layer 108[3], a conductive layer 108[4], a conductive layer 108[5], and the conductive layer 108[6] (see FIGS. 18A and 18B and FIG. 19). The conductive layers 108[1] to 108[6] can be formed in a manner similar to that of the conductive layer 108. The conductive layer 113[1], the conductive layer 113[2], the conductive layer 113[3], a conductive layer 113[4], and a conductive layer 113[5] are provided over the insulating layer 111. The conductive layers 113[1] to 113[5] can be formed in a manner similar to that of the conductive layer 113.

The semiconductor device 100B includes the opening 112[1] in a region overlapping with the conductive layer 108[1], the opening 112[2] in a region overlapping with the conductive layer 108[2], the opening 112[3] in a region overlapping with the conductive layer 108[3], an opening 112[4] in a region overlapping with the conductive layer 108[4], an opening 112[5] in a region overlapping with the conductive layer 108[5], and an opening 112[6] in a region overlapping with the conductive layer 108[6]. The openings 112[1] to 112[6] can be formed in a manner similar to that of the opening 112.

The semiconductor device 100B includes the semiconductor layer 114[1] and the conductive layer 116[1]. The semiconductor layer 114[1] is provided over the conductive layer 113[1] and the conductive layer 108[1] and has a region overlapping with the opening 112[1]. The conductive layer 116[1] is provided over the insulating layer 115 and has a region overlapping with the semiconductor layer 114[1]. The semiconductor device 100B includes the semiconductor layer 114[2] and the conductive layer 116[2]. The semiconductor layer 114[2] is provided over the conductive layer 113[2] and the conductive layer 108[2] and has a region overlapping with the opening 112[2]. The conductive layer 116[2] is provided over the insulating layer 115 and has a region overlapping with the semiconductor layer 114[2].

The semiconductor device 100B includes the semiconductor layer 114[3] and the conductive layer 116[3]. The semiconductor layer 114[3] is provided over the conductive layer 113[3] and the conductive layer 108[3] and has a region overlapping with the opening 112[3]. The conductive layer 116[3] is provided over the insulating layer 115 and has a region overlapping with the semiconductor layer 114[3]. The semiconductor device 100B includes a semiconductor layer 114[4] and a conductive layer 116[4]. The semiconductor layer 114[4] is provided over the conductive layer 113[4] and the conductive layer 108[4] and has a region overlapping with the opening 112[4]. The conductive layer 116[4] is provided over the insulating layer 115 and has a region overlapping with the semiconductor layer 114[4].

The semiconductor device 100B includes a semiconductor layer 114[5] and the conductive layer 116[5]. The semiconductor layer 114[5] is provided over the conductive layer 113[5] and the conductive layer 108[5] and has a region overlapping with the opening 112[5]. The conductive layer 116[5] is provided over the insulating layer 115 and has a region overlapping with the semiconductor layer 114[5]. The semiconductor device 100B includes a semiconductor layer 114[6] and a conductive layer 116[6]. The semiconductor layer 114[6] is provided over the conductive layer 113[6] and the conductive layer 108[6] and has a region overlapping with the opening 112[6]. The conductive layer 116[6] is provided over the insulating layer 115 and has a region overlapping with the semiconductor layer 114[6].

The semiconductor layers 114[1] to 114[6] can be formed in a manner similar to that of the semiconductor layer 114. The conductive layers 116[1] to 116[6] can be formed in a manner similar to that of the conductive layer 116.

In a region overlapping with the conductive layer 108[1] of the semiconductor device 100B, the opening 121 is provided in the insulating layer 115, the insulating layer 111, the insulating layer 110, and the insulating layer 109 (see FIG. 17 and FIG. 18A). In the opening 121, the conductive layer 116[2] is electrically connected to the conductive layer 108[1].

In a region overlapping with the conductive layer 108[2] of the semiconductor device 100B, an opening 125 is provided in the insulating layer 115, the insulating layer 111, the insulating layer 110, and the insulating layer 109 (see FIG. 17 and FIG. 18A). In the opening 125, a conductive layer 116[7] is electrically connected to the conductive layer 108[2].

In a region overlapping with the conductive layer 108[5] of the semiconductor device 100B, an opening 124 is provided in the insulating layer 115, the insulating layer 111, the insulating layer 110, and the insulating layer 109 (see FIG. 17 and FIG. 18B). In the opening 124, the conductive layer 116[6] is electrically connected to the conductive layer 108[5].

In a region overlapping with the conductive layer 108[3] of the semiconductor device 100B, the opening 122 is provided in the insulating layer 111, the insulating layer 110, and the insulating layer 109 (see FIG. 17 and FIG. 19). In the opening 122, the conductive layer 113[2] is electrically connected to the conductive layer 108[3].

In a region overlapping with the conductive layer 108[4] of the semiconductor device 100B, an opening 123 is provided in the insulating layer 111, the insulating layer 110, and the insulating layer 109 (see FIG. 17 and FIG. 19). In the opening 123, the conductive layer 113[3] is electrically connected to the conductive layer 108[4].

The electrical connection between the conductive layer 116[2] and the conductive layer 108[1] enables the capacitor C1 of the transistor 10[2] to be used as the capacitor Cba. With the use of the capacitor C1 of the transistor 10[2] as the capacitor Cba, another capacitor Cba does not need to be additionally provided, reducing the occupied area of the semiconductor device (see FIG. 18A). For this reason, it is preferable that the conductive layer 116[2] and the conductive layer 108[1] be electrically connected to each other.

The electrical connection between the conductive layer 116[6] and the conductive layer 108[5] enables the capacitor C1 of the transistor 10[6] to be used as the capacitor Cbb. With the use of the capacitor C1 of the transistor 10[6] as the capacitor Cbb, another capacitor Cbb does not need to be additionally provided, reducing the occupied area of the semiconductor device (see FIG. 18B). For this reason, it is preferable that the conductive layer 116[6] and the conductive layer 108[5] be electrically connected to each other.

Like the semiconductor device 100A, the semiconductor device 100B includes the insulating layer 187 over the insulating layer 117. The insulating layer 187 preferably serves as a planarization layer for reducing difference in level generated by a transistor, a capacitor, a wiring, and the like below the insulating layer 187.

The semiconductor device 100B includes the conductive layer 191, the conductive layer 192, the conductive layer 193, and the conductive layer 194 over the insulating layer 187 (see FIGS. 18A and 18B and FIG. 19). The conductive layers 191 to 194 can be formed with the same material by the same method as those of the other conductive layers.

In the semiconductor device 100B, an opening is formed in the insulating layer 187, the insulating layer 117, and the insulating layer 115 in each of a region overlapping with the conductive layer 113[1], a region overlapping with the conductive layer 113[2], a region overlapping with the conductive layer 113[4], and a region overlapping with the conductive layer 113[5].

The conductive layer 191 is electrically connected to the conductive layer 113[1] in an opening overlapping with the conductive layer 113[1]. The conductive layer 192 is electrically connected to the conductive layer 113[2] in the opening overlapping with the conductive layer 113[2]. The conductive layer 193 is electrically connected to the conductive layer 113[4] in the opening overlapping with the conductive layer 113[4]. The conductive layer 194 is electrically connected to the conductive layer 113[5] in an opening overlapping with the conductive layer 113[5].

In the semiconductor device 100B, the conductive layer 191 serves as the terminal IN1B, and the conductive layer 116[3] serves as the terminal IN1. The conductive layer 194 serves as the terminal IN2B, the conductive layer 116[4] serves as the terminal IN2, and the conductive layer 192 serves as the terminal OUT.

Figure 20:
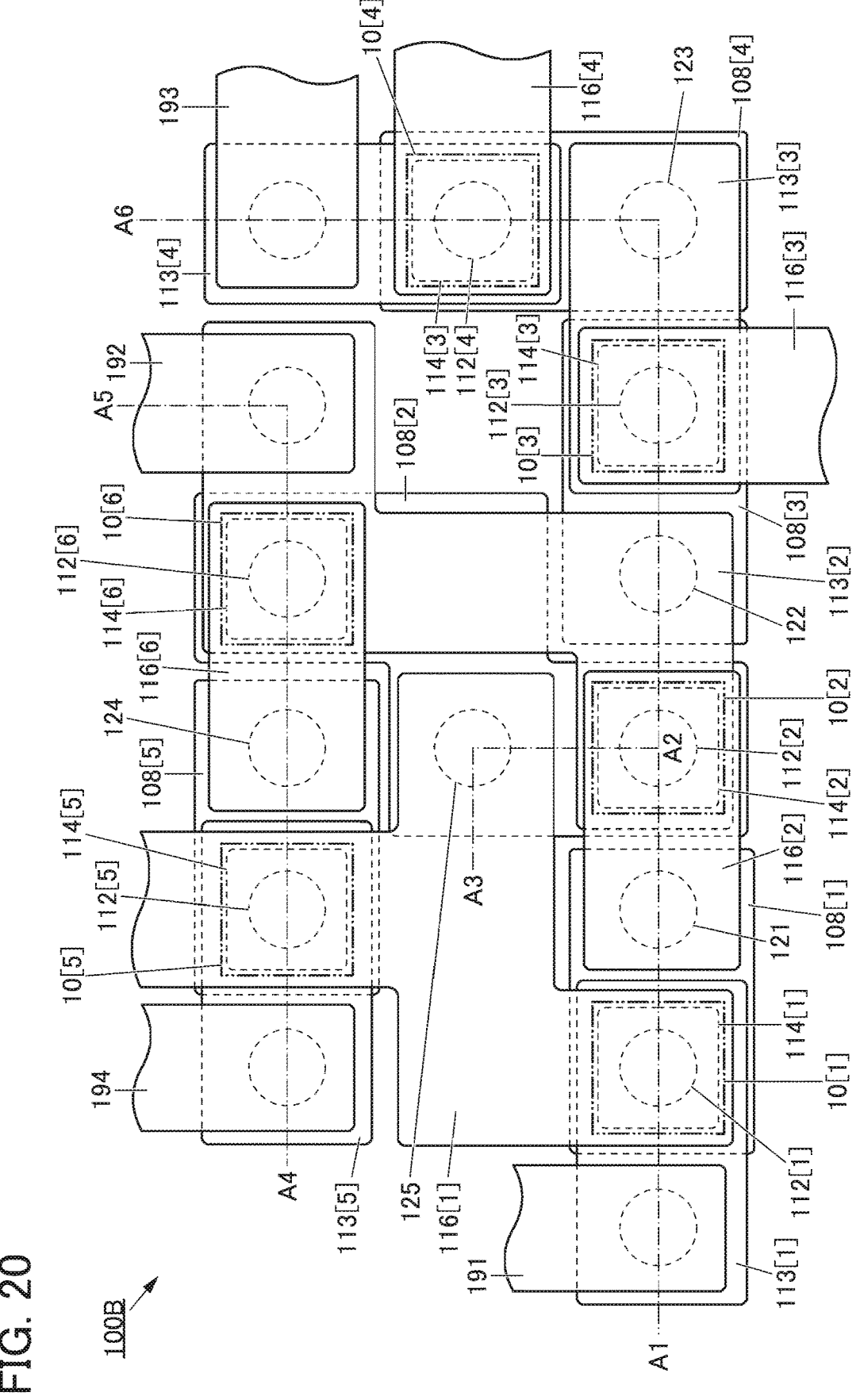
FIG. 20 is a plan view of a semiconductor device.

FIG. 20 illustrates a modification example of the planar structure in FIG. 17. In the planar structure in FIG. 20, the conductive layer 116[1] also serves as the conductive layers 116[5] and 116[7]. In addition, in the planar structure in FIG. 20, the conductive layer 108[2] also serves as the conductive layer 108[6].

A cross-sectional view taken along the dashed-dotted line A1-A2-A3 in FIG. 20 corresponds to the cross-sectional view of FIG. 18A. In that case, the conductive layer 116[7] in FIG. 18A is replaced with the conductive layer 116[1]. A cross-sectional view taken along the dashed-dotted line A4-A5 in FIG. 20 corresponds to the cross-sectional view of FIG. 18B. In that case, the conductive layer 116[5] in FIG. 18B is replaced with the conductive layer 116[1]. The conductive layer 108[6] in FIG. 18B is replaced with the conductive layer 108[2]. A cross-sectional view taken along the dashed-dotted line A2-A6 in FIG. 20 corresponds to the cross-sectional view of FIG. 19.

With the use of one conductive layer as the conductive layer 116[1], the conductive layer 116[5], and the conductive layer 116[7], the area occupied by the semiconductor device 100B can be reduced. With the use of one conductive layer as the conductive layer 108[2] and the conductive layer 108[6], the area occupied by the semiconductor device 100B can be further reduced.

In order that the capacitor C1 of the transistor 10[2] is used as the capacitor Cba in the semiconductor device 100B illustrated in the circuit diagrams of FIGS. 21A and 21B, it is important to use the transistor (vertical-channel transistor) of one embodiment of the present invention as the transistor 10[2]. In order that the capacitor C1 of the transistor 10[6] is used as the capacitor Cbb, it is important to use the transistor (vertical-channel transistor) of one embodiment of the present invention as the transistor 10[6].

Transistors other than the transistor of one embodiment of the present invention may be used as transistors other than the transistors 10[2] and 10[6]. However, a large number of the transistors of one embodiment of the present invention are preferably used for the semiconductor device 100B in order to achieve a semiconductor device with a small occupied area. Therefore, all the transistors included in the semiconductor device 100B are preferably the transistors of one embodiment of the present invention.

Figure 23:
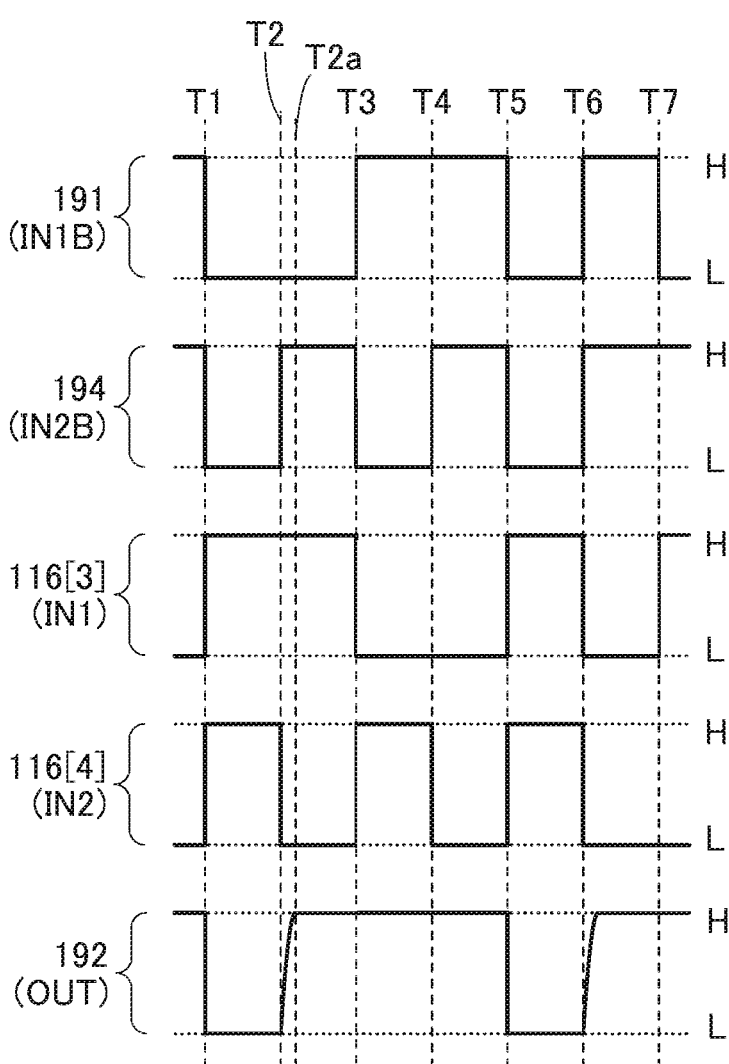
FIG. 23 is a timing chart for explaining an operation example of a semiconductor device.
Figure 24A:
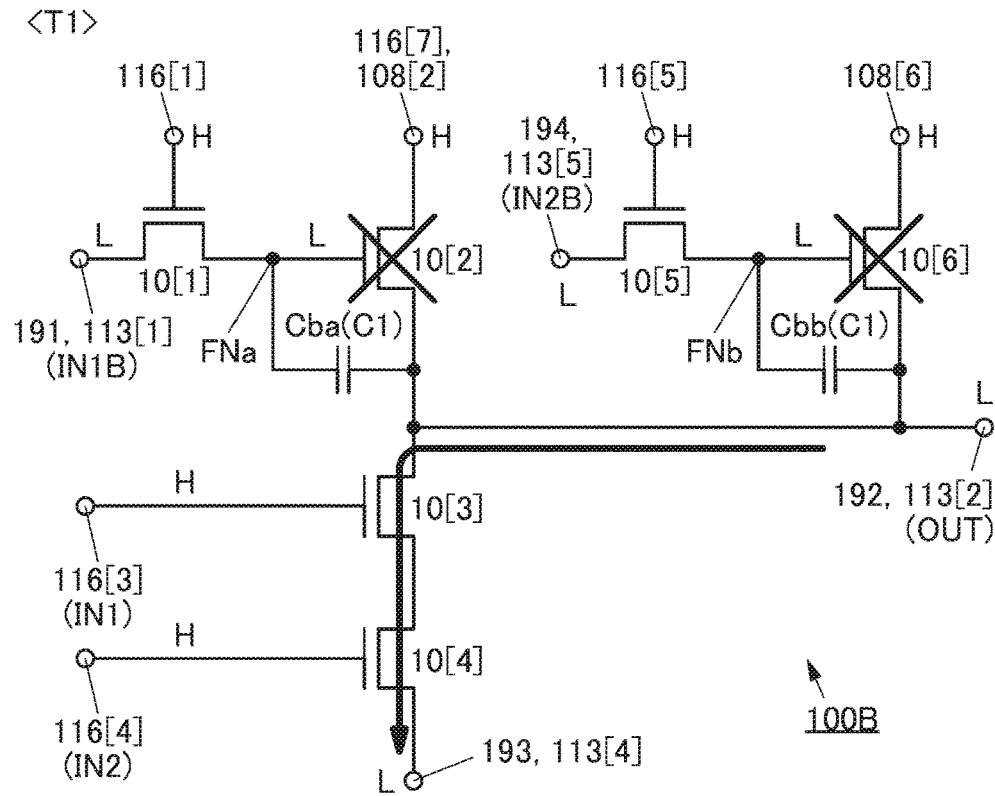
FIGS. 24A and 24B are each a circuit diagram for explaining an operation example of a semiconductor device.
Figure 24B:
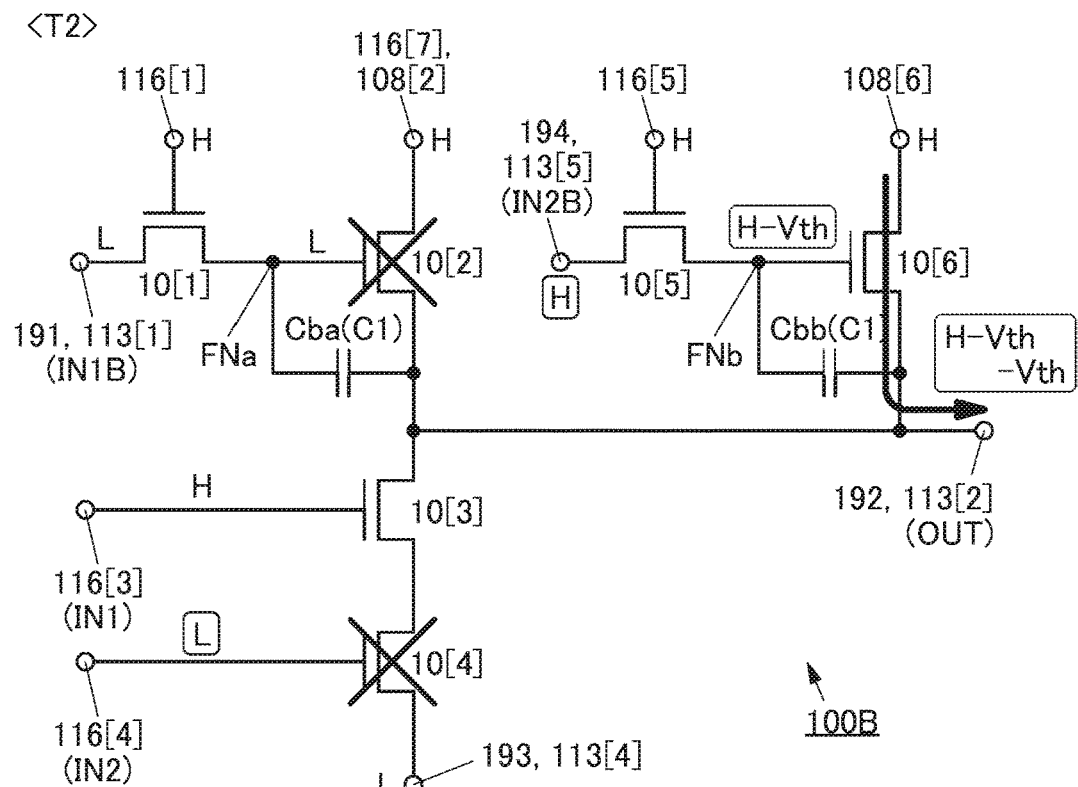

Next, an operation example of the semiconductor device 100B is described. FIG. 23 is a timing chart showing an operation example of the semiconductor device 100B. FIGS. 24A and 24B and FIGS. 25A and 25B are circuit diagrams illustrating operation examples of the semiconductor device 100B.

The potential H (VDD) is supplied to the conductive layer 116[1], the conductive layer 116[7] (the conductive layer 108[2]), the conductive layer 116[5], and the conductive layer 108[6], and the potential L (VSS) is supplied to the conductive layer 193 (the conductive layer 113[4]). In the initial state (a state immediately before Time T1), the potential H is supplied to the terminal IN1 (the conductive layer 116[3]) (the potential L is supplied to the terminal IN1B (the conductive layer 191 and the conductive layer 113[1])) and the potential H is supplied to the terminal IN2 (the conductive layer 116[4]) (the potential L is supplied to the terminal IN2B (the conductive layer 194 and the conductive layer 113[5])). Thus, the terminal OUT (the conductive layer 192 and the conductive layer 113[2]) has the potential H.

In Time T1 (see FIG. 23 and FIG. 24A), when the potential H is supplied to the terminal IN1 (the potential L is supplied to the terminal IN1B), the transistor 10[3] is turned on. The potential of the node FNa becomes the potential L, and the transistor 10[2] is turned off In Time T1, when the potential H is supplied to the terminal IN2 (the potential L is supplied to the terminal IN2B), the transistor 10[4] is turned on. The potential of the node FNb becomes the potential L, and the transistor 10[6] is turned off. Since the transistor 10[2] and the transistor 10[6] are turned off and the transistor 10[3] and the transistor 10[4] are turned on, the potential of the terminal OUT becomes the potential L.

In Time T2 (see FIG. 23 and FIG. 24B), the potential H is supplied to the terminal IN2B (the potential L is supplied to the terminal IN2), so that the transistor 10[4] is turned off. The potential of the node FNb changes from the potential H to a potential lower by the $V_{th}$ of the transistor 10[5] (the potential H–$V_{th}$). Here, the value of the potential H–$V_{th}$ is greater than or equal to $V_{th}$. As a result, the transistor 10[6] is turned on and the potential of the terminal OUT is increased. In Time T2, since the potential of the node FNb (the gate potential of the transistor 10[6]) is the potential H–$V_{th}$, the potential of the terminal OUT becomes the potential H–$V_{th}$–$V_{th}$.

The terminal OUT and the node FNb are connected (capacitively coupled) through the capacitor Cbb. Accordingly, in accordance with the increase in the potential of the terminal OUT, the potential of the node FNb also increases. When the potential of the node FNb increases, the transistor 10[5] is turned off and the node FNb is brought into a floating state. The capacitor Cbb serves as a bootstrap capacitor. By the capacitive coupling between the terminal OUT and the node FNb through the capacitor Cbb, the potential of the node FNb increases to the potential H–$V_{th}$+ the potential H ($2\times$the potential H–$V_{th}$) (Time T2a, see FIG. 23, FIG. 25A). Since this potential is higher than the potential H+$V_{th}$, the potential of the terminal OUT can be the potential H.

In Time T3, in the case where the potential L is supplied to the terminal IN1 and the potential H is supplied to the terminal IN2, the potential H is supplied to the terminal OUT through the transistor 10[2]. In Time T4, also in the case where the potential L is supplied to the terminal IN1 and the terminal IN2, the potential H is supplied to the terminal OUT.

Figure 25A:
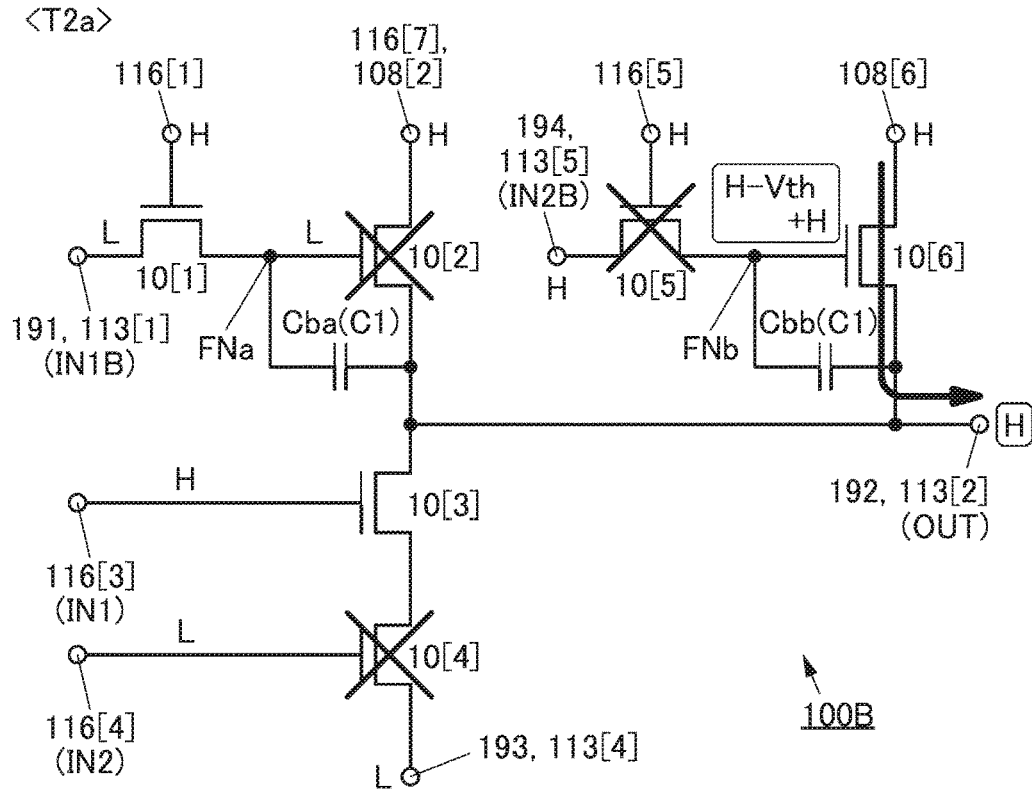
FIGS. 25A and 25B are each a circuit diagram for explaining an operation example of a semiconductor device.
Figure 25B:
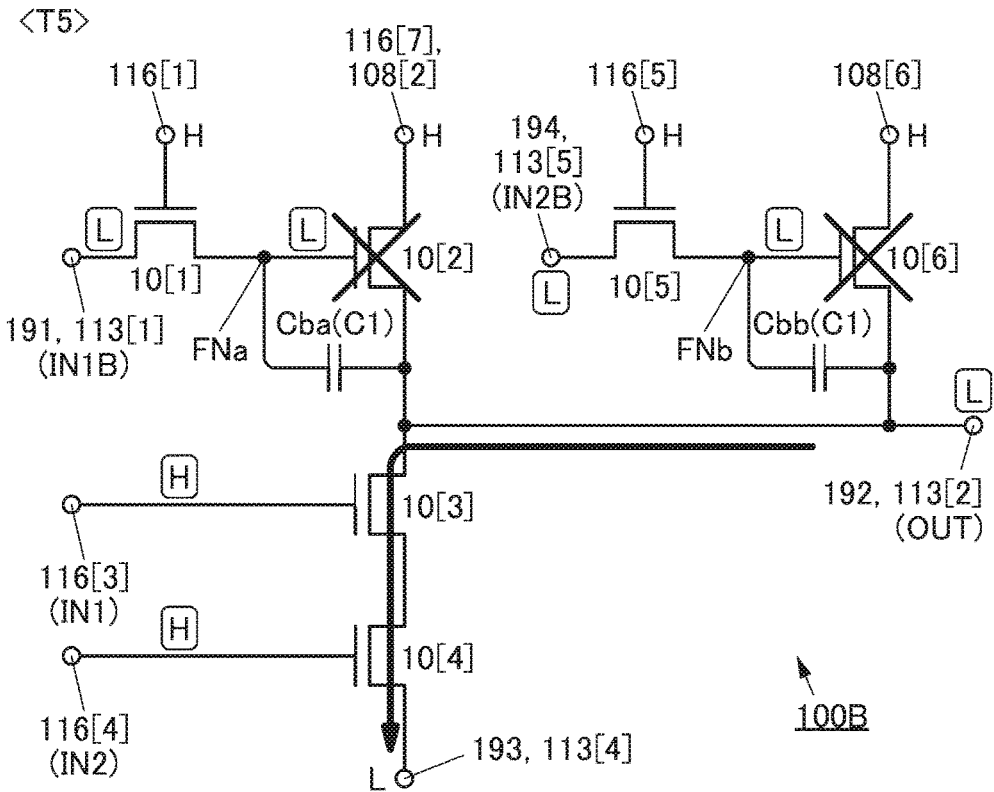

In Time T5, when the potential H is supplied to the terminal IN1 and the terminal IN2, the transistor 10[2] and the transistor 10[6] are turned off and the transistor 10[3] and the transistor 10[4] are turned on, so that the potential L is supplied to the terminal OUT (see FIG. 23 and FIG. 25B).

As described above, the semiconductor device 100B of one embodiment of the present invention is configured to determine a signal output to the terminal OUT in accordance with a combination of signals input to the terminal IN1 and the terminal IN2. In other words, the semiconductor device 100B is configured to determine a signal output to the terminal OUT in accordance with a combination of signals input to the terminal IN1B and the terminal IN2B. The semiconductor device 100B of one embodiment of the present invention can surely set the potential of the terminal OUT to the potential H by including the capacitors Cba and Cbb serving as a bootstrap capacitor.

With the use of the transistors 10 for the semiconductor device 100B, the occupied area of the semiconductor device 100B can be reduced. The use of the transistor 10 as the transistor included in the semiconductor device 100B enables the capacitor C1 to be used as the capacitor Cba and the capacitor Cbb. The capacitor Cba and the capacitor Cbb do not need to be additionally provided, further reducing the occupied area of the semiconductor device 100B.

The semiconductor device 100B of one embodiment of the present invention includes the terminal IN1 and the terminal IN1B as input terminals and inputs an inverted signal of the terminal IN1 to the terminal IN1B, so that a shoot-through current between the conductive layer 116[7] (the conductive layer 108[2]) and the conductive layer 193 (the conductive layer 113[4]) can be significantly reduced. Furthermore, the semiconductor device 100B includes the terminal IN2 and the terminal IN2B as input terminals and inputs an inverted signal of the terminal IN2 to the terminal IN2B, so that a shoot-through current between the conductive layer 108[6] and the conductive layer 193 (the conductive layer 113[4]) can be significantly reduced. Thus, the semiconductor device 100B can have reduced power consumption.

Figure 26:
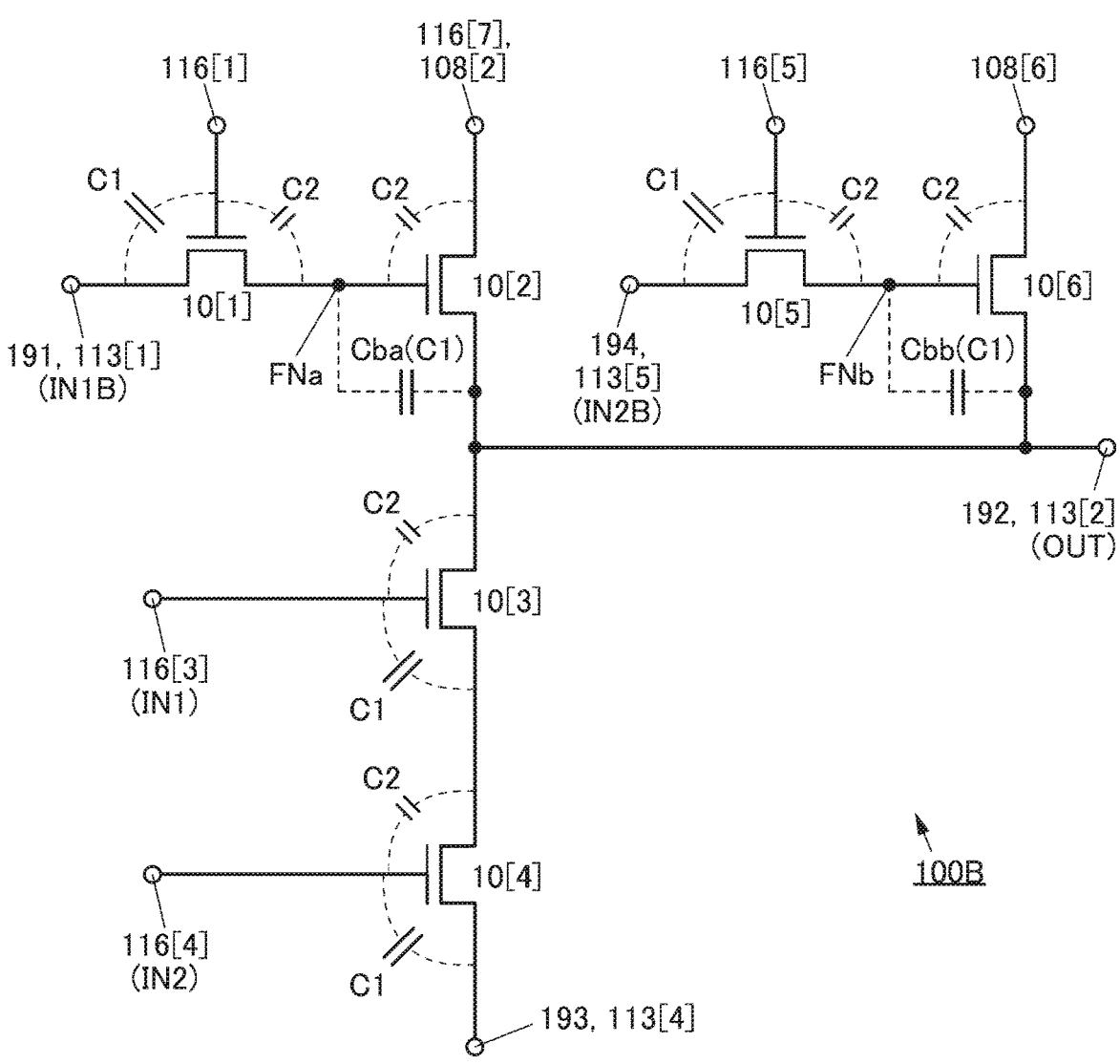
FIG. 26 is a circuit diagram of a semiconductor device.

In order to surely operate the semiconductor device 100B, the capacitance value of parasitic capacitance generated between the node FNa and the conductive layer 116[1] is preferably lower than the capacitance value of the capacitor Cba. Thus, in the transistor 10[1], it is preferable that the capacitor C1 be provided between the terminal IN1B and the conductive layer 116[1] and the capacitor C2 be provided between the node FNa and the conductive layer 116[1] (see FIG. 26). Accordingly, the conductive layer 116[2] is preferably electrically connected to the conductive layer 108[1]. The conductive layer 113[1] is preferably electrically connected to the conductive layer 191.

Similarly, the capacitance value of parasitic capacitance generated between the node FNb and the conductive layer 116[5] is preferably lower than the capacitance value of the capacitor Cbb. Thus, in the transistor 10[5], it is preferable that the capacitor C1 be provided between the terminal IN2B and the conductive layer 116[5] and the capacitor C2 be provided between the node FNb and the conductive layer 116[5]. Accordingly, the conductive layer 116[6] is preferably electrically connected to the conductive layer 108[5]. The conductive layer 113[5] is preferably electrically connected to the conductive layer 194.

In the transistor 10[3], the capacitor C1 and the capacitor C2 may be interchanged with each other. Note that in the transistor 10[3], the transistor 10[4] side serves as the source and the terminal OUT side serves as the drain. It is preferable that the capacitor C1 be provided on the source side and the capacitor C2 be provided on the drain side in order that the on state and the off state of the transistor 10[3] are kept more surely. The conductive layer 113[3] is preferably electrically connected to the conductive layer 108[4]. The conductive layer 108[3] is preferably electrically connected to the conductive layer 113[2].

In the transistor 10[4], the capacitor C1 and the capacitor C2 may be interchanged with each other. Note that in the transistor 10[4], the conductive layer 193 side serves as the source and the transistor 10[3] side serves as the drain. It is preferable that the capacitor C1 be provided on the source side and the capacitor C2 be provided on the drain side in order that the on state and the off state of the transistor 10[4] are kept more surely. The conductive layer 113[4] is preferably electrically connected to the conductive layer 193. The conductive layer 108[4] is preferably electrically connected to the conductive layer 113[3].

With the use of the capacitor C1 of the transistor 10[2] as the capacitor Cba, the capacitor C2 of the transistor 10[2] is provided between the conductive layer 108[2] and the node FNa. With the use of the capacitor C1 of the transistor 10[6]

as the capacitor Cbb, the capacitor C2 of the transistor 10[6] is provided between the conductive layer 108[6] and the node FNb.

As in the example of the circuit configuration of the semiconductor device 100A described with reference to FIG. 15, some or all of the transistors 10[1] to 10[6] may be formed with a plurality of transistors connected in parallel.

Figure 27A:
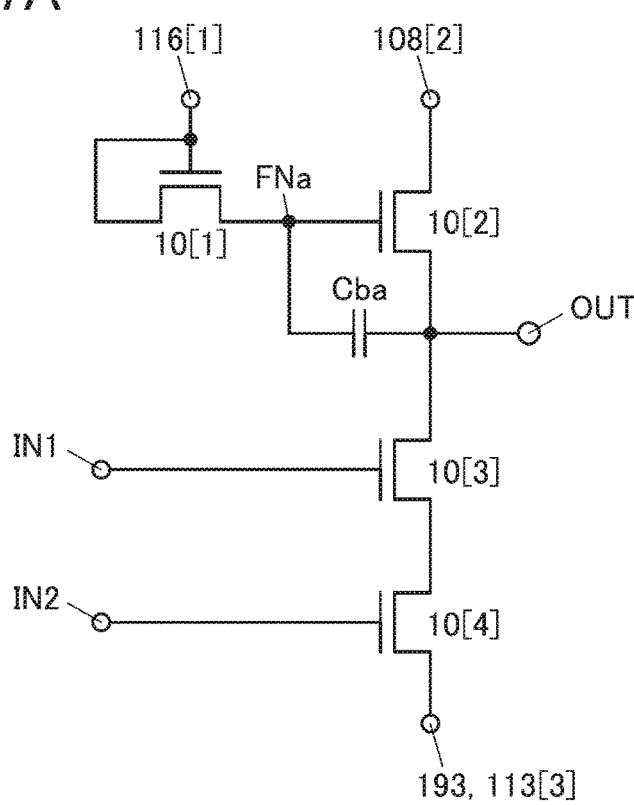
FIGS. 27A and 27B are each a circuit diagram of a semiconductor device.

The transistor 10 of one embodiment of the present invention may be used for a NAND circuit illustrated in FIG. 27A. The NAND circuit in FIG. 27A includes two input terminals (the terminal IN1 and the terminal IN2) and one output terminal (the terminal OUT).

The NAND circuit illustrated in FIG. 27A has a configuration in which the transistor 10[5] and the transistor 10[6] are eliminated from the semiconductor device 100B, and one of the source and the drain of the transistor 10[1] is electrically connected to the gate of the transistor 10[1].

In the NAND circuit in FIG. 27A, in the case where the potential H is supplied to the terminals IN1 and IN2, a shoot-through current is likely to be generated between the conductive layer 108[2] and the conductive layer 193. However, in the case where the potential L is supplied to one or both of the terminals IN1 and IN2, the potential H can be surely output from the terminal OUT due to the presence of the bootstrap capacitor (the capacitor Cba). Furthermore, since the number of transistors included in the circuit is smaller than that in the semiconductor device 100B in FIG. 21A, the occupied area of the NAND circuit can be reduced.

The vertical-channel transistor of one embodiment of the present invention is preferably used as the transistor included in the NAND circuit in FIG. 27A. With the use of the vertical-channel transistor of one embodiment of the present invention, the area occupied by the NAND circuit can be reduced.

Figure 27B:
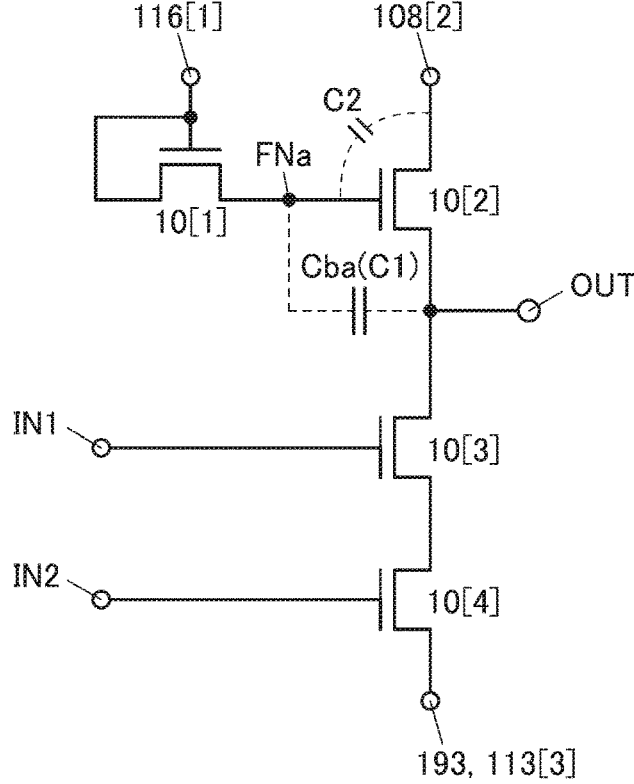

The vertical-channel transistor of one embodiment of the present invention is preferably used as at least the transistor 10[2] of the NAND circuit in FIG. 27A. Specifically, as illustrated in FIG. 27B, the transistor of one embodiment of the present invention is placed such that the capacitor (capacitor C2) is provided between the one of the source and the drain of the transistor 10[2] and the gate thereof and the capacitor (capacitor C1) is provided between the other of the source and the drain of the transistor 10[2] and the gate thereof.

By providing the capacitor C1 having a higher capacitance value than the capacitor C2 between the other of the source and the drain of the transistor 10[2] and the gate thereof, the capacitor C1 can be used as the capacitor Cba. Thus, the capacitor Cba does not need to be provided additionally, reducing the occupied area of the NAND circuit.

<NOR Circuit>

A configuration example of the semiconductor device 100C serving as an NOR circuit is described as the configuration example of the logic circuit including the transistor 10. The semiconductor device 100C is a semiconductor device of one embodiment of the present invention.

Figure 28:
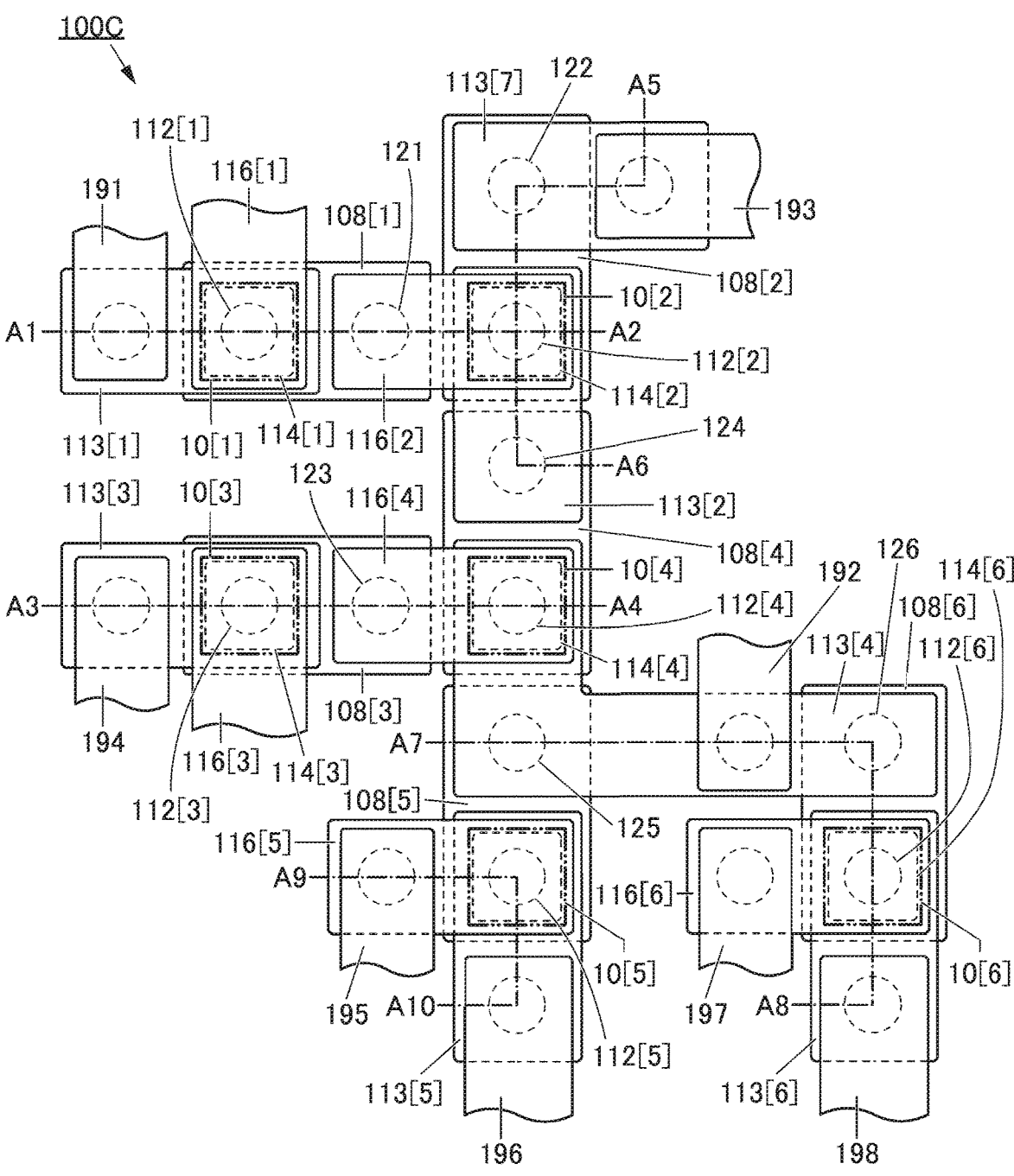
FIG. 28 is a plan view of a semiconductor device.
Figures 30A, 30B:
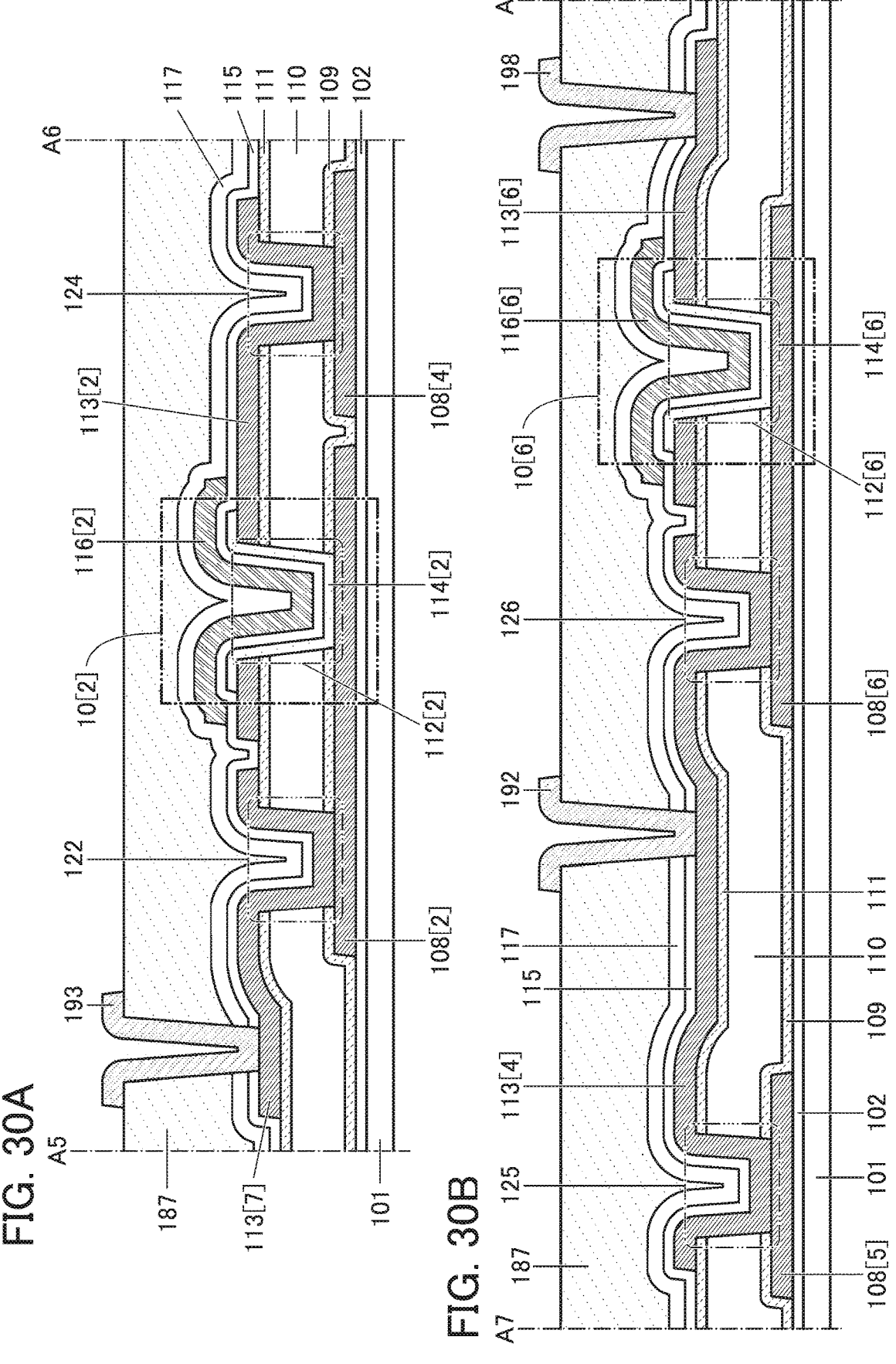
FIGS. 30A and 30B are cross-sectional views of a semiconductor device.
Figure 31:
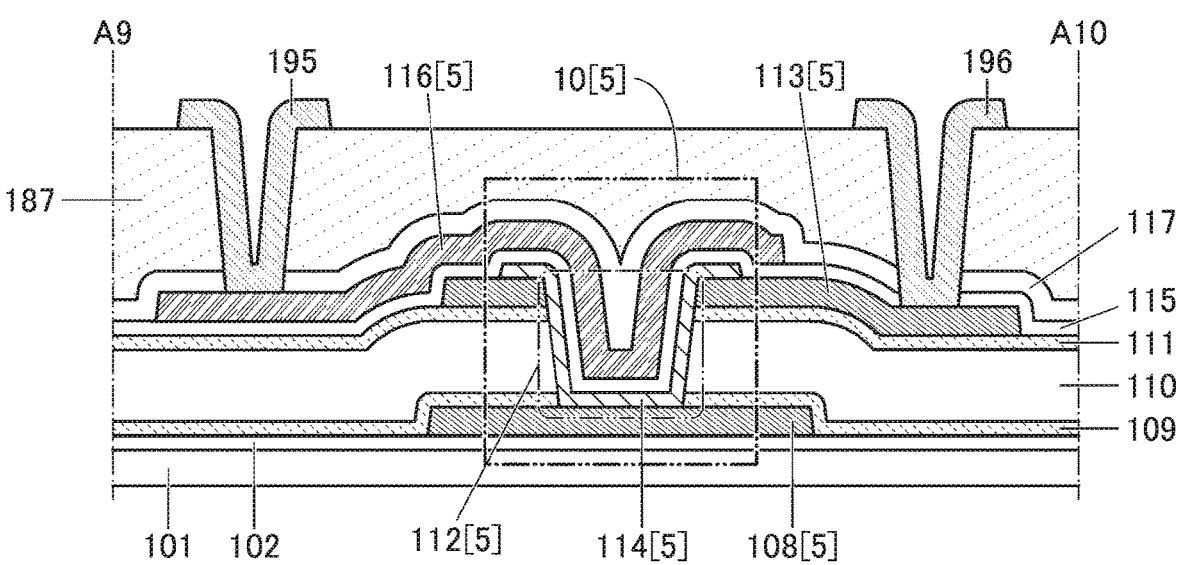
FIG. 31 is a cross-sectional view of a semiconductor device.
Figure 33A:
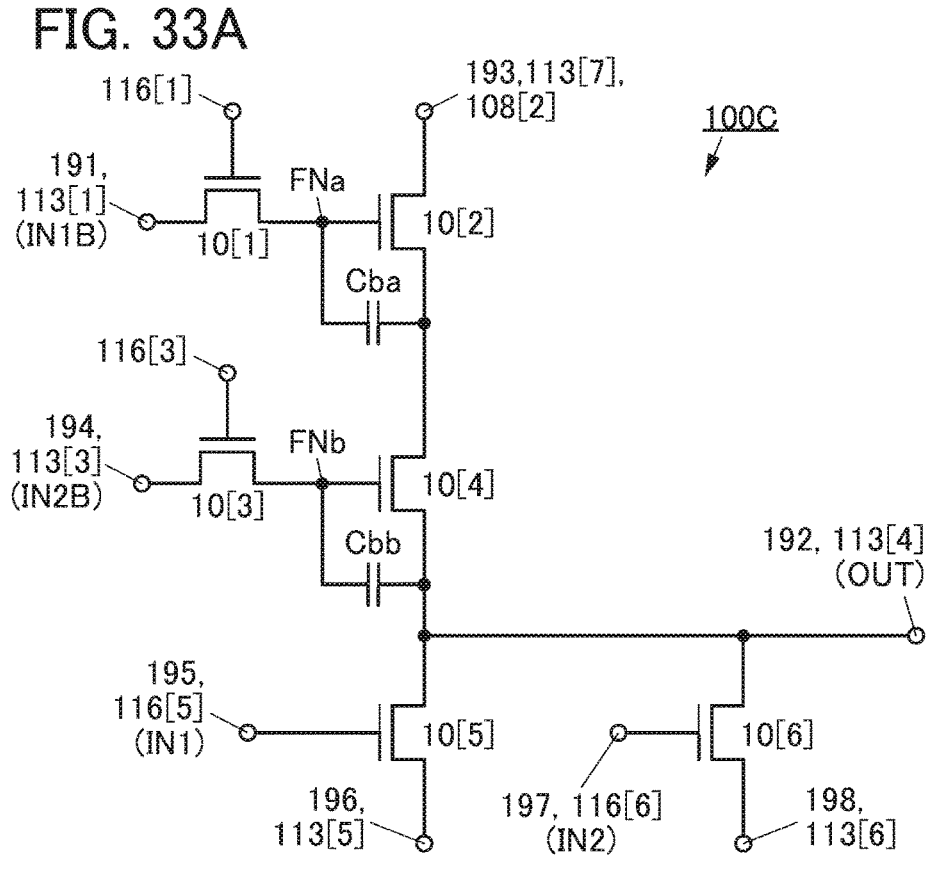
FIGS. 33A and 33B are each a circuit diagram of a semiconductor device.
Figure 33B:
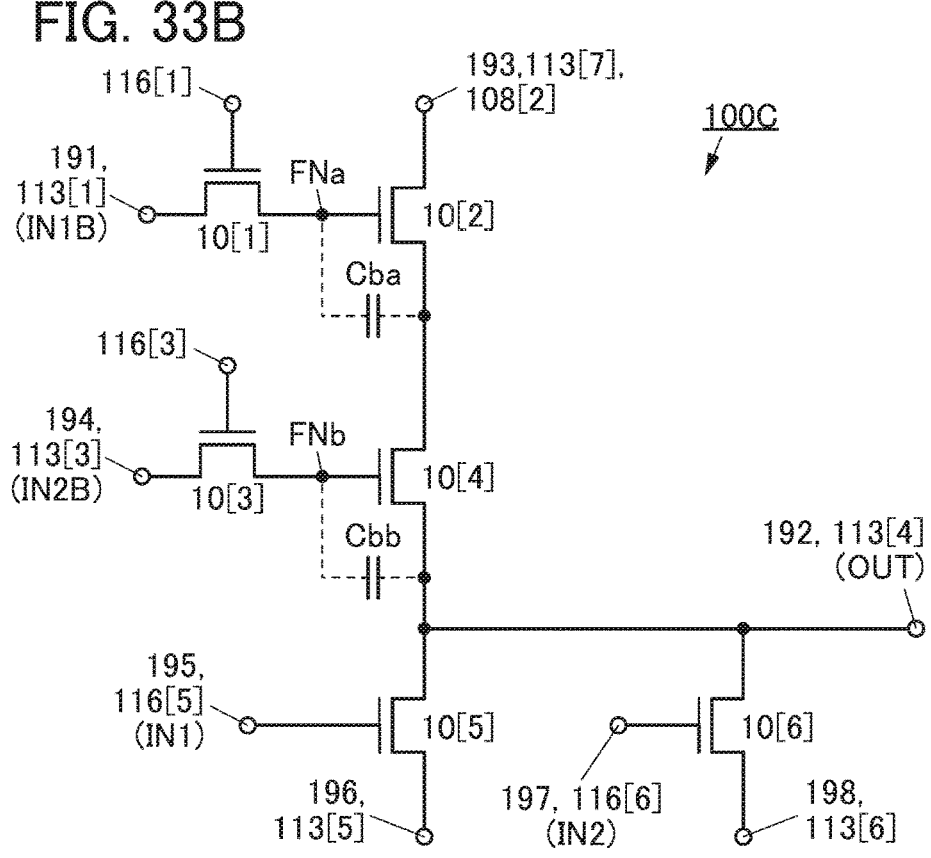

FIG. 28 is a plan view of the semiconductor device 100C. FIG. 29A is a cross-sectional view taken along the dashed-dotted line A1-A2 in FIG. 28. FIG. 29B is a cross-sectional view taken along the dashed-dotted line A3-A4 in FIG. 28. FIG. 30A is a cross-sectional view taken along the dashed-dotted line A5-A6 in FIG. 28. FIG. 30B is a cross-sectional view taken along the dashed-dotted line A7-A8 in FIG. 28. FIG. 31 is a cross-sectional view taken along the dashed-dotted line A9-A10 in FIG. 28. FIGS. 33A and 33B are equivalent circuit diagrams of the semiconductor device

100B. FIG. 34A shows circuit symbols of a NOR circuit. FIG. 34B is a graph showing combinations of signals input to the terminal IN1 and the terminal IN2 and a signal output to the terminal OUT. FIG. 34C shows circuit symbols of a NOR circuit, a NOT circuit, and an OR circuit.

First, the circuit configuration of the semiconductor device 100C is described with reference to the equivalent circuit diagram of FIG. 33A.

The semiconductor device 100C includes the transistor 10[1], the transistor 10[2], the transistor 10[3], the transistor 10[4], the transistor 10[5], a transistor 10[6], a capacitor Cba, and a capacitor Cbb. The semiconductor device 100C includes four input terminals (the terminal IN1, a terminal IN1B, the terminal IN2, and a terminal IN2B) and one output terminal (the terminal OUT) (see FIG. 33A). The potential H or the potential L is input to the terminal IN1, and an inverted signal of the terminal IN1 is input to the terminal IN1B. The potential H or the potential L is input to the terminal IN2, and an inverted signal of the terminal IN2 is input to the terminal IN2B.

The one of the source and the drain of the transistor 10[1] is electrically connected to the terminal IN1B. The gate of the transistor 10[1] is electrically connected to the conductive layer 116[1]. The other of the source and the drain of the transistor 10[1] is electrically connected to one terminal of the capacitor Cba and the gate of the transistor 10[2]. A region where the other of the source and the drain of the transistor 10[1], the one terminal of the capacitor Cba, and the gate of the transistor 10[2] are electrically connected to one another functions as a node FNa.

One of a source and a drain of the transistor 10[2] is electrically connected to a conductive layer 108[2]. The other of the source and the drain of the transistor 10[2] is electrically connected to the other terminal of the capacitor Cba and one of a source and a drain of the transistor 10[4].

The one of the source and the drain of the transistor 10[3] is electrically connected to the terminal IN2B. The gate of the transistor 10[3] is electrically connected to a conductive layer 116[3]. The other of the source and the drain of the transistor 10[3] is electrically connected to one terminal of the capacitor Cbb and the gate of the transistor 10[4]. A region where the other of the source and the drain of the transistor 10[3], the one terminal of the capacitor Cbb, and the gate of the transistor 10[4] are electrically connected to one another functions as a node FNb.

The other of the source and the drain of the transistor 10[4] is electrically connected to the other terminal of the capacitor Cbb, the terminal OUT, and the one of the source and the drain of the transistor 10[5]. The gate of the transistor 10[5] is electrically connected to the terminal IN1, and the other of the source and the drain is electrically connected to a conductive layer 196.

The gate of the transistor 10[6] is electrically connected to the terminal IN2, one of the source and the drain is electrically connected to the terminal OUT, the other of the source and the drain of the transistor 10[4], and the other terminal of the capacitor Cbb. The other of the source and the drain of the transistor 10[6] is electrically connected to a conductive layer 198.

In the semiconductor device 100C, a signal output to the terminal OUT is determined by a combination of signals input to the terminal IN1 and the terminal IN2. Thus, in FIGS. 34A and 34C showing the circuit symbols of the semiconductor device 100C, the terminal IN1B and the terminal IN2B are not illustrated.

As shown in FIG. 34B, in the semiconductor device 100C, when the potential H is input to one or both of the terminals IN1 and IN2, the potential L is output to the terminal OUT. When the potential L is input to both of the terminals IN1 and IN2, the potential H is output to the terminal OUT.

The terminal IN of the semiconductor device 100A which is a NOT circuit is connected to the terminal OUT of the semiconductor device 100C which is a NOR circuit, so that an OR circuit is formed (see FIG. 34C).

As illustrated in FIG. 33A, the semiconductor device 100C is a single-polarity NOR circuit formed with only n-channel transistors. Since p-channel transistors are not used for the semiconductor device 100C, the manufacturing cost can be reduced. Furthermore, since steps of forming the p-channel transistors are unnecessary, the manufacturing period is shortened and the manufacturing yield is improved. Note that p-channel transistors may be used for the semiconductor device 100C as needed.

Next, examples of a planar structure and a stacked-layer structure of the semiconductor device 100C are described with reference to FIG. 28 to FIG. 31.

The semiconductor device 100C includes, over the insulating layer 102, the conductive layer 108[1], the conductive layer 108[2], the conductive layer 108[3], a conductive layer 108[4], a conductive layer 108[5], and the conductive layer 108[6] (see FIGS. 29A and 29B, FIGS. 30A and 30B, and FIG. 31). The conductive layers 108[1] to 108[6] can be formed in a manner similar to that of the conductive layer 108. The conductive layers 113[1] to 113[7] are provided over the insulating layer 111. The conductive layers 113[1] to 113[7] can be formed in a manner similar to that of the conductive layer 113.

The semiconductor device 100C includes the opening 112[1] in a region overlapping with the conductive layer 108[1], the opening 112[2] in a region overlapping with the conductive layer 108[2], the opening 112[3] in a region overlapping with the conductive layer 108[3], the opening 112[4] in a region overlapping with the conductive layer 108[4], the opening 112[5] in a region overlapping with the conductive layer 108[5], and the opening 112[6] in a region overlapping with the conductive layer 108[6]. The openings 112[1] to 112[6] can be formed in a manner similar to that of the opening 112.

The semiconductor device 100C includes the semiconductor layer 114[1] and the conductive layer 116[1]. The semiconductor layer 114[1] is provided over the conductive layer 113[1] and the conductive layer 108[1] and has a region overlapping with the opening 112[1]. The conductive layer 116[1] is provided over the insulating layer 115 and has a region overlapping with the semiconductor layer 114[1]. The semiconductor device 100C includes the semiconductor layer 114[2] and the conductive layer 116[2]. The semiconductor layer 114[2] is provided over the conductive layer 113[2] and the conductive layer 108[2] and has a region overlapping with the opening 112[2]. The conductive layer 116[2] is provided over the insulating layer 115 and has a region overlapping with the semiconductor layer 114[2].

The semiconductor device 100C includes the semiconductor layer 114[3] and the conductive layer 116[3]. The semiconductor layer 114[3] is provided over the conductive layer 113[3] and the conductive layer 108[3] and has a region overlapping with the opening 112[3]. The conductive layer 116[3] is provided over the insulating layer 115 and has a region overlapping with the semiconductor layer 114[3]. The semiconductor device 100C includes a semiconductor layer 114[4] and a conductive layer 116[4]. The semiconductor layer 114[4] is provided over the conductive layer 113[4] and the conductive layer 108[4] and has a region overlapping with the opening 112[4]. The conductive layer 116[4] is provided over the insulating layer 115 and has a region overlapping with the semiconductor layer 114[4].

The semiconductor device 100C includes a semiconductor layer 114[5] and the conductive layer 116[5]. The semiconductor layer 114[5] is provided over the conductive layer 113[5] and the conductive layer 108[5] and has a region overlapping with the opening 112[5]. The conductive layer 116[5] is provided over the insulating layer 115 and has a region overlapping with the semiconductor layer 114[5]. The semiconductor device 100C includes a semiconductor layer 114[6] and a conductive layer 116[6]. The semiconductor layer 114[6] is provided over the conductive layer 113[6] and the conductive layer 108[6] and has a region overlapping with the opening 112[6]. The conductive layer 116[6] is provided over the insulating layer 115 and has a region overlapping with the semiconductor layer 114[6].

The semiconductor layers 114[1] to 114[6] can be formed in a manner similar to that of the semiconductor layer 114. The conductive layers 116[1] to 116[6] can be formed in a manner similar to that of the conductive layer 116.

In a region overlapping with the conductive layer 108[1] of the semiconductor device 100C, the opening 121 is provided in the insulating layer 115, the insulating layer 111, the insulating layer 110, and the insulating layer 109 (see FIG. 28 and FIG. 29A). In the opening 121, the conductive layer 116[2] is electrically connected to the conductive layer 108[1].

In a region overlapping with the conductive layer 108[2] of the semiconductor device 100C, the opening 122 is provided in the insulating layer 111, the insulating layer 110, and the insulating layer 109. In the opening 122, the conductive layer 113[7] is electrically connected to the conductive layer 108[2] (see FIG. 28 and FIG. 30A).

In a region overlapping with the conductive layer 108[3] of the semiconductor device 100C, the opening 123 is provided in the insulating layer 115, the insulating layer 111, the insulating layer 110, and the insulating layer 109 (see FIG. 28 and FIG. 29B). In the opening 123, the conductive layer 116[4] is electrically connected to the conductive layer 108[3].

In a region overlapping with the conductive layer 108[4] of the semiconductor device 100C, the opening 124 is provided in the insulating layer 111, the insulating layer 110, and the insulating layer 109. In the opening 124, the conductive layer 113[2] is electrically connected to the conductive layer 108[4] (see FIG. 28 and FIG. 30A).

In a region overlapping with the conductive layer 108[5] of the semiconductor device 100C, the opening 125 is provided in the insulating layer 111, the insulating layer 110, and the insulating layer 109. In the opening 125, the conductive layer 113[4] is electrically connected to the conductive layer 108[5] (see FIG. 28 and FIG. 30B).

In a region overlapping with the conductive layer 108[6] of the semiconductor device 100C, an opening 126 is provided in the insulating layer 111, the insulating layer 110, and the insulating layer 109. In the opening 126, the conductive layer 113[4] is electrically connected to the conductive layer 108[6] (see FIG. 28 and FIG. 30B). The conductive layer 108[5] and the conductive layer 108[6] are electrically connected to each other through the conductive layer 113[4].

The electrical connection between the conductive layer 116[2] and the conductive layer 108[1] enables the capacitor C1 of the transistor 10[2] to be used as the capacitor Cba. With the use of the capacitor C1 of the transistor 10[2] as the capacitor Cba, another capacitor Cba does not need to be additionally provided, reducing the occupied area of the semiconductor device (see FIG. 29A). For this reason, it is preferable that the conductive layer 116[2] and the conductive layer 108[1] be electrically connected to each other.

The electrical connection between the conductive layer 116[4] and the conductive layer 108[3] enables the capacitor C1 of the transistor 10[4] to be used as the capacitor Cbb. With the use of the capacitor C1 of the transistor 10[4] as the capacitor Cbb, another capacitor Cbb does not need to be additionally provided, reducing the occupied area of the semiconductor device (see FIG. 29B). For this reason, it is preferable that the conductive layer 116[4] and the conductive layer 108[3] be electrically connected to each other.

Like the semiconductor devices 100A and 100B, the semiconductor device 100C includes the insulating layer 187 over the insulating layer 117. The insulating layer 187 preferably serves as a planarization layer for reducing difference in level generated by a transistor, a capacitor, a wiring, and the like below the insulating layer 187.

The semiconductor device 100C includes conductive layers 191 to 198 over the insulating layer 187 (see FIG. 28, FIGS. 29A and 29B, FIGS. 30A and 30B, and FIG. 31). The conductive layers 191 to 198 can be formed with the same material by the same method as those of the other conductive layers.

In the semiconductor device 100C, an opening is formed in the insulating layer 187, the insulating layer 117, and the insulating layer 115 in each of a region overlapping with the conductive layer 113[1], a region overlapping with the conductive layer 113[3], a region overlapping with the conductive layer 113[4], a region overlapping with the conductive layer 113[5], a region overlapping with the conductive layer 113[6], and a region overlapping with the conductive layer 113[7].

In the semiconductor device 100C, an opening is formed in the insulating layer 187 and the insulating layer 117 in each of a region overlapping with the conductive layer 116[5] and a region overlapping with the conductive layer 116[6].

The conductive layer 191 is electrically connected to the conductive layer 113[1] in an opening overlapping with the conductive layer 113[1]. The conductive layer 192 is electrically connected to the conductive layer 113[4] in the opening overlapping with the conductive layer 113[4]. The conductive layer 193 is electrically connected to the conductive layer 113[7] in the opening overlapping with the conductive layer 113[7].

The conductive layer 194 is electrically connected to the conductive layer 113[3] in an opening overlapping with the conductive layer 113[3]. The conductive layer 195 is electrically connected to the conductive layer 116[5] in the opening overlapping with the conductive layer 116[5]. The conductive layer 196 is electrically connected to the conductive layer 113[5] in the opening overlapping with the conductive layer 113[5].

The conductive layer 197 is electrically connected to the conductive layer 116[6] in an opening overlapping with the conductive layer 116[6]. The conductive layer 198 is electrically connected to the conductive layer 113[6] in the opening overlapping with the conductive layer 113[6].

In the semiconductor device 100C, the conductive layer 191 serves as the terminal IN1B, the conductive layer 194 serves as the terminal IN2B, the conductive layer 195 serves as the terminal IN1, the conductive layer 197 serves as the terminal IN2, and the conductive layer 192 serves as the terminal OUT.

Figure 32:
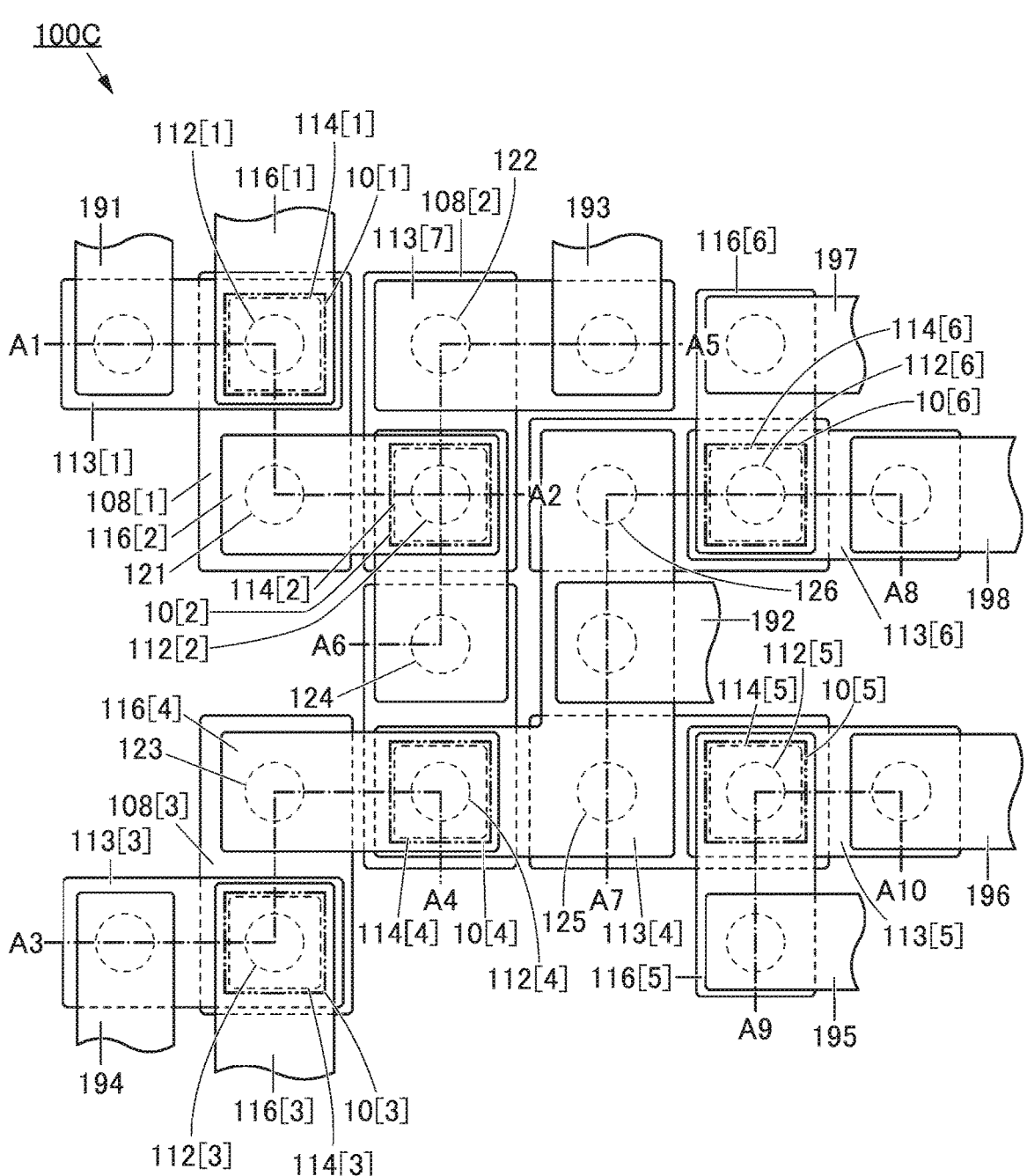
FIG. 32 is a plan view of a semiconductor device.

FIG. 32 is a modification example of the planar structure in FIG. 28. A cross-sectional view taken along the dashed-dotted line A1-A2 in FIG. 32 corresponds to the cross-sectional view of FIG. 29A. A cross-sectional view taken along the dashed-dotted line A3-A4 in FIG. 32 corresponds to the cross-sectional view of FIG. 29B. A cross-sectional view taken along the dashed-dotted line A5-A6 in FIG. 32 corresponds to the cross-sectional view of FIG. 30A. A cross-sectional view taken along the dashed-dotted line A7-A8 in FIG. 32 corresponds to the cross-sectional view of FIG. 30B. A cross-sectional view taken along the dashed-dotted line A9-A10 in FIG. 32 corresponds to the cross-sectional view of FIG. 31.

In order that the capacitor C1 of the transistor 10[2] is used as the capacitor Cba in the semiconductor device 100C illustrated in the circuit diagrams of FIGS. 33A and 33B, it is important to use the transistor (vertical-channel transistor) of one embodiment of the present invention as the transistor 10[2]. In order that the capacitor C1 of the transistor 10[4] is used as the capacitor Cbb, it is important to use the transistor (vertical-channel transistor) of one embodiment of the present invention as the transistor 10[4].

Transistors other than the transistor of one embodiment of the present invention may be used as transistors other than the transistors 10[2] and 10[4]. However, a large number of the transistors of one embodiment of the present invention are preferably used for the semiconductor device 100C in order to achieve a semiconductor device with a small occupied area. Therefore, all the transistors included in the semiconductor device 100C are preferably the transistors of one embodiment of the present invention.

Figure 35:
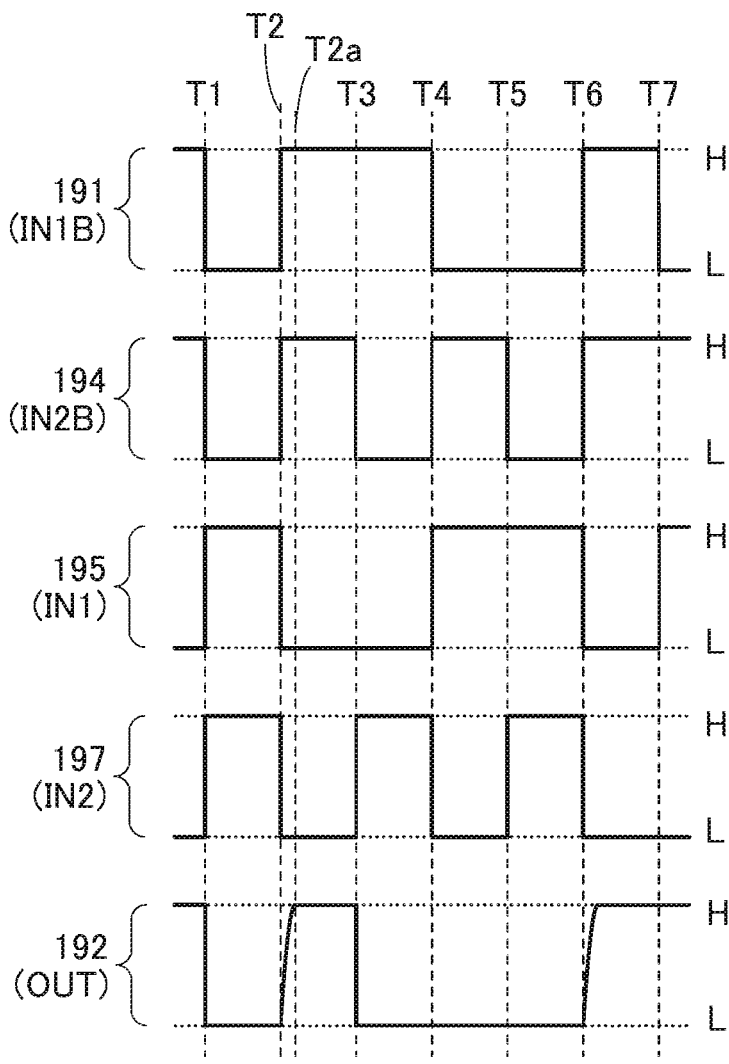
FIG. 35 is a timing chart for explaining an operation example of a semiconductor device.
Figure 36A:
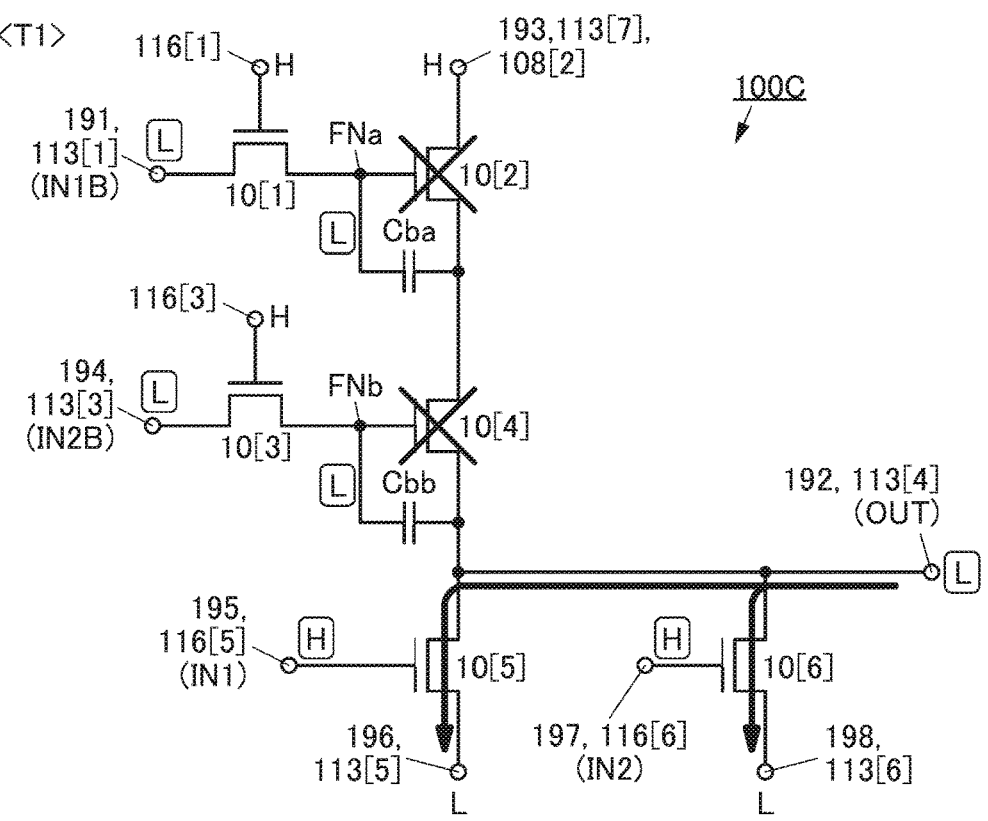
FIGS. 36A and 36B are each a circuit diagram for explaining an operation example of a semiconductor device.
Figure 36B:
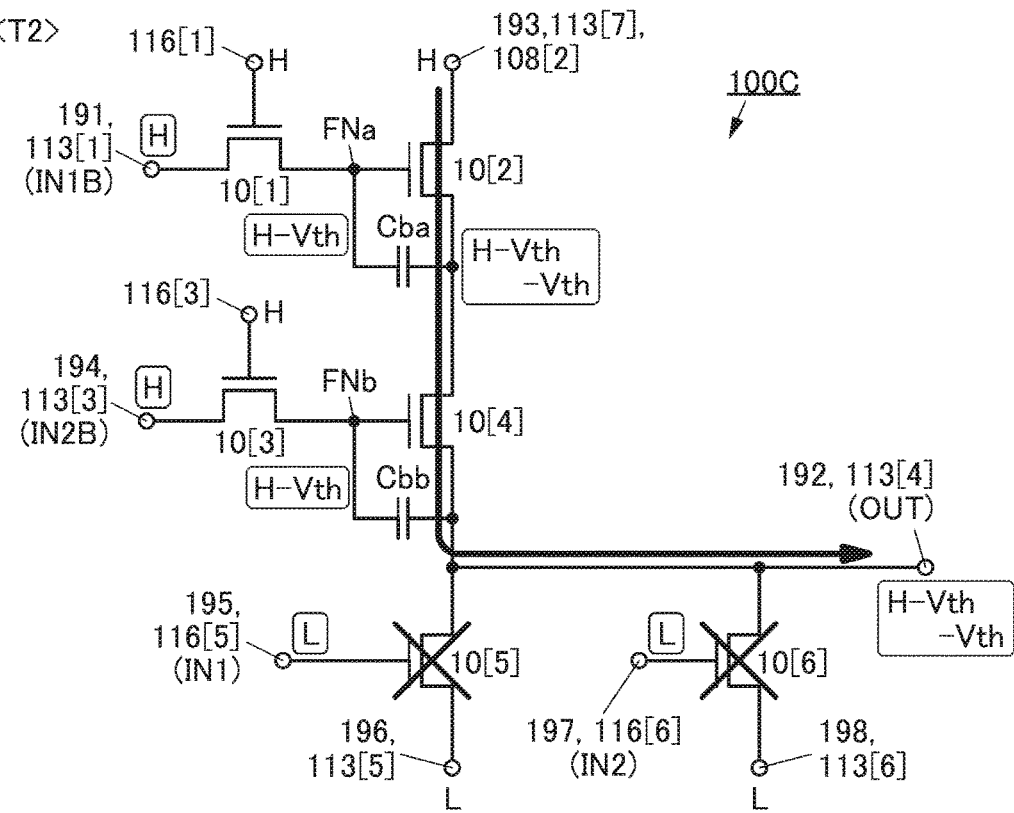
Figure 37A:
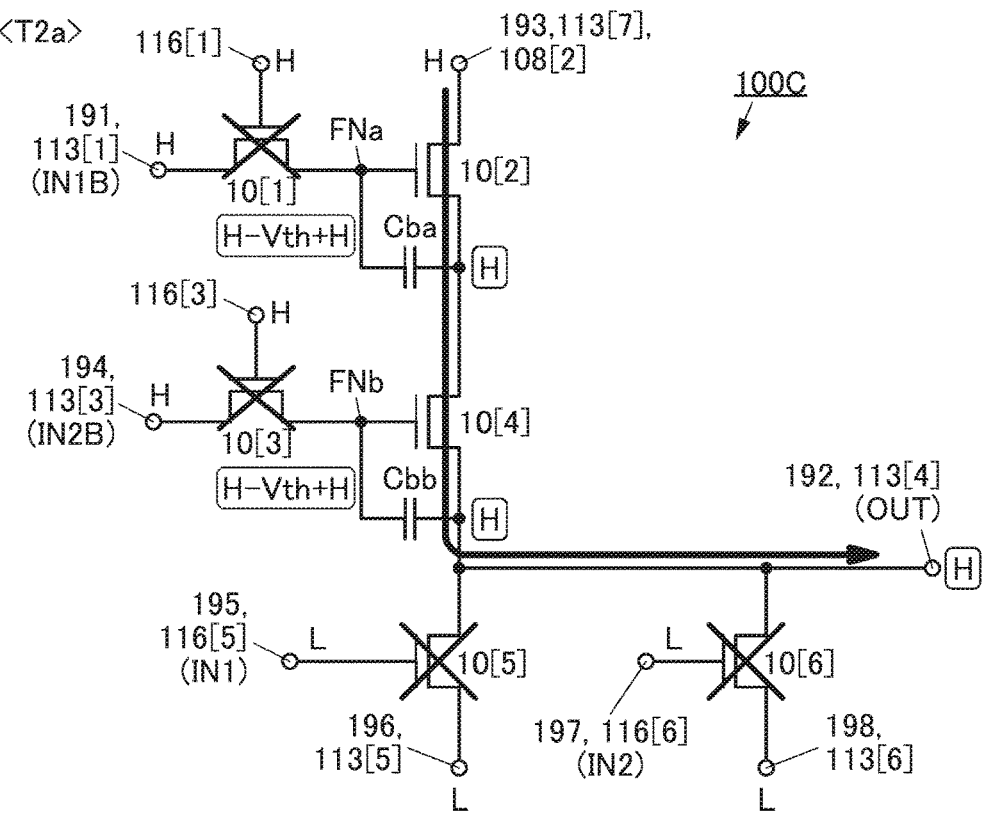
FIGS. 37A and 37B are each a circuit diagram for explaining an operation example of a semiconductor device.
Figure 37B:
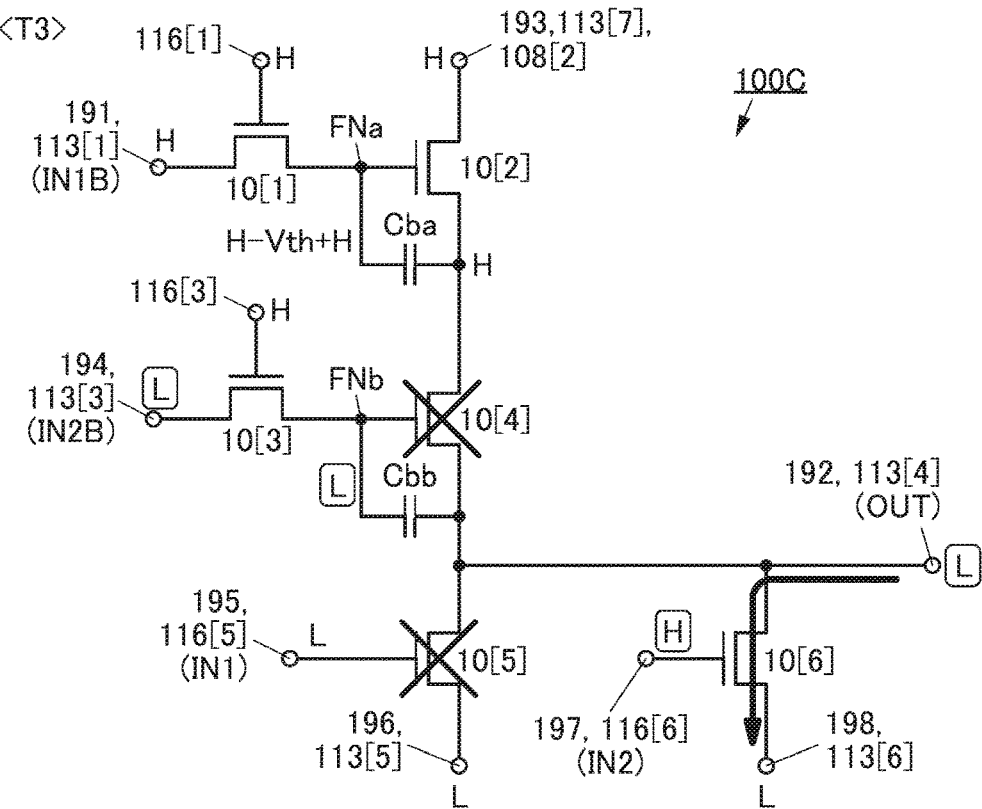

Next, an operation example of the semiconductor device 100C is described. FIG. 35 is a timing chart showing an operation example of the semiconductor device 100C. FIGS. 36A and 36B and FIGS. 37A and 37B are circuit diagrams illustrating operation examples of the semiconductor device 100C.

In the semiconductor device 100C, the potential H (VDD) is supplied to the conductive layer 116[1], the conductive layer 113[7] (the conductive layer 193 and the conductive layer 108[2]), and the conductive layer 116[3], and the potential L (VSS) is supplied to the conductive layer 196 (the conductive layer 113[5]) and the conductive layer 198 (the conductive layer 113[6]).

In the initial state (a state immediately before Time T1), the potential L is supplied to the terminal IN1 (the conductive layer 195 and the conductive layer 116[5]) (the potential H is supplied to the terminal IN1B), and the potential L is supplied to the terminal IN2 (the potential H is supplied to the terminal IN2B). Thus, the terminal OUT has the potential H.

In Time T1 (see FIG. 35 and FIG. 36A), when the potential H is supplied to the terminal IN1 (the potential L is supplied to the terminal IN1B), the transistor 10[5] is turned on. The potential of the node FNa becomes the potential L, and the transistor 10[2] is turned off In Time T1, when the potential H is supplied to the terminal IN2 (the potential L is supplied to the terminal IN2B), the transistor 10[6] is turned on. The potential of the node FNb becomes the potential L, and the transistor 10[4] is turned off. Since the transistor 10[2] and the transistor 10[4] are turned off and the transistor 10[5] and the transistor 10[6] are turned on, the potential of the terminal OUT becomes the potential L.

In Time T2 (see FIG. 35 and FIG. 36B), the potential L is supplied to the terminal IN1 (the potential H is supplied to the terminal IN1B), so that the transistor 10[5] is turned off. The potential of the node FNa changes from the potential H to a potential lower by the $V_{th}$ of the transistor 10[1] (the potential $H-V_{th}$). Here, the value of the potential $H-V_{th}$ is greater than or equal to $V_{th}$. As a result, the transistor 10[2] is turned on and the potential of the other of the source and the drain of the transistor 10[2] is increased. In Time T2, since the potential of the node FNa (the gate potential of the transistor 10[2]) is the potential H–$V_{th}$, the potential of the other of the source and the drain of the transistor 10[2] becomes the potential H–$V_{th}$–$V_{th}$.

In Time T2, when the potential L is supplied to the terminal IN2 (the potential H is supplied to the terminal IN2B), the transistor 10[6] is turned off. The potential of the node FNb becomes a potential lower than the potential H by $V_{th}$ of the transistor 10[3] (a potential H–$V_{th}$). Here, the value of the potential H–$V_{th}$ is greater than or equal to Val. As a result, the transistor 10[4] is turned on, and the potential of the terminal OUT increases. In Time T2, the potential of the node FNb (the gate potential of the transistor 10[6]) is the potential H–$V_{th}$, the potential of the terminal OUT becomes the potential H–$V_{th}$–$V_{th}$.

The node FNa and the other of the source and the drain of the transistor 10[2] are connected (capacitively coupled) through the capacitor Cba. Thus, the potential of the node FNa increases with an increase in the potential of the other of the source and the drain of the transistor 10[2]. When the potential of the node FNa increases, the transistor 10[1] is turned off and the node FNa is brought into a floating state. The capacitor Cba serves as a bootstrap capacitor. The node FNa and the other of the source and the drain of the transistor 10[2] are capacitively coupled with each other through the capacitor Cba, so that the potential of the node FNa increases up to a potential H–$V_{th}$+the potential H (2×the potential H–$V_{th}$ (Time T2a, see FIG. 35 and FIG. 37A). Since the potential is higher than the potential H+$V_{th}$, the potential of the other of the source and the drain of the transistor 10[2] can be the potential H.

The terminal OUT and the node FNb are connected (capacitively coupled) through the capacitor Cbb. Accordingly, in accordance with the increase in the potential of the terminal OUT, the potential of the node FNb also increases. When the potential of the node FNb increases, the transistor 10[3] is turned off and the node FNb is brought into a floating state. The capacitor Cbb serves as a bootstrap capacitor. By the capacitive coupling between the terminal OUT and the node FNb through the capacitor Cbb, the potential of the node FNb increases to the potential H–$V_{th}$+the potential H (2×the potential H–$V_{th}$). Since this potential is higher than the potential H+$V_{th}$, the potential of the terminal OUT can be the potential H.

In Time T3, when the potential H is supplied to the terminal IN2 (the potential L is supplied to the terminal IN2B), the transistor 10[6] is turned on. The potential of the node FNb becomes the potential L and the transistor 10[4] is turned off. The terminal OUT and the conductive layer 113[6] are brought into conduction through the transistor 10[6], so that the potential L is supplied to the terminal OUT (see FIG. 35 and FIG. 37B).

As described above, the semiconductor device 100C of one embodiment of the present invention is configured to determine a signal output to the terminal OUT in accordance with a combination of signals input to the terminal IN1 and the terminal IN2. In other words, the semiconductor device 100C is configured to determine a signal output to the terminal OUT in accordance with a combination of signals input to the terminal IN1B and the terminal IN2B. The semiconductor device 100C of one embodiment of the present invention can surely set the potential of the terminal OUT to the potential H by including the capacitors Cba and Cbb serving as a bootstrap capacitor.

With the use of the transistors 10 for the semiconductor device 100C, the occupied area of the semiconductor device 100C can be reduced. The use of the transistor 10 as the transistor included in the semiconductor device 100C enables the capacitor C1 to be used as the capacitor Cba and the capacitor Cbb. The capacitor Cba and the capacitor Cbb do not need to be additionally provided, further reducing the occupied area of the semiconductor device 100C.

The semiconductor device 100C of one embodiment of the present invention includes the terminal IN1 and the terminal IN1B as input terminals and inputs an inverted signal of the terminal IN1 to the terminal IN1B, so that a shoot-through current between the conductive layer 113[7] (the conductive layer 108[2]) and the conductive layer 196 (the conductive layer 113[5]) is significantly reduced. Furthermore, the semiconductor device 100C includes the terminal IN2 and the terminal IN2B as input terminals and inputs an inverted signal of the terminal IN2 to the terminal IN2B, so that a shoot-through current between the conductive layer 113[7] (the conductive layer 108[2]) and the conductive layer 193 (the conductive layer 113[6]) can be significantly reduced. Thus, the semiconductor device 100C can have reduced power consumption.

Figure 38:
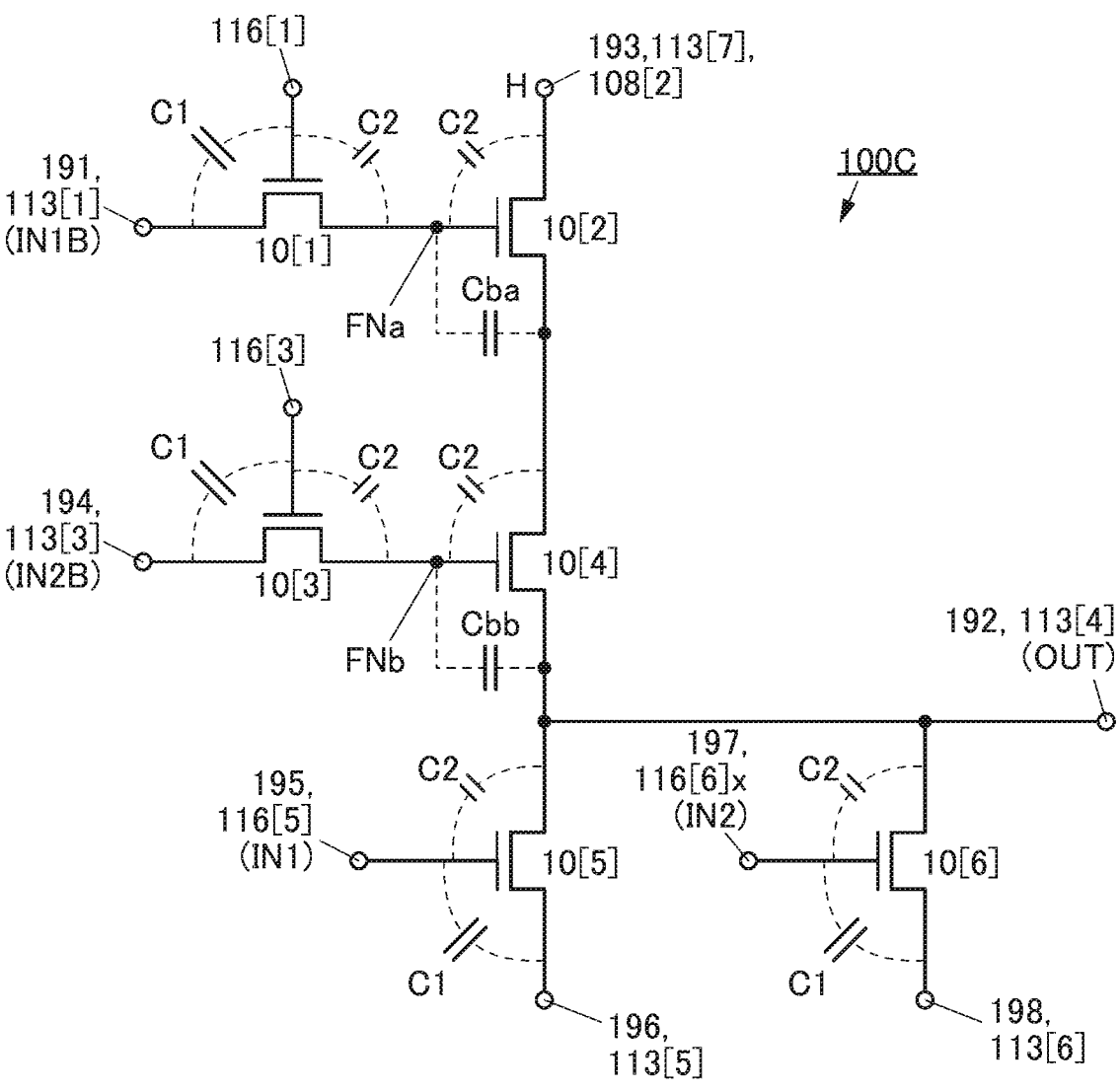
FIG. 38 is a circuit diagram of a semiconductor device.

In order to surely operate the semiconductor device 100C, the capacitance value of parasitic capacitance generated between the node FNa and the conductive layer 116[1] is preferably lower than the capacitance value of the capacitor Cba. Thus, in the transistor 10[1], it is preferable that the capacitor C1 be provided between the terminal IN1B and the conductive layer 116[1] and the capacitor C2 be provided between the node FNa and the conductive layer 116[1] (see FIG. 38). Accordingly, the conductive layer 116[2] is preferably electrically connected to the conductive layer 108[1] (see FIG. 29A). The conductive layer 113[1] is preferably electrically connected to the conductive layer 191.

Similarly, the capacitance value of parasitic capacitance generated between the node FNb and the conductive layer 116[3] is preferably lower than the capacitance value of the capacitor Cbb. Thus, in the transistor 10[3], it is preferable that the capacitor C1 be provided between the terminal IN2B and the conductive layer 116[3] and the capacitor C2 be provided between the node FNb and the conductive layer 116[3]. Accordingly, the conductive layer 116[4] is preferably electrically connected to the conductive layer 108[3] (see FIG. 29B). The conductive layer 113[3] is preferably electrically connected to the conductive layer 194.

In the transistor 10[5], the capacitor C1 and the capacitor C2 may be interchanged with each other. Note that in the transistor 10[5], the transistor 10[4] side serves as the drain and the conductive layer 196 side serves as the source. It is preferable that the capacitor C1 be provided on the source side and the capacitor C2 be provided on the drain side in order that the on state and the off state of the transistor 10[5] are kept more surely. The conductive layer 113[4] is preferably electrically connected to the conductive layer 108[5]. The conductive layer 196 is preferably electrically connected to the conductive layer 113[5].

In the transistor 10[6], the capacitor C1 and the capacitor C2 may be interchanged with each other. Note that in the transistor 10[6], the transistor 10[4] side serves as the drain and the conductive layer 198 side serves as the source. It is preferable that the capacitor C1 be provided on the source side and the capacitor C2 be provided on the drain side in order that the on state and the off state of the transistor 10[6] are kept more surely. The conductive layer 113[4] is preferably electrically connected to the conductive layer 108[6]

(see FIG. 30B). The conductive layer 198 is preferably electrically connected to the conductive layer 113[6].

With the use of the capacitor C1 of the transistor 10[2] as the capacitor Cba, the capacitor C2 of the transistor 10[2] is provided between the conductive layer 108[2] and the node FNa. With the use of the capacitor C1 of the transistor 10[6] as the capacitor Cbb, the capacitor C2 of the transistor 10[6] is provided between the conductive layer 108[6] and the node FNb.

As in the example of the circuit configuration of the semiconductor device 100A described with reference to FIG. 15, some or all of the transistors 10[1] to 10[6] may be formed with a plurality of transistors connected in parallel.

Figure 39A:
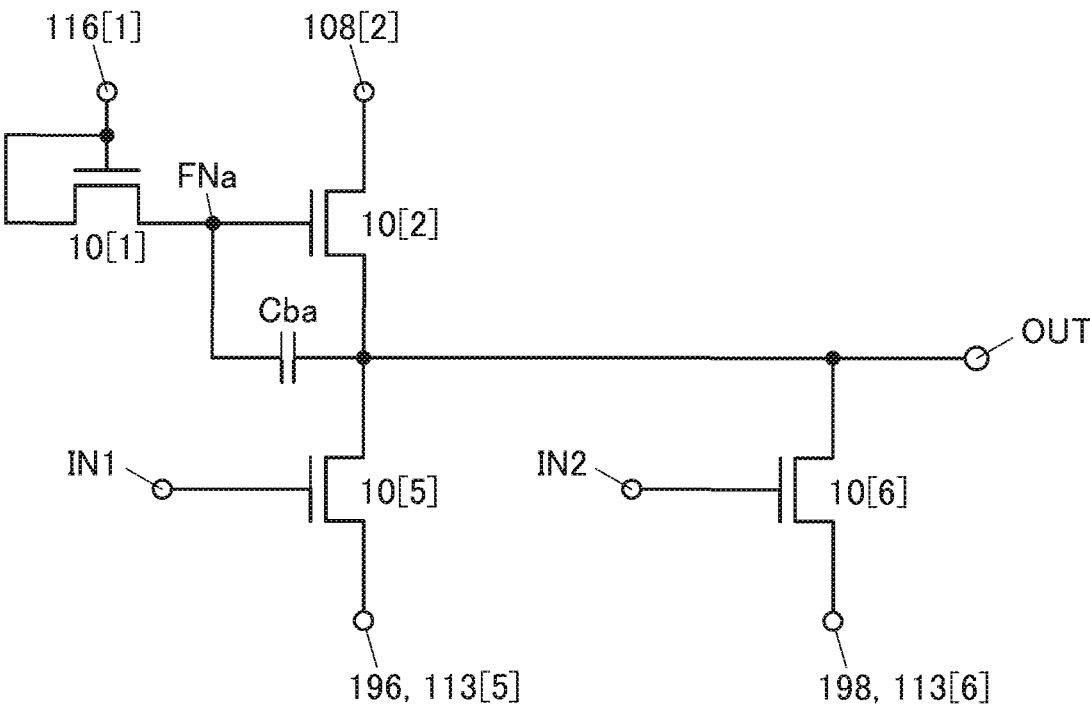
FIGS. 39A and 39B are each a circuit diagram of a semiconductor device.

The transistor 10 of one embodiment of the present invention may be used for a NOR circuit illustrated in FIG. 39A. The NOR circuit in FIG. 39A includes two input terminals (the terminal IN1 and the terminal IN2) and one output terminal (the terminal OUT).

The NOR circuit illustrated in FIG. 39A has a configuration in which the transistor 10[3] and the transistor 10[4] are eliminated from the semiconductor device 100C, and one of the source and the drain of the transistor 10[1] is electrically connected to the gate of the transistor 10[1]. The conductive layer 113[2], the conductive layer 108[5], the conductive layer 108[6], and the conductive layer 192 are electrically connected (not illustrated).

In the NOR circuit in FIG. 39A, in the case where the potential H is supplied to the terminal IN1, a shoot-through current is likely to be generated between the conductive layer 108[2] and the conductive layer 196. However, in the case where the potential L is supplied to the terminal IN1, the potential H can be surely output from the terminal OUT due to the presence of the bootstrap capacitor (the capacitor Cba). Furthermore, since the number of transistors included in the circuit is smaller than that in the semiconductor device 100C, the occupied area of the NOR circuit can be reduced.

The vertical-channel transistor of one embodiment of the present invention is preferably used as the transistor included in the NOR circuit in FIG. 39A. With the use of the vertical-channel transistor of one embodiment of the present invention, the area occupied by the NOR circuit can be reduced.

Figure 39B:
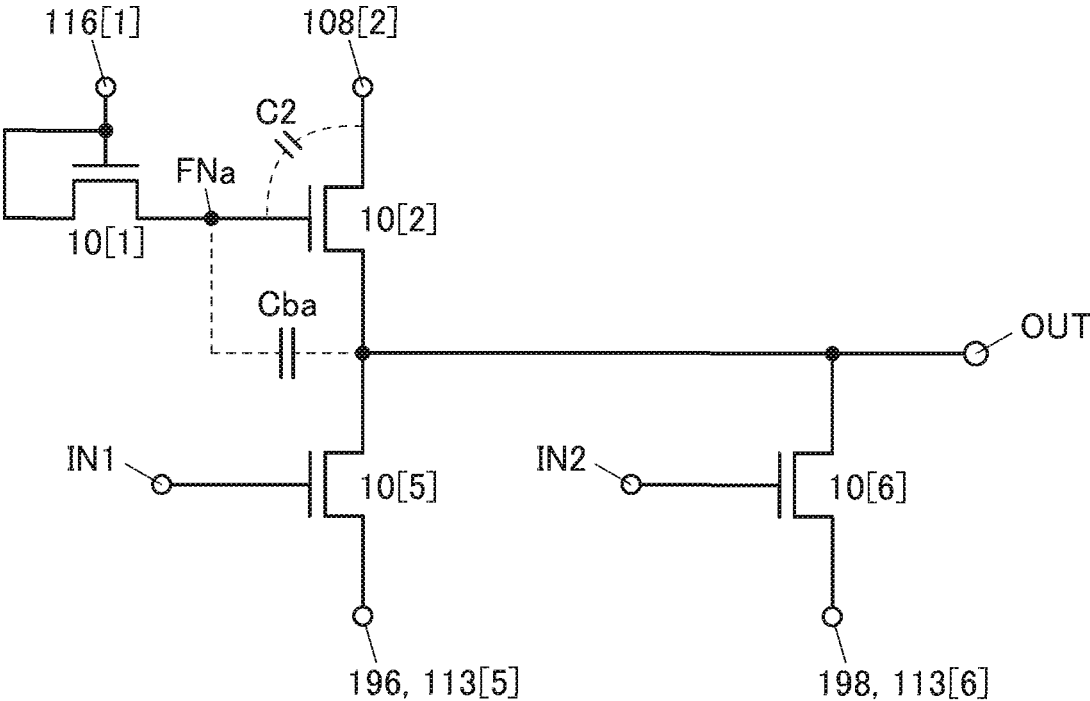

The vertical-channel transistor of one embodiment of the present invention is preferably used as at least the transistor 10[2] of the NOR circuit in FIG. 39A. Specifically, as illustrated in FIG. 39B, the transistor of one embodiment of the present invention is placed such that the capacitor C2 is provided between the one of the source and the drain of the transistor 10[2] and the gate thereof and the capacitor C1 is provided between the other of the source and the drain of the transistor 10[2] and the gate thereof.

By providing the capacitor C1 having a higher capacitance value than the capacitor C2 between the other of the source and the drain of the transistor 10[2] and the gate thereof, the capacitor C1 can be used as the capacitor Cba. Thus, the capacitor Cba does not need to be provided additionally, reducing the occupied area of the NOR circuit.

The structures described in this embodiment can be used in combination with any of the structures described in the other embodiments as appropriate.

Embodiment 2

Described in this embodiment is a metal oxide (hereinafter also referred to as an oxide semiconductor) applicable to an OS transistor described in the above embodiments.

A metal oxide used in an OS transistor preferably contains at least indium or zinc, and further preferably contains indium and zinc. The metal oxide preferably contains indium, M (M is one or more of gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. Specifically, M is preferably one or more of gallium, aluminum, yttrium, antimony, and tin and is further preferably gallium.

The metal oxide can be formed by a sputtering method, a chemical vapor deposition (CVD) method such as a metal organic chemical vapor deposition (MOCVD) method, an ALD method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Examples of a crystal structure of an oxide semiconductor include amorphous (including completely amorphous), c-axis-aligned crystalline (CAAC), nanocrystalline (nc), cloud-aligned composite (CAC), single crystal, and polycrystalline structures.

A crystal structure of a film or a substrate can be analyzed with an X-ray diffraction (XRD) spectrum. For example, evaluation is possible using an XRD spectrum which is obtained by grazing-incidence XRD (GIXD) measurement. Note that a GIXD method is also referred to as a thin film method or a Seemann-Bohlin method. Hereinafter, an XRD spectrum obtained from GIXD measurement is simply referred to as an XRD spectrum in some cases.

For example, the peak of the XRD spectrum of a quartz glass substrate has a substantially bilaterally symmetrical shape. On the other hand, the peak of the XRD spectrum of an In—Ga—Zn oxide film having a crystal structure has a bilaterally asymmetrical shape. The bilaterally asymmetrical peak of the XRD spectrum shows the existence of crystal in the film or the substrate. In other words, the crystal structure of the film or the substrate cannot be regarded as "amorphous" unless it has a bilaterally symmetrical peak in the XRD spectrum.

The crystal structure of a film or a substrate can be analyzed with a diffraction pattern obtained by nanobeam electron diffraction (NBED) (also referred to as a nanobeam electron diffraction pattern). For example, a halo pattern is observed in the diffraction pattern of a quartz glass substrate, which indicates that the quartz glass substrate is in an amorphous state. Furthermore, not a halo pattern but a spot-like pattern is observed in the diffraction pattern of an In—Ga—Zn oxide film formed at room temperature. Thus, it is presumed that the In—Ga—Zn oxide film formed at room temperature is in an intermediate state, which is neither a single crystal or polycrystalline state nor an amorphous state, and that it cannot be concluded that the In—Ga—Zn oxide film is in an amorphous state.

[Structure of Oxide Semiconductor]

Oxide semiconductors may be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the maximum diameter of the crystal region may be approximately several tens of nanometers.

In the case of an In—Ga—Zn oxide, the CAAC-OS tends to have a layered crystal structure (also referred to as a stacked-layer structure) in which a layer containing indium (In) and oxygen (hereinafter, an In layer) and a layer containing gallium (Ga), zinc (Zn), and oxygen (hereinafter, an (Ga,Zn) layer) are stacked. Indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution transmission electron microscope (TEM) image, for example.

When the CAAC-OS film is subjected to structural analysis by out-of-plane XRD measurement with an XRD apparatus using θ/2θ scanning, for example, a peak indicating c-axis alignment is detected at or around 2θ=31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are symmetric with respect to a spot of the incident electron beam which passes through a sample (also referred to as a direct spot).

When the crystal region is observed from the particular direction, a lattice arrangement in the crystal region is basically a hexagonal lattice arrangement; however, a unit lattice is not always a regular hexagon and is a non-regular hexagon in some cases. For example, a pentagonal lattice arrangement or a heptagonal lattice arrangement is included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus causes a decrease in the on-state current or the field-effect mobility of a transistor, for example. Hence, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities and/or formation of defects might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

[Composition of Oxide Semiconductor]

Next, the CAC-OS will be described in detail. Note that the CAC-OS relates to the material composition.

[CAC-OS]

The CAC-OS refers to a composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

The CAC-OS also refers to a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Here, the atomic ratios of In, Ga, and Zn to a metal element included in a CAC-OS in an In—Ga—Zn oxide are expressed as [In], [Ga], and [Zn], respectively. For example, the first region in the CAC-OS in the In—Ga—Zn oxide has [In] higher than that in the composition of the CAC-OS film. Moreover, the second region of the CAC-OS in the In—Ga—Zn oxide has [Ga] higher than that in the composition of the CAC-OS film. Alternatively, for example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions randomly exist to form a mosaic pattern. Thus, it is suggested that the CAC-OS has a structure in which metal elements are unevenly distributed.

The CAC-OS can be formed by a sputtering method under conditions where intentional heating is not performed on a substrate, for example. In the case of forming the CAC-OS by a sputtering method, one or more selected from an inert gas (typically, argon), an oxygen gas, and a nitrogen gas can be used as a deposition gas. The proportion of the flow rate of an oxygen gas in the total flow rate of the deposition gas during deposition is preferably as low as possible. For example, the proportion of the flow rate of an oxygen gas in the total flow rate of the deposition gas is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a composition in which the regions containing In as a main component (the first regions) and the regions containing Ga as a main component (the second regions) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

A transistor including the CAC-OS is highly reliable. Thus, the CAC-OS is suitably used in a variety of semiconductor devices typified by a display apparatus.

An oxide semiconductor can have any of various structures that show various different properties. Two or more of an amorphous oxide semiconductor, a polycrystalline oxide semiconductor, an a-like OS, the CAC-OS, an nc-OS, and the CAAC-OS may be included in an oxide semiconductor of one embodiment of the present invention.

<Transistor Including Oxide Semiconductor>

Next, a transistor including the above oxide semiconductor will be described.

When the oxide semiconductor is used for a transistor, the transistor can have high field-effect mobility. In addition, the transistor can have high reliability.

It is particularly preferable that an oxide containing indium (In), gallium (Ga), and zinc (Zn) (also referred to as "IGZO") be used for the semiconductor layer where a channel is formed. Alternatively, an oxide containing indium (In), aluminum (Al), and zinc (Zn) (also referred to as "IAZO") may be used for the semiconductor layer. Alternatively, an oxide containing indium (In), aluminum (Al), gallium (Ga), and zinc (Zn) (also referred to as "IAGZO") may be used for the semiconductor layer.

An oxide semiconductor having a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, reducing the concentration of impurities in the oxide semiconductor is effective. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon. Note that an impurity in an oxide semiconductor refers to, for example, elements other than the main components of the oxide semiconductor. For example, an element with a concentration lower than 0.1 atomic % is regarded as an impurity.

<Impurities>

The influence of impurities in the oxide semiconductor will be described.

When silicon or carbon, which is a Group 14 element, is contained in an oxide semiconductor, defect states are formed in the oxide semiconductor. Thus, the concentration of silicon or carbon in the oxide semiconductor (the concentration measured by secondary ion mass spectrometry (SIMS)) is lower than or equal to $2 \times 10^{18}$ atoms/cm$^{-3}$, preferably lower than or equal to $2 \times 10^{17}$ atoms/cm$^{-3}$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1 \times 10^{18}$ atoms/cm$^{-3}$, preferably lower than or equal to $2 \times 10^{16}$ atoms/cm$^{-3}$.

An oxide semiconductor containing nitrogen easily becomes n-type by generation of electrons serving as carriers and an increase in carrier concentration. As a result, a transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is lower than $5 \times 10^{19}$ atoms/cm$^{-3}$, preferably lower than or equal to $5 \times 10^{18}$ atoms/cm$^{-3}$, further preferably lower than or equal to $1 \times 10^{18}$ atoms/cm$^{-3}$, still further preferably lower than or equal to $5 \times 10^{17}$ atoms/cm$^{-3}$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, bonding of part of hydrogen to oxygen bonded to a metal atom generates an electron serving as a carrier. Thus, a transistor including an oxide semiconductor that contains hydrogen tends to have normally-on characteristics. For this reason, hydrogen in the oxide semiconductor is preferably reduced as much as possible. Specifically, the concentration of hydrogen in the oxide semiconductor, which is measured by SIMS, is lower than $1 \times 10^{20}$ atoms/cm$^{-3}$, preferably lower than $1 \times 10^{19}$ atoms/cm$^{-3}$, further preferably lower than $5 \times 10^{18}$ atoms/cm$^{-3}$, still further preferably lower than $1 \times 10^{18}$ atoms/cm$^{-3}$.

When an oxide semiconductor with sufficiently reduced impurities is used for a channel formation region in a transistor, the transistor can have stable electrical characteristics.

The structures described in this embodiment can be used in combination with any of the structures described in the other embodiments as appropriate.

Embodiment 3

In this embodiment, configuration examples of a display device 200 are described. For the display device 200, the transistor 10, the semiconductor device 100 (the semiconductor devices 100A, 100Aa, 100B, and 100C), and the like of embodiments of the present invention can be used.

Figure 40A:
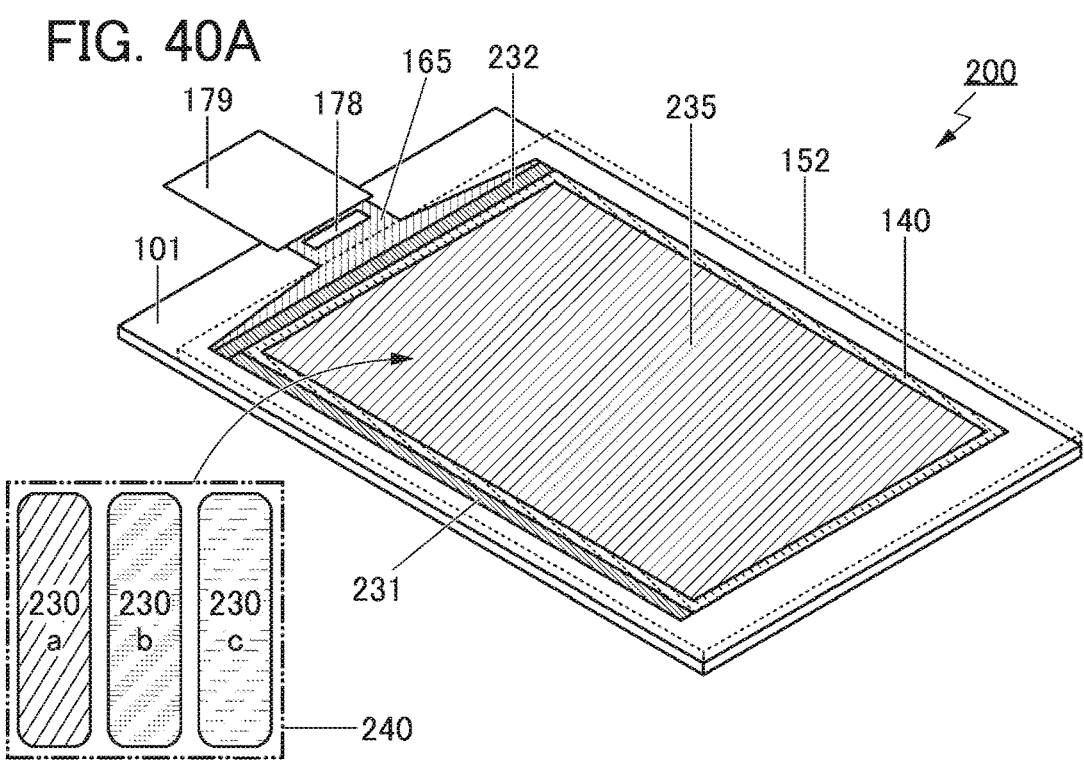
FIG. 40A is a perspective view of a display device.

FIG. 40A is a perspective view of the display device 200. In the display device 200, a substrate 152 and the substrate 101 are attached to each other. In FIG. 40A, the substrate 152 is denoted by a dashed line.

The display device 200 includes a display portion 235, a connection portion 140, a first driver circuit portion 231, a second driver circuit portion 232, a wiring 165, and the like. FIG. 40A illustrates an example in which an IC (integrated circuit) 178 and an FPC 179 are implemented on the display device 200. Thus, the structure illustrated in FIG. 40A can be regarded as a display module including the display device 200, the IC, and the FPC.

The connection portion 140 is provided outside the display portion 235. The connection portion 140 can be provided along one or more sides of the display portion 235. The number of connection portions 140 may be one or more. FIG. 40A illustrates an example in which the connection portion 140 is provided to surround the four sides of the display portion. The common electrode of the light-emitting device is electrically connected to a conductive layer in the connection portion 140, and thus a potential can be supplied to the common electrode.

The wiring 165 is configured to supply a signal and power to the display portion 235, the first driver circuit portion 231, and the second driver circuit portion 232. The signal and power are input to the wiring 165 from the outside through the FPC 179 or from the IC 178.

FIG. 40A illustrates an example in which the IC 178 is provided over the substrate 101 by a chip on glass (COG) method, a chip on film (COF) method, or the like. The IC 178 may include, for example, a scan line driver circuit or a signal line driver circuit. Note that the display device 200 and the display module are not necessarily provided with an IC. The IC may be mounted on the FPC by a COF method or the like.

The display portion 235 includes a plurality of pixels 230 arranged in a matrix of m rows (m is an integer greater than or equal to 1) and n columns (n is an integer greater than or equal to 1). The plurality of pixels 230 are classified into, for example, pixels 230a, pixels 230b, and pixels 230c. The pixel 230a, the pixel 230b, and the pixel 230c are configured to emit light of different colors. For example, the pixel 230a, the pixel 230b, and the pixel 230c may be configured to emit light of red (R), green (G), and blue (B), respectively.

Alternatively, for example, the pixel 230a, the pixel 230b, and the pixel 230c may be configured to emit light of yellow (Y), cyan (C), and magenta (M), respectively.

One pixel 230a, one pixel 230b, and one pixel 230c form one pixel 240, which achieves full-color display. That is, the pixel 230 serves as a subpixel. The display device 200 illustrated in FIG. 40A shows an example in which pixels 230 each serving as a subpixel are arranged in a stripe pattern. The number of subpixels for forming one pixel 240 is not limited to three, and may be four or more. For example, one pixel 240 may include four subpixels which emit light of four colors, R, G, B, and white (W). Alternatively, one pixel 240 may include four subpixels which emit light of four colors, R, G, B, and Y.

Figure 40B:
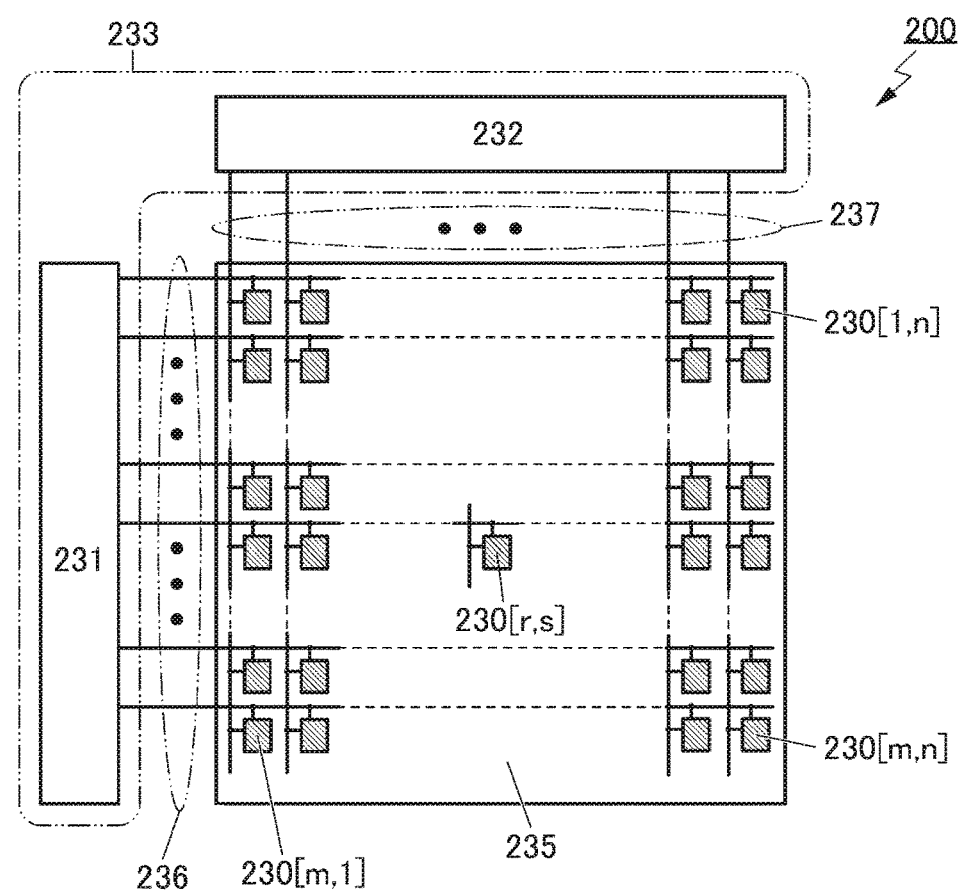
FIG. 40B is a block diagram of the display device.

FIG. 40B is a block diagram illustrating the display device 200. The display device 200 includes the display portion 235, the first driver circuit portion 231, and the second driver circuit portion 232. In FIG. 40B, the pixel 230 in the first row and the n-th column is denoted as a pixel 230[1, n], the pixel 230 in the m-th row and the first column is denoted as a pixel 230[m, 1], and the pixel 230 in the m-th row and the n-th column is denoted as a pixel 230[m, n]. A given pixel 230 included in the display portion 235 is denoted as a pixel 230[r, s] in some cases. Note that r is an integer greater than or equal to 1 and less than or equal to m, and s is an integer greater than or equal to 1 and less than or equal to n.

A circuit included in the first driver circuit portion 231 functions as, for example, a scan line driver circuit. A circuit included in the second driver circuit portion 232 functions as, for example, a signal line driver circuit. Some sort of circuit may be provided to face the first driver circuit portion 231 with the display portion 235 positioned therebetween. Some sort of circuit may be provided to face the second driver circuit portion 232 with the display portion 235 positioned therebetween. Note that circuits included in the first driver circuit portion 231 and the second driver circuit portion 232 are collectively referred to as a peripheral driver circuit 233.

As the peripheral driver circuit 233, a variety of circuits such as a shift register circuit, a level shifter circuit, an inverter circuit, a latch circuit, an analog switch circuit, a multiplexer circuit, a demultiplexer circuit, a logic circuit can be used. For the peripheral driver circuit 233, the transistor 10 and the semiconductor device 100 of embodiments of the present invention can be used. Note that a transistor included in the peripheral driver circuit and a transistor included in the pixel 230 may be formed through the same process.

The display device 200 includes m wirings 236 which are arranged substantially parallel to each other and whose potentials are controlled by the circuits included in the first driver circuit portion 231, and n wirings 237 which are arranged substantially parallel to each other and whose potentials are controlled by the circuits included in the second driver circuit portion 232.

FIG. 40B illustrates an example in which the wiring 236 and the wiring 237 are connected to the pixel 230. Note that the wiring 236 and the wiring 237 are examples, and wirings connected to the pixel 230 are not limited to the wiring 236 and the wiring 237.

<Configuration Examples of Pixel Circuit>
FIGS. 41A to 41D, FIGS. 42A to 42D, and FIGS. 43A and 43B illustrate configuration examples of the pixels 230. The pixel 230 includes a pixel circuit 51 (a pixel circuit 51A, a pixel circuit 51B, a pixel circuit 51C, a pixel circuit 51D, a pixel circuit 51E, a pixel circuit 51F, a pixel circuit 51G, a pixel circuit 51H, a pixel circuit 51I, or a pixel circuit 51J) and a light-emitting element 61.

The light-emitting element (also referred to as a light-emitting device) described in this embodiment and the like is a self-luminous display element such as an organic light-emitting diode (also referred to as OLED). The light-emitting element electrically connected to the pixel circuit can be a self-luminous light-emitting element such as a light-emitting diode (LED), a micro LED, a quantum-dot light-emitting diode (QLED), or a semiconductor laser.

Figure 41A:
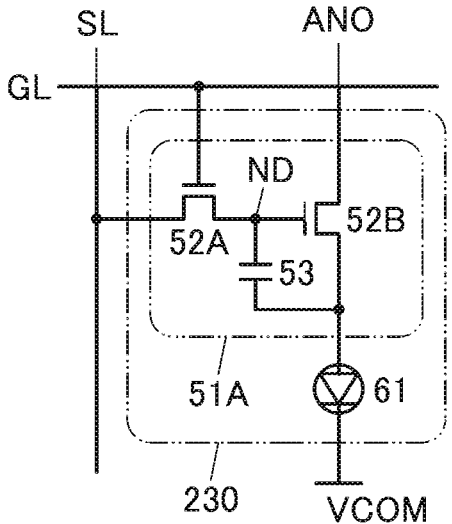
FIGS. 41A to 41D are each a circuit diagram of a pixel circuit.

The pixel circuit 51A illustrated in FIG. 41A is a 2Tr1C-type pixel circuit including a transistor 52A, a transistor 52B, and a capacitor 53.

One of a source and a drain of the transistor 52A is electrically connected to a wiring SL, and the gate of the transistor 52A is electrically connected to a wiring GL. The one of the source and the drain of the transistor 52A is electrically connected to a gate of the transistor 52B and one terminal of the capacitor 53. One of a source and a drain of the transistor 52B is electrically connected to a wiring ANO. The other of the source and the drain of the transistor 52B is electrically connected to the other terminal of the capacitor 53 and an anode of the light-emitting element 61. A cathode of the light-emitting element 61 is electrically connected to a wiring VCOM. A region to which the other of the source and the drain of the transistor 52A, the gate of the transistor 52B, and the one terminal of the capacitor 53 are electrically connected serves as the node ND.

The wiring GL corresponds to the wiring 236, and the wiring SL corresponds to the wiring 237. The wiring VCOM supplies a potential for supplying a current to the light-emitting element 61. The transistor 52A has a function of controlling the on/off state between the wiring SL and the gate of the transistor 52B in accordance with the potential of the wiring GL. For example, VDD is supplied to the wiring ANO, and VSS is supplied to the wiring VCOM.

When the transistor 52A is turned on, an image signal is supplied from the wiring SL to the node ND. Then, the transistor 52A is turned off, and the image signal is held in the node ND. In order to surely hold the image signal supplied to the node ND, a transistor with a low off-state current is preferably used as the transistor 52A. For example, an OS transistor is preferably used as the transistor 52A.

The transistor 52B has a function of controlling the amount of current flowing through the light-emitting element 61. The capacitor 53 has a function of holding a gate potential of the transistor 52B. The intensity of light emitted from the light-emitting element 61 is controlled in accordance with an image signal supplied to the gate of the transistor 52B (the node ND).

Figure 41B:
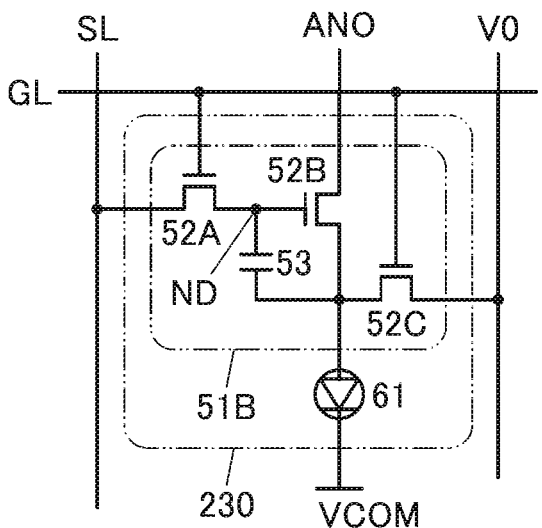

The pixel circuit 51B illustrated in FIG. 41B is a 3Tr1C-type pixel circuit including the transistor 52A, the transistor 52B, a transistor 52C, and the capacitor 53. The pixel circuit 51B in FIG. 41B has a configuration in which the transistor 52C is added to the pixel circuit 51A in FIG. 41A.

One of a source and a drain of the transistor 52C is electrically connected to the other of the source and the drain of the transistor 52B. The gate of the transistor 52C is electrically connected to the wiring GL. The other of the source and the drain of the transistor 52C is electrically connected to a wiring V0. For example, a reference potential is supplied to the wiring V0.

The transistor 52C has a function of controlling the on/off state between the wiring V0 and the other of the source and the drain of the transistor 52B in accordance with the potential of the wiring GL. The wiring V0 is a wiring that supplies the reference potential. In the case where an n-channel transistor is used as the transistor 52B, variations in the gate-source potential of the transistor 52B can be reduced by the reference potential of the wiring V0 supplied through the transistor 52C.

A current value that can be used for setting of pixel parameters can be obtained with the use of the wiring V0. Specifically, the wiring V0 can function as a monitor line for outputting a current flowing in the transistor 52B or a current flowing in the light-emitting element 61 to the outside. A current output to the wiring V0 is converted into a voltage by a source follower circuit or the like and can be output to the outside. Alternatively, the current is converted into a digital signal by an A/D converter or the like and can be output to the outside.

Figure 41C:
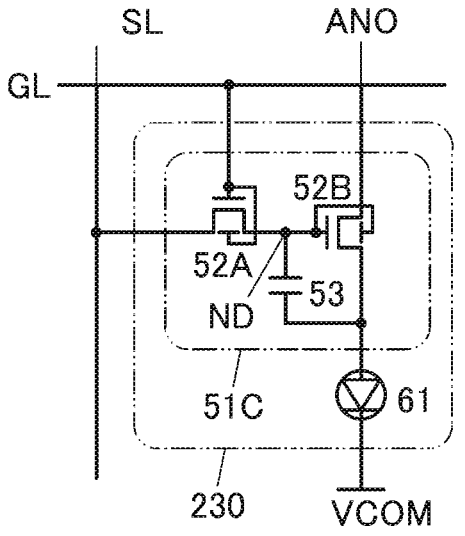
Figure 41D:
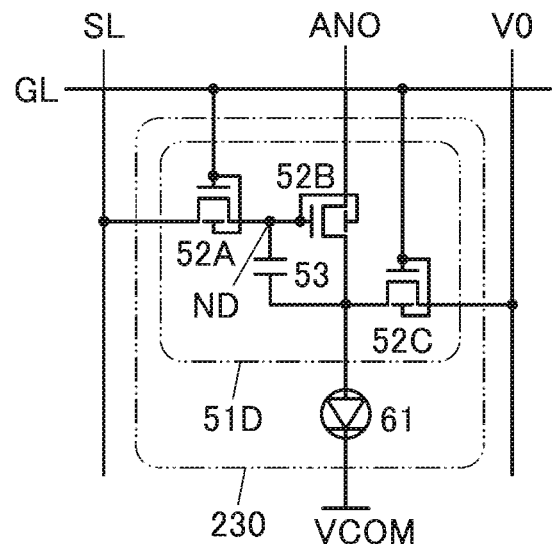

The pixel circuit 51C illustrated in FIG. 41C is an example in which a transistor including a gate and a backgate which are electrically connected to each other is used as each of the transistor 52A and the transistor 52B of the pixel circuit 51A. The pixel circuit 51D illustrated in FIG. 41D is an example in which such transistors are used in the pixel circuit 51B. With these structures, a current that can flow through the transistors can be increased. Although a transistor including a gate and a backgate electrically connected to each other is used as every transistor here, one embodiment of the present invention is not limited thereto. A transistor that includes a gate and a backgate which are electrically connected to different wirings may be used. For example, with use of a transistor in which one of a gate and a backgate is electrically connected to a source, the reliability can be increased.

Figure 42A:
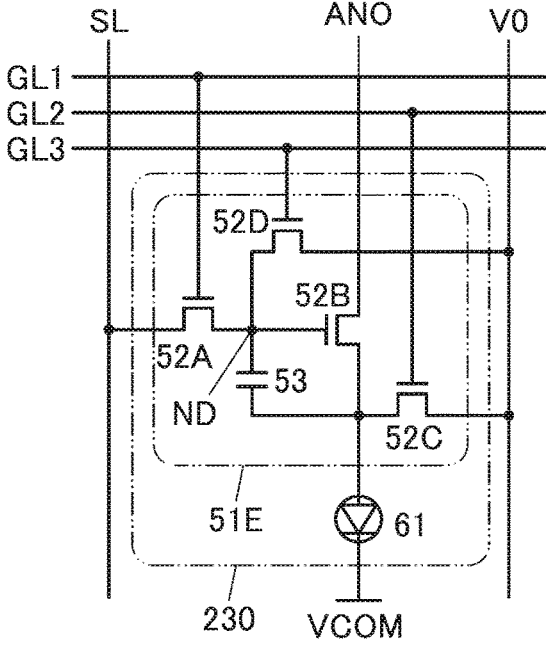
FIGS. 42A to 42D are each a circuit diagram of a pixel circuit.

The pixel circuit 51E illustrated in FIG. 42A has a configuration in which a transistor 52D is added to the pixel circuit 51B in FIG. 41B. The pixel circuit 51E illustrated in FIG. 42A is a 4Tr1C-type pixel circuit including the transistor 52A, the transistor 52B, the transistor 52C, the transistor 52D, and the capacitor 53.

The one of the source and the drain of the transistor 52D is electrically connected to the node ND, and the other is electrically connected to the wiring V0.

A wiring GL1, a wiring GL2, and a wiring GL3 are electrically connected to the pixel circuit 51E. The wiring GL1 is electrically connected to the gate of the transistor 52A, the wiring GL2 is electrically connected to the gate of the transistor 52C, and the wiring GL3 is electrically connected to a gate of the transistor 52D. In this embodiment and the like, the wirings GL1, GL2, and GL3 are collectively referred to as the wiring GL in some cases. Thus, the wiring GL may be one wiring or a plurality of wirings.

When the transistors 52C and 52D are turned on at the same time, the source and the gate of the transistor 52B have the same potential, so that the transistor 52B can be turned off. Thus, a current flowing to the light-emitting element 61 can be blocked forcibly. Such a pixel circuit is suitable for the case of using a display method in which a display period and an off period are alternately provided.

Figure 42B:
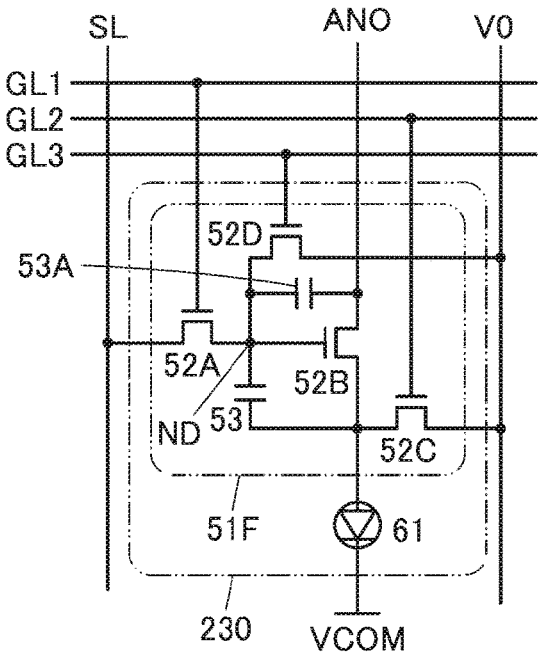

The pixel circuit 51F illustrated in FIG. 42B is an example in which a capacitor 53A is added to the pixel circuit 51E. The capacitor 53A functions as a storage capacitor. The pixel circuit 51E illustrated in FIG. 42A is a 4Tr1C-type pixel circuit. The pixel circuit 51F illustrated in FIG. 42B is a 4Tr2C-type pixel circuit.

Figure 42C:
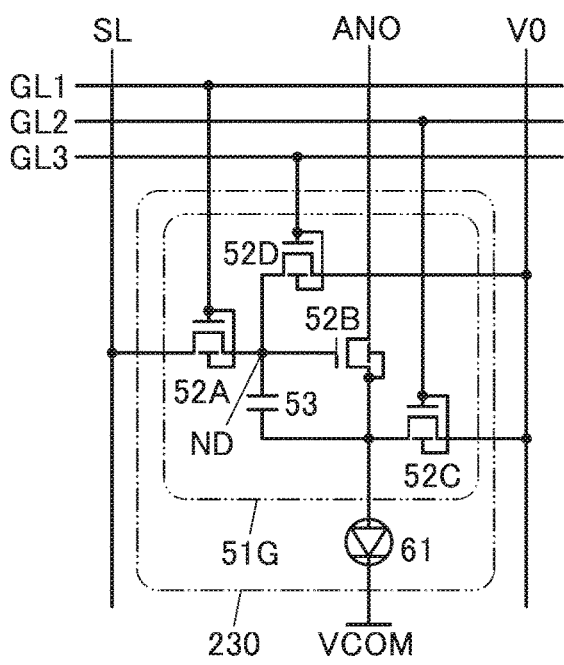
Figure 42D:
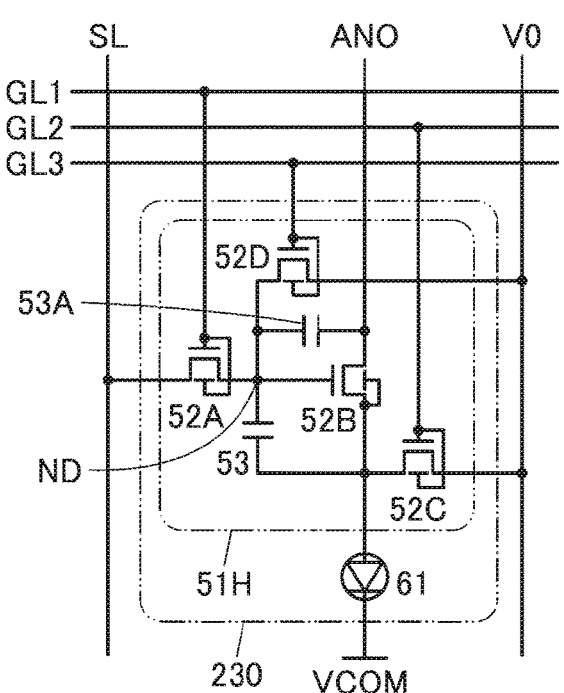

The pixel circuit 51G illustrated in FIG. 42C and the pixel circuit 51H illustrated in FIG. 42D are each an example in which a transistor including a backgate is used in the pixel circuit 51E or the pixel circuit 51F. A transistor including a gate and a backgate which are electrically connected to each other is used as each of the transistors 52A, 52C, and 52D, and a transistor in which one of a gate and a backgate is electrically connected to a source is used as the transistor 52B.

Figure 43A:
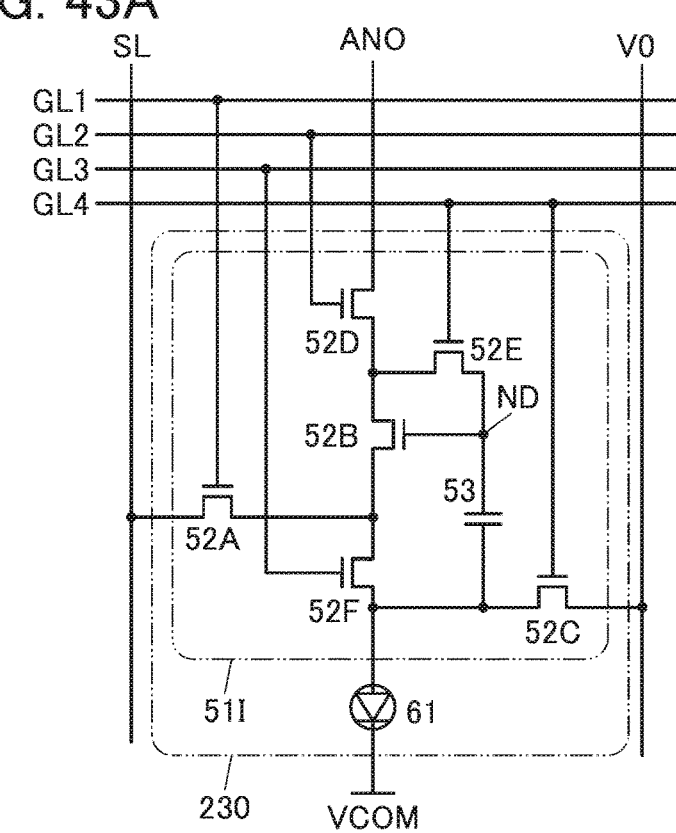
FIGS. 43A and 43B are each a circuit diagram of a pixel circuit.

The pixel circuit 51I illustrated in FIG. 43A is a 6Tr1C-type pixel circuit including the transistor 52A, the transistor 52B, the transistor 52C, the transistor 52D, a transistor 52E, a transistor 52F, and the capacitor 53.

The one of the source and the drain of the transistor 52A is electrically connected to the wiring SL, and the gate of the transistor 52A is electrically connected to the wiring GL1. One of a source and a drain of the transistor 52D is electrically connected to the wiring ANO, and the gate of the transistor 52D is electrically connected to the wiring GL2. The other of the source and the drain of the transistor 52D is electrically connected to the one of the source and the drain of the transistor 52B. The other of the source and the drain of the transistor 52B is electrically connected to the other of the source and the drain of the transistor 52A and one of a source and a drain of the transistor 52F. A gate of the transistor 52F is electrically connected to the wiring GL3.

One of a source and a drain of the transistor 52E is electrically connected to the other of the source and the drain of the transistor 52D and the one of the source and the drain of the transistor 52B. The other of the source and the drain of the transistor 52E is electrically connected to the gate of the transistor 52B and the one terminal of the capacitor 53. The other terminal of the capacitor 53 is electrically connected to the other of the source and the drain of the transistor 52F, the anode of the light-emitting element 61, and the one of the source and the drain of the transistor 52C. A gate of the transistor 52E and the gate of the transistor 52C are electrically connected to a wiring GL4. The other of the source and the drain of the transistor 52C is electrically connected to the wiring V0. A region to which the other of the source and the drain of the transistor 52E, the gate of the transistor 52B, and the one terminal of the capacitor 53 are electrically connected serves as the node ND.

Figure 43B:
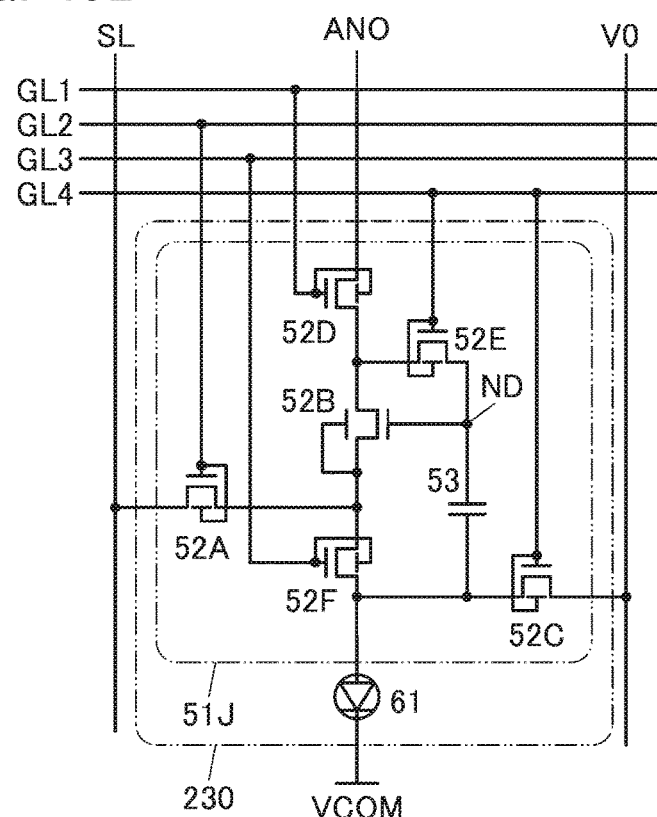

As illustrated in FIG. 43B, a transistor included in the pixel circuit 51J may have a backgate. A transistor in which a gate and a backgate are electrically connected to each other is used as each of the transistors 52A, 52C, 52D, 52E, and 52F, and a transistor in which a backgate is electrically connected to the other of the source and the drain is used as the transistor 52B.

The transistor 10 of one embodiment of the present invention can be used as each of the transistors 52A, 52C, 52D, 52E, and 52F.

With the use of the transistor 10 of one embodiment of the present invention for a pixel circuit of a display device, the area occupied by the pixel circuit can be reduced. Thus, the resolution of the display device can be increased. For example, a display device with a resolution higher than or equal to 1000 ppi, preferably higher than or equal to 2000 ppi, further preferably higher than or equal to 3000 ppi, still further preferably higher than or equal to 4000 ppi, yet further preferably higher than or equal to 5000 ppi, yet still further preferably higher than or equal to 6000 ppi, and lower than or equal to 10000 ppi, lower than or equal to 9000 ppi, or lower than or equal to 8000 ppi can be achieved.

The reduction in the area occupied by the pixel circuit can increase the number of pixels of the display device (can increase the resolution). For example, a display device with an extremely high resolution of HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320) can be achieved.

Accordingly, the use of the transistor 10 of one embodiment of the present invention for the pixel circuit of the display device can increase the display quality of the display device. A bottom-emission display device including the EL element can have a high aperture ratio of a pixel. A pixel with a high aperture ratio can have a lower current density than a pixel with a low aperture ratio when the pixel with a high aperture ratio and the pixel with a low aperture ratio emit light with the same luminance. Accordingly, the reliability of the display device can be improved.

<Pixel Layout>

Pixel layouts different from FIG. 40A are mainly described with reference to FIGS. 44A to 44G and FIGS. 45A to 45K. There is no particular limitation on the arrangement of subpixels, and a variety of pixel layouts can be employed. The arrangement of subpixels may be stripe arrangement, S stripe arrangement, matrix arrangement, delta arrangement, Bayer arrangement, or PenTile arrangement, for example.

Note that each of the planar shapes of the subpixels illustrated in FIG. 40A, FIGS. 44A to 44G, and FIGS. 45A to 45K corresponds to the planar shape of a light-emitting region.

Examples of the planar shape of the subpixel include polygons such as a triangle, a tetragon (including a rectangle and a square), and a pentagon; polygons with rounded corners; an ellipse; and a circle.

The pixel circuit 51 included in the subpixel (the pixel 230) may be placed to overlap with a light-emitting region or may be placed outside the light-emitting region.

The pixel 240 illustrated in FIG. 44A employs the S stripe arrangement. The pixel 240 in FIG. 44A includes three subpixels, the pixel 230a, the pixel 230b, and the pixel 230c.

The pixel 240 illustrated in FIG. 44B includes the pixel 230a whose planar shape is a rough trapezoidal shape with rounded corners, the pixel 230b whose planar shape is a rough triangle shape with rounded corners, and the pixel 230c whose planar shape is a rough tetragonal or rough hexagonal shape with rounded corners. The pixel 230a has a larger light-emitting area than the pixel 230b. In this manner, the shapes and sizes of the subpixels can be determined independently. For example, the size of a subpixel including a light-emitting device with higher reliability can be smaller.

A pixel 240A and a pixel 240B illustrated in FIG. 44C employ PenTile arrangement. FIG. 44C illustrates an example where the pixels 240A including the pixels 230a and 230b and the pixels 240B including the pixels 230b and 230c are alternately arranged.

The pixels 240A and 240B illustrated in FIGS. 44D and 44F employ delta arrangement. The pixel 240A includes two subpixels (the pixels 230a and 230b) in the upper row (first row) and one subpixel (the pixel 230c) in the lower row (second row). The pixel 240B includes one subpixel (the pixel 230c) in the upper row (first row) and two subpixels (the pixels 230a and 230b) in the lower row (second row).

FIG. 44D illustrates an example where the planar shape of each subpixel is a rough square shape with rounded corners, FIG. 44E illustrates an example where the planar shape of each subpixel is a circular shape, and FIG. 44F illustrates an example where the planar shape of each subpixel is a rough hexagonal shape with rounded corners.

In FIG. 44F, each subpixel is provided inside one of the closest-packed hexagonal regions. Focusing on one of the subpixels, the subpixel is placed so as to be surrounded by six subpixels. In addition, the subpixels are arranged such that subpixels exhibiting the same color are not adjacent to each other. For example, focusing on the pixel 230a, three pixels 230b and three pixels 230c are alternately provided so as to surround the pixel 230a.

FIG. 44G illustrates an example where subpixels of different colors are arranged in a zigzag manner. Specifically, the positions of the top sides of two subpixels arranged in the column direction (e.g., the pixel 230a and the pixel 230b or the pixel 230b and the pixel 230c) are not aligned in the top view.

For example, in each pixel in FIGS. 44A to 44G, it is preferable that the pixel 230a be a subpixel R emitting red light, the pixel 230b be a subpixel G emitting green light, and the pixel 230c be a subpixel B emitting blue light. Note that the structures of the subpixels are not limited to this, and the colors and arrangement order of the subpixels can be determined as appropriate. For example, the pixel 230b may be the subpixel R emitting red light and the pixel 230a may be the subpixel G emitting green light.

In a photolithography method, as a pattern to be formed by processing becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the planar shape of a subpixel may be a polygonal shape with rounded corners, an elliptical shape, a circular shape, or the like.

In the case where the EL layer is processed into an island shape with the use of a resist mask, a resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film might have a shape different from a desired shape by processing. As a result, a planar shape of the EL layer may have a polygonal shape with rounded corners, an elliptical shape, a circular shape, or the like. For example, when a resist mask with a square planar shape is intended to be formed, a resist mask with a circular planar shape might be formed, and the planar shape of the EL layer might be circular.

To obtain a desired planar shape of the EL layer, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

As illustrated in FIGS. 45A to 45I, the pixel can include four types of subpixels.

The pixel 240 illustrated in FIGS. 45A to 45C employs stripe arrangement.

FIG. 45A illustrates an example where each subpixel has a rectangular planar shape, FIG. 45B illustrates an example where each subpixel has a planar shape formed by combining two half circles and a rectangle, and FIG. 45C illustrates an example where each subpixel has an elliptical planar shape.

The pixel 240 illustrated in FIGS. 45D to 45F employs matrix arrangement.

FIG. 45D illustrates an example where the top surface of each subpixel has a square shape, FIG. 45E illustrates an example where the top surface of each subpixel has a rough square shape with rounded corners, and FIG. 45F illustrates an example where the top surface of each subpixel has a circular shape.

FIGS. 45G and 45H each illustrate an example where one pixel 240 is composed of subpixels arranged in two rows and three columns.

The pixel 240 illustrated in FIG. 45G includes three subpixels (the pixels 230*a*, 230*b*, and 230*c*) in the upper row (first row) and one subpixel (pixel 230*d*) in the lower row (second row). In other words, the pixel 240 includes the pixel 230*a* in the left column (first column), the pixel 230*b* in the center column (second column), the pixel 230*c* in the right column (third column), and the pixel 230*d* across these three columns.

The pixel 240 illustrated in FIG. 45H includes three subpixels (the pixels 230*a*, 230*b*, and 230*c*) in the upper row (first row) and three pixels 230*d* in the lower row (second row). In other words, the pixel 240 includes the pixel 230*a* and the pixel 230*d* in the left column (first column), the pixel 230*b* and another pixel 230*d* in the center column (second column), and the pixel 230*c* and another pixel 230*d* in the right column (third column). Matching the positions of the subpixels in the upper row and the lower row as illustrated in FIG. 45H enables dust and the like that would be produced in the manufacturing process to be removed efficiently. Thus, a display apparatus having high display quality can be provided.

FIG. 45I illustrates an example where one pixel 240 is composed of subpixels arranged in three rows and two columns.

The pixel 240 illustrated in FIG. 45I includes the pixel 230*a* in the upper row (first row), the pixel 230*b* in the center row (second row), the pixel 230*c* across the first and second rows, and one subpixel (the pixel 230*d*) in the lower row (third row). In other words, the pixel 240 includes the pixels 230*a* and 230*b* in the left column (first column), the pixel 230*c* in the right column (second column), and the pixel 230*d* across these two columns.

The pixel 240 illustrated in FIGS. 45A to 45I includes four types of pixels 230*a*, 230*b*, 230*c*, and 230*d*.

The pixels 230*a*, 230*b*, 230*c*, and 230*d* include light-emitting devices that emit light of different colors. The pixels 230*a*, 230*b*, 230*c*, and 230*d* can be of four colors of R, G, B, and white (W), of four colors of R, G, B, and Y, or of R, G, B and infrared (IR) light, for example.

In the pixel 240 illustrated in FIGS. 45A to 45I, it is preferable that the pixel 230*a* be the subpixel R emitting red light, the pixel 230*b* be the subpixel G emitting green light, the pixel 230*c* be the subpixel B emitting blue light, and the pixel 230*d* be any of a subpixel W emitting white light, a subpixel Y emitting yellow light, and a subpixel IR emitting near-infrared light, for example. In the case of such a structure, stripe arrangement is employed as the layout of R, G, and B in the pixel 240 illustrated in FIGS. 45G and 45H, leading to an increase in the display quality. In the pixel 240 illustrated in FIG. 45I, what is called S stripe arrangement is employed as the layout of R, G, and B, leading to higher display quality.

The pixel 240 may include a subpixel including a light-receiving element (also referred to as a light-receiving device).

In the pixel 240 illustrated in FIGS. 45A to 45I, any one of the pixels 230*a* to 230*d* may be a subpixel including a light-receiving device.

In the pixel 240 illustrated in FIGS. 45A to 45I, for example, the pixel 230*a* may be the subpixel R emitting red light, the pixel 230*b* may be the subpixel G emitting green light, the pixel 230*c* may be the subpixel B emitting blue light, and the pixel 230*d* may be a subpixel S including a light-receiving device. In the case of such a structure, stripe arrangement is employed as the layout of R, G, and B in the pixel 240 illustrated in FIGS. 45G and 45H, leading to higher display quality. In addition, what is called S stripe arrangement is employed as the layout of R, G, and B in the pixel 240 illustrated in FIG. 45I, leading to higher display quality.

There is no particular limitation on the wavelength of light sensed by the subpixel S including a light-receiving device. The subpixel S can have a structure in which one or both of infrared light and visible light can be sensed.

As illustrated in FIGS. 45J and 45K, one pixel 240 may include five subpixels.

FIG. 45J illustrates an example in which one pixel 240 is formed with subpixels arranged in two rows and three columns.

The pixel 240 illustrated in FIG. 45J includes three subpixels (the pixel 230*a*, the pixel 230*b*, and the pixel 230*c*) in the upper row (the first row) of the pixel 240 and two subpixels (the pixel 230*d* and a pixel 230*e*) in the lower row (the second row). In other words, the pixel 240 includes the pixels 230*a* and 230*d* in the left column (first column), the pixel 230*b* in the center column (second column), the pixel 230*c* in the right column (third column), and the pixel 230*e* across the second and third columns.

FIG. 45K illustrates an example in which one pixel 240 is formed with subpixels arranged in three rows and two columns.

The pixel 240 illustrated in FIG. 45K includes the pixel 230*a* in the upper row (first row), the pixel 230*b* in the center row (second row), the pixel 230*c* across the first and second rows, and two subpixels (the pixels 230*d* and 230*e*) in the lower row (third row). In other words, the pixel 240 includes the pixels 230*a*, 230*b*, and 230*d* in the left column (first column), and the pixels 230*c* and 230*e* in the right column (second column).

In the pixel 240 illustrated in FIGS. 45J and 45K, for example, it is preferable that the pixel 230*a* be the subpixel R emitting red light, the pixel 230*b* be the subpixel G emitting green light, and the pixel 230*c* be the subpixel B emitting blue light. In the case of such a structure, stripe arrangement is employed as the layout of R, G, and B in the pixel 240 illustrated in FIGS. 45J, leading to higher display quality. In addition, what is called S stripe arrangement is employed as the layout of R, G, and B in the pixel 240 illustrated in FIG. 45K, leading to higher display quality.

In the pixel 240 illustrated in FIGS. 45J and 45K, for example, the subpixel S including a light-receiving device may be used as at least one of the pixels 230*d* and 230*e*. In the case where light-receiving devices are used as both the pixels 230*d* and 230*e*, the light-receiving devices may have different structures. For example, the wavelength ranges of sensed light may be different at least partly. Specifically, one of the pixels 230*d* and 230*e* may include a light-receiving device mainly sensing visible light and the other may include a light-receiving device mainly sensing infrared light.

In the pixel 240 illustrated in FIGS. 45J and 45K, for example, the subpixel S including a light-receiving device may be used as one of the pixels 230*d* and 230*e* and a subpixel including a light-receiving device that can be used as a light source may be used as the other. For example, one of the pixels 230*d* and 230*e* may be the subpixel IR emitting infrared light and the other may be the subpixel S including a light-receiving device sensing infrared light.

In the pixel including the subpixels R, G, B, IR, and S, while displaying an image using the subpixels R, G, and B, the subpixel S can sense reflected light of infrared light emitted from the subpixel IR that is used as a light source.

As described above, in the display device of one embodiment of the present invention, various layouts of the subpixels (the pixels 230) can be employed for the pixel 240. Furthermore, the pixel 240 may have a configuration including both a light-emitting device and a light-receiving device. Also in that case, various layouts can be employed.

The structures described in this embodiment can be used in combination with any of the structures described in the other embodiments as appropriate.

Embodiment 4

In this embodiment, a light-emitting device that can be used in the light-emitting element 61 will be described.

Figure 46A:
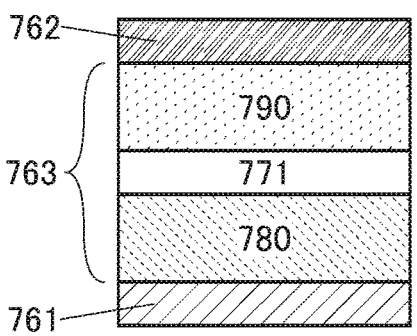
FIGS. 46A to 46F each illustrate a structure example of a light-emitting device.

As illustrated in FIG. 46A, the light-emitting device includes an EL layer 763 between a pair of electrodes (a lower electrode 761 and an upper electrode 762). The EL layer 763 can be formed of a plurality of layers such as a layer 780, a light-emitting layer 771, and a layer 790.

The light-emitting layer 771 contains at least a light-emitting substance (also referred to as a light-emitting material).

In the case where the lower electrode 761 is an anode and the upper electrode 762 is a cathode, the layer 780 includes one or more of a layer containing a substance having a high hole-injection property (a hole-injection layer), a layer containing a substance having a high hole-transport property (a hole-transport layer), and a layer containing a substance having a high electron-blocking property (an electron-blocking layer). The layer 790 includes one or more of a layer containing a substance having a high electron-injection property (an electron-injection layer), a layer containing a substance having a high electron-transport property (an electron-transport layer), and a layer containing a substance having a high hole-blocking property (a hole-blocking layer). In the case where the lower electrode 761 is a cathode and the upper electrode 762 is an anode, the structures of the layers 780 and 790 are replaced with each other.

The structure including the layer 780, the light-emitting layer 771, and the layer 790, which is provided between a pair of electrodes, can function as a single light-emitting unit, and the structure in FIG. 46A is referred to as a single structure in this specification.

Figure 46B:
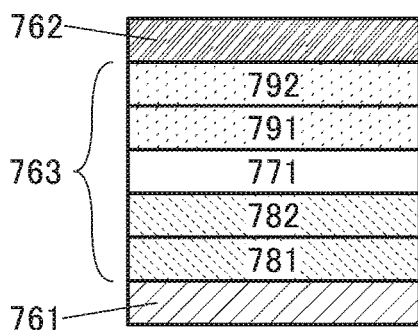

FIG. 46B is a variation example of the EL layer 763 included in the light-emitting device illustrated in FIG. 46A. Specifically, the light-emitting device illustrated in FIG. 46B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. In the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layered structure, carriers can be efficiently injected to the light-emitting layer 771, and the efficiency of the recombination of carriers in the light-emitting layer 771 can be enhanced.

Figure 46C:
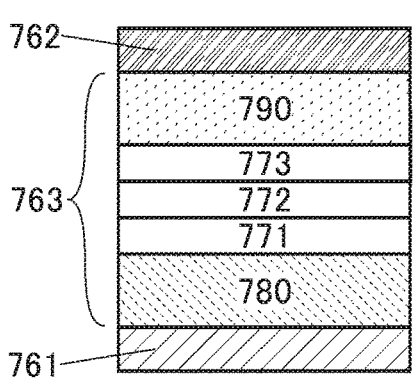
Figure 46D:
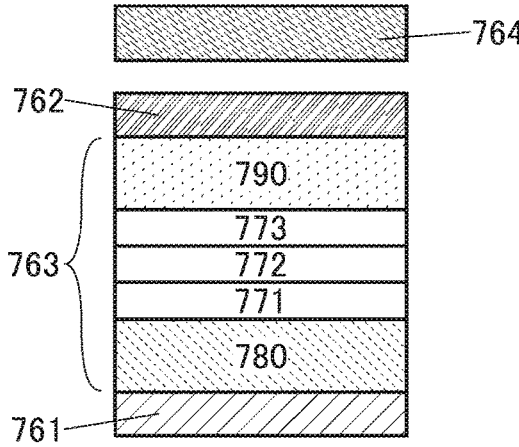

Note that structures in which a plurality of light-emitting layers (light-emitting layers 771, 772, and 773) are provided between the layers 780 and 790 as illustrated in FIGS. 46C and 46D are other variations of the single structure. Although FIGS. 46C and 46D illustrate the examples where three light-emitting layers are included, the light-emitting device having a single structure may include two or four or more light-emitting layers. In addition, the light-emitting device having a single structure may include a buffer layer between two light-emitting layers. A carrier-transport layer (a hole-transport layer or an electron-transport layer) can be used as the buffer layer, for example.

Figure 46E:
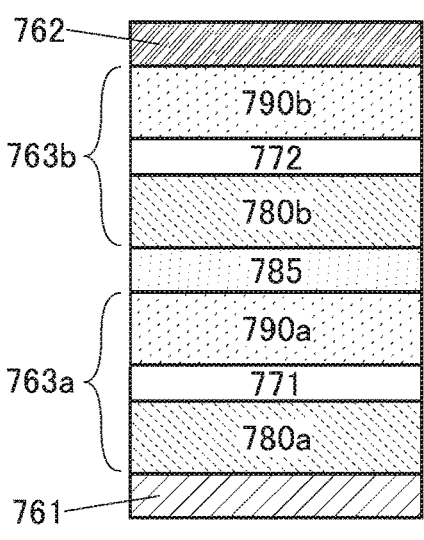
Figure 46F:
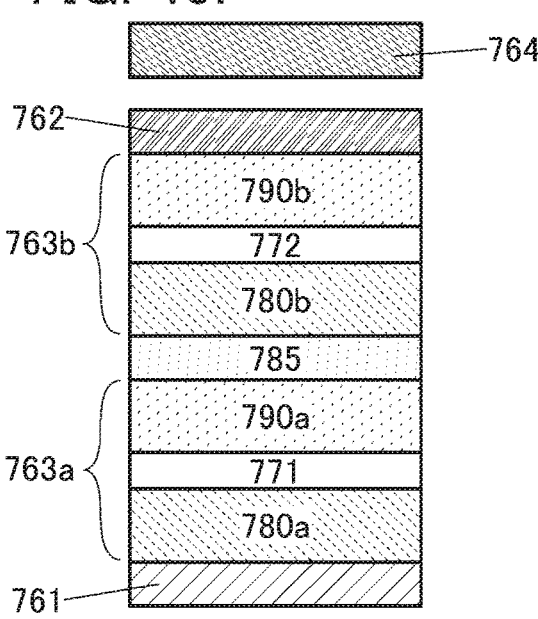

In this specification, as illustrated in FIGS. 46E and 46F, a structure where a plurality of light-emitting units (a light-emitting unit 763a and a light-emitting unit 763b) are connected in series with a charge-generation layer 785 (also referred to as an intermediate layer) therebetween is referred to as a tandem structure. Note that a tandem structure may be referred to as a stack structure. The tandem structure enables a light-emitting device capable of high-luminance light emission. Furthermore, a tandem structure allows the amount of current needed for obtaining the same luminance to be reduced as compared to the case of using a single structure, and thus can improve the reliability.

Note that FIGS. 46D and 46F illustrate examples where the display apparatus includes a layer 764 overlapping with the light-emitting device. FIG. 46D illustrates an example where the layer 764 overlaps with the light-emitting device illustrated in FIG. 46C, and FIG. 46F illustrates an example where the layer 764 overlaps with the light-emitting device illustrated in FIG. 46E. In FIGS. 46D and 46F, a conductive film transmitting visible light is used for the upper electrode 762 to extract light to the upper electrode 762 side.

One or both of a color conversion layer and a color filter (coloring layer) can be used as the layer 764.

In FIGS. 46C and 46D, light-emitting substances that emit light of the same color or the same light-emitting substance may be used for the light-emitting layers 771, 772, and 773. For example, a light-emitting substance that emits blue light may be used for the light-emitting layers 771, 772, and 773. In a subpixel that emits blue light, blue light from the light-emitting device can be extracted as it is. In each of a subpixel that emits red light and a subpixel that emits green light, a color conversion layer is provided as the layer 764 illustrated in FIG. 46D for converting blue light from the light-emitting device into light with a longer wavelength, so that red light or green light can be extracted. As the layer 764, both a color conversion layer and a coloring layer are preferably used. In some cases, part of light emitted from the light-emitting device is transmitted through the color conversion layer without being converted. When light transmitted through the color conversion layer is extracted through the coloring layer, light other than light of the intended color can be absorbed by the coloring layer, and color purity of light exhibited by a subpixel can be improved.

In FIGS. 46C and 46D, light-emitting substances that emit light of different colors may be used for the light-emitting layers 771, 772, and 773. When the light-emitting layers 771, 772, and 773 emit light of complementary colors, white light emission can be obtained. The light-emitting device having a single structure preferably includes a light-emitting layer containing a light-emitting substance emitting blue light and a light-emitting layer containing a light-emitting substance emitting visible light with a longer wavelength than blue light, for example.

A color filter may be provided as the layer 764 illustrated in FIG. 46D. When white light passes through a color filter, light of a desired color can be obtained.

In the case where the light-emitting device having a single structure includes three light-emitting layers, for example, a light-emitting layer containing a light-emitting substance emitting red (R) light, a light-emitting layer containing a light-emitting substance emitting green (G) light, and a light-emitting layer containing a light-emitting substance emitting blue (B) light are preferably included. The stacking order of the light-emitting layers can be RGB or RBG from an anode side, for example. In that case, a buffer layer may be provided between R and G or between R and B.

In the case where the light-emitting device having a single structure includes two light-emitting layers, for example, a light-emitting layer containing a light-emitting substance emitting blue (B) light and a light-emitting layer containing a light-emitting substance emitting yellow (Y) light are preferably included. Such a structure may be referred to as a BY single structure.

In the light-emitting device that emits white light, two or more kinds of light-emitting substances are preferably contained. To obtain white light emission, the two or more kinds of light-emitting substances are selected so as to emit light of complementary colors. For example, when emission colors of a first light-emitting layer and a second light-emitting layer are complementary colors, the light-emitting device can emit white light as a whole. The same applies to a light-emitting device including three or more light-emitting layers.

In FIGS. 46C and 46D, each of the layers 780 and 790 may independently has a stacked structure of two or more layers as in FIG. 46B.

In FIGS. 46E and 46F, light-emitting substances emitting light of the same color or the same light-emitting substance may be used for the light-emitting layers 771 and 772. For example, in light-emitting devices included in subpixels emitting light of different colors, a light-emitting substance that emits blue light can be used for each of the light-emitting layer 771 and the light-emitting layer 772. In the subpixel that emits blue light, blue light from the light-emitting device can be extracted as it is. In each of the subpixel that emits red light and the subpixel that emits green light, a color conversion layer is provided as the layer 764 illustrated in FIG. 46F for converting blue light from the light-emitting device into light with a longer wavelength, so that red light or green light can be extracted. As the layer 764, both a color conversion layer and a coloring layer are preferably used.

In the case where the light-emitting device having any of the structures illustrated in FIG. 46E or 46F is used for the subpixels emitting different colors, the subpixels may use different light-emitting substances. Specifically, in the light-emitting device included in the subpixel emitting red light, a light-emitting substance that emits red light can be used for each of the light-emitting layer 771 and the light-emitting layer 772. In the light-emitting device included in the subpixel emitting green light, a light-emitting substance that emits green light can be used for each of the light-emitting layer 771 and the light-emitting layer 772. In the light-emitting device included in the subpixel emitting blue light, a light-emitting substance that emits blue light can be used for each of the light-emitting layer 771 and the light-emitting layer 772. A display apparatus having such a structure can be regarded as employing a light-emitting device with the tandem structure and the side-by-side (SBS) structure. Thus, such a display apparatus takes advantages of both the tandem structure and the SBS structure. Thus, a light-emitting device being capable of high-luminance light emission and having high reliability can be obtained.

In FIGS. 46E and 46F, light-emitting substances emitting light of different colors may be used for the light-emitting layers 771 and 772. When the light-emitting layers 771 and 772 emit light of complementary colors, white light emission can be obtained. A color filter may be provided as the layer 764 illustrated in FIG. 46F. When white light passes through a color filter, light of a desired color can be obtained.

Although FIGS. 46E and 46F illustrate examples where the light-emitting unit 763*a* includes one light-emitting layer 771 and the light-emitting unit 763*b* includes one the light-emitting layer 772, one embodiment of the present invention is not limited thereto. The light-emitting units 763*a* and 763*b* may each include two or more light-emitting layers.

In addition, although FIGS. 46E and 46F illustrate the light-emitting device including two light-emitting units, one embodiment of the present invention is not limited thereto. The light-emitting device may include three or more light-emitting units. Note that a structure including two light-emitting units and a structure including three light-emitting units may be referred to as a two-unit tandem structure and a three-unit tandem structure, respectively.

In FIGS. 46E and 46F, the light-emitting unit 763*a* includes a layer 780*a*, the light-emitting layer 771, and a layer 790*a*, and the light-emitting unit 763*b* includes a layer 780*b*, the light-emitting layer 772, and a layer 790*b*.

In the case where the lower electrode 761 is an anode and the upper electrode 762 is a cathode, and the layers 780*a* and 780*b* each include one or more of a hole-injection layer, a hole-transport layer, and an electron-blocking layer. The layers 790*a* and 790*b* each include one or more of an electron-injection layer, an electron-transport layer, and a hole-blocking layer. In the case where the lower electrode 761 is a cathode and the upper electrode 762 is an anode, the structures of the layers 780*a* and 790*a* are replaced with each other, and the structures of the layers 780*b* and 790*b* are also replaced with each other.

In the case where the lower electrode 761 is an anode and the upper electrode 762 is a cathode, for example, the layer 780*a* includes a hole-injection layer and a hole-transport layer over the hole-injection layer, and may further include an electron-blocking layer over the hole-transport layer. The layer 790*a* includes an electron-transport layer, and may further include a hole-blocking layer between the light-emitting layer 771 and the electron-transport layer. The layer 780*b* includes a hole-transport layer, and may further include an electron-blocking layer over the hole-transport layer. The layer 790*b* includes an electron-transport layer and an electron-injection layer over the electron-transport layer, and may further include a hole-blocking layer between the light-emitting layer 772 and the electron-transport layer. In the case where the lower electrode 761 is a cathode and the upper electrode 762 is an anode, for example, the layer 780*a* includes an electron-injection layer and an electron-transport layer over the electron-injection layer, and may further include a hole-blocking layer over the electron-transport layer. The layer 790*a* includes a hole-transport layer, and may further include an electron-blocking layer between the light-emitting layer 771 and the hole-transport layer. The layer 780*b* includes an electron-transport layer, and may further include a hole-blocking layer over the electron-transport layer. The layer 790*b* includes a hole-transport layer and a hole-injection layer over the hole-transport layer, and may further include an electron-blocking layer between the light-emitting layer 772 and the hole-transport layer.

In the case of manufacturing a light-emitting device having a tandem structure, two light-emitting units are stacked with the charge-generation layer 785 therebetween. The charge-generation layer 785 includes at least a charge-generation region. The charge-generation layer 785 has a function of injecting electrons into one of the two light-emitting units and injecting holes to the other when voltage is applied between the pair of electrodes.

Figure 47A:
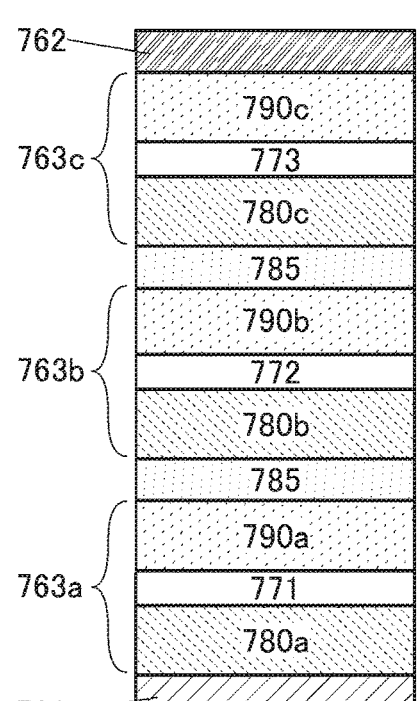
FIGS. 47A to 47C each illustrate a structure example of a light-emitting device.
Figure 47B:
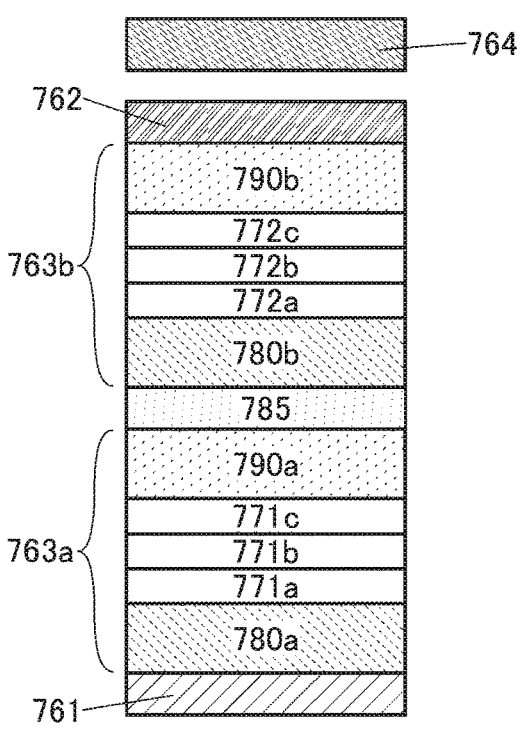
Figure 47C:
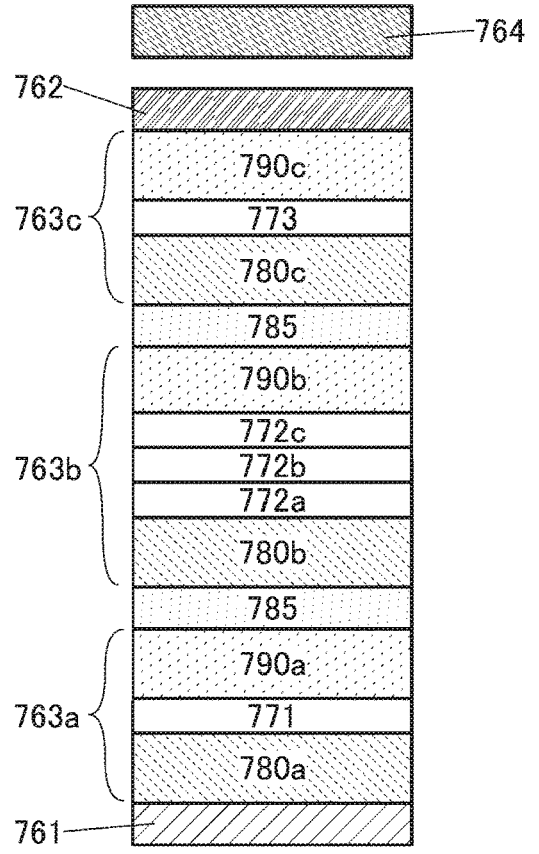

Examples of the light-emitting device with a tandem structure are structures illustrated in FIGS. 47A to 47C.

FIG. 47A shows a structure including three light-emitting units. In the structure illustrated in FIG. 47A, a plurality of light-emitting units (light-emitting units 763*a*, 763*b*, and 763*c*) are connected in series with the charge-generation layer 785 provided between each two light-emitting units. The light-emitting unit 763*a* includes the layer 780*a*, the light-emitting layer 771, and the layer 790*a*. The light-emitting unit 763*b* includes the layer 780*b*, the light-emitting layer 772, and the layer 790*b*. The light-emitting unit 763*c* includes a layer 780*c*, the light-emitting layer 773, and a layer 790*c*. Note that the layer 780*c* can have a structure applicable to the layers 780*a* and 780*b*, and the layer 790*c* can have a structure applicable to the layers 790*a* and 790*b*.

In FIG. 47A, the light-emitting layers 771, 772, and 773 preferably contain light-emitting substances that emit light of the same color. Specifically, the light-emitting layers 771, 772, and 773 can each contain a light-emitting substance that emits red (R) light (i.e., an R\R\R three-unit tandem structure), can each contain a light-emitting substance that emits green (G) light (i.e., a G\G\G three-unit tandem structure), or can each contain a light-emitting substance that emits blue (B) light (i.e., a B\B\B three-unit tandem structure). Note that "a\b" means that a light-emitting unit containing a light-emitting substance that emits light of the color "b" is provided over a light-emitting unit containing a light-emitting substance that emits light of the color "a" with a charge-generation layer therebetween.

In FIG. 47A, light-emitting substances that emit light of different colors may be used for some or all of the light-emitting layers 771, 772, and 773. Examples of a combination of emission colors for the light-emitting layers 771, 772, and 773 include blue (B) for two of them and yellow (Y) for the other; and red (R) for one of them, green (G) for another, and blue (B) for the other.

Note that the structure containing the light-emitting substances that emit light of the same color is not limited to the above structure. For example, a light-emitting device with a tandem structure may be employed in which light-emitting units each including a plurality of light-emitting layers are stacked as illustrated in FIG. 47B. FIG. 47B illustrates a structure in which two light-emitting units (light-emitting units 763*a* and 763*b*) are connected in series with the charge-generation layer 785 therebetween. The light-emitting unit 763*a* includes the layer 780*a*, a light-emitting layer 771*a*, a light-emitting layer 771*b*, a light-emitting layer 771*c*, and the layer 790*a*. The light-emitting unit 763*b* includes the layer 780*b*, a light-emitting layer 772*a*, a light-emitting layer 772*b*, a light-emitting layer 772*c*, and the layer 790*b*.

In FIG. 47B, the light-emitting unit 763*a* is configured to emit white (W) light by selecting light-emitting substances for the light-emitting layers 771*a*, 771*b*, and 771*c* so that their emission colors are complementary colors. Furthermore, the light-emitting unit 763*b* is configured to emit white (W) light by selecting light-emitting substances for the light-emitting layers 772*a*, 772*b*, and 772*c* are selected so that their emission colors are complementary colors. That is, the structure illustrated in FIG. 47B is a two-unit tandem structure of W\W. Note that there is no particular limitation on the stacking order of light-emitting substances that emit light of complementary colors, and a practitioner can select an optimum stacking order as appropriate. Although not illustrated, a three-unit tandem structure of W\W\W or a tandem structure with four or more units may be employed.

In the case of a light-emitting device with a tandem structure, any of the following structure may be employed, for example: a two-unit tandem structure of MY or Y\B including a light-emitting unit that emits yellow (Y) light and a light-emitting unit that emits blue (B) light; a two-unit tandem structure of R·G\B or B\R·G including a light-emitting unit that emits red (R) and green (G) light and a light-emitting unit that emits blue (B) light; a three-unit tandem structure of B\Y\B including a light-emitting unit that emits blue (B) light, a light-emitting unit that emits yellow (Y) light, and a light-emitting unit that emits blue (B) light in this order; a three-unit tandem structure of B\YG\B including a light-emitting unit that emits blue (B) light, a light-emitting unit that emits yellow-green (YG) light, and a light-emitting unit that emits blue (B) light in this order; and a three-unit tandem structure of B\G\B including a light-emitting unit that emits blue (B) light, a light-emitting unit that emits green (G) light, and a light-emitting unit that emits blue (B) light in this order. Note that "a·b" means that one light-emitting unit contains a light-emitting substance that emits light of the color "a" and a light-emitting substance that emits light of the color "b".

A light-emitting unit containing one light-emitting layer and a light-emitting unit including a plurality of light-emitting layers may be used in combination as illustrated in FIG. 47C.

Specifically, in the structure illustrated in FIG. 47C, a plurality of light-emitting units (the light-emitting units 763*a*, 763*b*, and 763*c*) are connected in series with the charge-generation layer 785 provided between each two light-emitting units. The light-emitting unit 763*a* includes the layer 780*a*, the light-emitting layer 771, and the layer 790*a*. The light-emitting unit 763*b* includes the layer 780*b*, the light-emitting layer 772*a*, the light-emitting layer 772*b*, the light-emitting layer 772*c*, and the layer 790*b*. The light-emitting unit 763*c* includes the layer 780*c*, the light-emitting layer 773, and the layer 790*c*.

The structure illustrated in FIG. 47C can be, for example, a three-unit tandem structure of B\R·G·YG\B in which the light-emitting unit 763*a* is a light-emitting unit that emits blue (B) light, the light-emitting unit 763*b* is a light-emitting unit that emits red (R), green (G), and yellow-green (YG) light, and the light-emitting unit 763*c* is a light-emitting unit that emits blue (B) light.

Examples of the number of stacked light-emitting units and the order of colors from the anode side include a two-unit structure of B and Y; a two-unit structure of B and a light-emitting unit X; a three-unit structure of B, Y, and B; and a three-unit structure of B, X, and B. Examples of the number of light-emitting layers stacked in the light-emitting unit X and the order of colors from an anode side include a two-layer structure of R and Y; a two-layer structure of R and G; a two-layer structure of G and R; a three-layer structure of G, R, and G; and a three-layer structure of R, G, and R. Another layer may be provided between two light-emitting layers.

Next, materials that can be used for the light-emitting device will be described.

A conductive film transmitting visible light is used for the electrode through which light is extracted, which is either the lower electrode 761 or the upper electrode 762. A conductive film reflecting visible light is preferably used for the electrode through which light is not extracted. In the case where the display apparatus includes a light-emitting device emitting infrared light, a conductive film transmitting visible light and infrared light is used for the electrode through which light is extracted, and a conductive film reflecting visible light and infrared light is preferably used for the electrode through which light is not extracted.

A conductive film transmitting visible light may be used also for the electrode through which light is not extracted. In that case, the electrode is preferably provided between a reflective layer and the EL layer 763. In other words, light emitted from the EL layer 763 may be reflected by the reflective layer to be extracted from the display apparatus.

For the pair of electrodes of the light-emitting device, a metal, an alloy, an electrically conductive compound, a mixture thereof, and the like can be used as appropriate. Specific examples of the material include metals such as aluminum, magnesium, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing any of these metals in appropriate combination. Examples of the material include indium tin oxide (In—Sn oxide), indium tin oxide containing silicon (In—Si—Sn oxide), indium zinc oxide (In—Zn oxide), and indium zinc oxide containing tungsten (In—W—Zn oxide). Other examples of the material include an alloy containing aluminum (aluminum alloy), such as an alloy of aluminum, nickel, and lanthanum (Al—Ni—La), and an alloy containing silver, such as an alloy of silver and magnesium and an alloy of silver, palladium, and copper (Ag—Pd—Cu, also referred to as APC). Other examples of the material include a Group 1 element and a Group 2 element of the periodic table, which are not described above (e.g., lithium, cesium, calcium, and strontium), rare earth metals such as europium and ytterbium, an alloy containing any of these elements in appropriate combination, and graphene.

The light-emitting device preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transmittance of an electrode having a property of transmitting visible light is greater than or equal to 40%. For example, in the case where an electrode having a property of transmitting visible light is used for the light-emitting device, an electrode having a visible light (light with wavelengths greater than or equal to 400 nm and less than 750 nm) transmittance higher than or equal to 40% is preferably used. The transflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity lower than or equal to $1 \times 10^{-2}$ $\Omega$cm.

The light-emitting device includes at least a light-emitting layer. In addition to the light-emitting layer, the light-emitting device may further include a layer containing any of a substance having a high hole-injection property, a substance having a high hole-transport property, a hole-blocking material, a substance having a high electron-transport property, an electron-blocking material, a substance having a high electron-injection property, a substance having a bipolar property (a substance with a high electron- and hole-transport property), and the like. For example, the light-emitting device can include one or more of a hole-injection layer, a hole-transport layer, a hole-blocking layer, a charge-generation layer, an electron-blocking layer, an electron-transport layer, and an electron-injection layer in addition to the light-emitting layer.

Either a low molecular compound or a high molecular compound can be used in the light-emitting device, and an inorganic compound may also be included. Each layer included in the light-emitting device can be formed, for example, by an evaporation method (including a vacuum evaporation method), a transfer method, a printing method, an inkjet method, or a coating method.

The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As the one or more kinds of organic compounds, one or both of a substance having a high hole-transport property (a hole-transport material) and a substance having a high electron-transport property (an electron-transport material) can be used. As the hole-transport material, it is possible to use a substance having a high hole-transport property which can be used for the hole-transport layer and will be described later. As the electron-transport material, it is possible to use a substance having a high electron-transport property which can be used for the electron-transport layer and will be described later. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by exciplex—triplet energy transfer (ExTET), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

The hole-injection layer injects holes from the anode to the hole-transport layer and contains a material with a high hole-injection property. Examples of a material with a high hole-injection property include an aromatic amine compound and a composite material containing a hole-transport material and an acceptor material (electron-accepting material).

As the hole-transport material, it is possible to use a substance having a high hole-transport property which can be used for the hole-transport layer and will be described later.

As the acceptor material, an oxide of a metal belonging to any of Group 4 to Group 8 of the periodic table can be used, for example. Specific examples include molybdenum oxide, vanadium oxide, niobium oxide, tantalum oxide, chromium oxide, tungsten oxide, manganese oxide, and rhenium oxide. Among these, molybdenum oxide is especially preferable since it is stable in the air, has a low hygroscopic property, and is easy to handle. Alternatively, an organic acceptor material containing fluorine can be used. Alternatively, organic acceptor materials such as a quinodimethane derivative, a chloranil derivative, and a hexaazatriphenylene derivative can also be used.

For example, a hole-transport material and a material containing an oxide of a metal belonging to any of Groups 4 to 8 of the periodic table (typically, molybdenum oxide) may be used as the substance having a high hole-injection property.

The hole-transport layer transports holes injected from the anode by the hole-injection layer, to the light-emitting layer. The hole-transport layer contains a hole-transport material. The hole-transport material preferably has a hole mobility higher than or equal to $1\times10^{-6}$ cm$^2$/Vs. Note that other substances can also be used as long as the substances have a hole-transport property higher than an electron-transport property. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-blocking layer is provided in contact with the light-emitting layer. The electron-blocking layer has a hole-transport property and contains a material capable of blocking electrons. Any of the materials having an electron-blocking property among the above hole-transport materials can be used for the electron-blocking layer.

The electron-blocking layer has a hole-transport property, and thus can also be referred to as a hole-transport layer. A layer having an electron-blocking property among the hole-transport layers can also be referred to as an electron-blocking layer.

The electron-transport layer transports electrons injected from the cathode by the electron-injection layer, to the light-emitting layer. The electron-transport layer contains an electron-transport material. The electron-transport material preferably has an electron mobility higher than or equal to $1\times10^{-6}$ cm$^2$/Vs. Note that other substances can also be used as long as the substances have an electron-transport property higher than a hole-transport property. As the electron-transport material, any of the following materials with a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a n-electron deficient heteroaromatic compound such as a nitrogen-containing heteroaromatic compound.

The hole-blocking layer is provided in contact with the light-emitting layer. The hole-blocking layer has an electron-transport property and contains a material capable of blocking holes. Any of the materials having a hole-blocking property among the above electron-transport materials can be used for the hole-blocking layer.

The hole-blocking layer has an electron-transport property, and thus can also be referred to as an electron-transport layer. A layer having a hole-blocking property among the electron-transport layers can also be referred to as a hole-blocking layer.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The difference between the lowest unoccupied molecular orbital (LUMO) level of the substance having a high electron-injection property and the work function value of the material used for the cathode is preferably small (specifically, smaller than or equal to 0.5 eV).

The electron-injection layer can be formed using an alkali metal, an alkaline earth metal, or a compound thereof, such as lithium, cesium, ytterbium, lithium fluoride (LiF), cesium fluoride (CsF), calcium fluoride (CaFx, where X is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide (LiOx), or cesium carbonate, for example. The electron-injection layer may have a stacked structure of two or more layers. In the stacked-layer structure, for example, lithium fluoride can be used for the first layer and ytterbium can be used for the second layer.

The electron-injection layer may contain an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, or a pyridazine ring), and a triazine ring.

Note that the LUMO level of the organic compound having an unshared electron pair is preferably greater than or equal to −3.6 eV and less than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition point (Tg) than BPhen and thus has high heat resistance.

As described above, the charge-generation layer includes at least a charge-generation region. The charge-generation region preferably contains an acceptor material, and for example, preferably contains a hole-transport material and an acceptor material which can be used for the hole-injection layer.

In addition, the charge-generation layer preferably includes a layer containing a substance having a high electron-injection property. The layer can also be referred to as an electron-injection buffer layer. The electron-injection buffer layer is preferably provided between the charge-generation region and the electron-transport layer. By provision of the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (e.g., lithium oxide (Li2O)). Alternatively, a material that can be used for the electron-injection layer can be used for the electron-injection buffer layer.

The charge-generation layer preferably includes a layer containing a substance having a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper(II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other in some cases depending on the cross-sectional shapes, the characteristics, or the like.

Note that the charge-generation layer may contain a donor material instead of an acceptor material. For example, the charge-generation layer may include a layer containing an electron-transport material and a donor material, which can be used for the electron-injection layer.

When the light-emitting units are stacked, provision of a charge-generation layer between two light-emitting units can suppress an increase in driving voltage.

The structures described in this embodiment can be used in combination with any of the structures described in the other embodiments as appropriate.

Embodiment 5

An example of a method for forming the light-emitting element 61 is described in this embodiment.

Figure 48A:
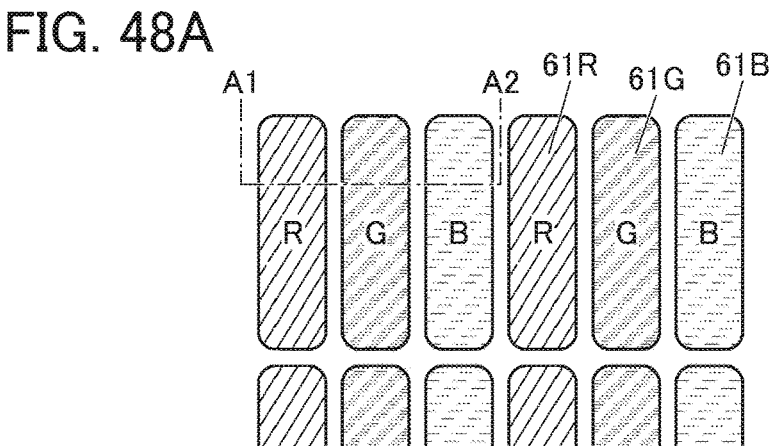
FIGS. 48A to 48D each illustrate a structure example of a light-emitting device.

FIG. 48A is a schematic plan view of the light-emitting element 61. The light-emitting element 61 includes a plurality of light-emitting elements 61R emitting red light, a plurality of light-emitting elements 61G emitting green light, and a plurality of light-emitting elements 61B emitting blue light. In FIG. 48A, light-emitting regions of the light-emitting elements are denoted by R, G, and B to easily differentiate the light-emitting elements. Although the structure illustrated in FIG. 48A has three emission colors of red (R), green (G), and blue (B), one embodiment of the present invention is not limited thereto. For example, the structure may have four or more colors.

The light-emitting elements 61R, the light-emitting elements 61G, and the light-emitting elements 61B are arranged in a matrix. Although FIG. 48A illustrates what is called a stripe arrangement in which the light-emitting elements of the same color are arranged in one direction, the arrangement of the light-emitting elements is not limited thereto.

As the light-emitting elements 61R, 61G, and 61B, an organic EL device such as an organic light-emitting diode (OLED) or a quantum-dot organic light-emitting diode (QOLED) is preferably used. Examples of a light-emitting substance contained in the EL element include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material).

Figure 48B:
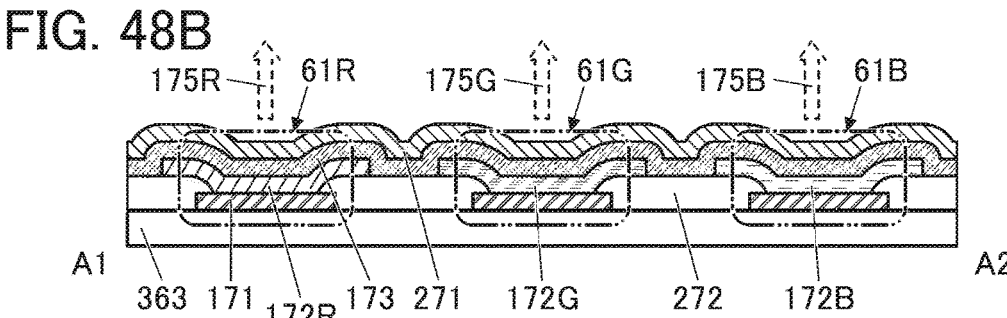

FIG. 48B is a schematic cross-sectional view taken along dashed-dotted line A1-A2 in FIG. 48A. FIG. 48B illustrates a cross section of the light-emitting elements 61R, 61G, and 61B. The light-emitting elements 61R, 61G, and 61B are provided over an insulator 363, and include the conductor 171 functioning as a pixel electrode and the conductor 173 functioning as a common electrode. For the insulator 363, one or both of an inorganic insulating film and an organic insulating film can be used. An inorganic insulating film is preferably used for the insulator 363. Examples of the inorganic insulating film include an oxide insulating film and a nitride insulating film, such as a silicon oxide film, a silicon oxynitride film, a silicon nitride oxide film, a silicon nitride film, an aluminum oxide film, an aluminum oxynitride film, and a hafnium oxide film.

The light-emitting element 61R includes an EL layer 172R between the conductor 171 functioning as a pixel electrode and the conductor 173 functions as a common electrode. The EL the layer 172R contains at least a light-emitting substance that emits light having a peak in a red wavelength range. An EL layer 172G included in the light-emitting element 61G contains at least a light-emitting substance that emits light having a peak in a green wavelength range. An EL layer 172B included in the light-emitting element 61B contains at least a light-emitting substance that emits light having a peak in a blue wavelength range.

The EL layers 172R, 172G, and 172B may each include one or more of an electron-injection layer, an electron-transport layer, a hole-injection layer, and a hole-transport layer in addition to the layer containing a light-emitting substance (the light-emitting layer).

The conductor 171 functioning as a pixel electrode is provided for each of the light-emitting elements. The conductor 173 functioning as a common electrode is provided as a common layer to the light-emitting elements. A conductive film that has a property of transmitting visible light is used for either the conductor 171 functioning as a pixel electrode or the conductor 173 functioning as a common electrode, and a reflective conductive film is used for the other. When the conductor 171 functioning as a pixel electrode is a light-transmitting electrode and the conductor 173 functioning as a common electrode is a reflective electrode, a bottom-emission display apparatus can be obtained. When the conductor 171 functioning as a pixel electrode is a reflective electrode and the conductor 173 functioning as a common electrode is a light-transmitting electrode, a top-emission display apparatus can be obtained. Note that when both the conductor 171 functioning as a pixel electrode and the conductor 173 functioning as a common electrode transmit light, a dual-emission display apparatus can be obtained.

For example, in the case where the light-emitting element 61R has a top-emission structure, light 175R is emitted from the light-emitting element 61R to the conductor 173 side. In the case where the light-emitting element 61G has a top-emission structure, light 175G is emitted from the light-emitting element 61G to the conductor 173 side. In the case where the light-emitting element 61B has a top-emission structure, light 175B is emitted from the light-emitting element 61B to the conductor 173 side.

An insulator 272 is provided to cover an end portion of the conductor 171 functioning as a pixel electrode. An end portion of the insulator 272 is preferably tapered. For the insulator 272, a material similar to the material that can be used for the insulator 363 can be used.

The insulator 272 is provided to prevent an unintentional electric short-circuit between adjacent light-emitting elements 61 and unintended light emission therefrom. The insulator 272 also has a function of preventing the contact of a metal mask with the conductor 171 in the case where the metal mask is used to form the EL layer 172.

The EL layers 172R, 172G, and 172B each include a region in contact with the top surface of the conductor 171 functioning as a pixel electrode and a region in contact with a surface of the insulator 272. End portions of the EL layers 172R, 172G, and 172B are positioned over the insulator 272.

As illustrated in FIG. 48B, there is a gap between the EL layers of two light-emitting elements with different colors. The EL layers 172R, 172G, and 172B are thus preferably provided not to be in contact with each other. This suitably prevents unintentional light emission (also referred to as crosstalk) from being caused by a current flowing through two adjacent EL layers. As a result, the contrast can be increased to achieve a display apparatus with high display quality.

The EL layers 172R, 172G, and 172B can be formed separately by a vacuum evaporation method or the like using a shadow mask such as a metal mask. These layers may be formed separately by a photolithography method. The photolithography method achieves a display device with high resolution, which is difficult to obtain in the case of using a metal mask. Furthermore, leakage current between adjacent EL layers is reduced, enabling the display device to perform extremely clear display with high contrast and high display quality.

A formation method using a metal mask, for example, does not easily reduce the distance between adjacent light-emitting elements 61 to less than 10 μm. However, the photolithography method can shorten the distance between adjacent light-emitting elements 61 to 8 μm or less, 3 μm or less, 2 μm or less, or 1 μm or less. Here, the distance between adjacent light-emitting elements 61 can be determined by the distance between edges of two adjacent pixel electrodes. Alternatively, the distance between adjacent light-emitting elements 61 can be determined by the distance between edges of two adjacent EL layers.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

By the above-described reduction in the distance between the adjacent light-emitting elements 61, the area of a non-light-emitting region that may exist between two light-emitting elements can be significantly reduced, and the aperture ratio can be close to 100%. For example, the aperture ratio lower than 100% but higher than or equal to 50%, higher than or equal to 60%, higher than or equal to 70%, higher than or equal to 80%, or higher than or equal to 90% can be achieved.

Furthermore, a pattern of the EL layer (also referred to as a processing size) can be made much smaller than that in the case of using a metal mask. For example, in the case of using a metal mask for forming EL layers separately, a variation in the thickness occurs between the center and the edge of the EL layer. This causes a reduction in an effective area that can be used as a light-emitting region with respect to the area of the EL layer. In contrast, in the above manufacturing method, an EL layer is formed by processing a film deposited to have a uniform thickness, which enables a uniform thickness in the EL layer. Thus, even in a fine pattern, almost the whole area can be used as a light-emitting region. Therefore, the above method makes it possible to obtain a high resolution display apparatus with a high aperture ratio.

In many cases, an organic film formed using FMM has an extremely small taper angle (e.g., a taper angle greater than 0° and less than 30°) so that the thickness of the film becomes smaller in a portion closer to an end portion. Therefore, it is difficult to clearly observe a side surface of an organic film formed using an FMM because the side surface and a top surface are continuously connected. In contrast, an EL layer included in one embodiment of the present invention is processed without using an FMM, and has a clear side surface. In particular, part of the taper angle of the EL layer included in one embodiment of the present invention is preferably greater than or equal to 30° and less than or equal to 120°, further preferably greater than or equal to 60° and less than or equal to 120°.

A protective layer 271 is provided over the conductor 173 functioning as a common electrode to cover the light-emitting elements 61R, 61G, and 61B. The protective layer 271 has a function of preventing diffusion of impurities such as water into each light-emitting element from the above.

The protective layer 271 can have, for example, a single-layer structure or a stacked-layer structure at least including an inorganic insulating film. Examples of the inorganic insulating film include an oxide film and a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide (IGZO) may be used for the protective layer 271. The protective layer 271 may be formed by an ALD method, a CVD method, or a sputtering method. Although the protective layer 271 includes an inorganic insulating film in this example, one embodiment of the present invention is not limited thereto. For example, the protective layer 271 may have a stacked-layer structure of an inorganic insulating film and an organic insulating film.

Note that in this specification, a nitride oxide refers to a compound in which the nitrogen content is higher than the oxygen content. An oxynitride refers to a compound in which the oxygen content is higher than the nitrogen content. The content of each element can be measured by Rutherford backscattering spectrometry (RBS), for example.

In the case where an indium gallium zinc oxide is used for the protective layer 271, the indium gallium zinc oxide can be processed by a wet etching method or a dry etching method. For example, in the case where IGZO is used for the protective layer 271, a chemical solution of oxalic acid, phosphoric acid, a mixed chemical solution (e.g., a mixed chemical solution of phosphoric acid, acetic acid, nitric acid, and water, which is also referred to as a mixed acid aluminum etchant), or the like can be used. Note that the volume ratio of phosphoric acid, acetic acid, nitric acid, and water mixed in the mixed acid aluminum etchant can be 53.3:6.7:3.3:36.7 or in the neighborhood thereof.

Note that the structure illustrated in FIG. 48B may be referred to as an SBS structure.

Figure 48C:
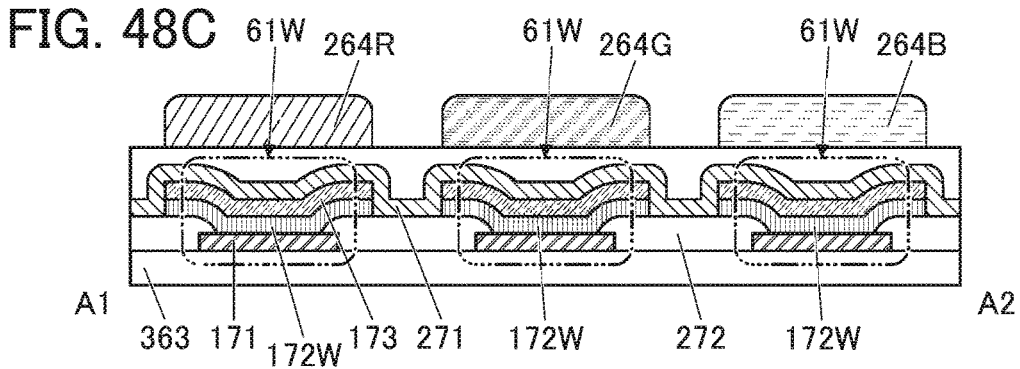

FIG. 48C illustrates an example different from the above. Specifically, in FIG. 48C, a light-emitting element 61W emitting white light is provided. The light-emitting element 61W includes an EL layer 172W emitting white light between the conductor 171 functioning as a pixel electrode and the conductor 173 functioning as a common electrode.

The EL layer 172W can have, for example, a stacked structure of two or more light-emitting layers that are selected so as to emit light of complementary colors. It is also possible to use a stacked EL layer in which a charge-generation layer is provided between light-emitting layers.

FIG. 48C illustrates three light-emitting elements 61W side by side. A coloring layer 264R is provided above the left light-emitting element 61W. The coloring layer 264R functions as a band path filter transmitting red light. Similarly, a coloring layer 264G transmitting green light is provided above the middle light-emitting element 61W, and a coloring layer 264B transmitting blue light is provided above the right light-emitting element 61W. This enables the display apparatus to display color images.

The EL layer 172W and the conductor 173 functioning as a common electrode are each separated between adjacent two light-emitting elements 61W. This suitably prevents unintentional light emission from being caused by current flowing through the EL layers 172W in the two adjacent light-emitting elements 61W. Particularly when the EL layer 172W is a stacked EL layer in which a charge-generation layer is provided between two light-emitting layers, the effect of crosstalk is more significant as the resolution increases, i.e., as the distance between adjacent pixels decreases, leading to lower contrast. Thus, the above structure can achieve a display apparatus having both high resolution and high contrast.

The EL layer 172W and the conductor 173 functioning as a common electrode are preferably isolated by a photolithography method. This can reduce the distance between light-emitting elements, achieving a display apparatus with a higher aperture ratio than that formed using, for example, a shadow mask such as a metal mask.

Note that in the case of a bottom-emission light-emitting element, coloring layers may be provided between the conductor 171 functioning as a pixel electrode and the insulator 363.

Figure 48D:
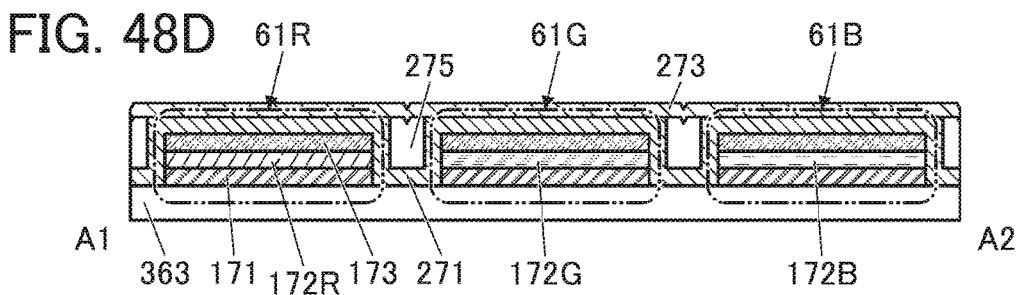

FIG. 48D illustrates an example different from the above. Specifically, in FIG. 48D, the insulators 272 are not provided between the light-emitting elements 61R, 61G, and 61B. With such a structure, a display apparatus with a high aperture ratio can be obtained. When the insulator 272 is not provided, unevenness formed by the light-emitting elements 61 can be reduced, thereby improving the viewing angle of the display apparatus. Specifically, the viewing angle can be greater than or equal to 150° and less than 180°, preferably greater than or equal to 160° and less than 180°.

The protective layer 271 covers the side surfaces of the EL layers 172R, 172G, and 172B. With this structure, impurities (typically, water or the like) can be prevented from entering the EL layers 172R, 172G, and 172B through their side surfaces. In addition, a leak current between adjacent light-emitting elements 61 is reduced, so that color saturation and contrast ratio are improved and power consumption is reduced.

In the structure illustrated in FIG. 48D, the conductor 171, the EL layer 172R, and the conductor 173 have the same or substantially the same top surface shapes. This structure can be formed in such a manner that the conductor 171, the EL layer 172R, and the conductor 173 are formed, and collectively processed using a resist mask or the like. In this process, the EL layer 172R and the conductor 173 are processed using the conductor 173 as a mask, and thus this process can be called self-alignment patterning. Although the EL layer 172R is described here, the EL layer 172G and the EL layer 172B can each have a similar structure.

In FIG. 48D, a protective layer 273 is further provided over the protective layer 271. For example, the protective layer 271 can be formed with an apparatus that can form a film with excellent coverage (typically, an ALD apparatus), and the protective layer 273 can be formed with an apparatus that can form a film with coverage inferior to that of the protective layer 271 (typically, a sputtering apparatus), whereby a region 275 can be provided between the protective layer 271 and the protective layer 273. In other words, the regions 275 are positioned between the EL layer 172R and the EL layer 172G and between the EL layer 172G and the EL layer 172B.

Note that the region 275 includes, for example, one or more selected from air, nitrogen, oxygen, carbon dioxide, and Group 18 elements (typically, helium, neon, argon, xenon, and krypton). Furthermore, a gas used during the formation of the protective layer 273 is sometimes contained in the region 275. For example, in the case where the protective layer 273 is formed using a sputtering method, one or more of the above-described Group 18 elements may be contained in the region 275. In the case where a gas is contained in the region 275, a gas can be identified with a gas chromatography method or the like. Alternatively, in the case where the protective layer 273 is formed using a sputtering method, a gas used in the sputtering is sometimes contained in the protective layer 273. In this case, an element such as argon may be detected when the protective layer 273 is analyzed by an energy dispersive X-ray (EDX) analysis or the like.

In the case where the refractive index of the region 275 is lower than that of the protective layer 271, light emitted from the EL layer 172R, the EL layer 172G, or the EL layer 172B is reflected at the interface between the protective layer 271 and the region 275. Thus, light emitted from the EL layer 172R, the EL layer 172G, or the EL layer 172B can be prevented from entering an adjacent pixel in some cases. This can inhibit color mixture of light emitted from adjacent pixels and thus can improve the display quality of the display apparatus.

In the case of the structure illustrated in FIG. 48D, a region between the light-emitting elements 61R and 61G or a region between the light-emitting elements 61G and 61B (hereinafter simply referred to as a distance between the light-emitting elements) can be shortened. Specifically, the distance between the light-emitting elements can be 1 or shorter, preferably 500 nm or shorter, further preferably 200 nm or shorter, 100 nm or shorter, 90 nm or shorter, 70 nm or shorter, 50 nm or shorter, 30 nm or shorter, 20 nm or shorter, 15 nm or shorter, or 10 nm or shorter. In other words, the display apparatus includes a region in which an interval between a side surface of the EL layer 172R and a side surface of the EL layer 172G or an interval between a side surface of the EL layer 172G and a side surface of the EL layer 172B is 1 μm or shorter, preferably 0.5 μm (500 nm) or shorter, further preferably to 100 nm or shorter.

In the case where the region 275 contains a gas, for example, the light-emitting elements can be isolated from each other and color mixture of light from the light-emitting elements, crosstalk, or the like can be inhibited.

The region 275 may be a space or may be filled with a filler. Examples of the filler include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. Alternatively, a photoresist may be used as the filler. The photoresist used as the filler may be a positive photoresist or a negative photoresist.

FIG. 49A illustrates an example different from the above example. Specifically, the structure illustrated in FIG. 49A is different from that in FIG. 48D in the structure of the insulator 363. The insulator 363 has a depressed portion in its top surface that is formed by being partially etched when the light-emitting elements 61R, 61G, and 61B are processed. In addition, the protective layer 271 is formed in the depressed portion. In other words, in the cross-sectional view, there is a region in which the bottom surface of the protective layer 271 is positioned below the bottom surface of the conductor 171. With the region, impurities (typically, water or the like) can be suitably prevented from entering the light-emitting elements 61R, 61G, and 61B from the bottom. It is likely that the depressed portion can be formed when impurities (also referred to as residue) that could be attached to the side surfaces of the light-emitting elements 61R, 61G, and 61B in processing of the light-emitting elements are removed by wet etching or the like. After the residue is removed, the side surfaces of the light-emitting elements are covered with the protective layer 271, whereby a highly reliable display apparatus can be provided.

FIG. 49B illustrates an example different from the above example. Specifically, the structure illustrated in FIG. 49B includes an insulator 276 and a microlens array 277 in addition to the structure illustrated in FIG. 49A. The insulator 276 has a function of an adhesive layer. Note that when the refractive index of the insulator 276 is lower than that of the microlens array 277, the microlens array 277 can condense light emitted from the light-emitting elements 61R, 61G, and 61B. This can increase the outcoupling efficiency of the display apparatus. In particular, this is suitable, because a user can see bright images when the user sees the display surface from the front of the display apparatus. As the insulator 276, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, polyimide a polyvinyl chloride (PVC) resin, a polyvinyl butyral (PVB) resin, and an ethylene vinyl acetate (EVA) resin. In particular, a material with low moisture permeability, such as an epoxy resin, is preferable. A two-component-mixture-type resin may be used. An adhesive sheet or the like may be used.

FIG. 49C illustrates an example different from the above. Specifically, the structure illustrated in FIG. 49C includes three light-emitting elements 61W instead of the light-emitting elements 61R, 61G, and 61B in the structure illustrated in FIG. 49A. In addition, the insulator 276 is provided over the three light-emitting elements 61W, and the coloring layers 264R, 264G, and 264B are provided over the insulator 276. Specifically, the coloring layer 264R transmitting red light is provided at a position overlapping with the left light-emitting element 61W, the coloring layer 264G transmitting green light is provided at a position overlapping with the middle light-emitting element 61W, and the coloring layer 264B transmitting blue light is provided at a position overlapping with the right light-emitting element 61W. This enables the semiconductor device to display color images. The structure illustrated in FIG. 49C is a variation example of the structure illustrated in FIG. 48C.

FIG. 49D illustrates an example different from the above. Specifically, in the structure illustrated in FIG. 49D, the protective layer 271 is provided to be in contact with the side surfaces of the conductor 171 and the EL layer 172. The conductor 173 is provided as a layer common to the light-emitting elements. In the structure illustrated in FIG. 49D, the region 275 is preferably filled with a filler.

When the light-emitting element 61 has a micro-optical resonator (microcavity) structure, the color purity of each emission color can be increased. In order that the light-emitting element 61 has a microcavity structure, a product of a distance d between the conductors 171 and 173 and a refractive index n of the EL layer 172 (optical path length) is set to m times greater than the half of a wavelength λ (m is an integer of 1 or more). The distance d can be obtained by Formula 1.

$$d = m \times \lambda / (2 \times n) \qquad \text{Formula 1}$$

According to Formula 1, in the light-emitting element 61 having the microcavity structure, the distance d is determined in accordance with the wavelength (color) of emitted light. The distance d corresponds to the thickness of the EL layer 172. Thus, the EL layer 172G is provided to have a larger thickness than the EL layer 172B, and the EL layer 172R is provided to have a larger thickness than the EL layer 172G in some cases.

To be exact, the distance dis a distance from a reflection region in the conductor 171 functioning as a reflective electrode to a reflection region in the conductor 173 functioning as an electrode having properties of transmitting and reflecting light (a transflective electrode). For example, in the case where the conductor 171 is a stack of silver and indium tin oxide (ITO) that is a transparent conductive film and the ITO is positioned on the EL layer 172 side, the distance d suitable for the emission color can be set by adjusting the thickness of the ITO. That is, even when the EL layers 172R, 172G, and 172B have the same thickness, the distance d suitable for the emission color can be obtained by adjusting the thickness of the ITO.

However, it is sometimes difficult to determine the exact position of the reflection region in each of the conductors 171 and 173. In this case, it is assumed that the effect of the microcavity structure can be obtained sufficiently with a certain position in each of the conductors 171 and 173 being supposed as the reflective region.

The light-emitting element 61 includes a hole-injection layer, a hole-transport layer, a light-emitting layer, an electron-transport layer, an electron-injection layer, and the like. Note that a specific structure example of the light-emitting element 61 will be described in another embodiment. In order to increase the outcoupling efficiency in the microcavity structure, the optical path length from the conductor 171 functioning as a reflective electrode to the light-emitting layer is preferably set to an odd multiple of λ/4. In order to achieve this optical path length, the thicknesses of the layers in the light-emitting element 61 are preferably adjusted as appropriate.

In the case where light is emitted to the conductor 173 side, the reflectance of the conductor 173 is preferably higher than the transmittance thereof. The transmittance of the conductor 173 is preferably higher than or equal to 2% and lower than or equal to 50%, further preferably higher than or equal to 2% and lower than or equal to 30%, still further preferably higher than or equal to 2% and lower than or equal to 10%. When the transmittance of the conductor 173 is set low (the reflectance is set high), the effect of the microcavity structure can be enhanced.

Figure 50A:
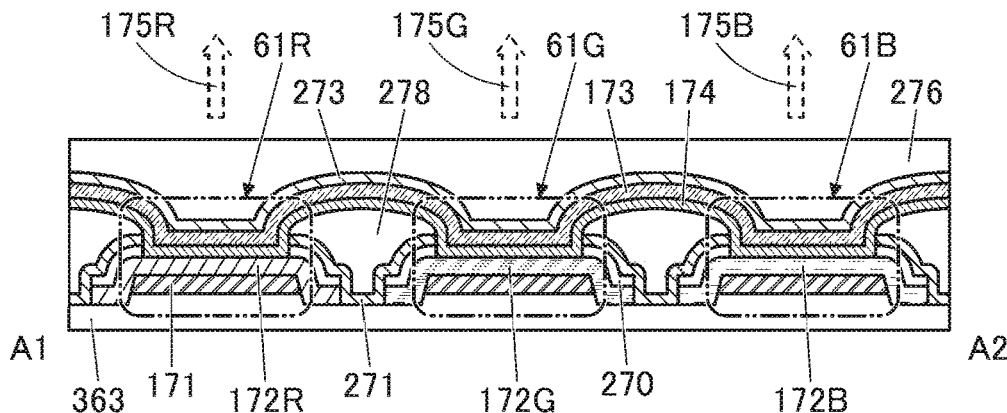
FIGS. 50A to 50C each illustrate a structure example of a light-emitting device.

FIG. 50A illustrates an example different from the above. Specifically, in the structure illustrated in FIG. 50A, the EL layer 172 extends beyond an end portion of the conductor 171 in each of the light-emitting elements 61R, 61G, and 61B. For example, in the light-emitting element 61R, the EL layer 172R extends beyond the end portion of the conductor 171. In the light-emitting element 61G, the EL layer 172G extends beyond the end portion of the conductor 171. In the light-emitting element 61B, the EL layer 172B extends beyond the end portion of the conductor 171.

The light-emitting elements 61R, 61G, and 61B each include a region where the EL layer 172 and the protective layer 271 overlap with each other with an insulator 270 therebetween. In a region between adjacent light-emitting elements 61, an insulator 278 is provided over the protective layer 271.

For the insulator 278, an epoxy resin, an acrylic resin, a silicone resin, a phenol resin, polyimide, a polyvinyl chloride (PVC) resin, a polyvinyl butyral (PVB) resin, an ethylene vinyl acetate (EVA) resin, and the like can be used. Alternatively, a photoresist may be used as the insulator 278. The photoresist used as the insulator 278 may be a positive photoresist or a negative photoresist.

A common layer 174 is provided over the light-emitting element 61R, the light-emitting element 61G, the light-emitting element 61B, and the insulator 278, and the conductor 173 is provided over the common layer 174. The common layer 174 includes a region in contact with the EL layer 172R, a region in contact with the EL layer 172G, and a region in contact with the EL layer 172B. The common layer 174 is shared by the light-emitting elements 61R, 61G, and 61B.

One or more of a hole-injection layer, a hole-transport layer, a hole-blocking layer, an electron-blocking layer, an electron-transport layer, and an electron-injection layer can be used as the common layer 174. For example, the common layer 174 may be a carrier-injection layer (a hole-injection layer or an electron-injection layer). The common layer 174 can also be regarded as part of the EL layer 172. Note that the common layer 174 is provided as necessary. In the case where the common layer 174 is provided, a layer having the same function as the common layer 174 is not necessarily provided in the EL layer 172.

In addition, the protective layer 273 is provided over the conductor 173, and the insulator 276 is provided over the protective layer 273.

Figure 50B:
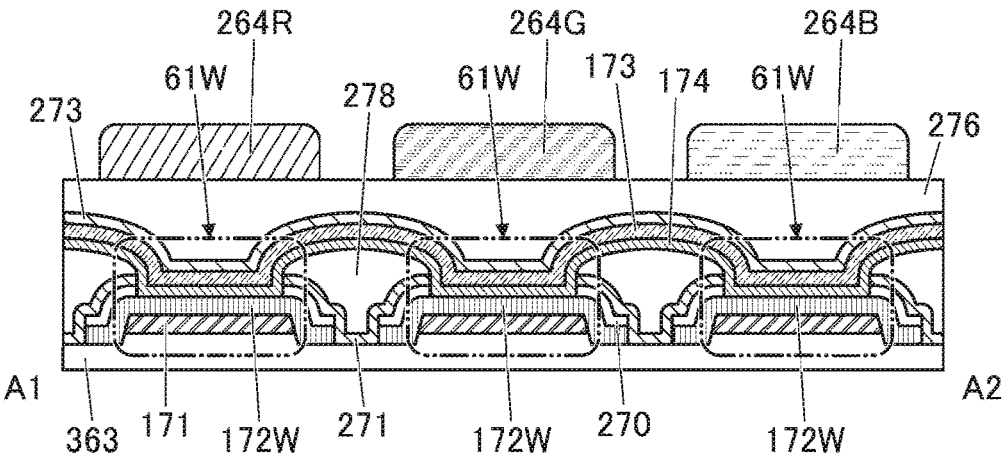

FIG. 50B illustrates an example different from the above. Specifically, the structure illustrated in FIG. 50B includes three light-emitting elements 61W instead of the light-emitting elements 61R, 61G, and 61B in the structure illustrated in FIG. 50A. In addition, the insulator 276 is provided over the three light-emitting elements 61W, and the coloring layers 264R, 264G, and 264B are provided over the insulator 276. Specifically, the coloring layer 264R transmitting red light is provided at a position overlapping with the left light-emitting element 61W, the coloring layer 264G transmitting green light is provided at a position overlapping with the middle light-emitting element 61W, and the coloring layer 264B is provided at a position overlapping with the right light-emitting element 61W. This enables the semiconductor device to display color images. The structure illustrated in FIG. 50B is a variation example of the structure illustrated in FIG. 49C.

Figure 50C:
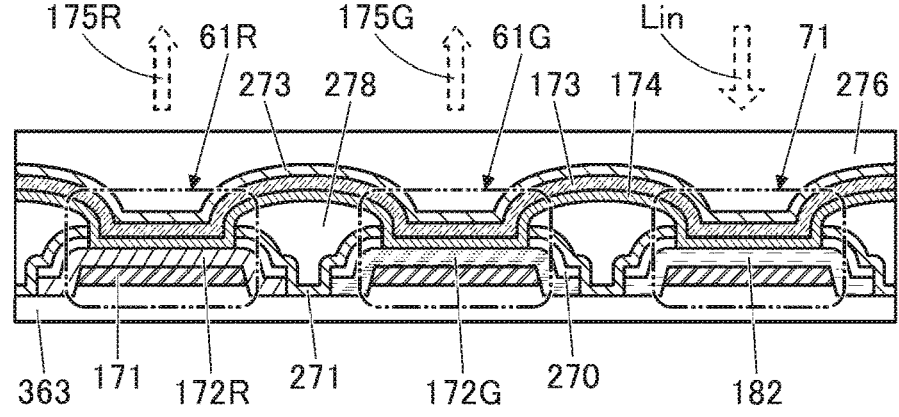

As illustrated in FIG. 50C, the light-emitting element 61R, the light-emitting element 61G, and the light-receiving element 71 may be provided over the insulator 363. The light-receiving element 71 in FIG. 50C is achieved by replacing the EL layer 172 of the light-emitting element 61 with an active layer 182 (also referred to as a "light-receiving layer") serving as a photoelectric conversion layer. The active layer 182 has a function of changing a resistance value depending on the wavelength and intensity of the incident light. The active layer 182 can be formed with a substance similar to that of the EL layer 172. Note that an inorganic material such as silicon may be used for the active layer 182.

The light-receiving element 71 has a function of sensing light Lin entering from the outside of the display device and passing through the protective layer 273, the conductor 173, and the common layer 174. A coloring layer transmitting light in a given wavelength range may be provided on the incident side of the light Lin so as to overlap with the light-emitting element 71.

The structures described in this embodiment can be used in combination with any of the structures described in the other embodiments as appropriate.

Embodiment 6

In this embodiment, electronic devices that can include the semiconductor device of one embodiment of the present invention will be described.

The semiconductor device of one embodiment of the present invention can be used for a display portion of an electronic device. Therefore, an electronic device having high display quality can be obtained. Alternatively, an electronic device with extremely high resolution can be obtained. Alternatively, a highly reliable electronic device can be obtained.

Examples of the electronic devices including any of the semiconductor devices of one embodiment of the present invention are as follows: display devices such as televisions and monitors, lighting devices, desktop personal computers, laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as chain saws, smoke detectors, and medical equipment such as dialyzers. Further examples include the following industrial equipment: guide lights, traffic lights, belt conveyors, elevators, escalators, industrial robots, power storage systems, and power storage devices for leveling the amount of power supply and smart grid. In addition, moving objects and the like driven by fuel engines and electric motors using power from power storage units, and the like may also be included in the range of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention may include a secondary battery. It is preferable that the secondary battery be capable of being charged by non-contact power transmission.

Examples of the secondary battery include a lithium ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display an image, information, and the like on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of one embodiment of the present invention can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Furthermore, the electronic device including a plurality of display portions can have a function of displaying image data mainly on one display portion while displaying text data mainly on another display portion, a function of displaying a three-dimensional image by displaying images on a plurality of display portions with a parallax taken into account, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited to these, and the electronic devices can have a variety of functions.

A display device including the semiconductor device of one embodiment of the present invention can display a high-resolution image. For this reason, the display device is particularly suitable for portable electronic devices, wearable electronic devices, e-book readers, and the like. For example, the display device is suitable for virtual reality (VR) devices, augmented reality (AR) devices, and the like.

Figure 51A:
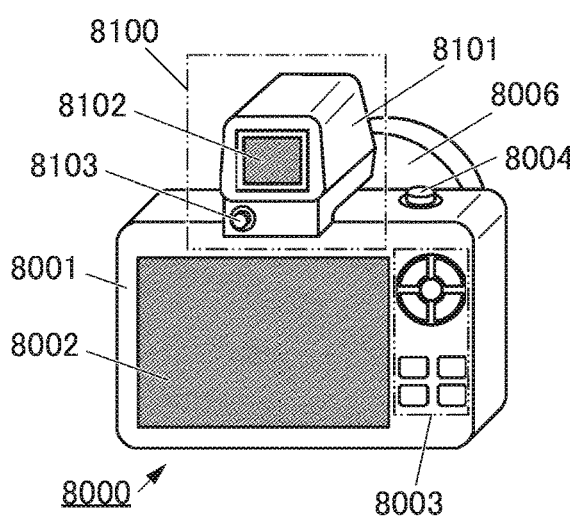
FIGS. 51A to 51F illustrate examples of electronic devices.

FIG. 51A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power supply button or the like.

The semiconductor device of one embodiment of the present invention can be used in the display portion 8002 of the camera 8000 and the display portion 8102 of the finder 8100. Note that the finder 8100 may be incorporated in the camera 8000.

Figure 51B:
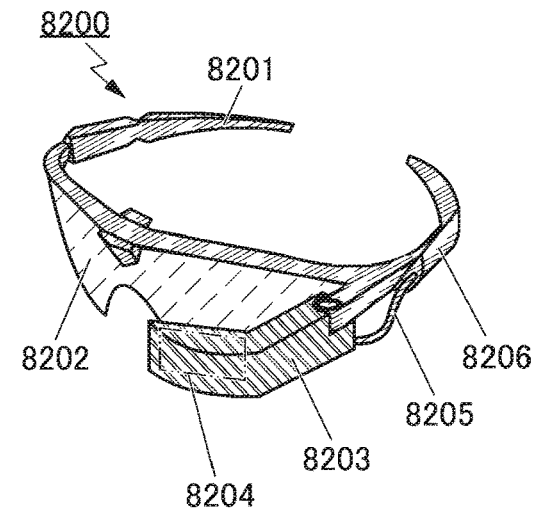

FIG. 51B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing in the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

A display device including the semiconductor device of one embodiment of the present invention can be used in the display portion 8204.

Figure 51C:
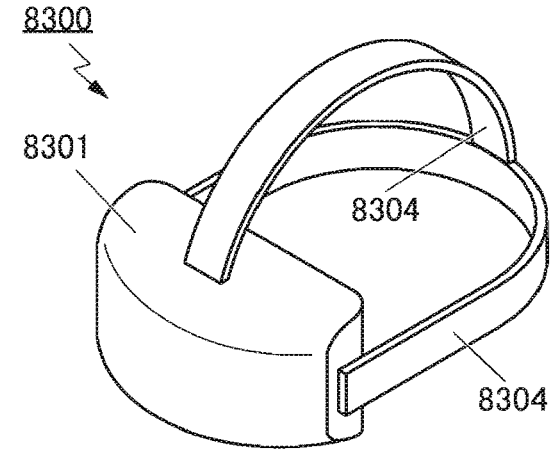
Figure 51D:
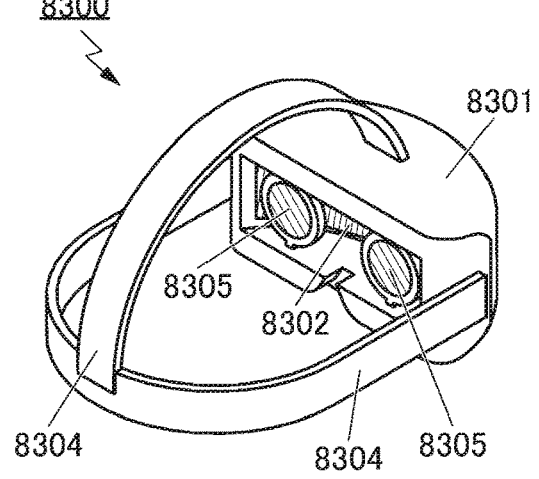
Figure 51E:
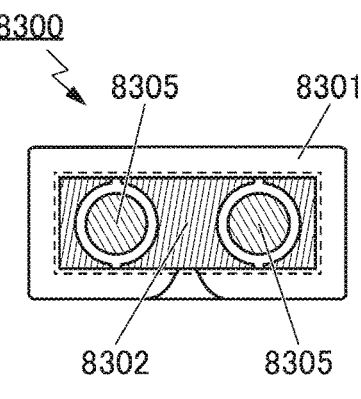

FIGS. 51C to 51E are external views of a head-mounted display 8300. The head-mounted display 8300 includes the housing 8301, the display portion 8302, the band-like fixing member 8304, and a pair of lenses 8305.

A user can see display on the display portion 8302 through the lenses 8305. The display portion 8302 is preferably curved because the user can feel high realistic sensation. Another image displayed in another region of the display portion 8302 is viewed through the lenses 8305, so that three-dimensional display using parallax or the like can be performed. Note that the number of the display portions 8302 is not limited to one; two display portions 8302 may be provided for user's respective eyes.

A display device including the semiconductor device of one embodiment of the present invention can be used for the display portion 8302. A display device including the semiconductor device of one embodiment of the present invention achieves extremely high resolution. For example, a pixel is not easily seen by the user even when the user sees display that is magnified by the use of the lenses 8305 as illustrated in FIG. 51E. In other words, a video with a strong sense of reality can be seen by the user with use of the display portion 8302.

Figure 51F:
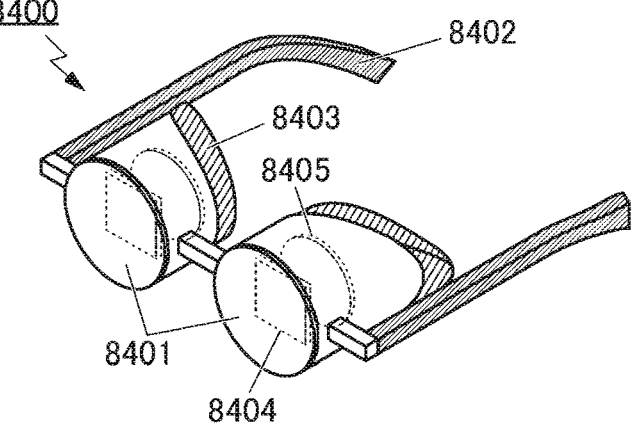

FIG. 51F is an external view of a google-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy images and sounds only when wearing the head-mounted display 8400.

Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Figure 52A:
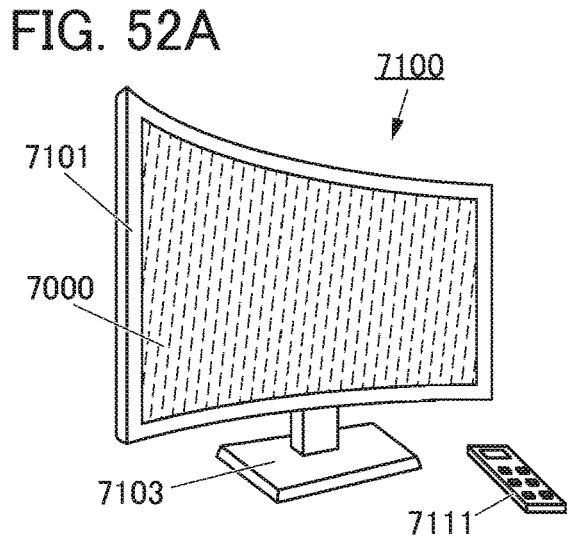
FIGS. 52A to 52F illustrate examples of electronic devices.

FIG. 52A illustrates an example of a television device. In a television device 7100, a display portion 7000 is incorporated in a housing 7101. Here, the housing 7101 is supported by a stand 7103.

A display device including the semiconductor device of one embodiment of the present invention can be used for the display portion 7000.

Operation of the television device 7100 illustrated in FIG. 52A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 52B:
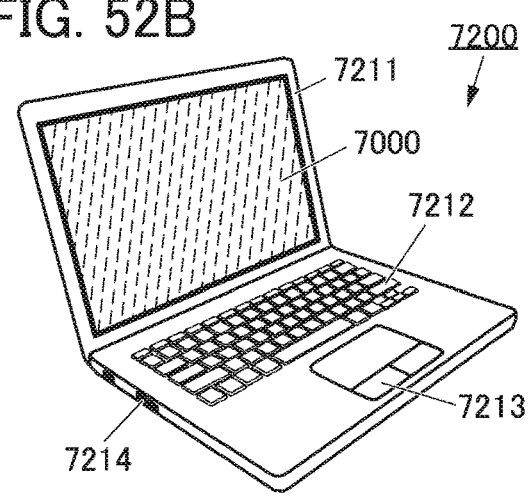

FIG. 52B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

A display device including the semiconductor device of one embodiment of the present invention can be used for the display portion 7000.

Figure 52C:
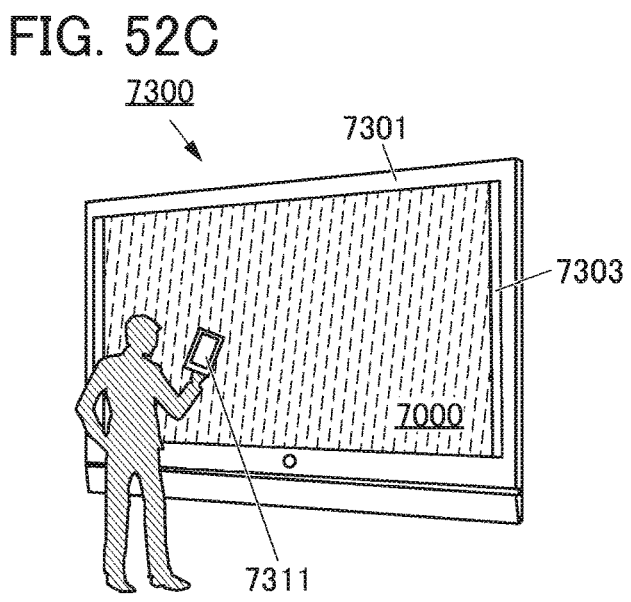
Figure 52D:
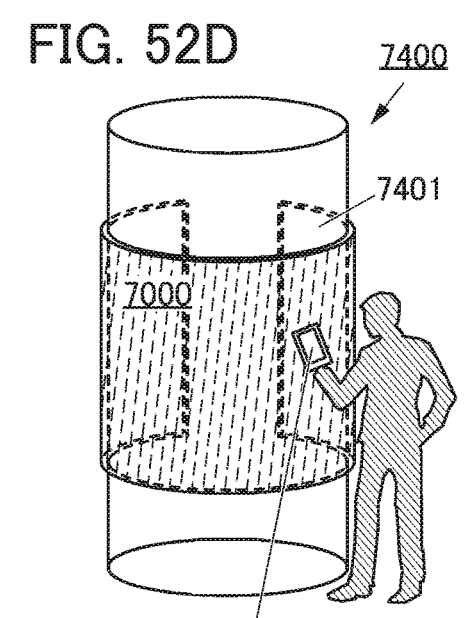

FIGS. 52C and 52D illustrate examples of digital signage.

A digital signage 7300 illustrated in FIG. 52C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 52D illustrates a digital signage 7400 mounted on a cylindrical pillar 7401. The digital signage 7400 includes the display portion 7000 provided along a curved surface of the pillar 7401.

In FIGS. 52C and 52D, a display device including the semiconductor device of one embodiment of the present invention can be used for the display portion 7000.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 52C and 52D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 52E:
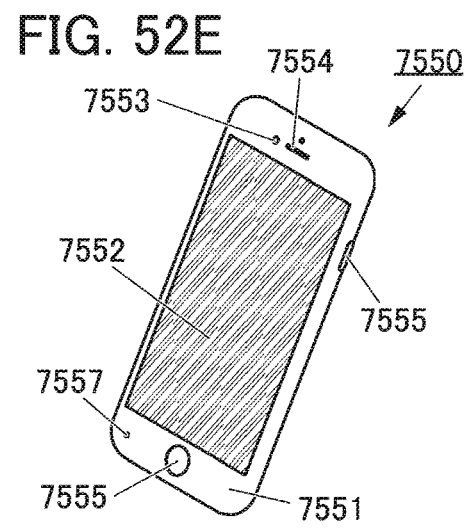

An information terminal 7550 illustrated in FIG. 52E includes a housing 7551, a display portion 7552, a microphone 7557, a speaker portion 7554, a camera 7553, an operation switch 7555, and the like. The display device including the semiconductor device of one embodiment of the present invention can be used for the display portion 7552. The display portion 7552 has a function of a touch panel. In addition, the information terminal 7550 includes an antenna, a battery, and the like inside the housing 7551. The information terminal 7550 can be used as, for example, a smartphone, a mobile phone, a tablet information terminal, a tablet personal computer, or an e-book reader.

Figure 52F:
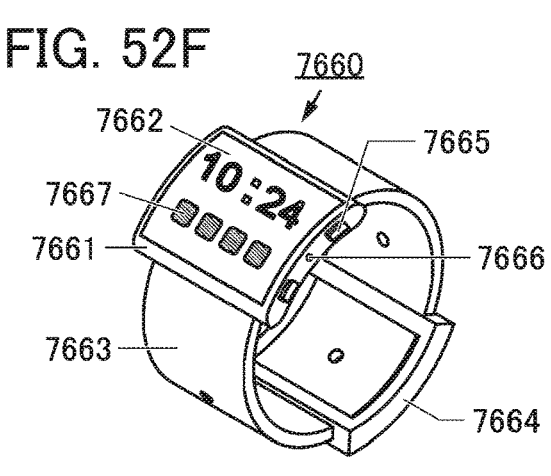

FIG. 52F illustrates an example of a watch-type information terminal. An information terminal 7660 includes a housing 7661, a display portion 7662, a band 7663, a buckle 7664, an operation switch 7665, an input/output terminal 7666, and the like. In addition, the information terminal 7660 includes an antenna, a battery, and the like inside the housing 7661. The information terminal 7660 is capable of executing a variety of applications such as mobile phone calls, e-mailing, text viewing and editing, music reproduction, Internet communication, and computer games.

The display portion 7662 includes a touch sensor, and operation can be performed by touching the screen with a finger, a stylus, or the like. For example, by touching an icon 7667 displayed on the display portion 7662, application can be started. With the operation switch 7665, a variety of functions such as time setting, power on/off, on/off of wireless communication, setting and cancellation of a silent mode, and setting and cancellation of a power saving mode can be performed. For example, the functions of the operation switch 7665 can be set by setting the operating system incorporated in the information terminal 7660.

The information terminal 7660 can employ near field communication that is a communication method based on an existing communication standard. In that case, for example, mutual communication between the information terminal 7660 and a headset capable of wireless communication can be performed, and thus hands-free calling is possible. The information terminal 7660 includes the input/output terminal 7666, and can transmit and receive data to/from another information terminal through the input/output terminal 7666. Power charging through the input/output terminal 7666 is also possible. The charging operation may be performed by wireless power feeding without using the input/output terminal 7666.

The structures described in this embodiment can be used in combination with any of the structures described in the other embodiments as appropriate.

This application is based on Japanese Patent Application Serial No. 2022-067469 filed with Japan Patent Office on Apr. 15, 2022, Japanese Patent Application Serial No. 2022-075586 filed with Japan Patent Office on Apr. 29, 2022, and Japanese Patent Application Serial No. 2022-086755 filed with Japan Patent Office on May 27, 2022, the entire contents of which are hereby incorporated by reference.

What is claimed is:

1. A semiconductor device comprising a first transistor, a second transistor, a third transistor, a fourth transistor, a fifth transistor, and a sixth transistor, wherein one of a source and a drain of the first transistor is electrically connected to a first terminal, wherein a gate of the first transistor is electrically connected to a second terminal, wherein the other of the source and the drain of the first transistor is electrically connected to a gate of the second transistor, wherein a drain of the second transistor is electrically connected to a third terminal, wherein a source of the second transistor is electrically connected to a drain of the fourth transistor, wherein one of a source and a drain of the third transistor is electrically connected to a fourth terminal, wherein a gate of the third transistor is electrically connected to a fifth terminal, wherein the other of the source and the drain of the third transistor is electrically connected to a gate of the fourth transistor, wherein a source of the fourth transistor is electrically connected to a drain of the fifth transistor, a drain of the sixth transistor, and a sixth terminal, wherein a gate of the fifth transistor is electrically connected to a seventh terminal, wherein the source of the fifth transistor is electrically connected to an eighth terminal, wherein a gate of the sixth transistor is electrically connected to a ninth terminal, wherein a source of the sixth transistor is electrically connected to a tenth terminal, wherein the second transistor comprises:

a first conductive layer over a first layer;

a first insulating layer over the first conductive layer;

a second conductive layer over the first insulating layer;

a first opening in the first insulating layer and the second conductive layer, the first opening overlapping with the first conductive layer;

a first semiconductor layer comprising, in the first opening, a region in contact with the first conductive layer, a region in contact with the first insulating layer, and a region in contact with the second conductive layer, the first semiconductor layer being covered with a second insulating layer; and a third conductive layer comprising a region overlapping with the first semiconductor layer, the third conductive layer being over the second insulating layer, wherein the first conductive layer is electrically connected to the third terminal, wherein the second conductive layer is electrically connected to the drain of the fourth transistor, wherein the third conductive layer is electrically connected to the other of the source and the drain of the first transistor, wherein the fourth transistor comprises:

a fourth conductive layer over the first layer;

the first insulating layer over the fourth conductive layer;

a fifth conductive layer over the first insulating layer;

a second opening in the first insulating layer and the fifth conductive layer, the second opening overlapping with the fourth conductive layer;

a second semiconductor layer comprising, in the second opening, a region in contact with the fourth conductive layer, a region in contact with the first insulating layer, and a region in contact with the fifth conductive layer, the second semiconductor layer being covered with the second insulating layer; and a sixth conductive layer comprising a region overlapping with the second semiconductor layer, the sixth conductive layer being over the second insulating layer, wherein the fifth conductive layer is electrically connected to the drain of the fifth transistor, and wherein the sixth conductive layer is electrically connected to the other of the source and the drain of the third transistor.

2. The semiconductor device according to claim 1, wherein a first signal is supplied to the second terminal, the third terminal, and the fifth terminal, wherein a second signal is supplied to the first terminal, the fourth terminal, the eighth terminal, and the tenth terminal, wherein a first input signal is supplied to the seventh terminal, wherein an inverted signal of the first input signal is supplied to the first terminal, wherein a second input signal is supplied to the ninth terminal, wherein an inverted signal of the second input signal is supplied to the fourth terminal, wherein an output signal is supplied to the sixth terminal, and wherein a potential of the second signal is lower than a potential of the first signal.

3. The semiconductor device according to claim 1, wherein each of the first semiconductor layer and the second semiconductor layer comprises an oxide semiconductor.

4. The semiconductor device according to claim 3, wherein the oxide semiconductor comprises at least one of indium and zinc.

5. The semiconductor device according to claim 1, wherein the first insulating layer comprises an insulating layer containing silicon and oxygen between two insulating layers each containing silicon and nitrogen.

6. The semiconductor device according to claim 1, wherein the first layer is an insulating substrate or an insulating layer.

7. A semiconductor device comprising a first transistor, a second transistor, a third transistor, and a fourth transistor, wherein one of a source and a drain of the first transistor and a gate of the first transistor are electrically connected to a first terminal, wherein the other of the source and the drain of the first transistor is electrically connected to a gate of the second transistor, wherein a drain of the second transistor is electrically connected to a second terminal, wherein a source of the second transistor is electrically connected to a drain of the third transistor, a drain of the fourth transistor, and a third terminal, wherein a gate of the third transistor is electrically connected to a fourth terminal, wherein a source of the third transistor is electrically connected to a fifth terminal, wherein a gate of the fourth transistor is electrically connected to a sixth terminal, wherein a source of the fourth transistor is electrically connected to a seventh terminal, wherein the second transistor comprises:

a first conductive layer over a first layer;

a first insulating layer over the first conductive layer;

a second conductive layer over the first insulating layer;

an opening in the first insulating layer and the second conductive layer, the opening overlapping with the first conductive layer;

a semiconductor layer comprising, in the opening, a region in contact with the first conductive layer, a region in contact with the first insulating layer, and a region in contact with the second conductive layer, the semiconductor layer being covered with a second insulating layer; and a third conductive layer comprising a region overlapping with the semiconductor layer, the third conductive layer being over the second insulating layer, wherein the first conductive layer is electrically connected to the second terminal, wherein the second conductive layer is electrically connected to the third terminal, and wherein the third conductive layer is electrically connected to the other of the source and the drain of the first transistor.

8. The semiconductor device according to claim 7, wherein a first signal is supplied to the first terminal and the second terminal, wherein a second signal is supplied to the fifth terminal and the seventh terminal, wherein a first input signal is supplied to the fourth terminal, wherein a second input signal is supplied to the sixth terminal, wherein an output signal is supplied to the third terminal, and wherein a potential of the second signal is lower than a potential of the first signal.

9. The semiconductor device according to claim 7, wherein the semiconductor layer comprises an oxide semiconductor.

10. The semiconductor device according to claim 9, wherein the oxide semiconductor comprises at least one of indium and zinc.

11. The semiconductor device according to claim 7, wherein the first insulating layer comprises an insulating layer containing silicon and oxygen between two insulating layers each containing silicon and nitrogen.

12. The semiconductor device according to claim 7, wherein the first layer is an insulating substrate or an insulating layer.

\* \* \* \* \*